(12) United States Patent (10) Patent No.: US 12,144,120 B2
Kasai et al. (45) Date of Patent: Nov. 12, 2024

(54) WIRING STRUCTURE AND METHOD OF MANUFACTURING THE SAME, SEMICONDUCTOR DEVICE, MULTILAYER WIRING STRUCTURE AND METHOD OF MANUFACTURING THE SAME, SEMICONDUCTOR ELEMENT MOUNTING SUBSTRATE, METHOD OF FORMING PATTERN STRUCTURE, IMPRINT MOLD AND METHOD OF MANUFACTURING THE SAME, IMPRINT MOLD SET, AND METHOD OF MANUFACTURING MULTILAYER WIRING BOARD

(71) Applicant: DAI NIPPON PRINTING CO., LTD., Tokyo-to (JP)

(72) Inventors: Ryohei Kasai, Tokyo-to (JP); Tadashi Furukawa, Tokyo-to (JP); Ryo Furugen, Tokyo-to (JP); Teppei Sotoda, Tokyo-to (JP); Tetsushi Hosoda, Tokyo-to (JP); Ayako Furuse, Tokyo-to (JP)

(73) Assignee: DAI NIPPON PRINTING CO., LTD., Tokyo-to (JP)

( * ) Notice: Subject to any disclaimer, the term of this patent is extended or adjusted under 35 U.S.C. 154(b) by 171 days.

(21) Appl. No.: 17/505,950

(22) Filed: Oct. 20, 2021

(65) Prior Publication Data

US 2022/0046801 A1 Feb. 10, 2022

Related U.S. Application Data

(63) Continuation of application No. 15/764,025, filed as application No. PCT/JP2016/078247 on Sep. 26, 2016, now Pat. No. 11,191,164.

(30) Foreign Application Priority Data

Sep. 29, 2015 (JP) .............................. 2015-191214
Dec. 7, 2015 (JP) .............................. 2015-238262
(Continued)

(51) Int. Cl.
*H05K 3/00* (2006.01)
*H01L 21/48* (2006.01)
(Continued)

(52) U.S. Cl.
CPC ......... *H05K 3/0014* (2013.01); *H01L 21/481* (2013.01); *H01L 21/4846* (2013.01);
(Continued)

(58) Field of Classification Search
CPC ........ H05K 3/00; H05K 3/001; H05K 3/0014; H05K 3/002; H05K 3/0023; H01L 21/00;
(Continued)

(56) References Cited

U.S. PATENT DOCUMENTS 6,839,964 B2 1/2005 Henson
7,168,936 B2 1/2007 Padovani
(Continued)

FOREIGN PATENT DOCUMENTS

CN 102687605 A 9/2012
JP 2007-103915 A 4/2007
(Continued)

OTHER PUBLICATIONS

Nov. 29, 2016 International Search Report issued in International Patent Application No. PCT/JP2016/078247.
(Continued)

*Primary Examiner* — Daniel McNally
(74) *Attorney, Agent, or Firm* — Oliff PLC

(57) ABSTRACT

A mold includes a mold base material and a rugged structure located at a main surface of the mold base material. The
(Continued)

rugged structure includes a plurality of linearly shaped projected portions for forming wiring, and a circularly shaped projected portion for forming a pad portion, in which a light-shielding layer is provided at a top portion flat surface of the circularly shaped projected portion for forming the pad portion.

6 Claims, 60 Drawing Sheets

(30) Foreign Application Priority Data

| | | |
|---|---|---|
| Dec. 7, 2015 | (JP) | 2015-238263 |
| Apr. 14, 2016 | (JP) | 2016-081395 |
| Jul. 13, 2016 | (JP) | 2016-138198 |
| Jul. 13, 2016 | (JP) | 2016-138199 |
| Sep. 16, 2016 | (JP) | 2016-182064 |

(51) Int. Cl.
```
     H01L 21/768       (2006.01)
     H01L 23/498       (2006.01)
     H01L 23/544       (2006.01)
     H01L 21/56        (2006.01)
```
(52) U.S. Cl.
CPC .......... *H01L 21/768* (2013.01); *H01L 23/498* (2013.01); *H01L 23/544* (2013.01); *H05K 3/0023* (2013.01); *H01L 21/4857* (2013.01); *H01L 21/563* (2013.01); *H01L 23/49822* (2013.01); *H01L 2223/5442* (2013.01); *H01L 2223/54426* (2013.01); *H01L 2223/54486* (2013.01); *H01L 2224/16225* (2013.01); *H01L 2924/15192* (2013.01); *H01L 2924/15311* (2013.01); *H05K 2201/0376* (2013.01)

(58) Field of Classification Search
CPC ....... H01L 21/40; H01L 21/48; H01L 21/481; H01L 21/484; H01L 21/4846; H01L 21/70; H01L 21/76; H01L 21/768; H01L 23/00; H01L 23/40; H01L 23/49; H01L 23/498; H01L 23/50; H01L 23/54; H01L 23/544

See application file for complete search history.

(56) References Cited

U.S. PATENT DOCUMENTS

| | | |
|---|---|---|
| 2003/0064546 A1 | 4/2003 | McCormick et al. |
| 2004/0045832 A1 | 3/2004 | Martyak |
| 2005/0227497 A1* | 10/2005 | Padovani .................. G03F 1/50 |
| | | 438/758 |
| 2006/0170332 A1 | 8/2006 | Tamaki et al. |
| 2007/0187875 A1 | 8/2007 | Terasaki et al. |
| 2008/0008824 A1* | 1/2008 | Cho .......................... H05K 1/09 |
| | | 427/98.2 |
| 2009/0152239 A1 | 6/2009 | Terasaki et al. |
| 2009/0152753 A1 | 6/2009 | Terasaki et al. |
| 2010/0072675 A1 | 3/2010 | Cho et al. |
| 2011/0278259 A1 | 11/2011 | Terasaki et al. |
| 2012/0095435 A1 | 4/2012 | Hunter et al. |
| 2012/0133077 A1 | 5/2012 | Mizawa et al. |
| 2012/0295435 A1 | 11/2012 | Yoneda |
| 2012/0305179 A1 | 12/2012 | Hondo |
| 2014/0120199 A1 | 5/2014 | Terasaki et al. |
| 2014/0158407 A1 | 6/2014 | Ho |
| 2015/0004275 A1 | 1/2015 | Miyajima et al. |
| 2015/0230341 A1 | 8/2015 | Milne et al. |

FOREIGN PATENT DOCUMENTS

| | | |
|---|---|---|
| JP | 2008-022002 A | 1/2008 |
| JP | 2008-132722 A | 6/2008 |
| JP | 2010-074162 A | 4/2010 |
| JP | 4448191 B2 | 4/2010 |
| JP | 2010-245131 A | 10/2010 |
| JP | 2010-278330 A | 12/2010 |
| JP | 2011-114046 A | 6/2011 |
| JP | 4951981 B2 | 6/2012 |
| JP | 2012-243809 A | 12/2012 |
| JP | 2013-030522 A | 2/2013 |
| JP | 2013-043415 A | 3/2013 |
| JP | 2013-105902 A | 5/2013 |
| JP | 2013-237157 A | 11/2013 |
| JP | 2014-013902 A | 1/2014 |
| JP | 2014-165219 A | 9/2014 |
| JP | 2014-170976 A | 9/2014 |
| JP | 2014-209509 A | 11/2014 |
| JP | 2015-012034 A | 1/2015 |
| TW | 201503232 A | 1/2015 |
| WO | 2011/016549 A1 | 2/2011 |
| WO | 2011/081153 A1 | 7/2011 |

OTHER PUBLICATIONS

Apr. 3, 2018 International Preliminary Report on Patentability issued in International Patent Application No. PCT/JP2016/078247.
Feb. 15, 2019 Office Action issued in Japanese Patent Application No. 2017-543248.
Phtomask, "Optical Density: What DOES that number mean?", Aug. 11, 2015, https://www.photomaskportal.com/blog/optical-density-what does-that-number-mean (Year: 2015).
Dec. 27, 2019 Office Action issued in Taiwanese Patent Application No. 105131372.
Oct. 9, 2020 Office Action issued in Japanese Patent Application No. 2019-163976.
Feb. 23, 2022 Office Action issued in Chinese Patent Application No. 201680059751.8.

\* cited by examiner

WIRING STRUCTURE AND METHOD OF MANUFACTURING THE SAME, SEMICONDUCTOR DEVICE, MULTILAYER WIRING STRUCTURE AND METHOD OF MANUFACTURING THE SAME, SEMICONDUCTOR ELEMENT MOUNTING SUBSTRATE, METHOD OF FORMING PATTERN STRUCTURE, IMPRINT MOLD AND METHOD OF MANUFACTURING THE SAME, IMPRINT MOLD SET, AND METHOD OF MANUFACTURING MULTILAYER WIRING BOARD

CROSS-REFERENCE TO RELATED APPLICATIONS

This is a Continuation of application Ser. No. 15/764,025 filed Mar. 28, 2018, which in turn is a national stage entry of PCT/JP2016/078247 filed Sep. 26, 2016, which claims priority to JP 2016-182064 filed Sep. 16, 2016, JP 2016-138198 filed Jul. 13, 2016, JP 2016-138199 filed Jul. 13, 2016, JP 2016-081395 filed Apr. 14, 2016, JP 2015-238262 filed Dec. 7, 2015, JP 2015-238263 filed Dec. 7, 2015, and JP 2015-191214 filed Sep. 29, 2015. The disclosure of the prior applications is hereby incorporated by reference herein in its entirety.

TECHNICAL FIELD

The present invention relates to a method of manufacturing a wiring structure, a semiconductor device, a multilayer wiring structure and a method of manufacturing the same, a semiconductor element mounting substrate, a method of forming a pattern structure, an imprint mold and a method of manufacturing the same, an imprint mold set, and a method of manufacturing a multilayer wiring board.

BACKGROUND ART

In recent years, as a fine pattern forming technology for substituting a photolithographic technology, a pattern forming technology in which an imprint method is used has been paid attention to. The imprint method is a pattern forming technology in which a mold member (mold) provided with a fine rugged structure is used, and the rugged structure is transferred to a to-be-molded resin material, whereby the fine structure is transferred in actual size. For example, in an imprint method using a photo-curing resin as a to-be-molded resin material, a photo-curing resin composition is supplied onto a surface of a transfer substrate, a mold having a desired rugged structure and the transfer substrate are brought close to each other until a predetermined distance is attained therebetween to fill the inside of the rugged structure with the photo-curing resin composition, and, in this state, irradiation with light from the mold side is conducted to cure the photo-curing resin composition, thereby forming a resin layer, after which the mold is separated from the resin layer, whereby a pattern structure provided with a rugged structure (rugged pattern) through reversion of the ruggedness possessed by the mold is formed.

In the formation of a multilayer wiring structure by use of such an imprint method, it is necessary to form a pattern structure which has deeper recesses for forming interlayer connection vias for connection between upper and lower wiring layers, and shallower recesses for forming wiring. Therefore, as the mold, there can be used a mold provided with a rugged structure which has higher projected portions for forming deeper recesses for the interlayer connection vias and lower projected portions for forming wiring in an upper layer. In this case, a photo-curing insulating resist such as an epoxy-based one is supplied onto a transfer base material provided with desired wiring and pad portions, and the mold is pressed thereagainst to fill the inside of the rugged structure of the mold with the photo-curing insulating resist. Then, irradiation with light from the mold side is conducted to cure the photo-curing insulating resist, thereby forming an insulating material layer, after which the mold is separated from the insulating material layer, to thereby form a pattern structure comprised of the insulating material on the wiring and pad portions possessed by the transfer base material. The pattern structure formed in this way has deeper recesses for forming interlayer connection vias that are formed through reversion of the higher projected portions possessed by the mold and shallower recesses for forming wiring that are formed through reversion of the lower projected portions.

However, a residual film of the insulating material layer is present between the deeper recesses for forming the interlayer connection vias and the pad portions in a lower layer, so that even when a conductive material is disposed in the deeper recesses, connection thereof with the pad portions in the lower layer is obstructed by the residual film, and a function as the interlayer connection via is not realized. Therefore, it is necessary to remove the residual film present in the deeper recesses for forming the interlayer connection vias. However, where a dry etching treatment such as to remove the residual film formed through curing of the photo-curing insulating resist such as an epoxy-based one is performed, there is a problem that wall surfaces of the shallower recesses for wiring of the pattern structure would also be roughened, whereby the wiring formed by disposing a conductive material in the recesses would be lowered in high-frequency characteristics.

In order to solve such a problem, it has been proposed to use a mold in which at least top portions of higher projected portions of a rugged structure are formed of a light-shielding material (for example, Patent Document 1). By use of such a mold, it is ensured that exposure of the photo-curing insulating resist located beneath the higher projected portions of the mold to light is obstructed, so that the photo-curing insulating resist there remains uncured. Therefore, the residue present between the deeper recesses for forming the interlayer connection vias and the pad portions in the lower layer is the photo-curing insulating resist in an uncured state, and such residue can be easily removed by the subsequent development.

PRIOR ART DOCUMENT

Patent Document

Patent Document 1: U.S. Pat. No. 7,168,936
Patent Document 2: Japanese Patent No. 4951981
Patent Document 3: Japanese Patent No. 4448191

However, in the step in which the inside of the rugged structure of the mold provided with the rugged structure having projected portions differing in height is filled with the photo-curing insulating resist, a flow is first generated in the photo-curing insulating resist upon contact thereof with the higher projected portions, and thereafter a flow is generated in the photo-curing insulating resist upon contact with the lower projected portions. Due to the time difference between the generations of the flows, therefore, air bubbles are liable to remain in the recesses between the lower projected portions. As a result, there has been a problem that defects would be generated in the recesses for forming wiring of the pattern structure thus formed.

In addition, in the mold provided with the rugged structure having projected portions differing in height, there has been a problem as follows. When the photo-curing insulating resist is formed to be an insulating material layer and thereafter the mold is separated from the insulating material layer, breakage of the mold or breakage of the deeper recesses of the insulating material layer may be generated, particularly in separation between the higher projected portions of the mold and the insulating material layer. Accordingly, an operation of peeling between the mold and the insulating material layer is difficult to perform.

It is an object of the present invention to provide a method of forming with high accuracy a pattern structure which has through-holes for forming interlayer connection vias and recesses for forming wiring, a method of manufacturing a multilayer wiring structure by use of the forming method, and an imprint mold for use in these methods.

In addition, conventionally, in the case of producing a multilayer wiring structure by use of an imprint method, there is a problem that as insulating material layers are stacked from the lower side toward the upper side, peripheral edges of the insulating material layers would be warped upward. In general, when a photo-curing insulating resist is cured, the resin such as an epoxy-based one shrinks due to cure shrinkage upon photo-curing. Therefore, there arises a problem that each insulating material layer would be warped upward, and, as the insulating material layers are stacked, warping of the multilayer wiring structure as a whole would be enlarged.

It is an object of the present invention to provide a wiring structure, a semiconductor device, a multilayer wiring structure, a semiconductor element mounting substrate, a method of forming a pattern structure, a method of manufacturing a wiring structure, and a mold, such that it is possible to reduce warping of a resin (insulating material layer) constituting a pattern structure.

Besides, it has been proposed to use a mold in which at least top portions of higher projected portions of a rugged structure are formed of a light-shielding material such as chromium (for example, Patent Document 1). By use of such a mold, it is ensured that exposure of the photo-curing insulating resist located beneath the higher projected portions of the mold to light is obstructed, so that the photo-curing insulating resist there remains uncured. Therefore, the residue present between the deeper recesses as via holes and the pad portions in the lower layer is the residue of the photo-curing insulating resist in an uncured state, and such residue can be easily removed by the subsequent development.

In the mold provided with a light-shielding pattern as aforementioned, the residue of the photo-curing insulating resist in the uncured state can be easily removed, and a pattern structure provided with the through-holes as via holes can be formed. However, there has been a problem as follows. When the photo-curing insulating resist is cured to be an insulating material layer and thereafter the mold is separated from the insulating material layer, the insulating material or foreign matter may clog or adhere in the recesses or to the surface of the mold, depending on the state and/or properties of the photo-curing insulating resist, imprint conditions or the like. When the mold is used repeated in this state, defects would be generated, for example, in the recesses for wiring of the pattern structure thus formed.

Therefore, it is necessary to remove the adherent matter such as the insulating material and foreign matter from the mold. In the case where the adherent matter is a resin excellent in chemical resistance such as epoxy, benzocyclobutene, acrylics, maleimide, or fluorine-containing resins, a removing treatment using a chemical liquid containing a strong oxidizer is needed. However, in the mold in which at least the top portions of the higher projected portions of the rugged structure are formed of a light-shielding material such as chromium as aforementioned, there has been a problem as follows. The light-shielding material is damaged through oxidation by the chemical liquid containing the strong oxidizer, whereby decomposition, lessening of film, deficit or the like would be generated, leading to a lowering in the function of the light-shielding pattern.

It is an object of the present invention to provide an imprint mold for forming with high accuracy a pattern structure having recesses differing in depth, and a method of manufacturing the same.

Further, it is an object of the present invention to provide an imprint mold for transfer forming a rugged structure having recesses differing in depth to a transfer substrate with high accuracy, while suppressing influences of warping and/or ruggedness present in the transfer substrate, and a method of manufacturing such a mold.

Furthermore, it is an object of the present invention to provide an imprint mold which can restrain damaging such as peeling of a light-shielding layer from occurring and which can be stably used over a long period of time, and a method of manufacturing a multilayer wiring board using the same.

Furthermore, it is an object of the present invention to provide an imprint mold which can restrain damaging such as peeling of an alignment mark comprised of a light-shielding material from occurring and which can stably used over a long period of time, an imprint mold set for manufacturing a multilayer wiring board that includes the imprint mold, and a method of manufacturing a multilayer wiring board using the imprint mold set.

DISCLOSURE OF INVENTION

A method of forming a pattern structure of the present invention is configured to include: a supplying step of supplying a photo-curing insulating resist onto a transfer base material; a contact step of preparing a mold having a mold base material and a rugged structure located at a main surface of the mold base material, the rugged structure having at least a projected portion for forming wiring and a projected portion for forming a pad, with a through-hole forming light-shielding layer being provided at a desired part of a top portion flat surface of the projected portion for forming the pad, and bringing the mold and the transfer base material close to each other to spread the photo-curing insulating resist between the mold and the transfer base material, thereby forming a photo-curing insulating resist layer; a curing step of curing the photo-curing insulating resist layer by irradiation with light from the mold side to form an insulating material layer, while leaving uncured the photo-curing insulating resist layer located between the light-shielding layer of the mold and the transfer base material; a mold releasing step of separating the mold from the insulating material layer; and a developing step of developing the insulating material layer to remove the remaining photo-curing insulating resist layer, thereby obtaining a state in which an insulating pattern structure having a through-hole for forming an interlayer connection via and a recess for forming wiring is located on the transfer base material.

As another mode of the present invention, a configuration is adopted in which a heating step of curing the pattern structure by heating is provided after the developing step.

A method of manufacturing a multilayer wiring structure of the present invention has a configuration in which a pattern structure forming step of forming an insulating pattern structure having a through-hole for forming an interlayer connection via and a recess for forming wiring by the method of forming the pattern structure according to claim 1 or 2, a barrier layer forming step of forming the pattern structure with a conductor barrier layer, a seed layer forming step of forming a seed electrode layer on the conductor barrier layer, a plating step of depositing a conductor on the seed electrode layer by electroplating to form a conductor layer in such a manner as to fill the through-hole for forming the interlayer connection via and the recess for forming the wiring of the pattern structure, and a planarizing treatment step of polishing the conductor layer to leave the conductor layer only in the through-hole for forming the interlayer connection via and the recess for forming the wiring of the pattern structure, are repeated a desired number of times.

An imprint mold of the present invention is configured to include a mold base material and a rugged structure located at a main surface of the mold base material, the rugged structure having a plurality of linearly shaped projected portions for forming wiring and circularly shaped projected portions for forming pad portions, with a light-shielding layer being formed at top portion flat surfaces of the circularly shaped projected portions for forming the pad portions.

As another mode of the present invention, a configuration is adopted in which the height of the linearly shaped projected portions for forming the wiring and the height of the top portion flat surfaces of the circularly shaped projected portions for forming the pad portions are the same.

As another mode of the present invention, a configuration is adopted in which the circularly shaped projected portions for forming the pad portions are continuous with the linearly shaped projected portions for forming the wiring.

As another mode of the present invention, a configuration is adopted in which the circularly shaped projected portions for forming the pad portions include those continuous with the linearly shaped projected portions for forming the wiring and those separate from the linearly shaped projected portions for forming the wiring.

As another mode of the present invention, a configuration is adopted in which the light-shielding layer is located substantially in a center of the top portion flat surface, and the distance from an outer edge of the light-shielding layer to a peripheral edge of the top portion flat surface is in the range of 1 to 10 μm.

The method of forming the pattern structure of the present invention makes it possible to form, with high accuracy, a pattern structure which has through-holes for forming interlayer connection vias and recesses for forming wiring.

In addition, the method of manufacturing the multilayer wiring structure of the present invention includes forming, simultaneously and with high accuracy, the through-holes for forming interlayer connection vias and the recesses for forming wiring in forming a pattern structure, and, therefore, makes it possible to manufacture a multilayer wiring structure easily and with high accuracy.

Further, the imprint mold of the present invention makes it possible to form a pattern structure having through-holes or recesses differing in depth, easily and with high accuracy.

The present invention is a wiring structure formed on a transfer base material, the wiring structure including: an insulating pattern structure; and a wiring layer embedded in the pattern structure, in which the wiring layer has a pad portion and an interlayer connection via connected to the pad portion, and the interlayer connection via has a stepped shape including at least two steps.

The present invention is the wiring structure in which in a sectional view, a side surface of that one of the at least two steps which is on the transfer base material side is perpendicular to a surface of the transfer base material.

The present invention is the wiring structure in which in a sectional view, a side surface of that one of the at least two steps which is on the transfer base material side is inclined relative to a surface of the transfer base material.

The present invention is the wiring structure in which in a sectional view, a side surface of that one of the at least two steps which is on the transfer base material side is curved toward inside of the interlayer connection via.

The present invention is the wiring structure in which in a sectional view, a side surface of that one of the at least two steps which is on the transfer base material side is curved toward outside of the interlayer connection via.

The present invention is a semiconductor device including: the above-mentioned wiring structure; a semiconductor element fixed to the wiring structure; and a sealing resin that seals the semiconductor element.

The present invention is a multilayer wiring structure formed on a base material, including: insulating pattern structures formed in multiple layers; and a wiring layer embedded in each of the pattern structures, in which each wiring layer has a pad portion and an interlayer connection via connected to the pad portion, and the interlayer connection via has a stepped shape including at least two steps.

The present invention is a semiconductor element mounting substrate including: a core substrate; and the above-mentioned multilayer wiring structure which is disposed on the core substrate.

The present invention is a semiconductor device including: the above-mentioned semiconductor element mounting substrate; and a semiconductor element mounted on the semiconductor element mounting substrate.

The present invention is a semiconductor device including: the above-mentioned multilayer wiring structure; a semiconductor element fixed to the multilayer wiring structure; and a sealing resin that seals the semiconductor element.

The present invention is a method of forming a pattern structure, including the steps of: supplying an insulating resist onto a transfer base material; preparing a mold which has a mold base material and a projected portion located at a main surface of the mold base material, and bringing the mold and the transfer base material close to each other to spread the insulating resist between the mold and the transfer base material, thereby forming an insulating resist layer; curing the insulating resist layer to form an insulating material layer; separating the mold from the insulating material layer; and developing the insulating material layer to obtain a state in which an insulating pattern structure having a recess for forming a pad portion and a through-hole for forming an interlayer connection via, the through-hole located in the recess, is located on the transfer base material, in which the through-hole has a stepped shape including at least two steps.

The present invention is the method of forming the pattern structure, in which in a sectional view, an inside surface of that one of the at least two steps which is on the transfer base material side is perpendicular to a surface of the transfer base material.

The present invention is the method of forming the pattern structure, in which in a sectional view, an inside surface of that one of the at least two steps which is on the transfer base material side is inclined relative to a surface of the transfer base material.

The present invention is the method of forming the pattern structure, in which in a sectional view, an inside surface of that one of the at least two steps which is on the transfer base material side is curved toward inside of the through-hole.

The present invention is the method of forming the pattern structure, in which in a sectional view, an inside surface of that one of the at least two steps which is on the transfer base material side is curved toward outside of the through-hole.

A method of manufacturing a wiring structure, including the steps of: forming an insulating pattern structure having a recess for forming a pad portion and a through-hole for forming an interlayer connection via, the through-hole being located in the recess, by the above-mentioned method of forming the pattern structure; forming the pattern structure with a conductor barrier layer; forming a seed electrode layer on the conductor barrier layer; depositing a conductor on the seed electrode layer by electroplating to form a conductor layer in such a manner as to fill the recess for forming the pad portion and the through-hole for forming the interlayer connection via of the pattern structure; and polishing the conductor layer to leave the conductor layer in the recess for forming the pad portion and the through-hole for forming the interlayer connection via of the pattern structure.

The present invention is an imprint mold including: a mold base material; and a projected portion for forming a pad portion and an interlayer connection via, the projected portion located at a main surface of the mold base material, in which the projected portion has a stepped shape including at least two steps, and a light-shielding layer is provided at a top portion flat surface of the projected portion.

The present invention is the imprint mold in which in a sectional view, a side surface of the light-shielding layer is perpendicular to the top portion flat surface.

The present invention is the imprint mold in which in a sectional view, a side surface of the light-shielding layer is curved toward inside of the light-shielding layer.

The present invention is the imprint mold in which in a sectional view, a side surface of the light-shielding layer is curved toward outside of the light-shielding layer.

The present invention is the imprint mold in which the mold base material is comprised of glass.

The present invention is the imprint mold in which the mold base material is comprised of no alkali glass or quartz glass.

According to the present invention, warping of a resin (insulating material layer) constituting a pattern structure can be reduced.

An imprint mold of the present invention is configured to include a mold base material and a rugged structure located at a main surface of the mold base material, in which the rugged structure has a plurality of projected portions located at the main surface, a light-shielding layer is located at a top portion flat surface or surfaces of at least part of the projected portions, a protective film is located so as to cover at least the light-shielding layer, and the protective film has an oxidation-resisting property.

As another mode of the present invention, a configuration is adopted in which the protective film is an inorganic silicon compound, and its thickness is in the range of 40 to 120 nm.

As another mode of the present invention, a configuration is adopted in which the height of the projected portion from the main surface where the light-shielding layer is located is greater than the height of the projected portion from the main surface where the light-shielding layer is not located.

A method of manufacturing an imprint mold of the present invention is configured to include the steps of: preparing a mold which has a mold base material and a rugged structure located at a main surface of the mold base material, the rugged structure having a plurality of projected portions located at the main surface, with a light-shielding layer located at a top portion flat surface or surfaces of at least part of the projected portions; and forming a protective film having an oxidation-resisting property in such a manner as to cover at least the light-shielding layer.

As another mode of the present invention, a configuration is adopted in which in the step of forming the protective film, the protective film is formed in such a manner as to cover the whole area of the main surface where the rugged structure is located.

As another mode of the present invention, a configuration is adopted in which in the step of forming the protective film, a film of an inorganic silicon compound is formed in a thickness in the range of 40 to 120 nm.

As another mode of the present invention, a configuration is adopted in which in the step of preparing the mold, a mold in which the height of the projected portion from the main surface where the light-shielding layer is located is greater than the height of the projected portion from the main surface where the light-shielding layer is not located is prepared.

The imprint mold of the present invention is given an excellent oxidation-resisting property by the protective film, and is prevented from a lowering in the function of the light-shielding layer even when adhered foreign matter or the like is removed, whereby a pattern structure having recesses differing in depth can be repeatedly formed with high accuracy.

In addition, the method of manufacturing the imprint mold of the present invention makes it possible to easily manufacture a mold for repeatedly forming, with high accuracy, a pattern structure having recesses differing in depth.

An imprint mold of the present invention is configured to include a base material and a rugged structure located at a main surface of the base material, in which the rugged structure has a plurality of projected portions located at the main surface, the projected portions including those differing in the height from the main surface, a light-shielding portion is provided at a top portion flat surface of the projected portion which is the greatest in the height from the main surface, and the light-shielding portion has parts differing in thickness.

As another mode of the present invention, a configuration is adopted in which the light-shielding portion is the thickest at a central portion or in a vicinity of the central portion of a plan-view shape as viewed in a thickness direction thereof and is thinner at a position nearer to a peripheral edge of the plan-view shape.

As another mode of the present invention, a configuration is adopted in which the light-shielding portion has a thickness at the thickest part in the range of 0.1 to 5 μm.

As another mode of the present invention, a configuration is adopted in which the light-shielding portion has an elastic modulus of not more than 100 GPa.

As another mode of the present invention, a configuration is adopted in which the light-shielding portion has an elastic modulus of not more than 100 GPa in a temperature range from normal temperature to 200° C.

As another mode of the present invention, a configuration is adopted in which the light-shielding portion contains silver in an amount of not less than 90% by weight.

As another mode of the present invention, a configuration is adopted in which the light-shielding portion is united with the top portion flat surface of the projected portion through siloxane linkage.

As another mode of the present invention, a configuration is adopted in which the light-shielding portion includes a mold release layer at a surface thereof.

A method of manufacturing an imprint mold of the present invention is configured to include the steps of: preparing a mold which has a base material and a rugged structure located at a main surface of the base material, the rugged structure having a plurality of projected portions located at the main surface, the projected portions including those differing in the height from the main surface; and forming a light-shielding portion at a top portion flat surface of that one of the projected portions which is the greatest in the height from the main surface, the light-shielding portion having parts differing in thickness.

As another mode of the present invention, a configuration is adopted in which in the step of forming the light-shielding portion, the light-shielding portion is formed in such a manner as to be thickest at a central portion or in a vicinity of the central portion of a plan-view shape as viewed in a thickness direction thereof and be thinner at a position nearer to a peripheral edge of the plan-view shape.

As another mode of the present invention, a configuration is adopted in which a step of imparting a siloxane linkage group to a top portion flat surface of at least the projected portion which is the greatest in the height from the main surface is provided before the step of forming the light-shielding portion.

As another mode of the present invention, a configuration is adopted in which a step of applying a mold release treatment to the rugged structure located at the main surface of the base material is provided after the step of forming the light-shielding portion.

As another mode of the present invention, a configuration is adopted in which in the step of forming the light-shielding portion, the light-shielding portion is formed by supplying a light-shielding material from an ink jet nozzle to the top portion flat surface of the projected portion.

In the imprint mold of the present invention, influences of warping and/or ruggedness present in the transfer substrate are absorbed by the light-shielding portion itself, whereby the transfer substrate can be transfer formed with a rugged structure having recesses differing in depth, with high accuracy. In addition, the method of manufacturing the imprint mold of the present invention makes it possible to easily manufacture a mold for transfer forming, with high accuracy, the transfer substrate with a rugged structure having recesses differing in depth by the imprint method.

The present invention provides an imprint mold including: a transparent base material having a first surface and a second surface opposite to the first surface; a light-shielding layer provided on the first surface of the transparent base material; and a transparent rugged pattern layer provided on the first surface of the transparent base material in such a manner as to cover the light-shielding layer (Invention 5-1).

According to the above-mentioned invention (Invention 5-1), the light-shielding layer is covered by the transparent rugged pattern layer, whereby it is possible to provide an imprint mold which can restrain peeling or the like of the light-shielding layer from occurring and which can be used over a long period of time.

In the above-mentioned invention (Invention 5-1), it is preferable that the transparent rugged pattern layer includes a base layer covering a whole area of the first surface and a projected pattern portion projected from the base layer, and the light-shielding layer is covered by the projected pattern portion (Invention 5-2); it is preferable that the size of the light-shielding layer is not more than the size of the projected pattern portion which covers the light-shielding layer (Invention 5-3); and it is preferable that the light-shielding layer is provided on the first surface in such a manner that the light-shielding layer is physically included in the projected pattern portion covering the light-shielding layer, in a plan view of the imprint mold as viewed from the first surface side (Invention 5-4).

In the above-mentioned invention (Invention 5-1), it is preferable that the transparent rugged pattern layer includes a base layer covering a whole area of the first surface and a projected pattern portion projected from the base layer, and the light-shielding layer is covered by that portion of the base layer at which the projected pattern portion is not present (Invention 5-5).

In the above-mentioned inventions (Inventions 5-1 to 5-5), it is preferable that the transparent rugged pattern layer is comprised of a transparent resin material (Invention 5-6); it is preferable that a mold release layer that covers the transparent rugged pattern layer is further provided (Invention 5-7); and it is preferable that a close contact layer located between the transparent rugged pattern layer and the mold release layer is further provided (Invention 5-8).

In addition, the present invention provides a method of manufacturing a multilayer wiring board having first to Nth wiring layers (N is an integer of not less than 2) stacked in this order, the method including the steps of: forming an insulating film on an (N−1)th wiring layer; subjecting the insulating film to an imprint treatment by use of the imprint mold according to the above-mentioned invention (Inventions 5-1 to 5-8), to form the insulating film with an uncured portion and a recess; removing the uncured portion to form the insulating film with a through-hole; and forming a metal plating layer that fills the through-hole and the recess (Invention 5-9).

According to the present invention, it is possible to provide an imprint mold which can restrain damaging such as peeling of the light-shielding layer from occurring and which can be stably used over a long period of time, and a method of manufacturing a multilayer wiring board using the same.

The present invention provides an imprint mold including: a transparent base material having a first surface and a second surface opposite to the first surface; an alignment mark provided on the first surface of the transparent base material and comprised of a light-shielding material; and a transparent rugged pattern layer provided on the first surface of the transparent base material, in which the transparent rugged pattern layer includes a base layer which covers a whole area of the first surface of the transparent base material and a projected pattern portion which is projected from the base layer, and the alignment mark is covered by the base layer (Invention 6-1).

According to the above-mentioned invention (Invention 6-1), the alignment mark comprised of the light-shielding material is covered by the base layer of the transparent rugged pattern layer, whereby it is ensured that the alignment mark and the imprint resin do not make direct contact with each other at the time of an imprint treatment. Therefore, damaging (for example, peeling) of the alignment mark can be prevented from occurring, and the imprint mold can be stably used over a long period of time.

In the above-mentioned invention (Invention 6-1), the projected pattern portion is located in a pattern area on the first surface of the transparent base material, and the alignment mark may be located outside the pattern area (Invention 6-2), or the alignment mark may be located in the pattern area (Invention 6-3).

In the above-mentioned inventions (Inventions 6-1 to 6-3), it is preferable that the projected pattern portion includes a first projected pattern portion and a second projected pattern portion which has a stepped shape having at least two steps (Invention 6-4), and it is preferable that the transparent rugged pattern layer is comprised of a transparent resin material (Invention 6-5).

In the above-mentioned inventions (Inventions 6-1 to 6-5), it is preferable that a mold release layer that covers the transparent rugged pattern layer is further provided (Invention 6-6), and it is preferable that a close contact layer located between the transparent rugged pattern layer and the mold release layer is further provided (Invention 6-7).

In the above-mentioned inventions (Inventions 6-1 to 6-7), it is preferable that a light-shielding layer is provided on the first surface of the transparent base material, and the light-shielding layer is covered by the transparent rugged pattern layer (Invention 6-8).

In addition, the present invention provides an imprint mold set including a plurality of imprint molds to be used for manufacturing a multilayer wiring board having first to Nth wiring layers (N is an integer of not less than 2) stacked in this order, in which the plurality of imprint molds include a first imprint mold for producing the first wiring layer and the imprint mold according to the above-mentioned invention (Invention 6-1 to 6-8) to be used as a second imprint mold for producing an Mth wiring layer (M is an integer of not less than 2 and not more than N), and the first imprint mold has an aligning pattern forming projected portion at such a position that the first wiring layer can be formed with an aligning pattern to be used for alignment of the first wiring layer and the second imprint mold (Invention 6-9).

Further, the present invention provides a method of manufacturing a multilayer wiring board having first to Nth wiring layers (N is an integer of not less than 2) stacked in this order by use of the imprint mold set according to the above-mentioned invention (Invention 6-9), the method including the steps of: subjecting a first insulating film to an imprint treatment by use of the first imprint mold to produce the first wiring layer; forming an Mth insulating film (M is an integer of not less than 2 and not more than N) for producing an Mth wiring layer; and subjecting the Mth insulating film to an imprint treatment using the second imprint mold to produce the Mth wiring layer, in which in the step of producing the first wiring layer, the first insulating film is formed with the aligning pattern by the aligning pattern forming projected portion, and in the step of producing the Mth wiring layer, alignment of the first wiring layer and the second imprint mold is conducted by the alignment mark of the second imprint mold and the aligning pattern formed in the first insulating film (Invention 6-10).

According to the present invention, it is possible to provide an imprint mold which can restrain damaging such as peeling of an alignment mark comprised of a light-shielding material from occurring and which can be stably used over a long period of time, an imprint mold set for manufacturing a multilayer wiring board that includes the imprint mold, and a method of manufacturing a multilayer wiring board using the imprint mold set.

MODES FOR CARRYING OUT THE INVENTION

First Embodiment

Figure 1:
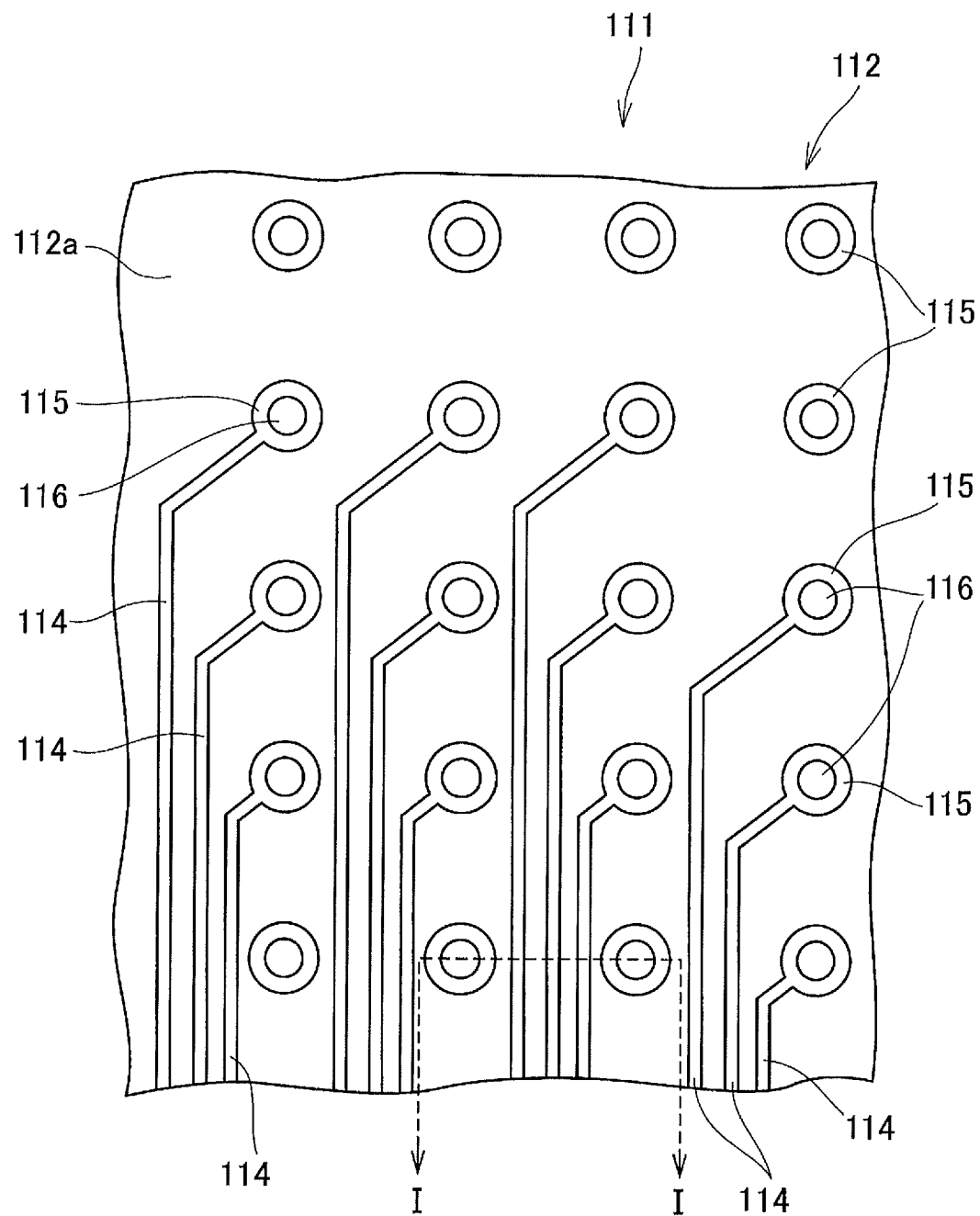
FIG. 1 is a partial plan view for explaining an imprint mold according to a first embodiment of the present invention.

A first embodiment of the present invention will be described below, referring to the drawings. Note that the drawings are schematic or conceptual, and the sizes of members, size ratios between the members and the like are not necessarily the same as the practical ones, and even the same member or the like may be represented in the respective drawings in mutually different sizes or ratios.

[Imprint Mold]

An imprint mold in the present embodiment has a mold base material and a rugged structure located at a main surface of the mold base material. The rugged structure has a plurality of projected portions, and a light-shielding layer is provided at a desired part of top portion flat surfaces of the projected portions.

Figure 2:
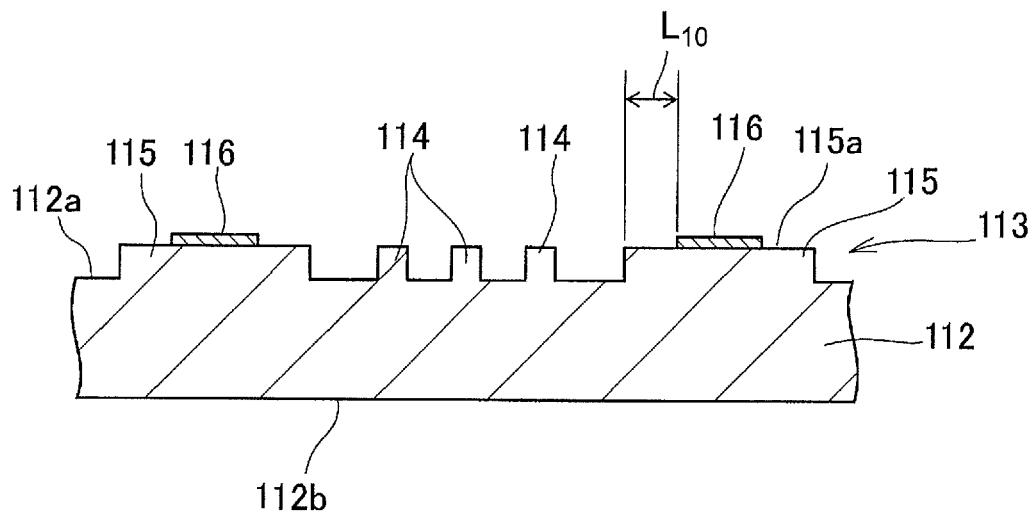
FIG. 2 is an enlarged vertical sectional view, taken along line I-I, of the imprint mold shown in FIG. 1.

FIG. 1 is a partial plan view for explaining the imprint mold according to the present embodiment as just described, and FIG. 2 is an enlarged vertical sectional view, taken along line I-I, of the mold shown in FIG. 1. The imprint mold 111 shown in FIGS. 1 and 2 is an example of a mold for forming an electrically insulating pattern structure provided with recesses for forming wiring of an upper layer and through-holes for forming interlayer connection vias, on a transfer base material provided with wiring and pad portions. The mold 111 has a mold base material 112, and a rugged structure 113 located at a main surface 112a of the mold base material 112. In the rugged structure 113 possessed by the mold 111, there are present projected portions 114 which are linear in plan-view shape and projected portions 115 which are circular in plan-view shape. The projected portions 114 which are linear in plan-view shape are projected portions for forming a pattern structure with recesses for forming wiring. On the other hand, the projected portions 115 which are circular in plan-view shape are projected portions for forming the pattern structure with recesses for forming pad portions, and light-shielding layers 116 are located at central portions of top portion flat surfaces 115a of the projected portions 115. The light-shielding layer 116 is a light-shielding layer for forming, in the pad portion forming recess, a through-hole for forming an interlayer connection via for connection between wiring layers located on upper and lower sides with an insulating layer therebetween, as will be described later in a method of forming a pattern structure. Note that the linearly shaped projected portions 114 are extended from desired ones of the projected portions 115. Therefore, the plurality of projected portions 115 may include those which are separate from the linearly shaped projected portions 114.

In the case where a to-be-molded resin material used in imprint is photo-curing, a material permitting transmission therethrough of irradiation light for curing the resin material can be used as the material of the mold base material 112; for example, there can be used not only glasses such as quartz glass, silicate glass, calcium fluoride, magnesium fluoride, acrylic glass, etc. but also sapphire, gallium nitride, and, further, resins such as polycarbonate, polystyrene, acrylics, polypropylene, etc. or arbitrary laminates of them. In the case where the to-be-molded resin material for use is not photo-curing, the mold 111 may not have a light-transmitting property, and, other than the above-mentioned materials, there can be used, for example, silicon, metals such as nickel, titanium, aluminum, etc. and their alloys, oxides, nitrides or arbitrary laminates of them.

The thickness of the mold base material 112 can be set taking the strength, handleability and the like of the material into consideration; for example, the thickness can be appropriately set within the range of about 300 μm to about 10 mm. Note that the main surface 112a side of the base material 112 may be a projected structure with two or more steps, or a so-called mesa structure; in this case, the uppermost step is the main surface 112a, and the rugged structure 113 is located at the main surface 112a.

The projected portions 114 possessed by the mold 111 is projected portions for forming the pattern structure with recesses for forming wiring as above-mentioned; for example, their width can be appropriately set within the range of 0.5 to 10 µm, and their height from the main surface 112a can be appropriately set within the range of 0.5 to 10 µm.

In addition, the projected portions 115 are projected portions for forming the pattern structure with recesses for forming pad portions as above-mentioned. In the example shown in the drawing, the plan-view shape of the projected portions 115 is circular; for example, the diameter of the projected portions 115 can be appropriately set within the range of 5 to 30 µm, and their height from the main surface 112a can be set within the range of 0.5 to 10 µm.

Besides, the light-shielding layers 116 located at central portions of the top portion flat surfaces 115a of the projected portions 115 are layers capable of shielding light to such an extent that photo-curing of the photo-curing to-be-molded resin material by light irradiation from the other surface 112b side of the mold base material 112 does not occur, in the imprint conducted using the to-be-molded resin material. Such a light-shielding layer 116 can be, for example, a layer having an optical density (OD) of not less than 2, preferably not less than 3, and examples of such a material include chromium, molybdenum, titanium, aluminum, silver, and nickel. The thickness of the light-shielding layer 116 can be appropriately set in such a manner as to obtain an optical density of not less than 2. For example, in the case where the material of the light-shielding layer 116 is chromium, the thickness is preferably about 50 to 150 nm. If the thickness of the chromium-made light-shielding layer 116 is less than 50 nm, the optical density would be less than 2, so that the light-shielding property is insufficient. Particularly in the case of using a light source with high illuminance, it is preferable, for obtaining a higher light-shielding property, that the thickness of the chromium-made light-shielding layer 116 is not less than 100 nm. On the other hand, if the thickness of the chromium-made light-shielding layer 116 exceeds 150 nm, internal stress of the light-shielding layer 116 would be high, so that peeling would easily occur, and durability would be lowered, which is unfavorable. In the example illustrated, the light-shielding layer 116 is located substantially in the center of the top portion flat surface 115a; in this case, the distance $L_{10}$ from an outer edge of the light-shielding layer 116 to a peripheral edge of the top portion flat surface 115a can be set within the range of 1 to 10 µm. With the distance $L_{10}$ set within the above-mentioned range, it is possible to absorb a deviation of the light-shielding layer 116 from the top portion flat surface 115a which deviation may be generated by a general aligning mechanism used in forming the light-shielding layer 116. Therefore, even in the case where a deviation of the light-shielding layer 116 from the top portion flat surface 115a is generated, it is possible to suppress the risk that an interlayer connection via 166 (described later) formed using the light-shielding layer 116 might be short-circuited to an underlying wiring portion or an adjacent wiring 164. Accordingly, a pattern structure 142 can be manufactured with high productivity and in a high yield, with the result that an electronic device 101 can be manufactured inexpensively.

Figure 3:
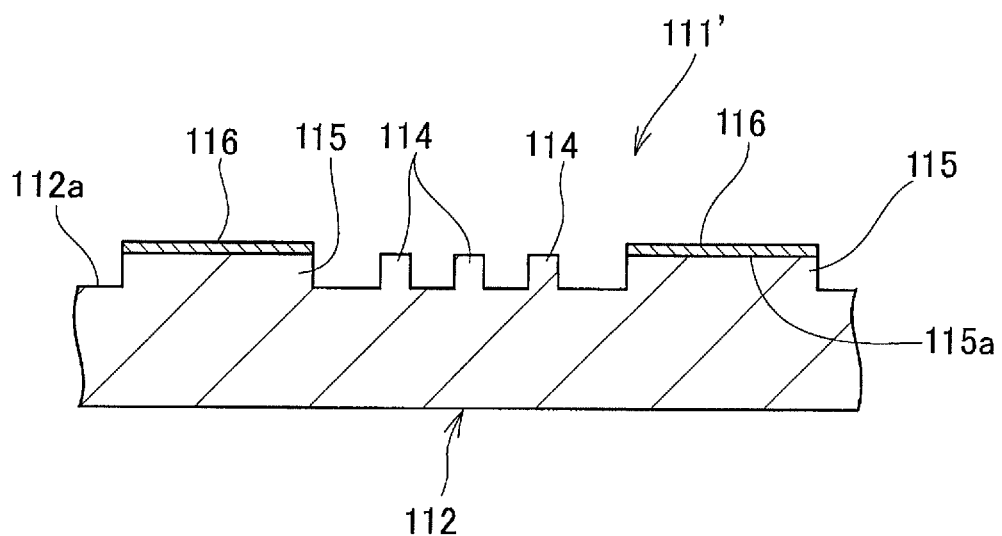
FIG. 3 is a vertical sectional view, corresponding to FIG. 2, of a modification of the imprint mold according to the first embodiment of the present invention.

The embodiment of the imprint mold as above-described is illustrative, and the present invention is not to be limited to the embodiment. For instance, as shown in FIG. 3, a mold 111' may be adopted in which a light-shielding layer 116 is provided over the whole surface of a top portion flat surface 115a of a projected portion 115.

In addition, while the rugged structure has the linearly shaped projected portions and the circularly shaped projected portions in the above-described embodiment, the rugged structure may have three or more kinds of projected portions. Besides, the light-shielding layers provided at desired parts of the top portion flat surfaces of the projected portions may include light-shielding layers with an optical density of less than 2, in addition to the light-shielding layers with an optical density of not less than 2. By this configuration, in the pattern structure formed, recesses with depths according to the light-shielding performances of the light-shielding layers can be formed.

With such an imprint mold, a pattern structure having recesses or through-holes differing in depth can be formed easily and with high accuracy.

[Method of Forming Pattern Structure]

Figure 4:
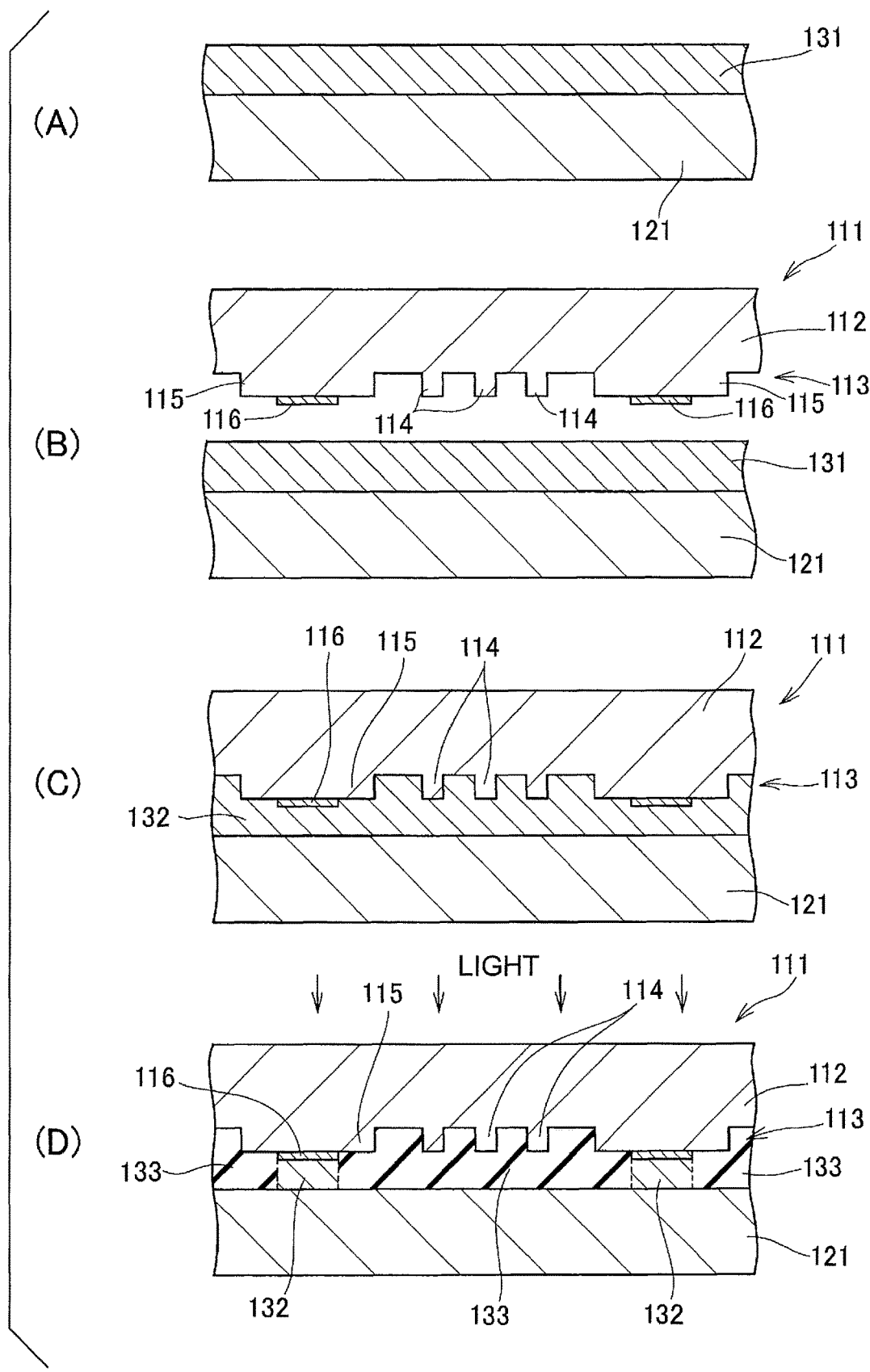
FIG. 4 is a process drawing for explaining a method of forming a pattern structure according to the first embodiment of the present invention.
Figure 5:
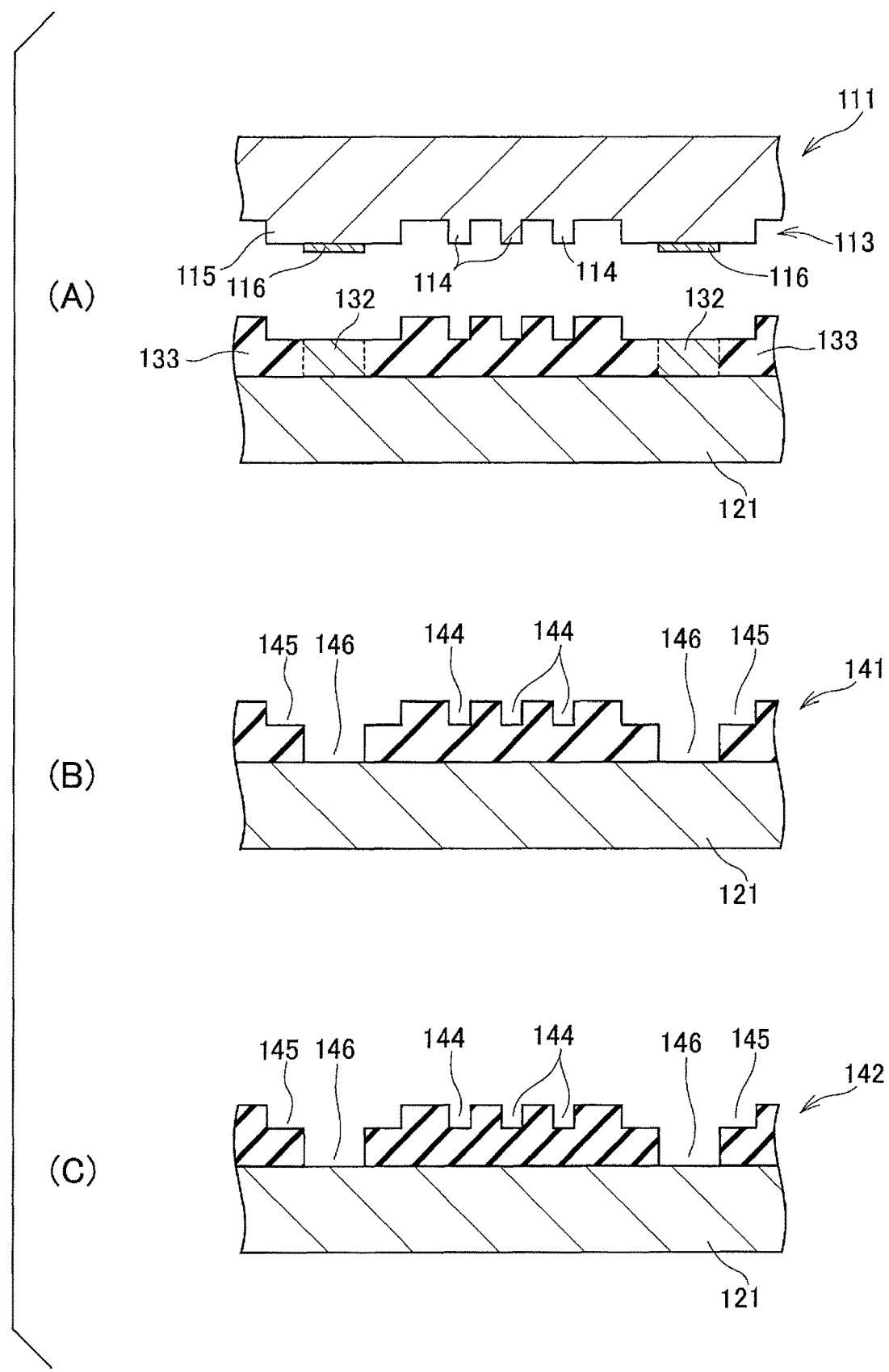
FIG. 5 is a process drawing for explaining the method of forming the pattern structure according to the first embodiment of the present invention.

FIGS. 4 and 5 are process drawings for explaining a method of forming a pattern structure according to the present embodiment, and show an example in which the aforementioned imprint mold 111 is used.

In the method of forming a pattern structure in the present invention, a photo-curing insulating resist 131 is supplied onto a transfer base material 121 (FIG. 4 (A)) in a supplying step. The transfer base material 121 may be one that has desired wiring and pad portions.

Next, in a contact step, the aforementioned imprint mold 111 is prepared (FIG. 4 (B)), the mold 111 and the transfer base material 121 are brought close to each other, and the photo-curing insulating resist 131 is spread between the mold 111 and the transfer base material 121, to form a photo-curing insulating resist layer 132 (FIG. 4 (C)).

Subsequently, in a curing step, irradiation with light from the mold 111 side is conducted to cure the photo-curing insulating resist layer 132, thereby forming an insulating material layer 133, and leaving uncured the photo-curing insulating resist layer 132 located between the light-shielding layers 116 of the mold 111 and the transfer base material 121 (FIG. 4 (D)). The light with which the mold 111 is irradiated from the mold 111 side is preferably parallel light, for preventing coming-around of light such as to cause curing of the photo-curing insulating resist layer 132 located beneath the light-shielding layers 116.

Thereafter, in a mold releasing step, the mold 111 is released from the insulating material layer 133 and the remaining photo-curing insulating resist layer 132 (FIG. 5 (A)). Note that in this mold releasing step, at least part of the remaining photo-curing insulating resist layer 132 may be adhered to the mold 111 and removed together with the mold 111.

Figure 6:
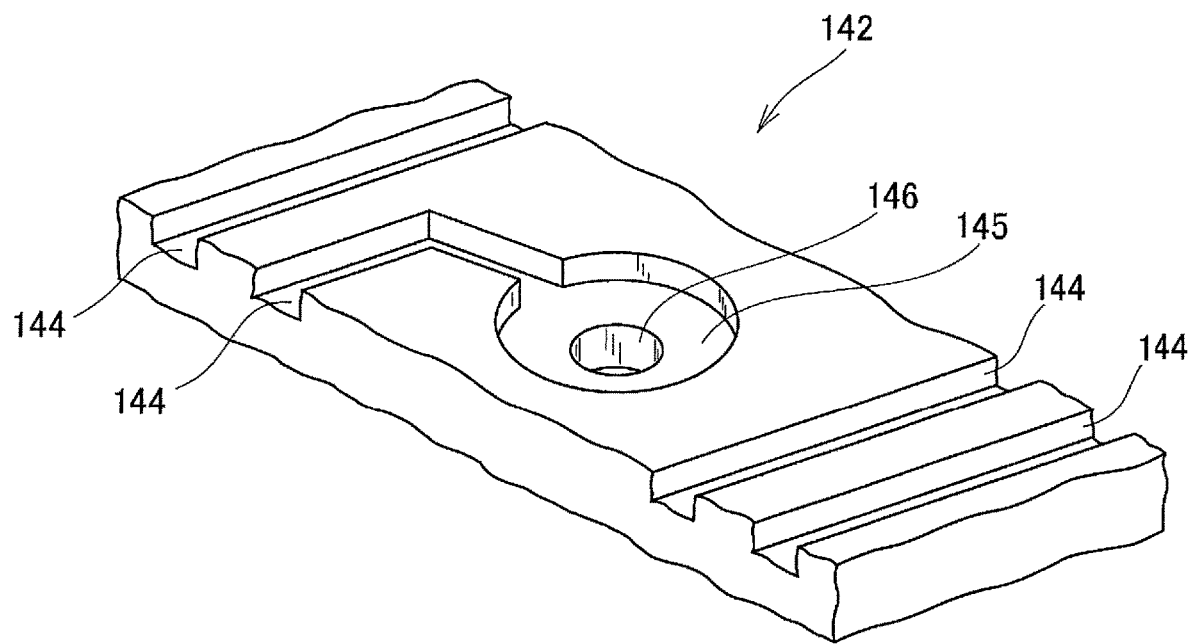
FIG. 6 is a partial perspective view showing an example of the pattern structure formed by the method of forming the pattern structure according to the first embodiment of the present invention.

Next, in a developing step, the insulating material layer 133 is developed, to remove the remaining photo-curing insulating resist layer 132 (FIG. 5 (B)). By this, a state is obtained in which an insulating pattern structure precursor 141 having recesses 144 for forming wiring, recesses 145 for forming pads, and through-holes 146 for forming interlayer connection vias located in the recesses 145 is located on the transfer base material 121 (FIG. 5 (B)). Thereafter, the pattern structure precursor 141 is subjected to a post-baking treatment, to obtain a pattern structure 142 (FIG. 5 (C)). FIG. 6 is a partial perspective view of the pattern structure 142 formed in this way. Note that in the pattern structure 142 thus formed, the plurality of recesses 145 for forming the pad portions may include those separate from the recess 144 for forming the wiring.

Figure 7:
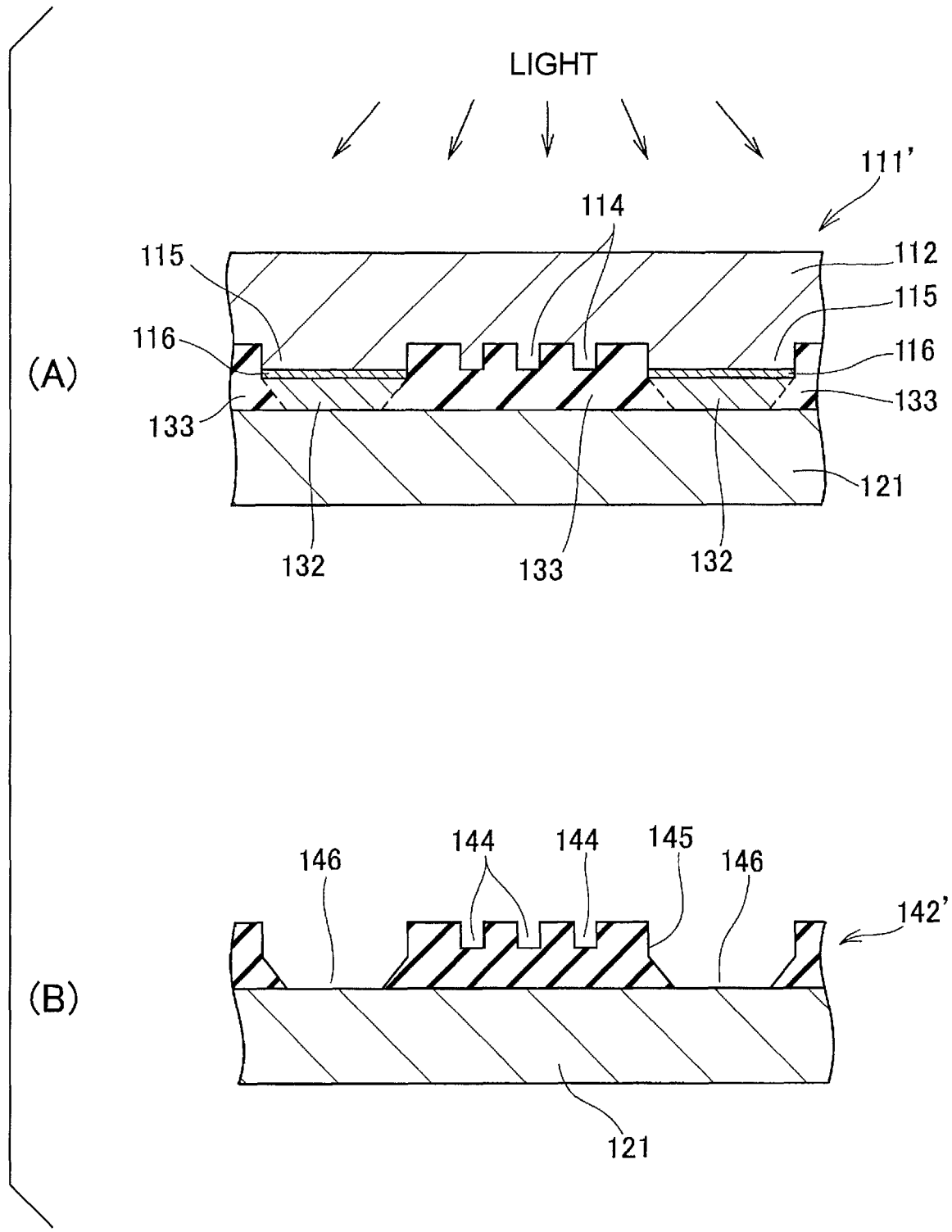
FIG. 7 is a process drawing for explaining a modification of the method of forming the pattern structure according to the first embodiment of the present invention.

In addition, FIG. 7 is a process drawing for explaining a modification of the method of forming the pattern structure according to the present embodiment, and shows an example in which the aforementioned imprint mold 111' is used.

In the method of forming the pattern structure using the mold 111', the same supplying step and contact step as those in the method of forming the pattern structure using the mold 111 aforementioned can be adopted, and descriptions thereof are omitted here.

Thereafter, in a curing step in the method of forming the pattern structure using the mold 111', irradiation with diffused light from the mold 111' side is conducted to cure the photo-curing insulating resist layer 132, thereby forming an insulating material layer 133. In this curing step, the photo-curing insulating resist layer 132 located between the light-shielding layers 116 of the mold 111' and the transfer base material 121 remains uncured, but, since the irradiation light is diffused light, part of the photo-curing insulating resist layer 132 beneath the light-shielding layers 116 is cured due to coming-around of the irradiation light (FIG. 7 (A)). In the example illustrated, beneath the light-shielding layer 116, the photo-curing insulating resist layer 132 remains in a sectional shape of an inverted trapezoid (a trapezoid with an upper base longer than a lower base).

Thereafter, in a mold releasing step, the mold 111' is released from the insulating material layer 133 and the remaining photo-curing insulating resist layer 132, and, then, in a developing step, the insulating material layer 133 is developed, to remove the remaining photo-curing insulating resist layer 132. Further, a post-baking treatment is conducted, whereby an insulating pattern structure 142' having recesses 144 for forming wiring, recesses 145 for forming pads, and through-holes 146 for forming interlayer connection vias located in the recesses 145 can be formed on the transfer base material 121 (FIG. 7 (B)). The through-holes 146 for forming interlayer connection vias of this pattern structure 142' are each in a tapered shape which is narrower on the transfer base material 121 side.

In the method of forming the pattern structure in the present invention as aforementioned, the pattern structure having the through-holes for forming interlayer connection vias and the recesses for forming the wiring can be formed with high accuracy.

The embodiment of the method of forming the pattern structure as aforementioned is illustrative, and the present invention is not to be limited to the embodiment.

[Method of Manufacturing Multilayer Wiring Structure]

Figure 8:
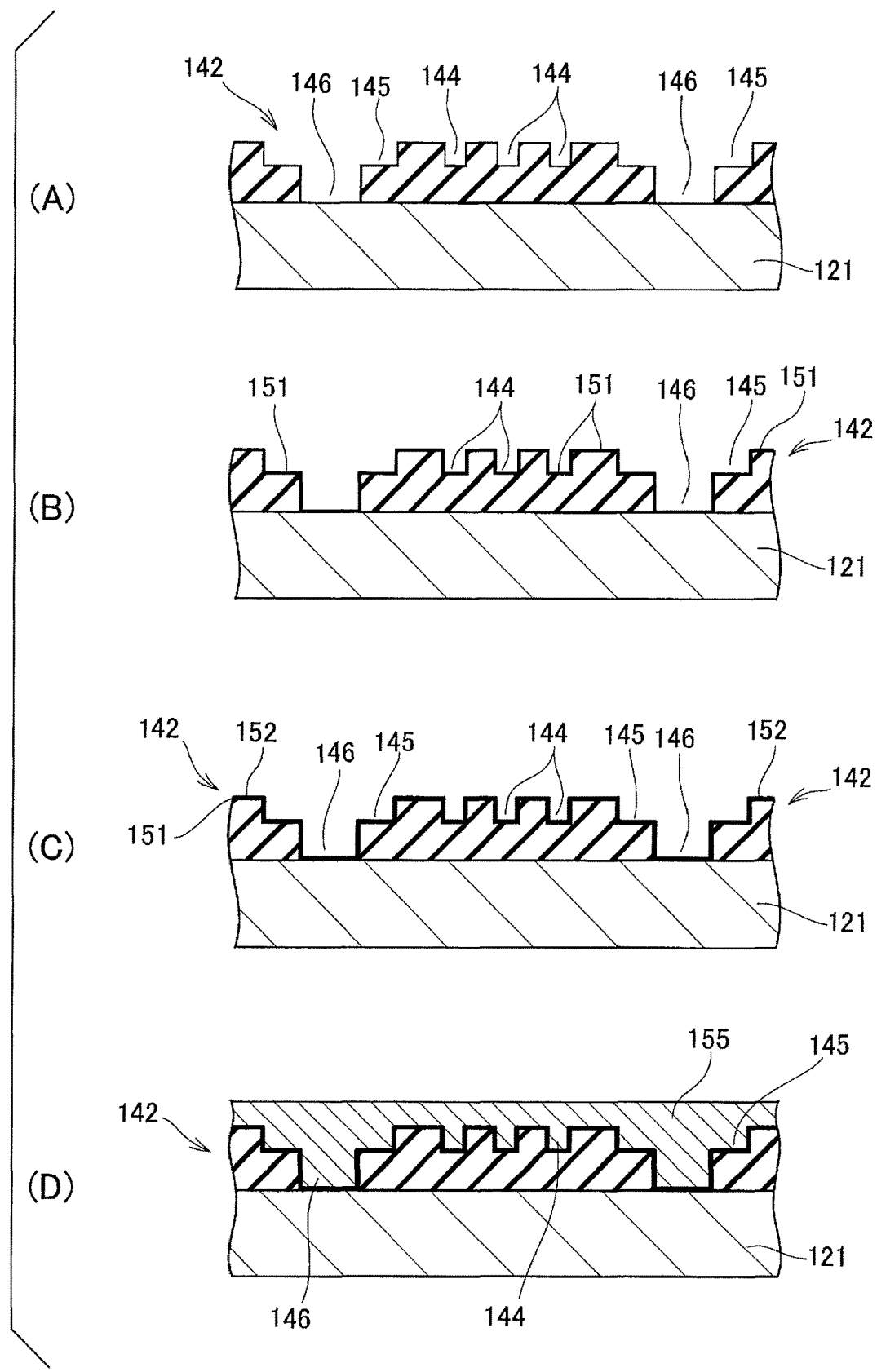
FIG. 8 is a process drawing for explaining a method of manufacturing a multilayer wiring structure according to the first embodiment of the present invention.
Figure 9:
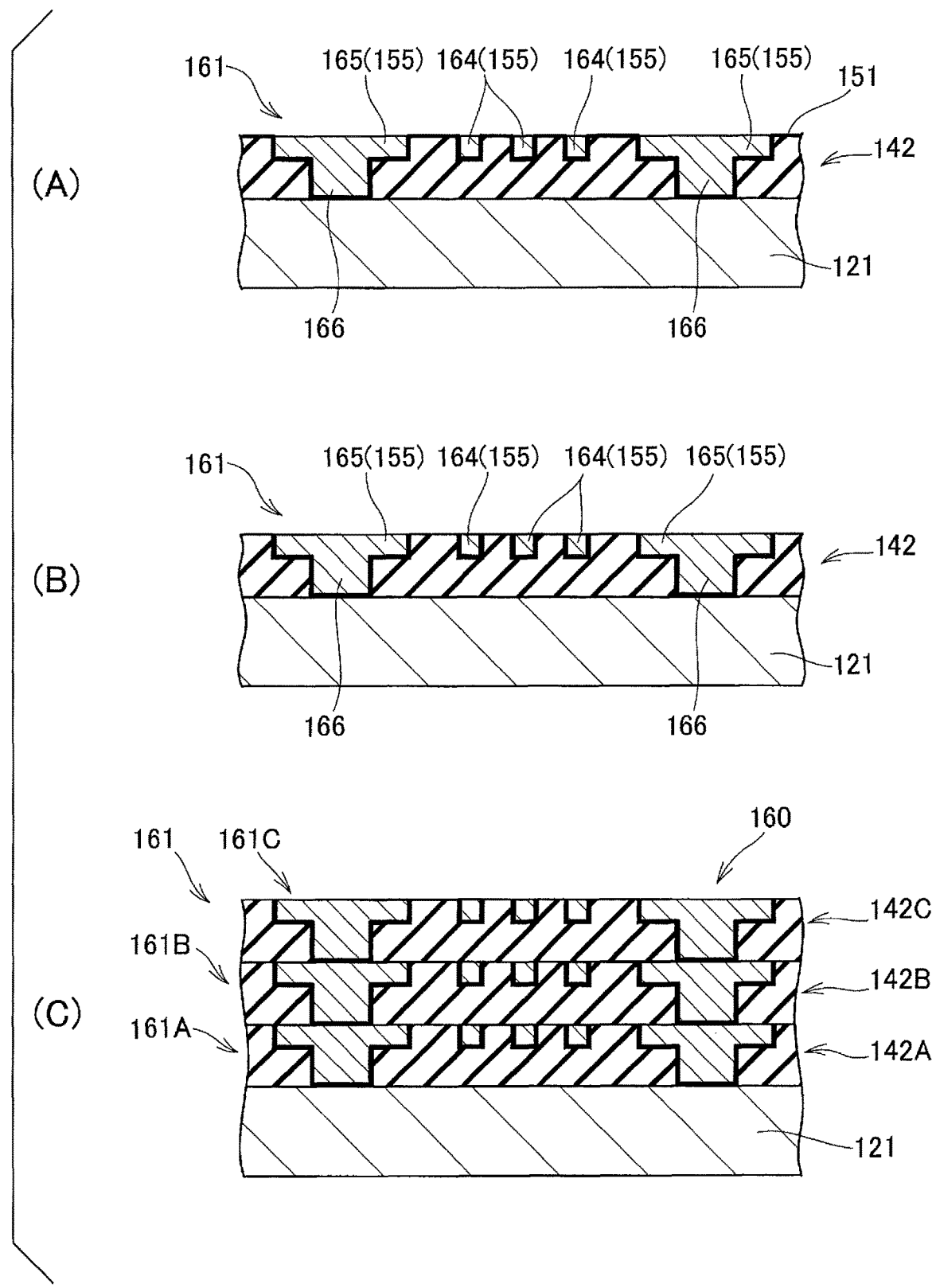
FIG. 9 is a process drawing for explaining the method of manufacturing the multilayer wiring structure according to the first embodiment of the present invention.

FIGS. 8 and 9 are process drawings for explaining a method of manufacturing a multilayer wiring structure according to the present embodiment.

In the present embodiment, in a pattern structure forming step, an insulating pattern structure having recesses for forming wiring and through-holes for forming interlayer connection vias is formed on a transfer base material. In FIG. 8 (A), there is shown a state in which a pattern structure 142 has been formed on a transfer base material 121, in the same manner as in the method of forming the pattern structure in the present invention described above. The transfer base material 121 to be used may be one that has desired wiring and pad portions. The insulating pattern structure 142 formed in this way has recesses 144 for forming wiring, recesses 145 for forming pad portions, and through-holes 146 for forming interlayer connection vias located in the recesses 145 for forming the pad portions. Note that in the pattern structure 142 thus formed, the plurality of recesses 145 for forming the pad portions may include those separate from the recess 144 for forming wiring.

Next, in a barrier layer forming step, the pattern structure 142 is formed with a conductor barrier layer 151 (FIG. 8 (B)). Note that in the example illustrated, the conductor barrier layer 151 is indicated by thick lines. This conductor barrier layer 151 is for preventing a component of a conductor layer to be formed in a later step from diffusing into the insulating pattern structure 142. The conductor barrier layer 151 may be formed from a material having a surface resistance of not less than several tens of Ω/□, such as, for example, titanium alloys such as TiN, tungsten alloys, molybdenum alloys, silicon alloys such as SiN, nickel alloys such as NIP, cobalt alloys such as CoWP, and tantalum alloys such as TaN, and can be formed in a thickness in the range of 10 to 200 nm by a known vacuum film forming method such as a sputtering method.

Next, in a seed layer forming step, a seed electrode layer 152 is formed on the conductor barrier layer 151 (FIG. 8 (C)). Note that in the example illustrated, the seed electrode layer 152 is indicated by thick lines. This seed electrode layer 152 is preferably formed from a material having a surface resistance of not more than 1Ω/□, such as, for example, copper, nickel, and nickel-chromium alloys, and can be formed in a thickness in the range of 10 to 500 nm by a known vacuum film forming method such as a sputtering method.

Subsequently, in a plating step, a conductor is deposited on the seed electrode layer 152 by electroplating, to form a conductor layer 155 in such a manner as to fill the recesses 144 for forming wiring, the recesses 145 for forming pad portions, and the through-holes 146 for forming interlayer connection vias located in the recesses 145 for forming the pad portions (FIG. 8 (D)). This conductor layer 155 is for forming the wiring and interlayer connection vias constituting the multilayer wiring structure, and is preferably formed from a material having a surface resistance of not more than 1Ω/□, such as, for example, copper, nickel, and nickel-chromium alloys. Such a conductor layer 155 can be formed in such a manner as to be thicker than the pattern structure 142 by an extent of several micrometers.

Next, in a planarizing treatment step, the conductor layer 155 and the seed electrode layer 152 are polished, to leave the conductor layer 155 and the seed electrode layer 152 only in the recesses 144 for forming wiring, the recesses 145 for forming pad portions, and the through-holes 146 for forming interlayer connection vias located in the recesses 145 for forming pad portions of the pattern structure 142 (FIG. 9 (A). Thereafter, further, the exposed conductor barrier layers 151 are removed (FIG. 9 (B)). The polishing of the conductor layer 155 as above-mentioned can be conducted, for example, with the conductor barrier layer 151 as a stopper for polishing, by use of a metal such as titanium, tungsten, or molybdenum or an alloy compound containing one of these metals. In addition, the conductor barrier layer 151 can be removed by conducting flash etching. Note that the conductor barrier layer 151 remains together with the seed electrode layer 152 at bottom portions of the through-holes 146 for forming interlayer connection vias, so that in the case where the transfer base material 121 has wiring and pad portions, the conductor barrier layer 151 is intermediately present between them and the conductor layer 155 in the through-holes 146. However, the thickness of the conductor barrier layer 151 is in the range of 10 to 200 nm as above-mentioned, and, therefore, even when the surface resistance thereof is not less than several tens of Ω/□, it does not give any trouble to the conduction function of the interlayer connection vias.

By the above-mentioned series of steps, one wiring layer 161 can be formed on the transfer base material 121. The wiring layer 161 has wiring 164, pad portions 165, and interlayer connection vias 166 connected to the pad portions 165.

In the present invention, by repeating the above-mentioned series of steps a desired number of times, a multiplicity of desired wiring layers can be formed. FIG. 9 (C) shows an example in which three wiring layers 161 consisting of a wiring layer 161A disposed in a pattern structure 142A, a wiring layer 161B disposed in a pattern structure 142B, and a wiring layer 161C disposed in a pattern structure 142C are formed. By this, a multilayer wiring structure 160 having a three-layer structure is obtained on a transfer base material 121.

Note that in the case where in the formed pattern structure 142 the plurality of recesses 145 for forming pad portions include those separate from the recess 144 for forming wiring as aforementioned, the pad portion 165 formed in such a pad portion forming recess 145 is a dummy pad portion which is not connected to the wiring 164. However, for securing uniformity of strength in plane of a multilayer wiring structure, the presence of the dummy pad portions not connected to the wiring is advantageous.

According to the method of manufacturing a multilayer wiring structure of the present invention as above-described, the through-holes for forming interlayer connection vias and the recesses for forming wiring are simultaneously formed with high accuracy in formation of the pattern structure, and, therefore, a multilayer wiring structure can be manufactured easily and with high accuracy.

The embodiment of the method of manufacturing the multilayer wiring structure as aforementioned is illustrative, and the present invention is not to be limited to the embodiment.

Figure 10:
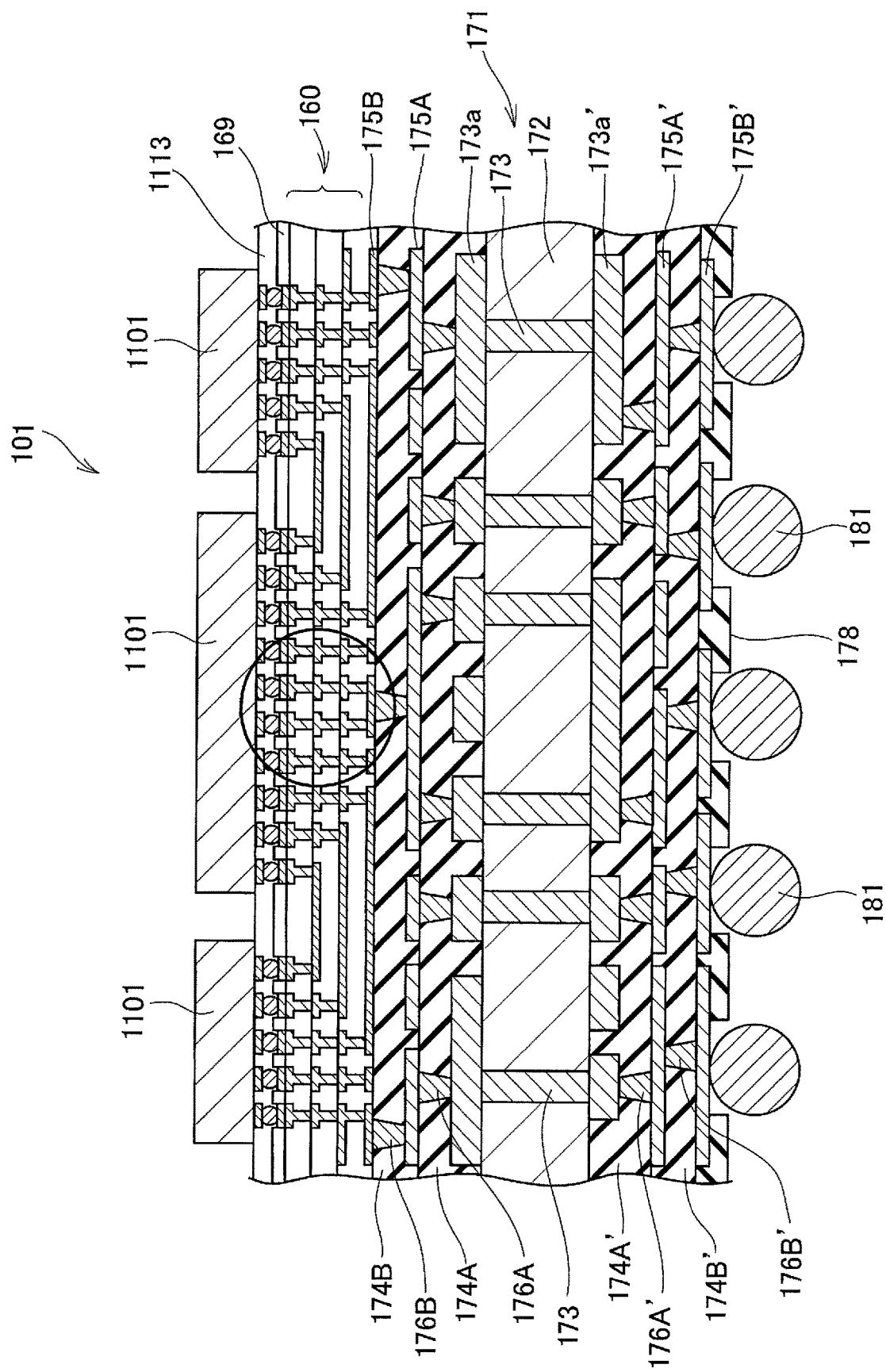
FIG. 10 is a schematic partial sectional view showing an example of an electronic device manufactured by use of the method of manufacturing the multilayer wiring structure according to the first embodiment of the present invention.
Figure 11:
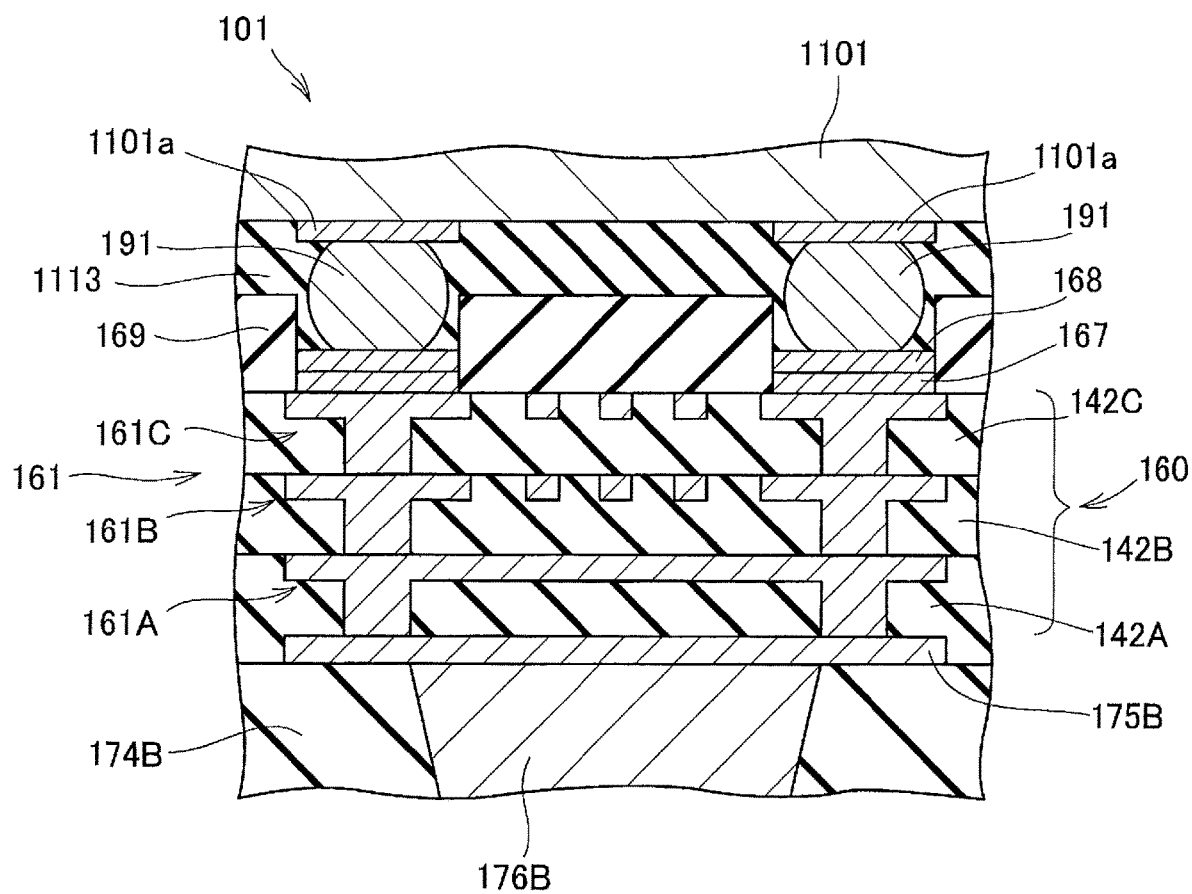
FIG. 11 is an enlarged sectional view of a part surrounded by a circle in FIG. 10.

Here, FIG. 10 is a schematic partial sectional view showing an example of an electronic device manufactured using the method of manufacturing a multilayer wiring structure of the present invention, and FIG. 11 is an enlarged sectional view of a part surrounded by a circle in FIG. 10. In FIGS. 10 and 11, the electronic device 101 has a configuration in which a multilayer wiring structure 160 is formed on a core substrate 171, and semiconductor elements 1101 are mounted through connection pads 191. In this embodiment, the multilayer wiring structure 160 can be manufactured by the method of manufacturing a multilayer wiring structure of the present invention as described above, and description thereof is omitted here.

Note that in FIG. 10, for avoiding complication of the drawing, slant lines are not given to pattern structures 142A, 142B, 142C as interlayer insulating layers constituting the multilayer wiring structure 160, a solder resist 169 and an underfill resin 1113. In addition, in the example illustrated, slant lines are given to the semiconductor elements 1101 in a unified manner, independently of the structures thereof.

The core substrate 171 has a multilayer structure including a core base material 172, and pluralities of conductor layers 175 stacked on both sides of the core base material 172 through insulating layers 174.

The core base material 172 has a plurality of face-back conduction via portions 173 penetrating the core base material 172, conductor layers 173a connected to desired face-back conduction via portions 173 at the front surface (in the illustrated example, on the side of the surface on which the multilayer wiring structure 160 is disposed) of the core base material 172, and conductor layers 173a' connected to desired face-back conduction via portions 173 at the back surface of the core base material 172. Such a core base material 172 may be an electrically insulating material such as, for example, glass and polyamide resin.

On the front surface side of the core base material 172, conductor layers 175A and 175B are stacked through insulating layers 174A and 174B. Besides, the conductor layer 173a and the conductor layer 175A located on upper and lower sides with the insulating layer 174A therebetween are connected by interlayer connection bodies 176A, and the conductor layer 175A and the conductor layer 175B located on upper and lower sides with the insulating layer 174B therebetween are connected by interlayer connection bodies 176B.

In addition, on the back surface side of the core base material 172, conductor layers 175A' and 175B' are stacked through insulating layers 174A' and 1746'. Besides, the conductor layers 173a' and the conductor layers 175A' located on upper and lower sides with the insulating layer 174A' therebetween are connected by interlayer connection bodies 176A', and the conductor layers 175A' and the conductor layers 175B' located on upper and lower sides with the insulating layer 174B' therebetween are connected by interlayer connection bodies 1766'. In addition, a solder resist 178 is disposed so that desired parts of the conductor layer 175B' are exposed, and the exposed parts of the conductor layer 175B' are provided with solder balls 181.

The conductor layers 175B located on the front surface side of the core substrate 171 are pad portions, and the multilayer wiring structure 160 is disposed in such a manner as to be connected to the pad portions. The multilayer wiring structure 160 has wiring layers 161 consisting of three wiring layers 161A, 161B and 161C, and the semiconductor elements 1101 are mounted over the pad portions of the wiring layer 161C through connection pads 191. In the illustrated example, nickel layers 167 and gold layers 168 are provided on the wiring layer 161C of the multilayer wiring structure 160, and the solder resist 169 is disposed in such a manner as to expose the nickel layers 167 and the gold layers 168. The connection pads 191 are thermocompression bonded, thereby interconnecting the gold layers 168 and terminals 1101a of the semiconductor elements 1101. In addition, a gap between the semiconductor element 1101 and the multilayer wiring structure 160 is filled with the underfill resin 1113 formed by placing a thermosetting resin to fill the gap and curing the resin by heating. The plurality of semiconductor elements 1101 mounted in this way may be different kinds of semiconductor elements.

The above-described electronic device is an example, and the electronic device which can be manufactured using the method of manufacturing the multilayer wiring structure of the present invention is not to be limited to the above-described example.

EXAMPLES

The present embodiment will be described more in detail below referring to examples.
<Production of Imprint Mold>
(Production of Mold (Sample 1))

A quartz glass (65 mm square) having a thickness of 675 μm was prepared as a mold base material, and a chromium thin film (150 nm thick) was formed on a surface of the base material by a sputtering method. A surface of the chromium thin film was coated with a photosensitive resist, then exposure to light through a desired photomask was conducted, and development was conducted, to form a resist pattern. With the resist pattern as an etching mask, the exposed chromium thin film was removed by dry etching using a chlorine-based gas. Thereafter, with the remaining chromium thin film as an etching mask, the exposed quartz glass was cut by dry etching using a fluorine-based gas, to obtain a mold having a rugged structure.

The rugged structure of the mold was composed of two kinds of projected portions, namely, projected portions linear in plan-view shape and projected portions circular in plan-view shape, in which the chromium thin film was present in the projected portions. The linearly shaped projected portions had a line/space (5 μm/5 μm) shape. In addition, the circularly shaped projected portions had a diameter of 30 μm, and were present in a density of 225 pieces/mm² (65 μm pitch). The projected portions of the quartz glass had a height from a main surface of 2 μm.

Next, the rugged structure of the above-mentioned mold was coated with a photosensitive resist, exposure to light through a desired photomask was conducted, and development was performed. By this, there was formed a resist pattern coating, in a circular shape with a diameter of 20 μm, substantially central portions of the chromium thin film located at top portion flat surfaces of the projected portions circular in plan-view shape. Subsequently, with this resist pattern as an etching mask, the exposed chromium thin film was removed by dry etching using a chlorine-based gas, thereby to form light-shielding layers with a diameter of 20 μm on substantially central portions of the top portion flat surfaces of the projected portions circular in plan-view shape. In this way, a mold (sample 1) was produced.

(Production of Mold (Sample 2))

A quartz glass (65 mm square) having a thickness of 675 μm was prepared as a mold base material, and a chromium thin film (150 nm thick) was formed on a surface of the base material by a sputtering method. A surface of the chromium thin film was coated with a photosensitive resist, and exposure to light through a desired photomask was conducted, and development was performed, to form resist patterns in a circular shape with a diameter of 30 μm in a density of 225 pieces/mm² (65 μm pitch), and to form resist patterns in a line/space (5 μm/5 μm) shape. With the resist patterns as an etching mask, the exposed chromium thin film was removed by dry etching using a chlorine-based gas. Thereafter, with the remaining chromium thin film as an etching mask, the exposed quartz glass was cut by dry etching using a fluorine-based gas, to obtain a mold having a rugged structure. By this, projected portions in a cylindrical shape with a diameter of 30 μm and a height of 2 μm were formed in a density of 225 pieces/mm², and projected portions in a line/space (5 μm/5 μm) shape were formed. Next, the remaining chromium thin film was removed by use of an aqueous sulfuric acid solution admixed with hydrogen peroxide. Subsequently, a photosensitive resist was applied to the whole region of the base material in such a manner as to coat the above-mentioned projected portions, then exposure to light through a desired photomask was conducted, and development was performed. By this, resist patterns in a circular shape with a diameter of 20 μm were formed in the center of top portion flat surfaces of the cylindrically shaped projected portions. Then, with the resist patterns as an etching mask, the base material was dry etched. By this, a mold (sample 2) was obtained.

The mold (sample 2) was comprised of two kinds of projected portions, namely, the projected portions linear in plan-view shape and projected portions circular in plan-view shape. The projected portions linear in plan-view shape had a line/space (5 μm/5 μm) shape, and the height of the line portions from a main surface was 2 μm. On the other hand, the projected portions circular in plan-view shape had a two-step structure composed of a base portion located on the base material side, and a projected portion located substantially centrally on the base portion, in which the base portion had a cylindrical shape with a diameter of 30 μm and a height from the main surface of 2 μm and the projected portion had a cylindrical shape with a diameter of 20 μm and a height from the base portion of 2 μm. Therefore, the projected portions circular in plan-view shape had a two-step structure greater in height from the main surface of the base material than the projected portions linear in plan-view shape. Note that the projected portions circular in plan-view shape were present in a density of 225 pieces/mm².

<Surface Treatment of Mold>

For the purpose of restraining improper formation of patterns from being generated due to transfer and adhesion of the resist film formed on the transfer base material side to the mold side as will be described later, the molds (sample 1, sample 2) produced as above-mentioned were subjected to a surface treatment for enhancing property for release from the resist film. Specifically, a mold releasing coat was formed on the molds (sample 1, sample 2) by a vapor deposition method using a modified perfluoropolyether (OPTOOL DSX, made by Daikin Industries, Ltd.).

<Evaluation of Imprint Mold>

By use of the above-mentioned molds (sample 1, sample 2), pattern structures were formed as follows.

First, a silicon substrate was prepared as a transfer base material, and a titanium thin film and a copper thin film were stackedly formed on a surface of the transfer substrate by a sputtering method. Next, a commercialized UV-curing type resist solution (SU-8 3000 Series, made by Nippon Kayaku Co., Ltd.) was supplied onto the copper thin film at the surface of the transfer base material, to coat the copper thin film in such a manner as to obtain a film thickness upon post-baking of about 5 μm, and was dried by soft baking using a hot plate, to obtain a resist film. Next, the mold was pressed against the above-mentioned resist film, and, in this state, irradiation with UV rays of parallel light component including a 350 to 405 nm wavelength component was conducted from the back side of the mold, to generate an acid at selected parts of the resist film, followed by a heating treatment by PEB (Post Exposure Bake), to cause primary curing of the resist film. Thereafter, the mold was released, a developing treatment was conducted using a PM thinner (propylene glycol monomethyl ether acetate) to form a pattern structure on the transfer substrate, and secondary curing was conducted by post bake (nitrogen atmosphere, 180° C., 60 minutes). Such formation of a pattern structure was conducted three times for each mold of sample 1 and sample 2.

The pattern structure formed by use of the mold of sample 1 had a configuration in which in each of the recesses with a diameter of 30 μm corresponding to the projected portions circular in plan-view shape, a through-hole with a diameter of 20 μm was located in a substantially central portion, where the copper thin film is exposed, and a residual resist film was not present in the through-hole.

In addition, the pattern structure formed by use of the mold of sample 2 also had a configuration in which in each of the recesses with a diameter of 30 μm corresponding to the projected portions circular in plan-view shape, a through-hole with a diameter of 20 μm was located in a substantially central portion. However, a residual resist film was present at a bottom surface portion constituting a boundary with the copper thin film, and the through-holes in which the copper thin film was covered with the residual resist film either partly or entirely were present in a proportion of not less than 90% based on the total number of through-holes.

Industrial Applicability

The imprint mold of the present invention is applicable to manufacture of various kinds of pattern structures and manufacture of multilayer wiring structures in which an imprint method is used.

Second Embodiment

A second embodiment of the present invention will be described below, referring to the drawings. Note that the drawings are schematic or conceptual, and the sizes of members, size ratios between the members and the like are not necessarily the same as the practical ones, and even the same member or the like may be represented in the respective drawings in mutually different sizes or ratios.

[Imprint Mold]

First, an imprint mold according to the present embodiment will be described. The imprint mold according to the present embodiment has a mold base material and a rugged structure located at a main surface of the mold base material. The rugged structure has a plurality of projected portions, and a light-shielding layer is provided at a desired part of top portion flat surfaces of the projected portions.

Figure 12:
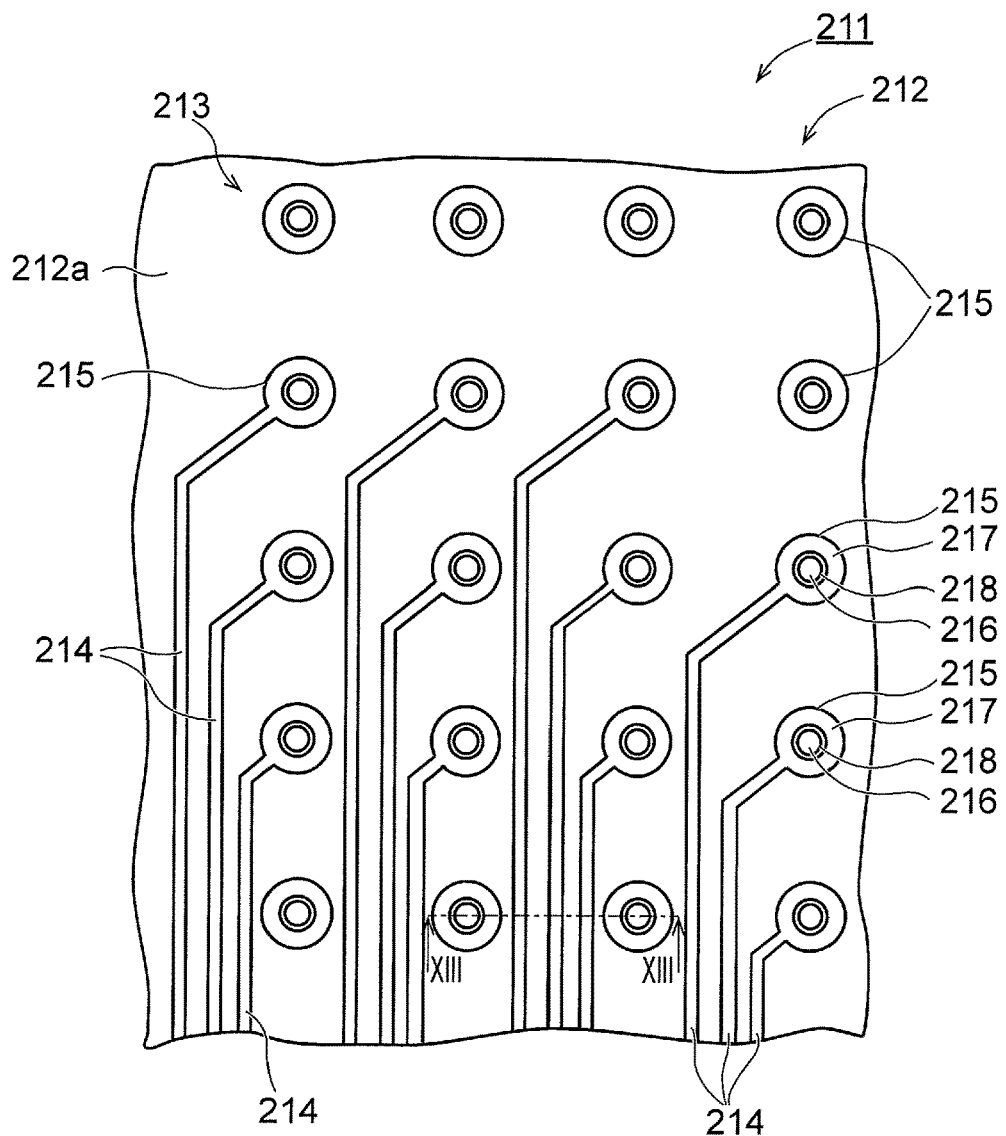
FIG. 12 is a partial plan view of an imprint mold according to a second embodiment of the present invention.
Figure 13:
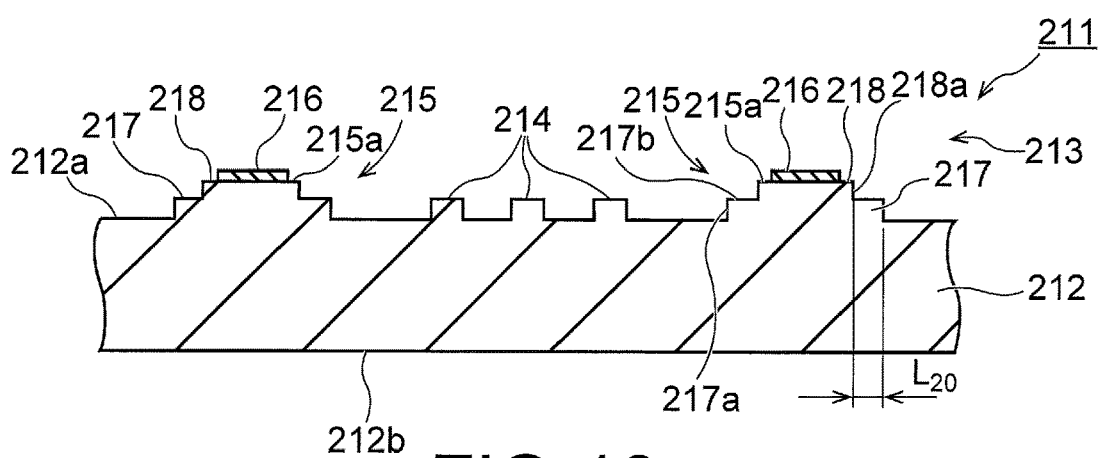
FIG. 13 is an enlarged vertical sectional view, taken along line XIII-XIII, of the imprint mold shown in FIG. 12.

FIG. 12 is a partial plan view for explaining one embodiment of an imprint mold according to the present embodiment. FIG. 13 is an enlarged vertical sectional view of the mold shown in FIG. 12, taken along line XIII-XIII.

An imprint mold 211 shown in FIGS. 12 and 13 is an example of a mold for forming an electrically insulating pattern structure having recesses for forming wiring in an upper layer and through-holes for forming interlayer connection vias, on a transfer base material provided with wiring and pad portions.

This mold 211 has a mold base material 212, and a rugged structure 213 located at a main surface 212a of the mold base material 212. Of these components, the rugged structure 213 includes projected portions 214 which are linear in plan-view shape and projected portions 215 which are circular in plan-view shape.

The projected portions 214 which are linear in plan-view shape are projected portions for forming a pattern structure 242, which will be described later, with recesses for forming wiring. On the other hand, the projected portions 215 which are circular in plan-view shape are projected portions for forming the pattern structure 242 with recesses 245 and through-holes 246 for forming pad portions 265 and interlayer connection vias 266 which will be described later, and light-shielding layers 216 are located at central portions of top portion flat surfaces 215a of the projected portions 215.

In the present embodiment, the projected portions 215 have a stepped shape including at least two steps (in this case, two steps). Specifically, the projected portion 215 has a pad-corresponding step 217 on a base end side which projects from the main surface 212a, and a via-corresponding step 218 which is disposed on the pad-corresponding step 217. A top portion flat surface 215a is formed on the via-corresponding step 218, and a light-shielding layer 216 is disposed at the top portion flat surface 215a. In plan view, the pad-corresponding step 217 is greater than the via-corresponding step 218, and the via-corresponding step 218 is completely included in the inside of the pad-corresponding step 217. In this case, the pad-corresponding step 217 and the via-corresponding step 218 are both circular in plan view.

The light-shielding layer 216 is for forming, in a recess 245, a part of a through-hole 246 for forming an interlayer connection via 266, as will be explained in a method of manufacturing a pattern structure to be described later. In plan view, the light-shielding layer 216 has a circular shape smaller than the via-corresponding step 218. Note that the linearly shaped projected portions 214 are made to extend from part of the projected portions 215. Therefore, the plurality of projected portions 215 may include those separate from the linearly shaped projected portion 214.

In the case where a to-be-molded resin material to be used for imprint is photo-curing, a material permitting transmission therethrough of irradiation light for curing the resin material can be used as the material for the mold base material 212; for example, there can be used not only glasses such as quartz glass, no alkali glass, silicate glass, calcium fluoride, magnesium fluoride, acrylic glass, etc. but also sapphire, gallium nitride, and, further, resins such as polycarbonate, polystyrene, acrylics, polypropylene, etc. and arbitrary laminates of them. Besides, in the case where the to-be-molded resin material to be used is not photo-curing, the mold 211 may not have a light-transmitting property, and, other than the above-mentioned materials, there can be used silicon, metals such as nickel, titanium, aluminum, etc. and their alloys, oxides, nitrides, and arbitrary laminates of them. The thickness of the mold base material 212 can be set taking the strength, handleability and the like of the material into consideration; for example, the thickness can be appropriately set in the range of 300 μm to 10 mm. Note that the main surface 212a side of the mold base material 212 may have a projected structure with two or more steps, or a so-called mesa structure; in this case, the uppermost step is the main surface 212a, and the rugged structure 213 may be located at the main surface 212a. In the case where the base material of the mold base material 212 is glass, the mold 211 can be used for both an optical imprint method and a thermal imprint method, whereby versatility of the mold 211 can be enhanced. In addition, unlike in the case where a metal-made mold is used, the mold base material 212 consisting of glass is smaller than metal in expansion of the mold 211 itself due to heat at the time of imprint, and, therefore, dimensional accuracy can be enhanced. Besides, in the case where the base material of the mold base material 212 consists of no alkali glass or quartz glass, it is possible to form a highly accurate pattern, because of the high transmittance to UV rays used in lithography, in forming the insulating pattern structure 242. Furthermore, no alkali glass or quartz glass is higher in strength than alkali glass, and can be used repeatedly, whereby member consumption cost can be suppressed, so that imprint process can be carried out inexpensively.

The projected portions 214 are projected portions for forming the pattern structure 242 with recesses 244 for forming wiring which will be described later. The width of the projected portions 214 can be appropriately set in the range of, for example, 0.5 to 10 μm, and their height from the main surface 212a can be appropriately set within the range of, for example, 0.5 to 10 μm.

The projected portions 215 are projected portions for forming the pattern structure with recesses 245 and through-holes 246 for forming pad portions 265 and interlayer connection vias 266 as will be described later. In the illustrated example, the whole part of the projected portion 215 is circular in plan-view shape, and, for example, the diameter of the projected portion 215 (the diameter of the pad-corresponding step 217) can be appropriately set within the range of 5 to 50 μm, and the height of the top portion flat surface 215a from the main surface 212a can be appropriately set within the range of 1 to 10 μm.

As shown in FIG. 13, the pad-corresponding step 217 of the projected portion 215 has a cylindrical side surface 217a, and a top surface 217b located in the periphery of the via-corresponding step 218. In sectional view, the side surface 217a is perpendicular to the main surface 212a, and the top surface 217b is parallel to the main surface 212a.

The height of the pad-corresponding step 217 from the main surface 212a may be, for example, 0.5 to 5 μm. Note that the height of the pad-corresponding step 217 from the main surface 212a may be the same as the height of the projected portion 214 from the main surface 212a. In this case, it becomes easy to produce the imprint mold 211 by a dry etching method.

The via-corresponding step 218 has a cylindrical side surface 218a, and the aforementioned top portion flat surface 215a. The diameter of the via-corresponding step 218 can be appropriately set within the range of 2 to 40 μm, and the height of the top portion flat surface 215a from the top surface 217b of the pad-corresponding step 217 can be appropriately set within the range of 0.5 to 5 μm. In sectional view, the side surface 218a is perpendicular to the main surface 212a, but this is not restrictive. The side surface 218a may not be perpendicular to the main surface 212a. Besides, in sectional view, the side surface 218a may be curved.

In addition, the light-shielding layers 216 located at central portions of the top portion flat surfaces 215a of the projected portions 215 are layers capable of shielding light to such an extent that in imprint conducted using a photo-curing to-be-molded resin material, photo-curing of the to-be-molded resin material by irradiation light from the other surface 212b side of the mold base material 212 is not generated. Such light-shielding layers 216 can be layers having an optical density (OD) of, for example, not less than 2, preferably not less than 3, and examples of the material thereof include chromium, molybdenum, titanium, aluminum, silver, and nickel.

The thickness of the light-shielding layer 216 can be appropriately set in such a manner that the optical density is not less than 2. For example, in the case where the material of the light-shielding layer 216 is chromium, the thickness is preferably about 50 to 150 nm. If the thickness of the chromium-made light-shielding layer 216 is less than 50 nm, the optical density would be less than 2, so that the light-shielding property is insufficient. Particularly in the case of using a light source with high illuminance, it is preferable, for obtaining a higher light-shielding property, that the thickness of the chromium-made light-shielding layer 216 is not less than 100 nm. On the other hand, if the thickness of the chromium-made light-shielding layer 216 exceeds 150 nm, internal stress of the light-shielding layer 216 would become high, peeling would be easily generated, and durability would be lowered, which is unfavorable. In the illustrated example, the light-shielding layer 216 is located substantially in the center of the top portion flat surface 215a; in this case, the distance $L_{20}$ from an outer edge of the light-shielding layer 216 to a peripheral edge of the top portion flat surface 215a can be set within the range of 1 to 10 μm.

The embodiment of the imprint mold as aforementioned is illustrative and is not restrictive. For example, while the rugged structure 213 has the linearly shaped projected portions 214 and the circularly shaped projected portions 215 in the aforementioned embodiment, the rugged structure 213 may be one that has three or more kinds of projected portions. In addition, the light-shielding layers 216 provided at desired parts of the top portion flat surfaces 215a of the projected portions 215 may include light-shielding layers 216 with an optical density of less than 2, in addition to the light-shielding layers 216 with an optical density of not less than 2. By this, in the pattern structure formed, recesses with depths according to the light-shielding performances of the light-shielding layers 216 can be formed. According to such an imprint mold, a pattern structure having recesses or through-holes differing in depth can be formed easily and with high accuracy.

[Method of Forming Pattern Structure]

Figure 14:
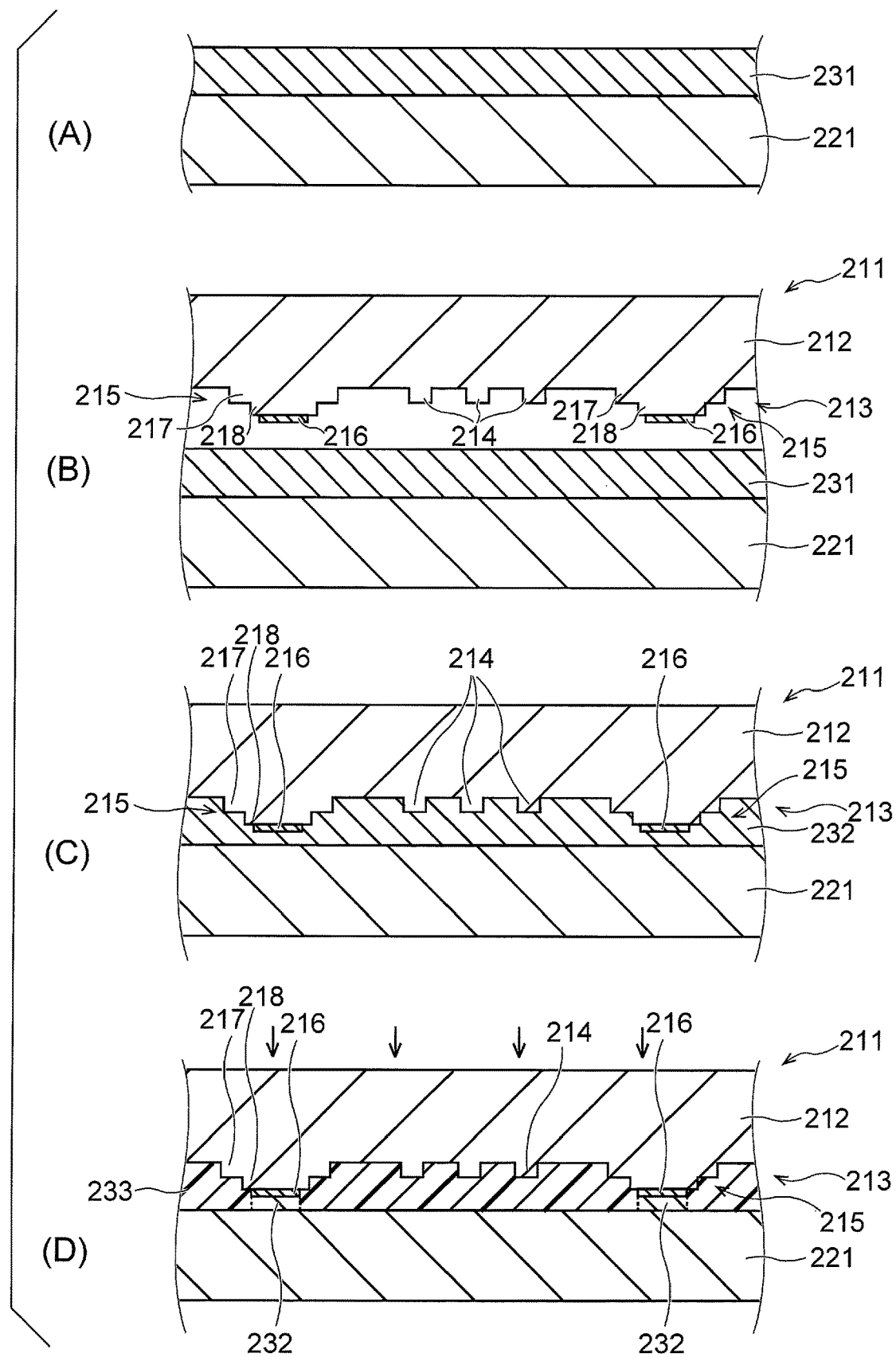
FIG. 14 is a process drawing for showing a method of forming a pattern structure according to the second embodiment of the present invention.
Figure 15:
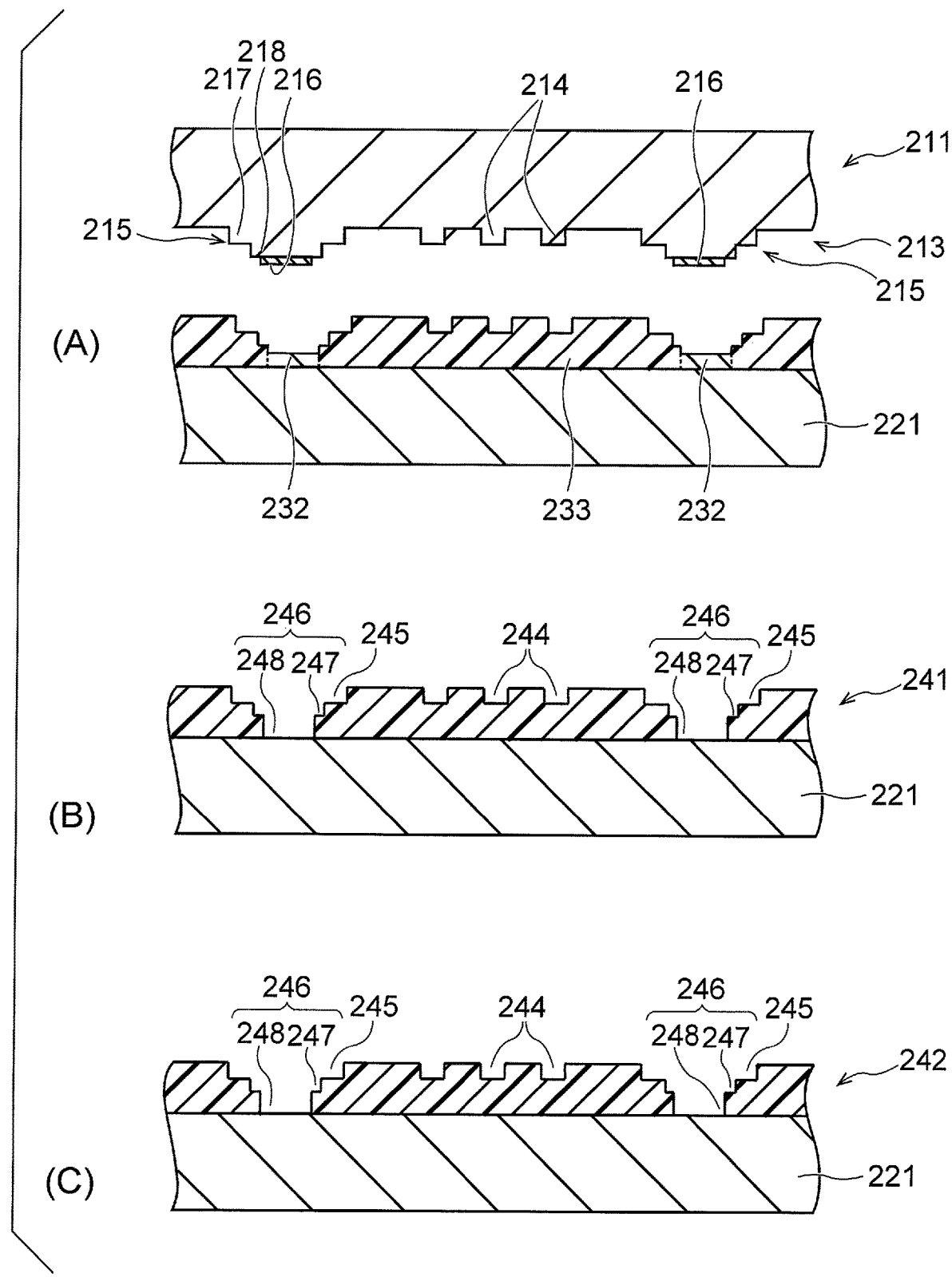
FIG. 15 is a process drawing showing the method of forming the pattern structure according to the second embodiment of the present invention.

FIGS. 14 and 15 are process drawings showing a method of forming a pattern structure according to the present embodiment, and show an example in which the aforementioned imprint mold 211 is used.

In the method of forming a pattern structure according to the present embodiment, a photo-curing insulating resist 231 is supplied onto a transfer base material 221 in a supplying step (FIG. 14 (A)). The transfer base material 221 may be one that has desired wiring and pad portions.

Next, in a contact step, the aforementioned imprint mold 211 is prepared (FIG. 14 (B)), the mold 211 and the transfer base material 221 are brought close to each other, and the photo-curing insulating resist 231 is spread between the mold 211 and the transfer base material 221, to form a photo-curing insulating resist layer 232 (FIG. 14 (C)).

Subsequently, in a curing step, irradiation with light from the mold 211 side is conducted to cure the photo-curing insulating resist layer 232, thereby forming an insulating material layer 233, while leaving uncured the photo-curing insulating resist layer 232 located between the light-shielding layers 216 of the mold 211 and the transfer base material 221 (FIG. 14 (D)). As the light for irradiation therewith from the mold 211 side, parallel light is preferably used, for preventing coming-around of light such as to cause curing of the photo-curing insulating resist layer 232 located beneath the light-shielding layers 216.

Thereafter, in a mold releasing step, the mold 211 is released from the insulating material layer 233 and the remaining photo-curing insulating resist layer 232 (FIG. 15 (A)). Note that in this mold releasing step, at least part of the remaining photo-curing insulating resist layer 232 may adhere to the mold 211, to be removed together with the mold 211.

Next, in a developing step, the insulating material layer 233 is developed, whereby the remaining photo-curing insulating resist layer 232 is removed (FIG. 15 (B)). By this, a state is obtained in which a pattern structure precursor 241 which has recesses 244 for forming wiring, recesses 245 for forming pad portions, and through-holes 246 for forming interlayer connection vias located in the recesses 245 is located on the transfer base material 221 (FIG. 15 (B)).

The through-hole 246 has a stepped shape having at least two steps (in this case, two steps), and includes a first recessed step 247 on the front surface side (the recess 245 side) and a second recessed step 248 on the back surface side (the transfer base material 221 side). Note that the first recessed step 247 is provided in continuity with the recess 245, and the second recessed step 248 is provided in continuity with the transfer base material 221. Note that the shapes of the recess 245 and the first recessed step 247 have shapes corresponding respectively to the pad-corresponding step 217 and the via-corresponding step 218 of the mold 211. Therefore, the sizes of the recess 245 and the first recessed step 247 correspond respectively to the pad-corresponding step 217 and the via-corresponding step 218 which have been described above.

Thereafter, the pattern structure precursor 241 is subjected to a post-baking treatment, to obtain a pattern structure 242 (FIG. 15 (C)).

Figure 16:
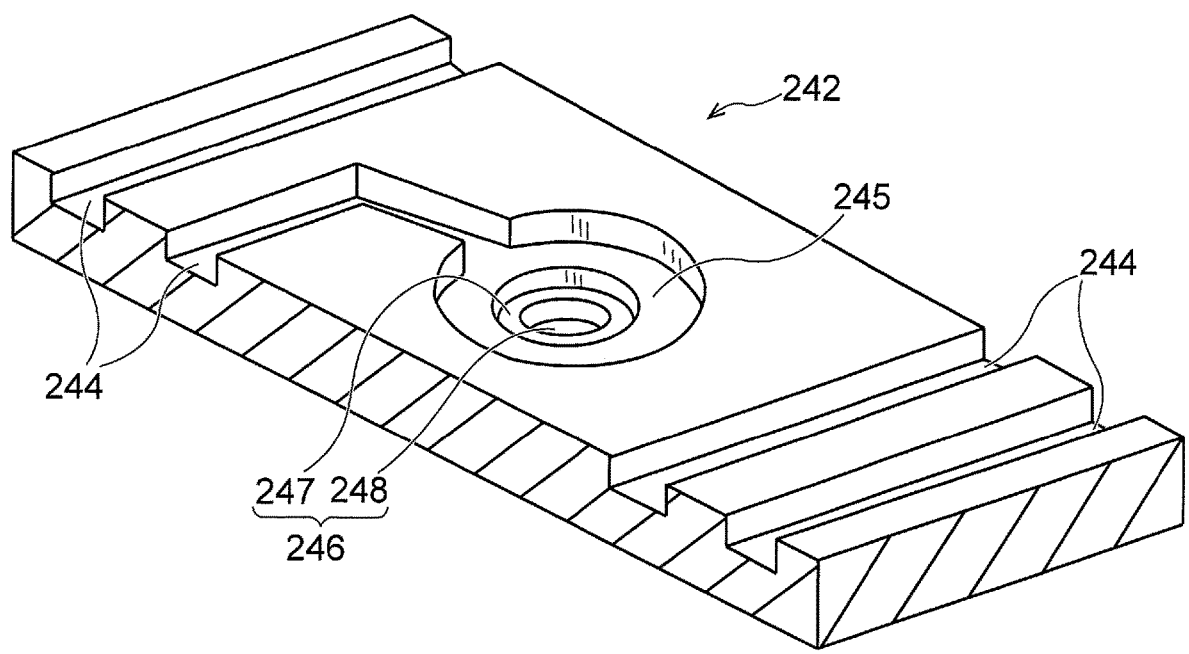
FIG. 16 is a partial perspective view showing the pattern structure formed by the method of forming the pattern structure according to the second embodiment of the present invention.

FIG. 16 is a partial perspective view of the pattern structure 242 formed in this way. Note that in the pattern structure 242 formed in this way, the plurality of recesses 245 for forming pad portions may include those separate from the recess 244 for forming wiring. As illustrated in FIG. 16, in plan view, the recess 245 is larger than the first recessed step 247 of the through-hole 246, and the first recessed step 247 is completely included in the inside of the recess 245. In addition, the first recessed step 247 of the through-hole 246 is larger than the second recessed step 248, and the second recessed step 248 is completely included in the inside of the first recessed step 247. In this case, the recess 245 and the first recessed step 247 and the second recessed step 248 are both circular in plan view.

Figure 17:
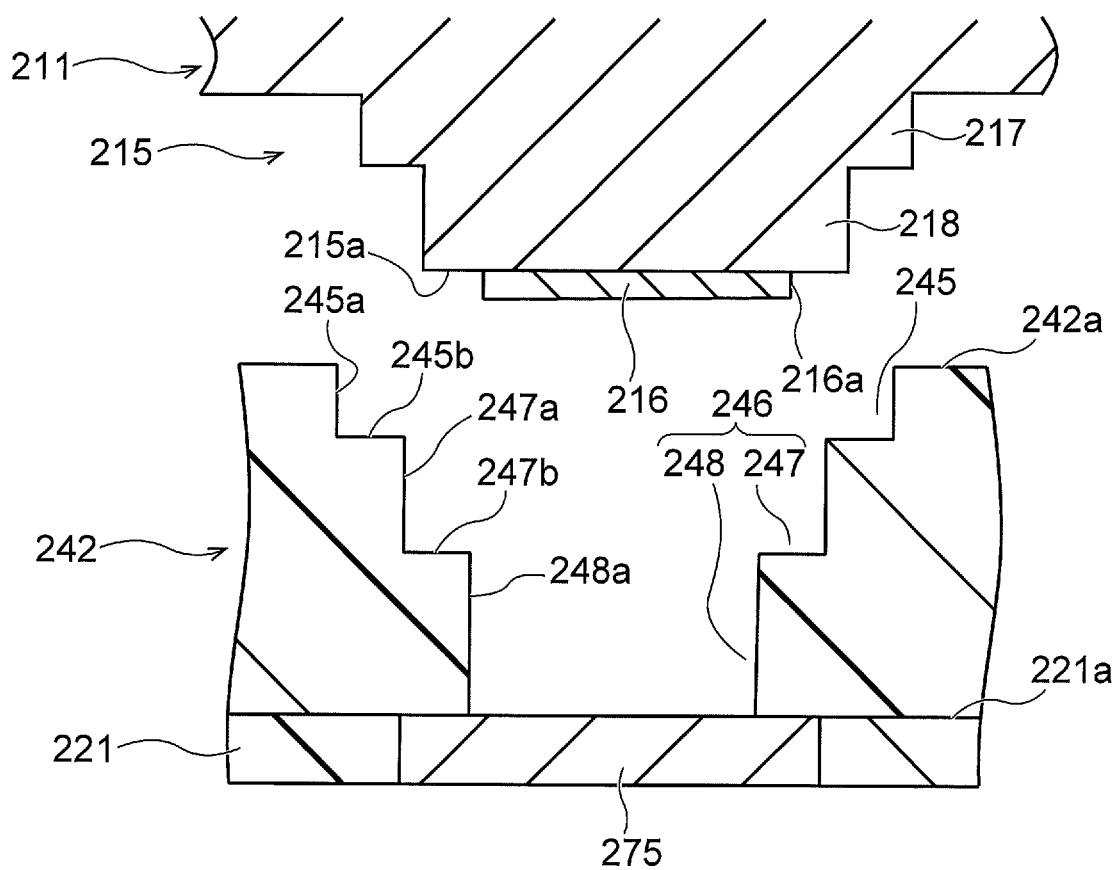
FIG. 17 is a schematic sectional view showing a recess and a through-hole of the pattern structure according to the second embodiment of the present invention and a projected portion of a mold for producing the same.

FIG. 17 is a schematic enlarged sectional view showing the recess 245 and the through-hole 246 of the pattern structure 242, and the projected portion 215 of the mold 211 for producing the same.

The recess 245 has a cylindrical inside surface 245a, and a bottom surface 245b located in the periphery of the first recessed step 247. In sectional view, the inside surface 245a of the recess 245 is perpendicular to the main surface 242a of the pattern structure 242, and the bottom surface 245b of the recess 245 is parallel to the main surface 242a of the pattern structure 242. Note that the main surface 242a of the pattern structure 242 is parallel to a front surface 221a of the transfer base material 221. In addition, in sectional view, the bottom surface 245b and/or the inside surface 245a may be curved. Note that the diameter of the recess 245 can be appropriately set within the range of 5 to 50 μm, and the depth of the recess 245 can be appropriately set within the range of 0.5 to 5 μm.

The first recessed step 247 has a cylindrical inside surface 247a, and a bottom surface 247b located in the periphery of the second recessed step 248. In sectional view, the inside surface 247a of the first recessed step 247 is perpendicular to the main surface 242a. In sectional view, the inside surface 247a of the first recessed step 247 is perpendicular to the main surface 242a of the pattern structure 242, and the bottom surface 247b is parallel to the main surface 242a. However, this is not restrictive; the inside surface 247a may not be perpendicular to the main surface 242a, and the bottom surface 247b may not be parallel to the main surface 242a. Besides, in sectional view, the bottom surface 247b and/or the inside surface 247a may be curved. Note that the diameter of the first recessed step 247 can be appropriately set within the range of 2 to 30 μm, and the depth of the first recessed step 247 can be appropriately set within the range of 0.5 to 5 μm.

The second recessed step 248 has a cylindrical inside surface 248a. The aperture area of the second recessed step 248 on the front surface side (the first recessed step 247 side) and that on the back surface side (the transfer base material 221 side) are the same. In the case of forming the inside surface 248a of the second recessed step 248 configured in this way, a side surface 216a of the light-shielding layer 216 of the mold 211 is set to be perpendicular to the top portion flat surface 215a of the projected portion 215, as shown in FIG. 17. By this, of the photo-curing insulating resist layer 232, a portion covered with the light-shielding layer 216 and a portion not covered with the light-shielding layer 216 are clearly distinguished from each other, with the side surface 216a as a boundary, and the inside surface 248a of the second recessed step 248 can be made perpendicular to the main surface 242a. Note that the transfer base material 221 has a conductor layer 275, and this conductor layer 275 is exposed from the second recessed step 248. Note that the diameter of the second recessed step 248 can be appropriately set within the range of 1 to 20 μm, and the depth of the first recessed step 247 can be appropriately set within the range of 1 to 10 μm.

Figure 18:
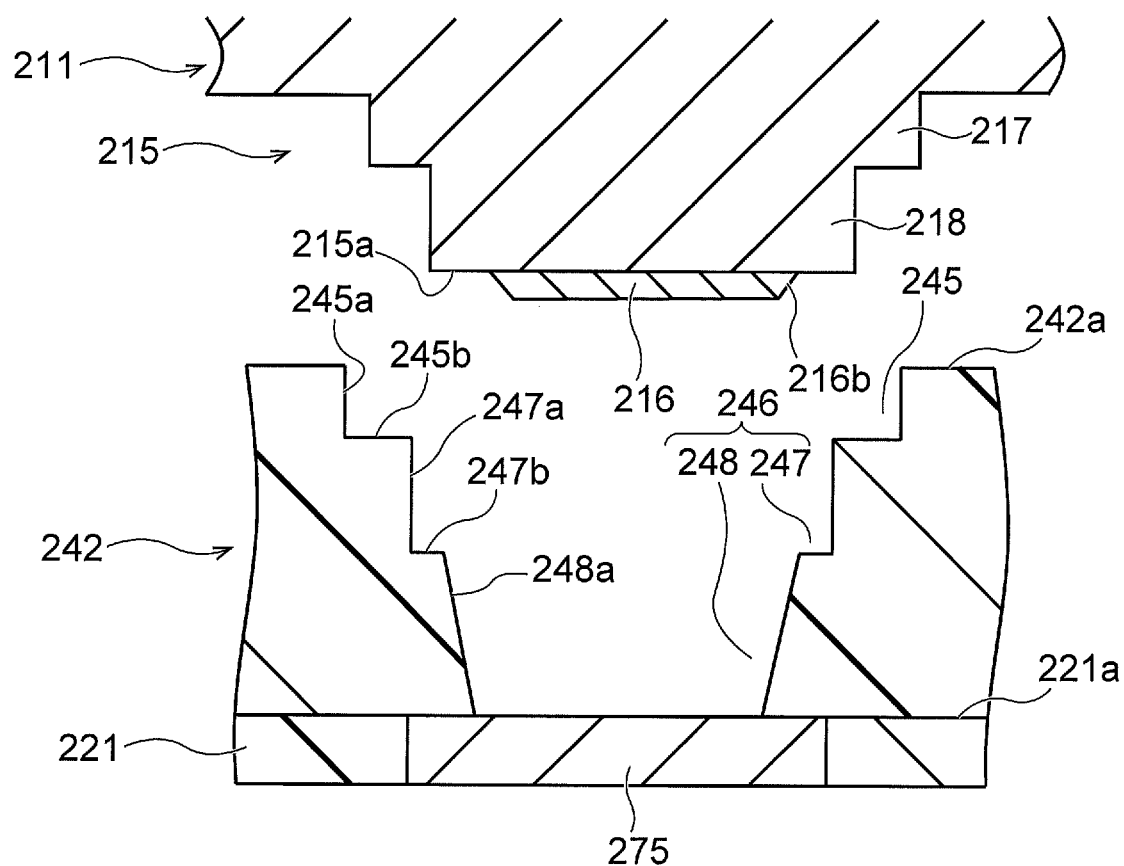
FIG. 18 is a schematic sectional view showing a recess and a through-hole of a pattern structure according to a modification of the second embodiment of the present invention and a projected portion of a mold for producing the same.
Figure 19:
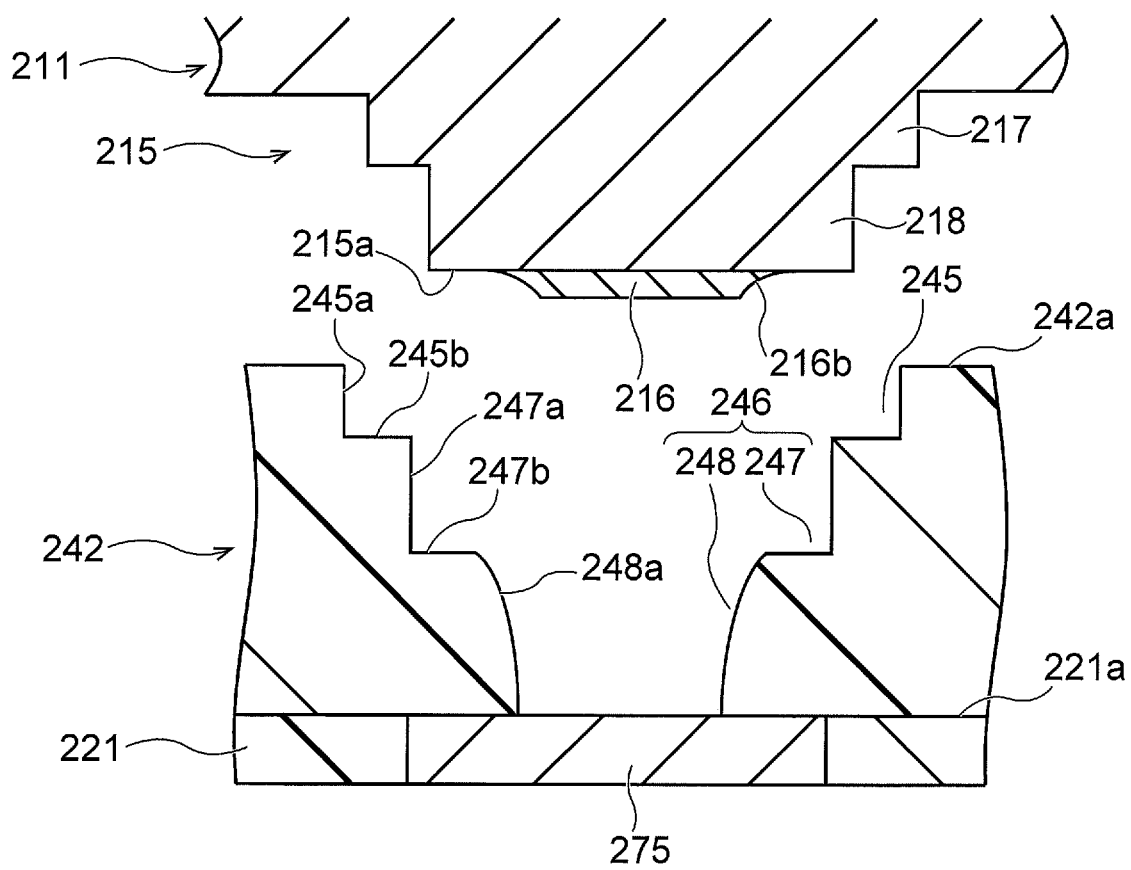
FIG. 19 is a schematic sectional view showing a recess and a through-hole of a pattern structure according to a modification of the second embodiment of the present invention and a projected portion of a mold for producing the same.
Figure 20:
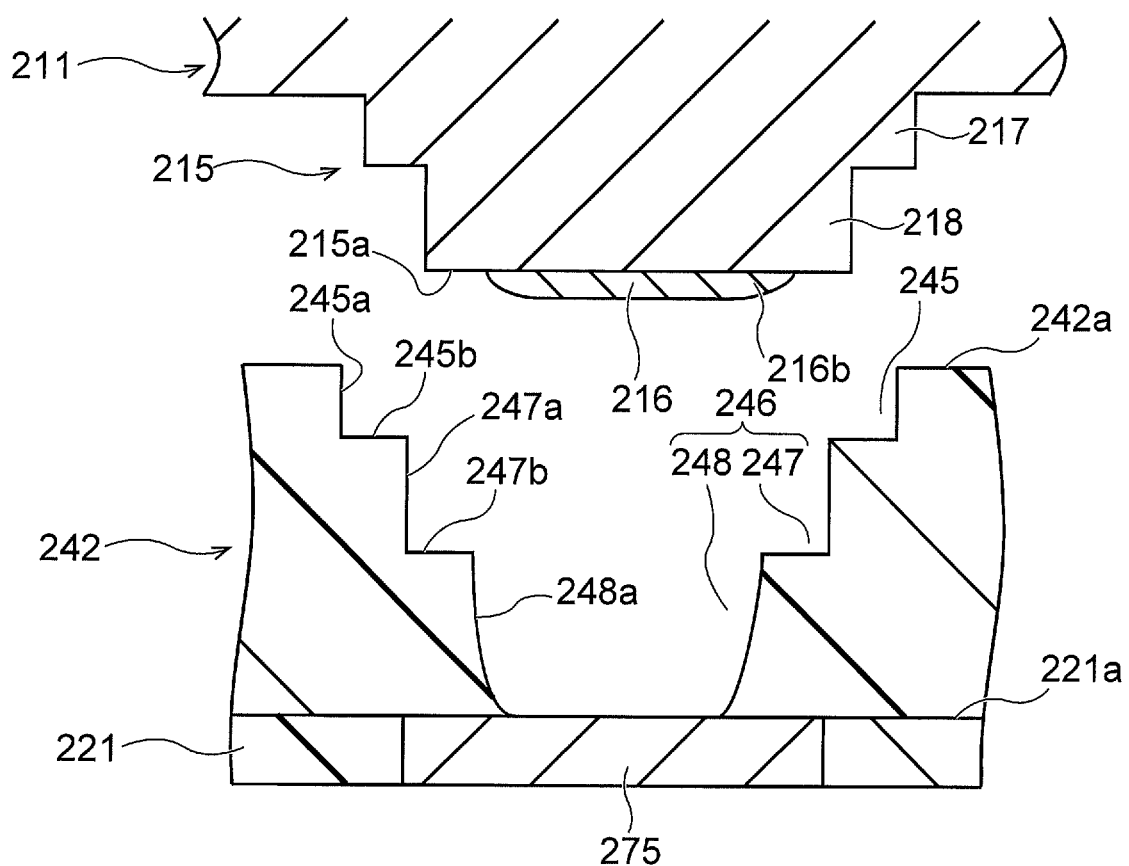
FIG. 20 is a schematic sectional view showing a recess and a through-hole of a pattern structure according to a modification of the second embodiment of the present invention and a projected portion of a mold for producing the same.

FIGS. 18 to 20 are schematic sectional views showing modifications of the pattern structure 242 and the mold 211 for producing the same. Each of the modifications shown in FIGS. 18 to 20 has a difference in the shape of the inside surface 248a of the second recessed step 248, with the other configurations being substantially the same as in the embodiment illustrated in FIG. 17. In FIGS. 18 to 20, the same parts as those in the embodiment shown in FIG. 17 are denoted by the same reference symbols used in FIG. 17, and detailed descriptions thereof will be omitted.

[Modification 1 of Recess]

As illustrated in FIG. 18, in sectional view, the inside surface 248a of the second recessed step 248 is formed obliquely in relation to the main surface 242a of the pattern structure 242. The aperture area of the second recessed step 248 gradually decreases from the front surface side (the first recessed step 247 side) toward the back surface side (the transfer base material 221 side). The diameter of the second recessed step 248 on the back surface side may be 50 to 90% of the diameter of the second recessed step 248 on the front surface side.

In the case of forming such an inside surface 248a, a peripheral edge portion 216b of the light-shielding layer 216 of the mold 211 is formed obliquely in relation to the top portion flat surface 215a of the projected portion 215. In this case, the peripheral edge portion 216b of the light-shielding layer 216 transmits only part of the light used for irradiation. Therefore, that region of the photo-curing insulating resist layer 232 which corresponds to the peripheral edge portion 216b becomes a region in which the degree of curing gradually varies according to the degree of transmission of light. Specifically, in a region where more light is transmitted, of the region corresponding to the peripheral edge portion 216b, the curing advances more and the insulating material layer 233 is formed to be thicker, than in a region where less light is transmitted. As a result, the inside surface 248a of the second recessed step 248 can be formed to be oblique in relation to the main surface 242a.

With the inside surface 248a of the second recessed step 248 thus inclined, the area of the inside surface 248a is enlarged, and, therefore, it is possible to enhance adhesion between the through-hole 246 and the interlayer connection via 266 described later. Note that the light-shielding layer 216 shown in FIG. 18 can be formed by dry etching, for example. Specifically, by appropriately controlling etching conditions at the time of dry etching, the peripheral edge portion 216b of the light-shielding layer 216 can be formed obliquely.

[Modification 2 of Recess]

As illustrated in FIG. 19, the inside surface 248a of the second recessed step 248 is curved toward the inside of the second recessed step 248, in sectional view. The aperture area of the second recessed step 248 gradually decreases from the front surface side (the first recessed step 247 side) toward the back surface side (the transfer base material 221 side). The diameter of the second recessed step 248 on the back surface side may be 50 to 90% of the diameter of the second recessed step 248 on the front surface side. Note that part (for example, the transfer base material 221 side) of the inside surface 248a may be rectilinear in shape, in sectional view.

In the case of forming such an inside surface 248a, the peripheral edge portion 216b of the light-shielding layer 216 of the mold 211 is curved toward the inside of the light-shielding layer 216. In this case, the peripheral edge portion 216b of the light-shielding layer 216 transmits only part of the light used for irradiation. Therefore, that region of the photo-curing insulating resist layer 232 which corresponds to the peripheral edge portion 216b becomes a region in which the degree of curing gradually varies according to the degree of transmission of light. Specifically, in a region where more light is transmitted, of the region corresponding to the peripheral edge portion 216b, curing advances more and the insulating material layer 233 is formed to be thicker, than in a region where less light is transmitted. By this, the inside surface 248a of the second recessed step 248 can be curved toward the inside of the second recessed step 248.

With the inside surface 248a of the second recessed step 248 thus curved toward the inside of the second recessed step 248, the area of the inside surface 248a is further enlarged, and, therefore, it is possible to further enhance the adhesion between the through-hole 246 and the interlayer connection via 266 described later. In addition, since the inside surface 248a is curved as a whole, no angular part is formed in the periphery of the second recessed step 248, and concentration of stress on a specific part can be relaxed. Note that the light-shielding layer 216 shown in FIG. 19 can be formed by wet etching, for example, and, by appropriately controlling etching conditions at the time of wet etching, the peripheral edge portion 216b can be curved toward the inside of the light-shielding layer 216.

[Modification 3 of Recess]

As illustrated in FIG. 20, in sectional view, the inside surface 248a of the second recessed step 248 is curved toward the outside of the second recessed step 248. The aperture area of the second recessed step 248 gradually decreases from the front surface side (the first recessed step 247 side) toward the back surface side (the transfer base material 221 side). The diameter of the second recessed step 248 on the back surface side may be 50 to 90% of the diameter of the second recessed step 248 on the front surface side. Note that part (for example, the main surface 242a side) of the inside surface 248a may be rectilinear in shape, in sectional view.

In the case of forming such an inside surface 248a, the peripheral edge portion 216b of the light-shielding layer 216 of the mold 211 is curved toward the outside of the light-shielding layer 216. In this case, the peripheral edge portion 216b of the light-shielding layer 216 transmits only part of the light used for irradiation. Therefore, that region of the photo-curing insulating resist layer 232 which corresponds to the peripheral edge portion 216b becomes a region in which the degree of curing gradually varies according to the degree of transmission of light. Specifically, in a region where more light is transmitted, of the region corresponding to the peripheral edge portion 216b, curing advances more and the insulating material layer 233 is formed to be thicker, than in a region where less light is transmitted. By this, the inside surface 248a of the second recessed step 248 can be curved toward the outside of the second recessed step 248.

With the inside surface 248a of the second recessed step 248 thus curved toward the outside of the second recessed step 248, the area of the inside surface 248a is further enlarged, and, therefore, it is possible to further enhance the adhesion between the through-hole 246 and the interlayer connection via 266 described later. In addition, since the inside surface 248a is curved as a whole, no angular part is formed in the periphery of the second recessed step 248, and concentration of stress on a specific part can be relaxed. Note that the light-shielding layer 216 shown in FIG. 20 can be formed by wet etching, for example, and, by appropriately controlling etching conditions at the time of wet etching, the peripheral edge portion 216b can be curved toward the outside of the light-shielding layer 216.

According to the method of forming the pattern structure according to the present embodiment as described above, a pattern structure having through-holes for forming interlayer connection vias and recesses for forming wiring can be formed with high accuracy. The embodiment of the method of forming the pattern structure as aforementioned is illustrative and is not restrictive. For example, the light-shielding layer 216 may not be provided, and the second recessed step 248 may be formed by transferring the shape of the projected portion 215 of the mold 211. In addition, while a case where the through-hole 246 has two steps has been taken as an example in the above description, this is not restrictive, and the through-hole 246 may have three or more steps.

[Method of Manufacturing Wiring Structure]

Figure 21:
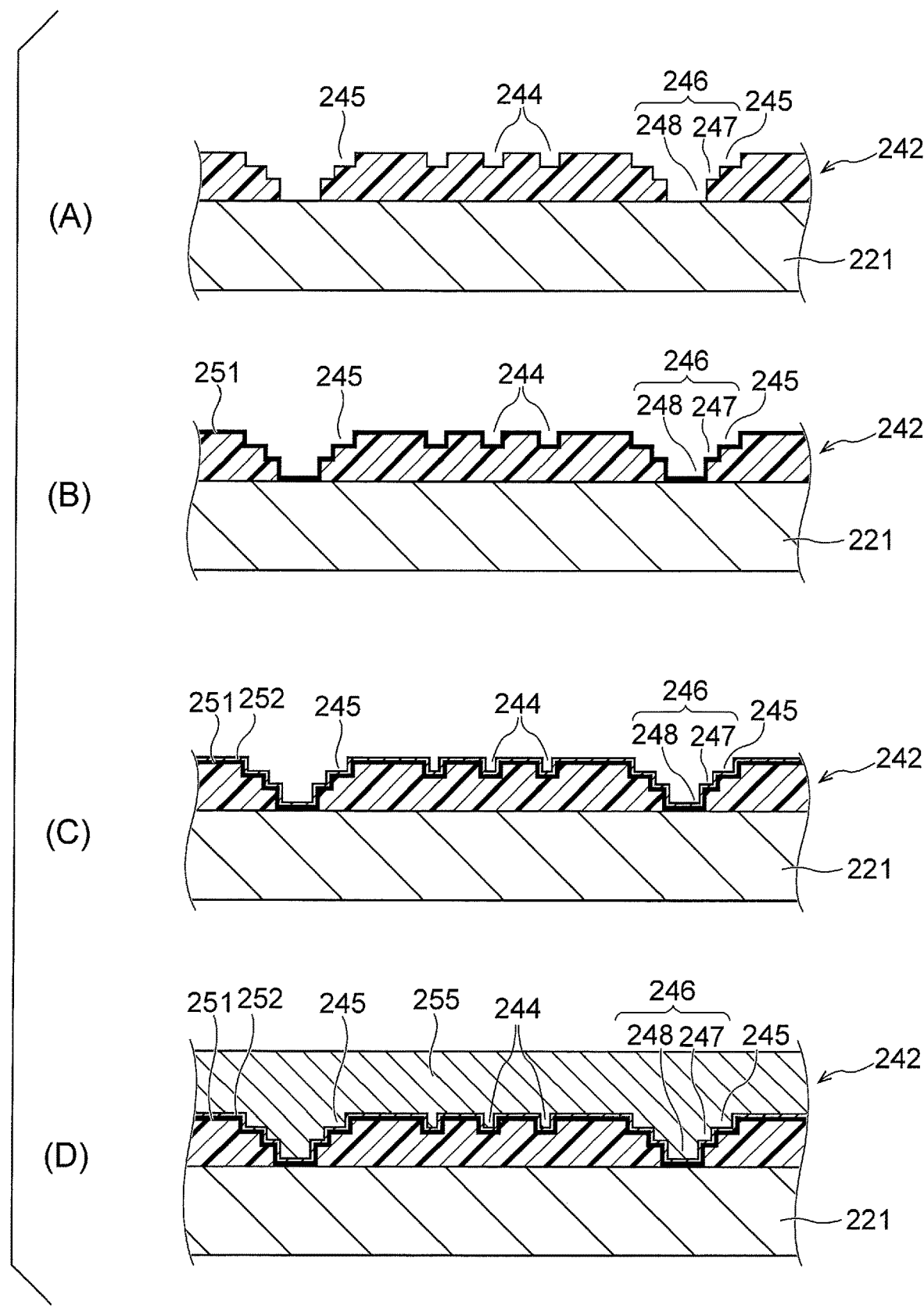
FIG. 21 is a process drawing showing a method of manufacturing a multilayer wiring structure according to the second embodiment of the present invention.
Figure 22:
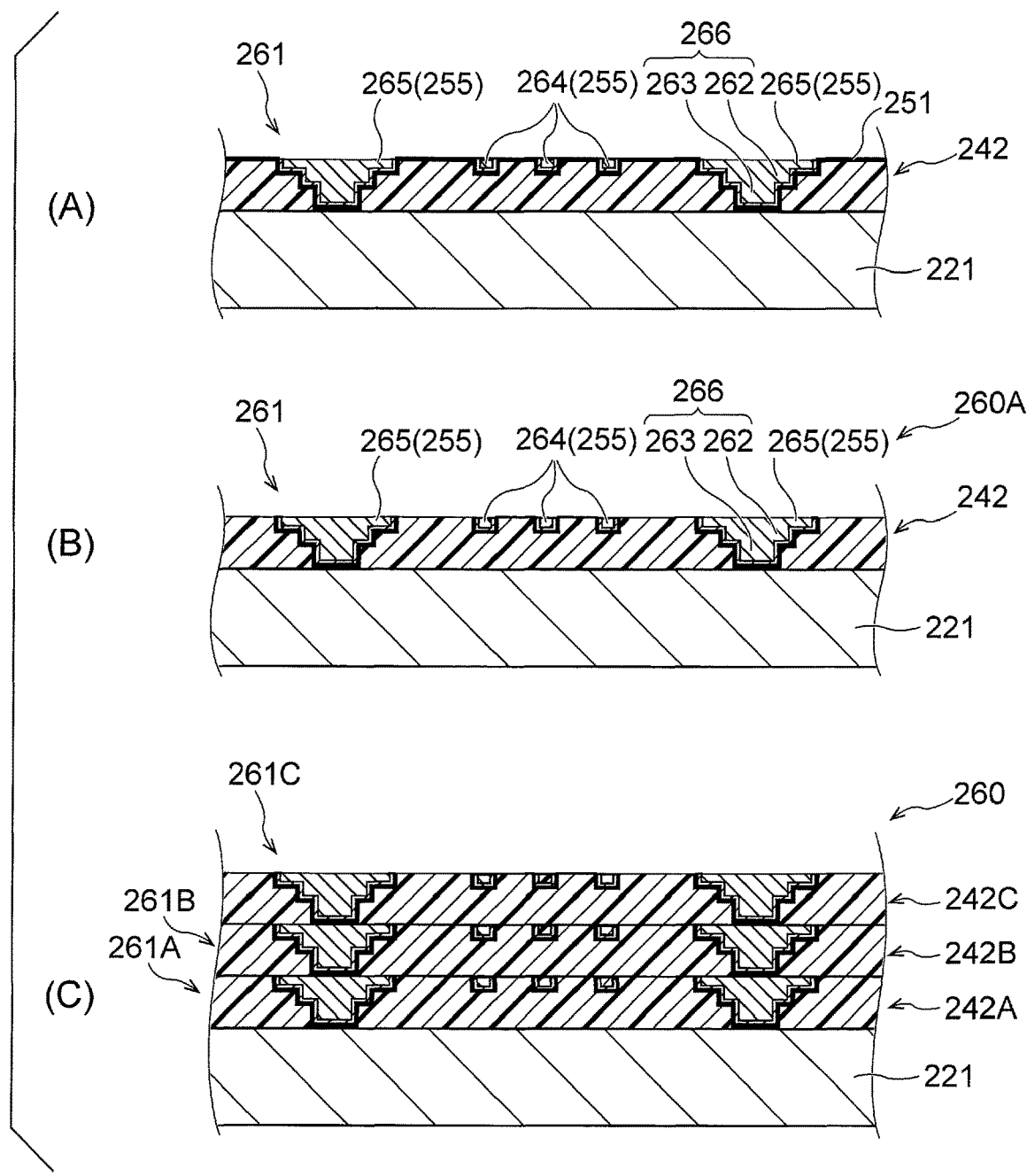
FIG. 22 is a process drawing showing the method of manufacturing the multilayer wiring structure according to the second embodiment of the present invention.

FIGS. 21 and 22 are process drawings showing a method of manufacturing a wiring structure according to the present embodiment. In the present embodiment, in a pattern structure forming step, an insulating pattern structure having recesses for forming wiring and through-holes for forming interlayer connection vias is formed on a transfer base material.

In FIG. 21 (A), there is shown a state in which a pattern structure 242 has been formed on a transfer base material 221, in the same manner as in the aforementioned method of forming the pattern structure according to the present embodiment. The transfer base material 221 may be one that has desired wiring and pad portions. The insulating pattern structure 242 thus formed has recesses 244 for forming wiring, recesses 245 for forming pad portions, and through-holes 246 for forming interlayer connection vias located in the recesses 245 for forming pad portions. The through-hole 246 has a stepped shape having at least two steps (in this case, two steps), and includes a first recessed step 247 on the front surface side (the recess 245 side) and a second recessed step 248 on the back surface side (the transfer base material 221 side).

Next, in a barrier layer forming step, the pattern structure 242 is formed with a conductor barrier layer 251 (FIG. 21 (B)). Note that in the illustrated example, the conductor barrier layer 251 is indicated by thick lines. This conductor barrier layer 251 is for preventing a component of a conductor layer formed in a later step from diffusing into the insulating pattern structure 242. The conductor barrier layer 251 may be formed from a material having a surface resistance of several tens of $\Omega/\square$, such as, for example, titanium compounds such as TiN, tungsten alloys, molybdenum alloys, silicon compounds such as SiN, nickel compounds such as NiP, cobalt compounds such as CoWP, and tantalum compounds such as TaN, and can be formed in a thickness in the range of 10 to 200 nm by a known vacuum film forming method such as a sputtering method.

Subsequently, in a seed layer forming step, a seed electrode layer 252 is formed on the conductor barrier layer 251 (FIG. 21 (C)). The seed electrode layer 252 is preferably formed from a material having a surface resistance of not more than $1\Omega/\square$, such as, for example, copper, nickel, or nickel-chromium alloy, and can be formed in a thickness in the range of 10 to 500 nm by a known vacuum film forming method such as a sputtering method.

Next, in a plating step, a conductor is deposited on the seed electrode layer 252 by electroplating, to form a conductor layer 255 in such a manner as to fill the recesses 244 for forming wiring, the recesses 245 for forming pad portions, and the through-holes 246 for forming interlayer connection vias located in the recesses 245 for forming pad portions (FIG. 21 (D)). The conductor layer 255 is for forming wiring and interlayer connection vias that constitute a wiring structure. The conductor layer 255 is preferably a material having a surface resistance of not more than 1Ω/□, such as, for example, copper, nickel, or nickel-chromium alloy. Such a conductor layer 255 can be formed to be thicker than the pattern structure 242 by an extent of several micrometers.

Subsequently, in a planarizing treatment step, the conductor layer 255 and the seed electrode layer 252 are polished, to leave the conductor layer 255 and the seed electrode layer 252 only in the recesses 244 for forming wiring, the recesses 245 for forming pad portions, and the through-holes 246 for forming interlayer connection vias located in the recesses 245 of the pattern structure 242 (FIG. 22 (A)). The polishing of the conductor layer 255 and the seed electrode layer 252 can be carried out, for example, with the conductor barrier layer 251 as a stopper of polishing, by using a metal such as titanium, tungsten, and molybdenum or an alloy compound containing one of the metals.

Thereafter, further, the exposed conductor barrier layer 251 is removed (FIG. 22 (B)). The conductor barrier layer 251 can be removed by conducting flash etching. Note that the conductor barrier layer 251 remains together with the seed electrode layer 252 at bottom portions of the through-holes 246 for forming interlayer connection vias, and, in the case where the transfer base material 221 has wiring and pad portions, the conductor barrier layer 251 is intermediately present between them and the conductor layer 255 in the through-holes 246. However, the conductor barrier layer 251 has a thickness in the range of 10 to 200 nm as above-mentioned, and, for this reason, even when the surface resistance is not less than several tens of Ω/□, it does not give any trouble to the conduction function of the interlayer connection vias.

By the above-mentioned series of steps, one wiring layer 261 can be formed on the transfer base material 221. By the pattern structure 242 thus formed on the transfer base material 221 and the wiring layer 261 embedded in the pattern structure 242, a wiring structure 260A is obtained. The wiring layer 261 has wiring 264, pad portions 265, and interlayer connection vias 266 connected to the pad portions 265. The pad portions 265 and the interlayer connection vias 266 are comprised of the same material (the conductor layer 255) and are united with each other.

In addition, the interlayer connection via 266 has a stepped shape having at least two steps (in this case, two steps), and includes a first projected step 262 on the front surface side (the pad portion 265 side) and a second projected step 263 on the back surface side (the transfer base material 221 side). In this case, the pad portion 265, the first projected step 262 and the second projected step 263 are each in a cylindrical shape. In the section shown in FIG. 22 (B), a side surface of the second projected step 263 of the interlayer connection via 266 is perpendicular to the front surface of the transfer base material 221, but this is not restrictive; the side surface of the second projected step 263 may be inclined relative to the front surface of the transfer base material 221, or may be curved toward the inside or outside of the second projected step 263 (see FIGS. 18 to 20).

In the present embodiment, by repeating the above-mentioned series of steps a desired number of times, a multiplicity of desired wiring layers can be formed. FIG. 22 (C) shows an example in which by repeating the above-described series of steps three times, three wiring layers 261 consisting of a wiring layer 261A disposed on a pattern structure 242A, a wiring layer 261B disposed on a pattern structure 242B, and a wiring layer 261C disposed on a pattern structure 242C are formed. By this, a multilayer wiring structure 260 of a three-layer structure can be obtained on the transfer base material 221. Note that in the pattern structure 242 formed as aforementioned, in the case where the plurality of recesses 245 for forming pad portions include those separate from the recess 244 for forming wiring, the pad portions 265 formed in such pad portion forming recesses 245 become dummy pad portions which are not connected to the wiring 264. However, for securing uniformity of strength in plane of the multilayer wiring structure 260, the presence of the dummy pad portions thus not connected is advantageous.

According to the method of manufacturing the multilayer wiring structure by the present embodiment as described above, it is possible, in forming the pattern structure 242, to form the through-holes 246 for forming interlayer connection vias and the recesses 245 for forming pad portions and the recesses 244 for forming wiring, simultaneously and with high accuracy, and, therefore, the multilayer wiring structure 260 can be manufactured easily and with high accuracy. The embodiment of the method of manufacturing the multilayer wiring structure as aforementioned is illustrative and is not restrictive.

As has been described above, according to the present embodiment, the through-holes 246 of the pattern structure 242 have a stepped shape having at least two steps, and, therefore, that region of the through-hole 246 which is on the transfer base material 221 side is narrower. This ensures that the resin (the insulating material layer 233) constituting the pattern structure 242 can be disposed in a larger amount on the transfer base material 221 side. In general, of the resin constituting the pattern structure 242, the region located on the back surface side (the transfer base material 221 side) is fixed to the transfer base material 221 and is therefore insusceptible to cure shrinkage, but the resin located on the front surface side (the side opposite to the transfer base material 221) is susceptible to cure shrinkage. According to the present embodiment, the resin constituting the pattern structure 242 is disposed in a larger amount on the transfer base material 221 side, so that the resin can be made liable to shrink more on the transfer base material side 221. By this, a good balance can be obtained between cure shrinkage of the resin on the front surface side (the side opposite to the transfer base material 221) and cure shrinkage of the resin on the back surface side (the transfer base material 221 side), and warping of the pattern structure 242 as a whole can be relaxed. As a result, flatness of the multilayer wiring structure 260 is secured, and a semiconductor device 2100 high in reliability can be obtained.

In addition, according to the present embodiment, since the through-holes 246 have a stepped shape having at least two steps, adhesion between the interlayer connection via 266 and the through-hole 246 can be enhanced, and a trouble of dislodging of the interlayer connection via 266 from the through-hole 246 can be prevented.

Besides, according to the present embodiment, the projected portions 215 of the imprint mold 211 have a stepped shape having at least two steps. By this, the spacing between the light-shielding layers 216 of the imprint mold 211 and the transfer base material 221 can be shortened, and, therefore, the second recessed steps 248 of the through-holes 246 can be formed to be small. In this case, the second projected steps 263 of the interlayer connection vias 266 are also formed to be small, so that the lands on the transfer base material 221 side can be reduced in size, and, as a result, semiconductor device 2100 with a finer pitch can be realized.

[Semiconductor Device]

Figure 23:
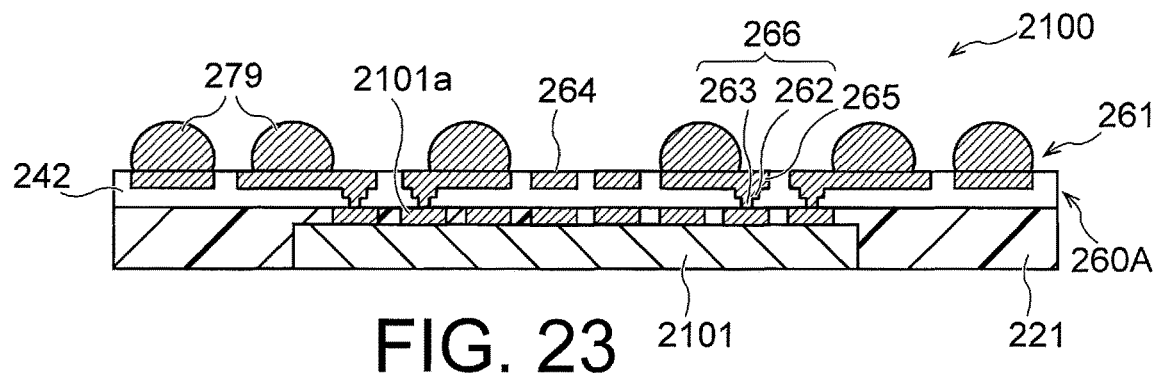
FIG. 23 is a schematic sectional view showing a semiconductor device according to the second embodiment of the present invention.

FIG. 23 is a schematic partial sectional view showing an example of a semiconductor device (package, electronic device) according to the present embodiment. The semiconductor device illustrated in FIG. 23 is produced by use of the aforementioned wiring structure 260A.

The semiconductor device 2100 shown in FIG. 23 has a wiring structure 260A composed of one layer, and a semiconductor element 2101 fixed to the wiring structure 260A.

The wiring structure 260A has a pattern structure 242 formed on a transfer base material 221, and a wiring layer 261 embedded in the pattern structure 242; the wiring layer 261 has wiring 264, pad portions 265, and interlayer connection vias 266 connected to the pad portions 265. The interlayer connection via 266 has a stepped shape having at least two steps (in this case, two steps), and includes a first projected step 262 on the front surface side (the pad portion 265 side) and a second projected step 263 on the back surface side (the transfer base material 221 side).

In this case, the transfer base material 221 is comprised of a sealing resin which seals the semiconductor element 2101. In other words, the semiconductor element 2101 is embedded in the transfer base material 221 which is the sealing resin.

In the case of producing such a semiconductor device 2100, the semiconductor elements 2101 are first prepared, and the semiconductor elements 2101 are sealed by the transfer base material 221 (sealing resin) in a state in which terminals 2101a of the semiconductor elements 2101 are exposed. Next, using the transfer base material 221 in which the semiconductor elements 2101 are embedded, a wiring structure 260A composed of one layer is produced, in substantially the same manner as described above (FIGS. 14, 15, 21 and 22). Thereafter, solder balls 279 are provided respectively at the pad portions 265 of the wiring structure 260A, whereby the semiconductor device 2100 shown in FIG. 23 is obtained.

[Modifications of Semiconductor Device]

FIGS. 24 to 29 are schematic sectional views showing various modifications (Modifications 1 to 5) of the semiconductor device. In FIGS. 24 to 29 the same parts as those in the embodiments shown in FIGS. 12 to 23 are denoted by the same reference symbols as used above, and detailed descriptions thereof will be omitted.

[Modification 1 of Semiconductor Device]

Figure 24:
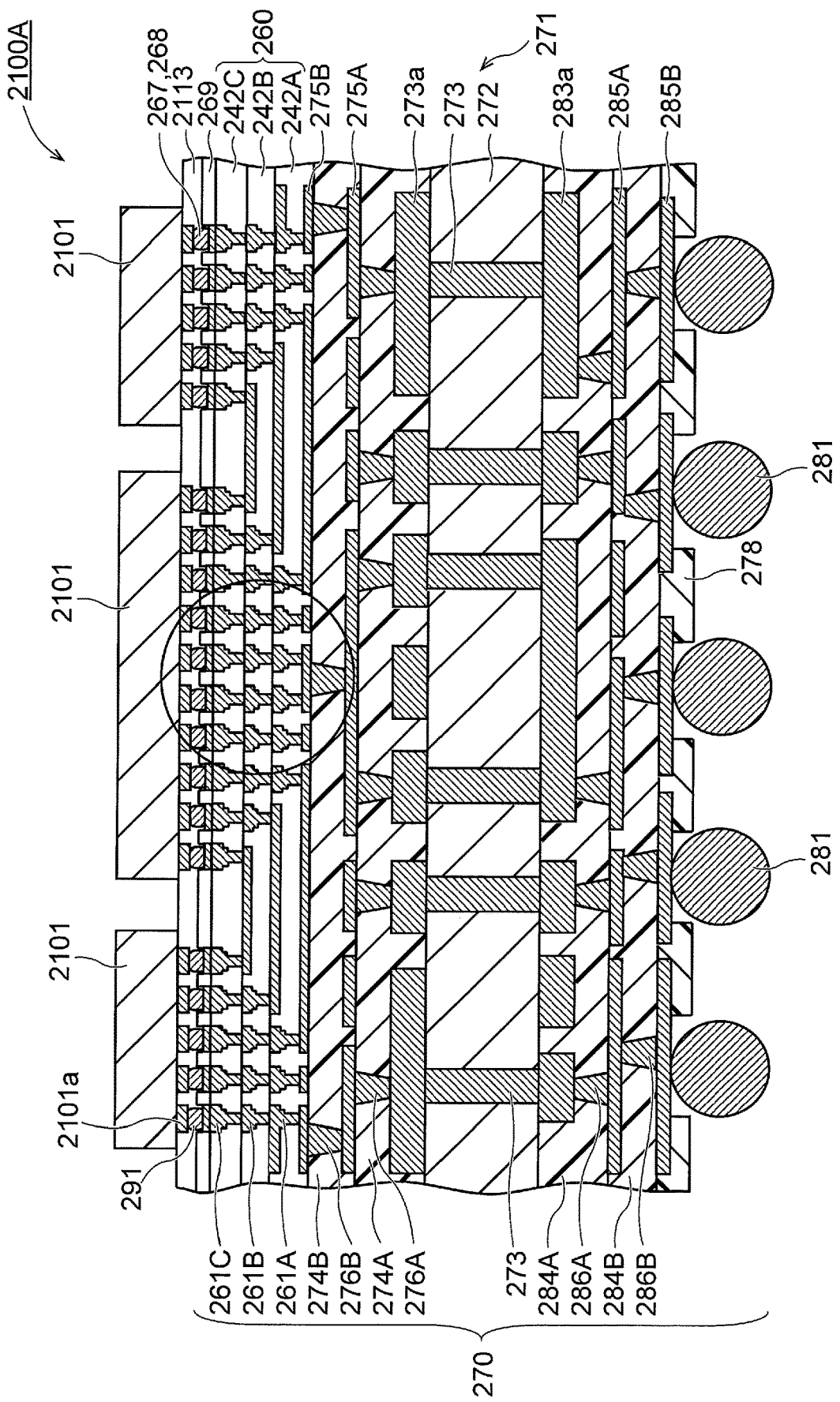
FIG. 24 is a schematic partial sectional view showing a semiconductor device according to a modification of the second embodiment of the present invention.
Figure 25:
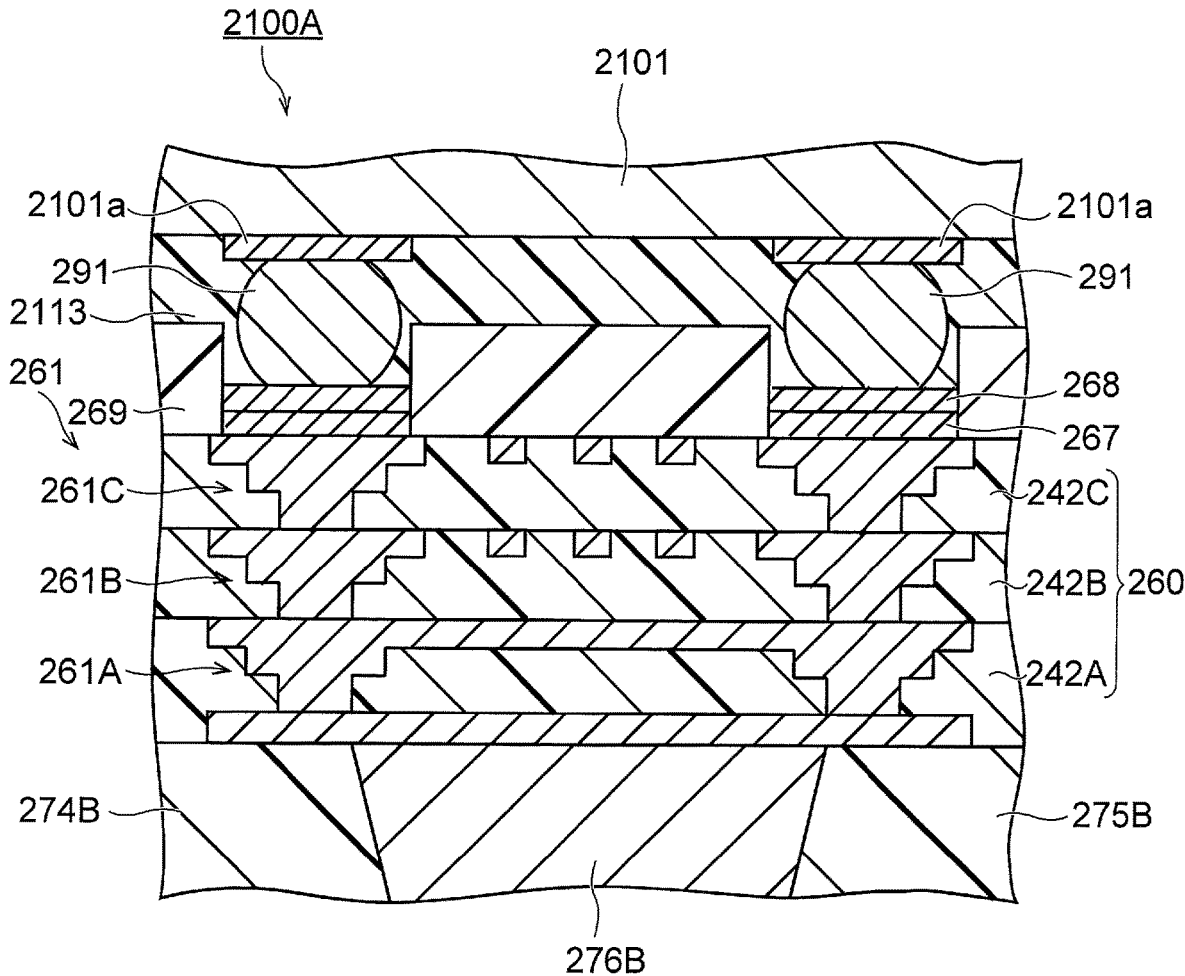
FIG. 25 is an enlarged sectional view of a part surrounded by a circle in FIG. 24.

FIG. 24 is a schematic partial sectional view showing a modification (Modification 1) of the semiconductor device, and FIG. 25 is an enlarged sectional view of the part surrounded by a circle in FIG. 24.

In FIGS. 24 and 25, a semiconductor device 2100A (2.1D mounted type) is one in which a multilayer wiring structure 260 composed of three layers is formed on a core substrate 271, and semiconductor elements 2101 are mounted through connection pads 291. In this modification, the multilayer wiring structure 260 can be manufactured by the method of manufacturing a multilayer wiring structure according to the present embodiment described above, and description thereof is omitted here. Note that in FIG. 24, for avoiding complication of the drawing, pattern structures 242A, 242B and 242C as interlayer insulating layers constituting the multilayer wiring structure 260 and a solder resist 269 and an underfill resin 2113 are not given slant lines. In addition, in the example illustrated, the semiconductor elements 2101 are given slant lines in a unified manner, independently of the structures thereof.

The core substrate 271 has a multilayer structure which includes a core base material 272, and a plurality of conductor layers 275A, 275B, 285A and 285B stacked on both sides of the core base material 272 through insulating layers 274A, 274B, 284A and 284B.

The core base material 272 has a plurality of face-back conduction via portions 273 penetrating the core base material 272, conductor layers 273a connected to the predetermined face-back conduction via portions 273 at a front surface (in the illustrated example, the side of the surface where the multilayer wiring structure 260 is disposed) of the core base material 272, and conductor layers 283a connected to the predetermined face-back conduction via portions 273 at a back surface of the core base material 272.

Such a core base material 272 may be an electrically insulating material such as, for example, glass cloth-containing epoxy resin, bismaleimide triazine resin, polyphenylene ether resin, and aramid resin. On the front surface side of the core base material 272, the conductor layers 275A and 275B are stacked through the insulating layers 274A and 274B. Besides, the conductor layers 273a and the conductor layers 275A located on upper and lower sides with the insulating layer 274A therebetween are connected by interlayer connection bodies 276A, and the conductor layers 275A and the conductor layers 275B located on upper and lower sides with the insulating layer 274A therebetween are connected by interlayer connection bodies 276B.

In addition, on the back surface side of the core base material 272, the conductor layers 285A and 285B are stacked through the insulating layers 284A and 284B. Besides, the conductor layers 283a and the conductor layers 285A located on upper and lower sides with the insulating layer 284A therebetween are connected by interlayer connection bodies 286A, and the conductor layers 285A and the conductor layers 285B located on upper and lower sides with the insulating layer 284B therebetween are connected by interlayer connection bodies 286B. In addition, a solder resist 278 is disposed in such a manner that desired parts of the conductor layer 285B are exposed, and solder balls 281 are provided at the exposed conductor layer 285B.

The conductor layers 275B located on the front surface side of the core substrate 271 are pad portions, and the multilayer wiring structure 260 is disposed in such a manner as to be in connection with the pad portions. The multilayer wiring structure 260 has wiring layers 261 composed of three layers, namely, wiring layers 261A, 261B and 261C, and the semiconductor elements 2101 are mounted on the pad portions of the wiring layer 261C through the connection pads 291.

In the example illustrated, nickel layers 267 and gold layers 268 are provided on the wiring layer 261C of the multilayer wiring structure 260, and a solder resist 269 is disposed in such a manner as to expose the nickel layers 267 and the gold layers 268. Besides, the connection pads 291, by being thermocompression bonded, connect the gold layers 268 with the terminals 2101a of the semiconductor elements 2101. In addition, a gap between the semiconductor element 2101 and the multilayer wiring structure 260 is filled with an underfill resin 2113, which is formed by placing a thermosetting resin to fill the gap and curing the resin by heating. The plurality of semiconductor elements 2101 mounted in this way may be different kinds of semiconductor elements.

In FIGS. 24 and 25, the core substrate 271 including at least the core base material 272 and the multilayer wiring structure 260 disposed on the core substrate 271 constitute a semiconductor element mounting substrate 270. In the present embodiment, such a semiconductor element mounting substrate 270 is also provided.

[Modification 2 of Semiconductor Device]

Figure 26:
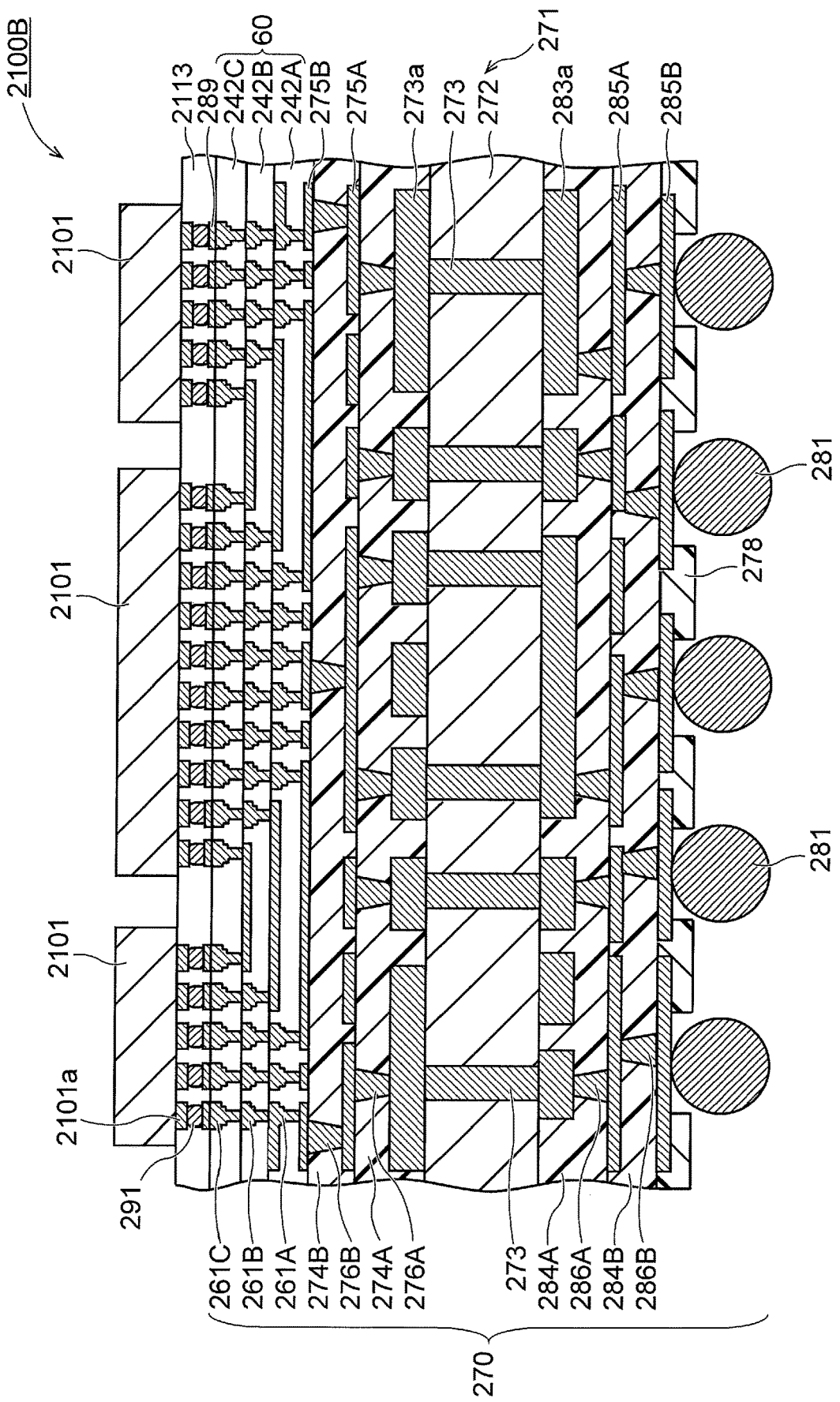
FIG. 26 is a schematic partial sectional view showing a semiconductor device according to a modification of the second embodiment of the present invention.

FIG. 26 is a schematic sectional view showing a modification (Modification 2) of the semiconductor device. A semiconductor device 2100B (2.1D mounted type) shown in FIG. 26 is one in which, unlike in the semiconductor device 2100A shown in FIGS. 24 and 25, the solder resist 269, the nickel layers 267 and the gold layers 268 are not provided, but copper bumps 289 are formed on the wiring layer 261C of the multilayer wiring structure 260. Connection pads 291 are provided on the copper bumps 289, and semiconductor elements 2101 are mounted through the connection pads 291. The other points of configuration are substantially the same as in the semiconductor device 2100A shown in FIGS. 24 and 25.

[Modification 3 of Semiconductor Device]

Figure 27:
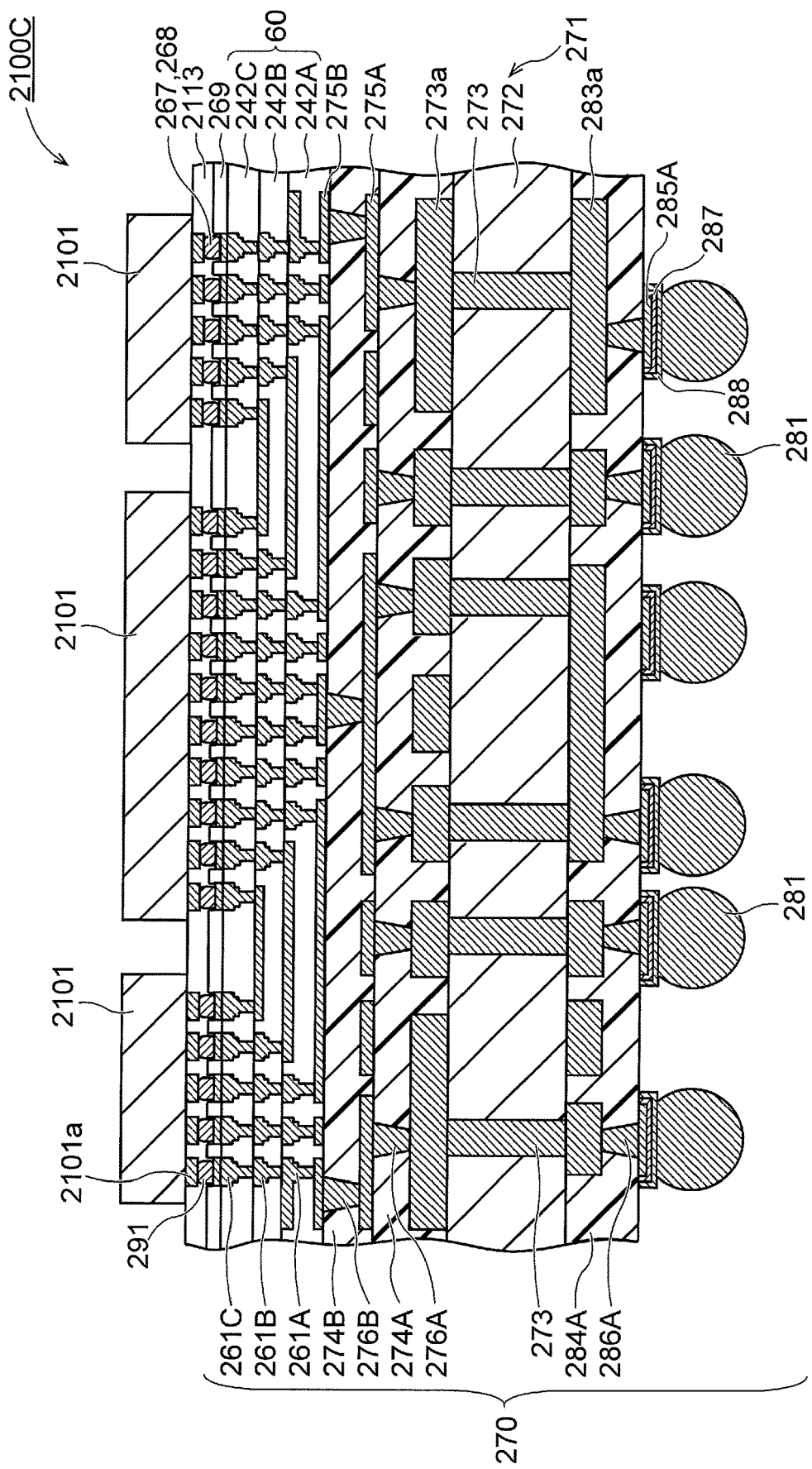
FIG. 27 is a schematic partial sectional view showing a semiconductor device according to a modification of the second embodiment of the present invention.

FIG. 27 is a schematic sectional view showing a modification (Modification 3) of the semiconductor device. A semiconductor device 2100C (Si/glass core type) shown in FIG. 27 has a configuration in which an insulating layer 284A as a single layer is formed on the back surface side of a core base material 272, unlike the semiconductor device 2100A shown in FIGS. 24 and 25. In addition, on the back surface side of the core base material 272, a conductor layer 285A is stacked through the insulating layer 284A, and conductor layers 283a and conductor layers 285A located on upper and lower sides with the insulating layer 284A therebetween are connected by interlayer connection bodies 286A. Nickel layers 287 and gold layers 288 are stacked on the conductor layers 285A, and solder balls 281 are provided on the gold layers 288. Note that the core base material 272 may be an electrically insulating material such as, for example, silicon or glass. The other points of configuration are substantially the same as in the semiconductor device 2100A shown in FIGS. 24 and 25.

[Modification 4 of Semiconductor Device]

Figure 28:
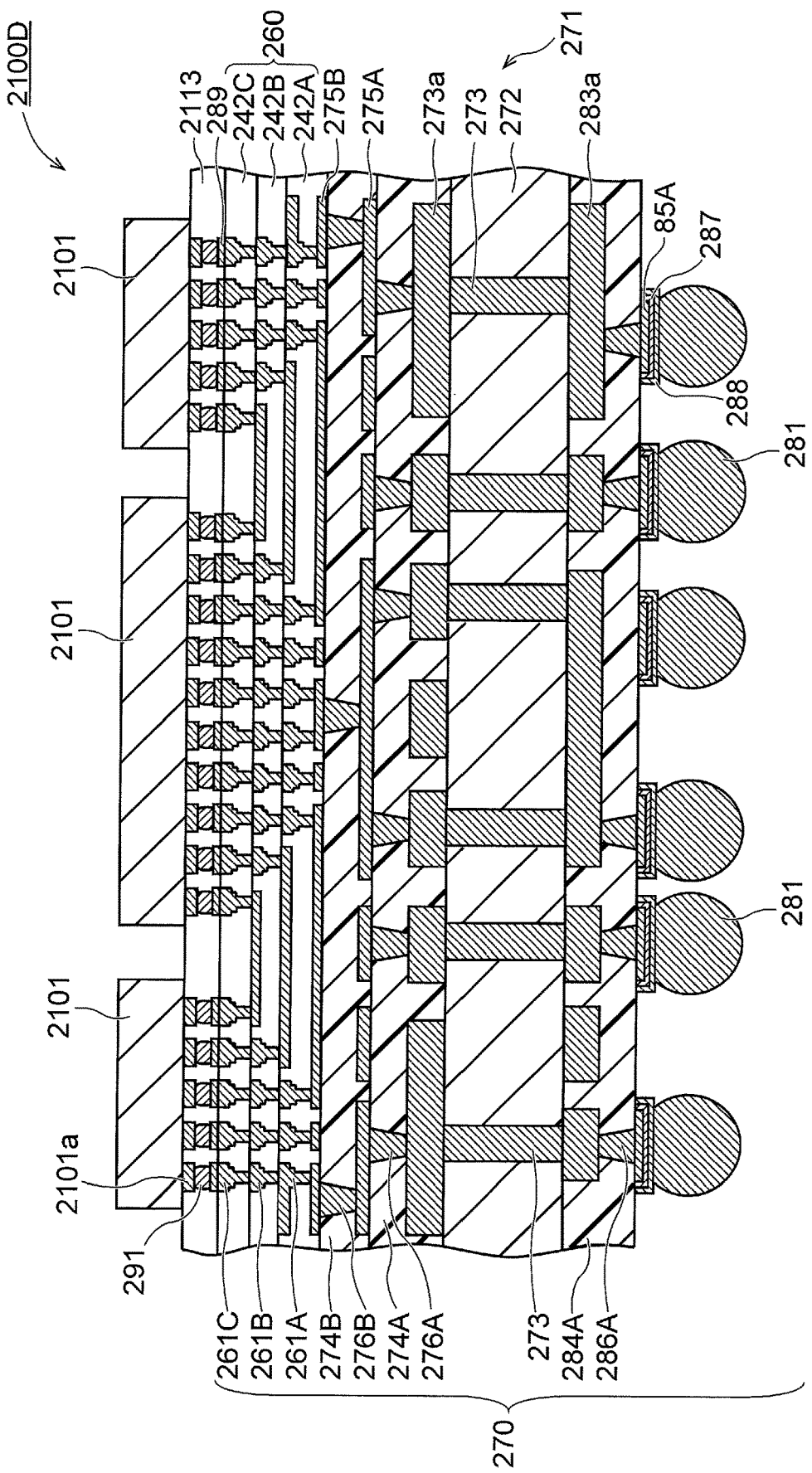
FIG. 28 is a schematic partial sectional view showing a semiconductor device according to a modification of the second embodiment of the present invention.

FIG. 28 is a schematic sectional view showing a modification (Modification 4) of the semiconductor device. A semiconductor device 2100D (Si/glass core type) shown in FIG. 28 is one in which, unlike in the semiconductor device 2100C shown in FIG. 27, the solder resist 269, the nickel layers 267 and the gold layers 268 are not provided, but copper bumps 289 are formed on the wiring layer 261C of the multilayer wiring structure 260. Connection pads 291 are provided on the copper bumps 289, and semiconductor elements 2101 are mounted through the connection pads 291. The other points of configuration are substantially the same as in the semiconductor device 2100C shown in FIG. 27.

[Modification 5 of Semiconductor Device]

Figure 29:
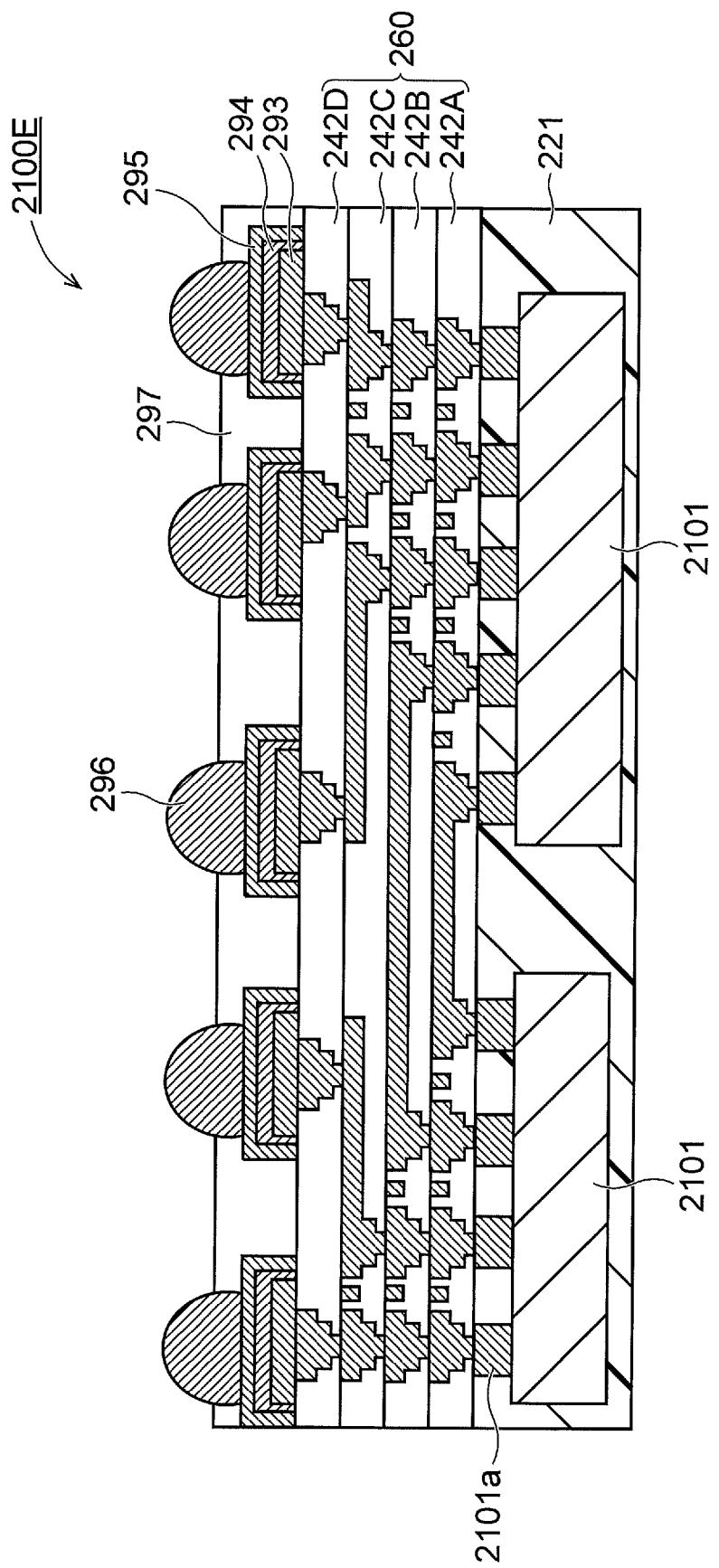
FIG. 29 is a schematic sectional view showing a semiconductor device according to a modification of the second embodiment of the present invention.

FIG. 29 is a schematic sectional view showing a modification (Modification 5) of the semiconductor device. A semiconductor device 2100E (FO-WLP type) shown in FIG. 29 has a multilayer wiring structure 260 composed of four layers, and semiconductor elements 2101 fixed to the multilayer wiring structure 260.

Of these components, the multilayer wiring structure 260 has pattern structures 242A, 242B, 242C and 242D formed over a transfer base material 221. Note that the multilayer wiring structure 260 can be manufactured by the method of manufacturing a multilayer wiring structure according to the present embodiment described above, and description thereof is omitted here.

In this case, the transfer base material 221 is comprised of a sealing resin that seals the semiconductor elements 2101. In other words, the semiconductor elements 2101 are embedded in the transfer base material 221 which is the sealing resin.

Conductor layers 293 of copper, for example, are provided on the multilayer wiring structure 260; nickel layers 294 and gold layers 295 are stacked on the conductor layers 293; and solder balls 296 are provided on the gold layers 295. In addition, a solder resist 297 is disposed on the multilayer wiring structure 260 in such a manner as to expose the solder balls 296.

In the case of producing such a semiconductor device 2100E, the semiconductor elements 2101 are first prepared, and the semiconductor elements 2101 are sealed by the transfer base material 221 (sealing resin) in a state in which terminals 2101a of the semiconductor elements 2101 are exposed to the front surface side. Next, using the transfer base material 221 (sealing resin) in which the semiconductor elements 2101 are embedded, the multilayer wiring structure 260 is produced in substantially the same manner as described above (FIGS. 14, 15, 21 and 22). Thereafter, the conductor layers 293, the nickel layers 294 and the gold layers 295 are sequentially formed over the multilayer wiring structure 260, and the solder balls 296 are provided on the gold layers 295. Thereafter, the solder resist 297 is provided in the surroundings of the solder balls 296, whereby the semiconductor device 2100E shown in FIG. 29 is obtained.

In the semiconductor device 2100E shown in FIG. 29, a structure is provided in which the pattern structures 242A, 242B, 242C and 242D are stacked on only one side of the transfer base material 221. Therefore, as the pattern structures 242A, 242B, 242C and 242D are stacked one after another, the tendency toward warping of the resin constituting the pattern structures 242A, 242B, 242C and 242D increases. In accordance with the present embodiment, the through-holes 246 have the stepped shape having at least two steps, whereby warping of the resin can be relaxed even in the semiconductor device 2100E of such a structure in which warping is liable to occur.

Third Embodiment

A third embodiment of the present invention will be described below, referring to the drawings.

Note that the drawings are schematic or conceptual, and the sizes of members, the size ratios between the members and the like are not necessarily the same as the practical ones, and even the same member or the like may be represented in the respective drawings in mutually different sizes or ratios.

[Imprint Mold]

Figure 30:
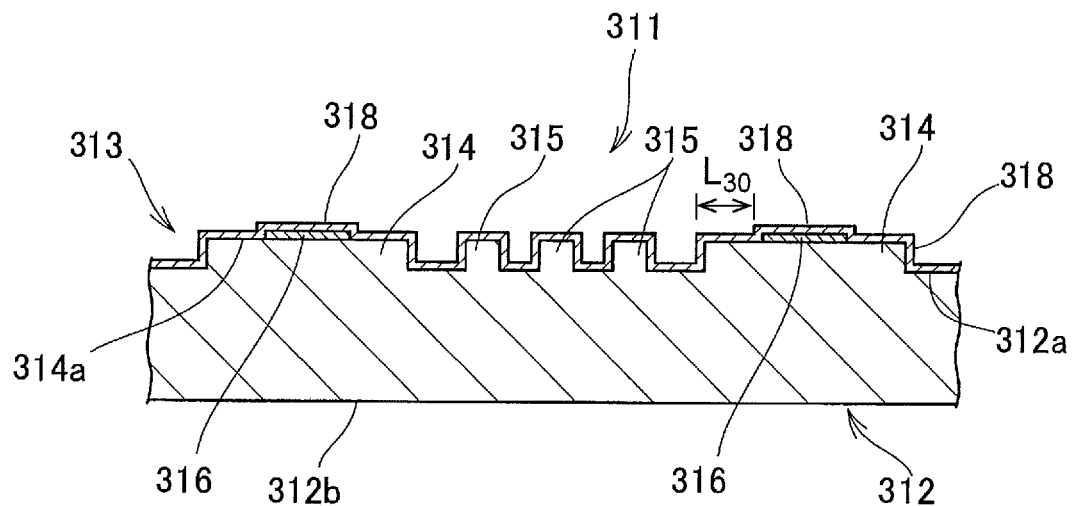
FIG. 30 is a sectional view for explaining an imprint mold according to a third embodiment of the present invention.

FIG. 30 is a sectional view for explaining an imprint mold according to the present embodiment. In FIG. 30, an imprint mold 311 is an example of a mold for forming an electrically insulating pattern structure having recesses for forming wiring in an upper layer and through-holes for forming interlayer connection vias, on a transfer base material provided with wiring and pad portions. The mold 311 has a mold base material 312, and a rugged structure 313 located at a main surface 312a of the mold base material 312. In the rugged structure 313 possessed by the mold 311, projected portions 314 and projected portions 315 are present. The projected portions 314 are projected portions for forming the pattern structure with recesses for forming pad portions, and their plan-view shape is not limited and may be a circular shape, for example. A light-shielding layer 316 is located at a central portion of a top portion flat surface 314a of the projected portion 314. The light-shielding layer 316 is a light-shielding layer for forming a through-hole for forming an interlayer connection via for connecting wiring layers located on upper and lower sides with an insulating layer therebetween, in the recess for forming the pad portion of the pattern structure. On the other hand, the projected portions 315 are projected portions for forming the pattern structure with recesses for forming wiring, and they are linear in plan-view shape. Besides, in the mold 311, a protective film 318 is so located as to cover the projected portions 314, the projected portions 315 and the light-shielding layers 316. Note that though not illustrated, linearly shaped projected portions 315 are led out from the desired projected portions 314.

In the case where a to-be-molded resin material used in imprint is photo-curing, a material permitting transmission therethrough of irradiation light for curing the resin material can be used as the material of the mold base material 312; for example, there can be used not only glasses such as quartz glass, silicate glass, calcium fluoride, magnesium fluoride, acrylic glass, etc. but also sapphire, gallium nitride, and, further, resins such as polycarbonate, polystyrene, acrylics, polypropylene, etc. or arbitrary laminates of them. In the case where the to-be-molded resin material for use is not photo-curing, the mold 311 may not have a light-transmitting property, and, other than the above-mentioned materials, there can be used, for example, silicon, metals such as nickel, titanium, aluminum, etc. and their alloys, oxides, nitrides or arbitrary laminates thereof.

The thickness of the mold base material 312 can beset taking the strength, handleability and the like of the material into consideration; for example, the thickness can be appropriately set within the range of about 300 μm to about 10 mm. Note that the main surface 312a side of the mold base material 312 may be a projected structure of two or more steps, or a so-called mesa structure; in this case, the uppermost step is the main surface 312a, and the rugged structure 313 is located at the main surface 312a.

The projected portions 314 possessed by the mold 311 are projected portions for forming the pattern structure with recesses for forming pad portions as above-described. In the case where the projected portions 314 are circular in plan-view shape; for example, the diameter of the projected portions 314 can be appropriately set within the range of 5 to 20 μm, and their height from the main surface 312a can be appropriately set within the range of 0.5 to 10 μm.

In addition, the projected portions 315 are projected portions for forming the pattern structure with recesses for forming wiring as above-mentioned; for example, their width can be appropriately set within the range of 0.5 to 10 μm, and their height from the main surface 312a can be appropriately set within the range of 0.5 to 10 μm.

Besides, the light-shielding layers 316 located at central portions of the top portion flat surfaces 314a of the projected portions 314 are layers capable of shielding light to such an extent that photo-curing of the photo-curing to-be-molded resin material by light irradiation from the other surface 312b side of the mold base material 312 doe not occur, in the imprint conducted using the to-be-molded resin material. Such a light-shielding layer 316 can be, for example, a layer having an optical density (OD) of not less than 2, preferably not less than 3, and examples of such a material include chromium, molybdenum, titanium, aluminum, silver, and nickel. The thickness of the light-shielding layer 316 can be appropriately set in such a manner as to obtain an optical density of not less than 2. For example, in the case where the material of the light-shielding layer 316 is chromium, the thickness is preferably about 50 to 150 nm. If the thickness of the chromium-made light-shielding layer 316 is less than 50 nm, the optical density would be less than 2, so that the light-shielding property is insufficient. Particularly in the case of using a light source with high illuminance, it is preferable, for obtaining a higher light-shielding property, that the thickness of the chromium-made light-shielding layer 316 is not less than 100 nm. On the other hand, if the thickness of the chromium-made light-shielding layer 316 exceeds 150 nm, internal stress of the light-shielding layer 316 would be high, so that peeling would easily occur, and durability would be lowered, which is unfavorable. In the example illustrated, the light-shielding layer 316 is located substantially in the center of the top portion flat surface 314a; in this case, the distance $L_{30}$ from an outer edge of the light-shielding layer 316 to a peripheral edge of the top portion flat surface 314a can be set within the range of 2 to 8 μm.

The protective film 318, which has an oxidation-resisting property, is for the purpose of protecting the light-shielding layers 316, in a treatment conducted using a chemical liquid containing a strong oxidizer for removing adherent matter, such as insulating material and foreign matter, adhering to the mold 311. The material of the protective film 318 may be an inorganic silicon compound having a silicon group, such as silicon oxide, silicon nitride and silicon carbide, and such an inorganic silicon compound is excellent in adhesion to the mold base material 312 and the light-shielding layers 316. Such a protective film 318 can have a thickness in the range of 40 to 120 nm, preferably 40 to 100 nm. If the thickness of the protective film 318 is less than 40 nm, the protection of the light-shielding layers 316 in the treatment conducted using a chemical liquid containing a strong oxidizer may be impossible to perform sufficiently. On the other hand, if the thickness exceeds 120 nm, internal stress of the protective film 318 would be high, peeling would easily occur, and durability would be lowered, which is unfavorable.

Figure 31:
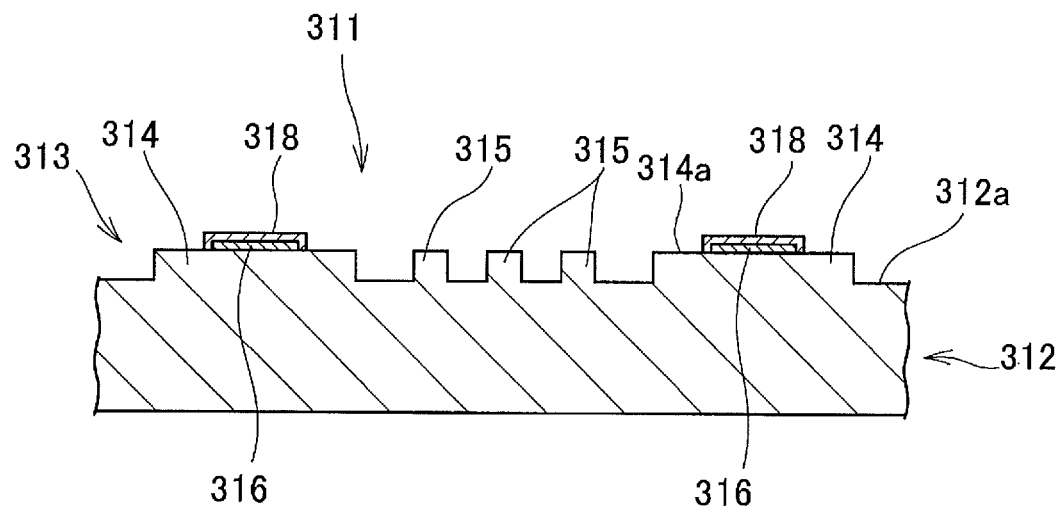
FIG. 31 is a sectional view for explaining a modification of the imprint mold according to the third embodiment of the present invention.

In the example shown in FIG. 30, the protective film 318 is located over the whole region on the main surface 312a side of the mold base material 312 such as to cover the projected portions 314, the projected portions 315 and the light-shielding layers 316. However, the mold 311 may have a protective film 318 such as to completely cover the light-shielding layers 316 only, as shown in FIG. 31.

Figure 32:
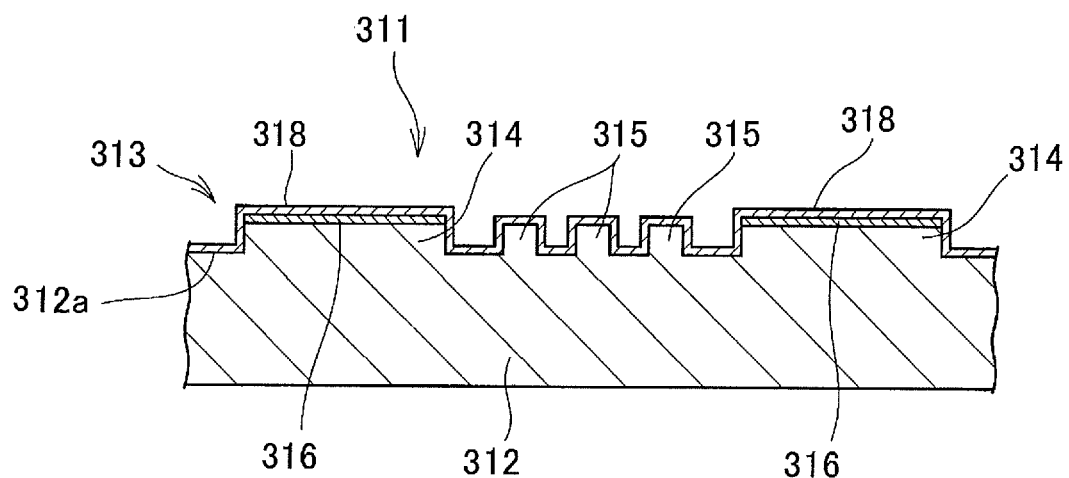
FIG. 32 is a sectional view for explaining a modification of the imprint mold according to the third embodiment of the present invention.

In addition, the mold 311 may have light-shielding layers 316 over the whole regions of the top portion flat surfaces 314a of the projected portions 314, as illustrated in FIG. 32.

Figure 33:
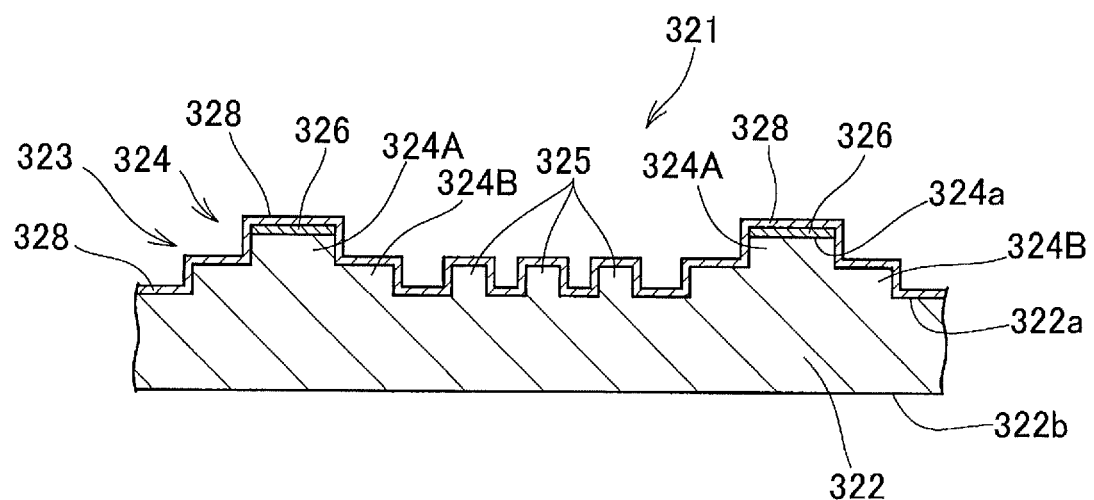
FIG. 33 is a sectional view for explaining a modification of the imprint mold according to the third embodiment of the present invention.

FIG. 33 is a sectional view for explaining a modification of the imprint mold according to the present embodiment. In FIG. 33, an imprint mold 321 is also an example of a mold for forming an electrically insulating pattern structure having recesses for forming wiring in an upper layer and through-holes for forming interlayer connection vias, on a transfer base material provided with wiring and pad portions. The mold 321 has a mold base material 322, and a rugged structure 323 located at a main surface 322a of the mold base material 322. The rugged structure 323 possessed by the mold 321 has a plurality of projected portions located at the main surface 322a, and the projected portions are composed of two or more kinds of projected portions differing in height from the main surface 322a. In the illustrated example, the rugged structure 323 has projected portions 324 comparatively greater in height from the main surface, and projected portions 325 comparatively smaller in height from the main surface. The higher projected portions 324 are projected portions for forming the pattern structure with recesses for forming pad portions, and for forming through-holes for forming interlayer connection vias, in the recesses for forming pad portions. On the other hand, the lower projected portions 325 are projected portions for forming the pattern structure with recesses for forming a wiring layer as an upper layer.

In the example illustrated, the projected portion 324 has a two-step structure comprised of a base portion 324B for forming a pad portion which is located on the base material 322 side, and a column-shaped top portion 324A for forming an interlayer connection via which is located substantially in the center of the base portion 324B. Besides, the mold 321 has light-shielding layers 326 on top portion flat surfaces 324a of the top portions 324A of the projected portions 324, and, further, has a protective film 328 such as to cover the projected portions 324, the projected portions 325 and the light-shielding layers 326. Note that though not illustrated, linearly shaped projected portions 325 are led out from the base portions 324B of the desired projected portions 324.

The material and thickness of the mold base material 322 can be the same or similar to those of the mold base material 312 in the mold 311 described above.

The base portions 324B of the projected portions 324 of the mold 321 are projected portions for forming the pattern structure with recesses for forming pad portions as described above. In the case where the base portions 324B are circular in plan-view shape, the diameter of the base portions 324B can be appropriately set within the range of 10 to 30 μm, and their height from the main surface 312a can be appropriately set within the range of 0.5 to 10μ, for example. On the other hand, the top portions 324A of the projected portions 324 are projected portions for forming the pattern structure with through-holes for forming interlayer connection vias, as above-mentioned. In the case where the top portions 324A are circular in plan-view shape, the diameter of the top portions 324A can be appropriately set within the range of 5 to 20 μm, and their height from the base portions 324B can be appropriately set within the range of 0.5 to 10 μm, for example.

The material and thickness of the light-shielding layers 326 of the mold 321 can be the same or similar to those of the light-shielding layers 316 in the mold 311 described above.

The protective film 328, which has an oxidation-resisting property, is for the purpose of protecting the light-shielding layers 326, in a treatment conducted using a chemical liquid containing a strong oxidizer for removing adherent matter, such as an insulating material and foreign matter, adhering to the mold 321. The material and thickness of the protective film 328 can be the same or similar to those of the protective film 318 in the mold 311 described above.

The embodiment of the imprint mold as aforementioned is illustrative, and the present invention is not to be limited to the embodiment. For example, while the rugged structures 313, 323 have the circularly shaped projected portions 314, 324 and the linearly shaped projected portions 315, 325 in the above-described embodiment, the rugged structure may have three or more kinds of projected portions. Besides, the light-shielding layers provided at desired parts of the top portion flat surfaces of the projected portions may include light-shielding layers with an optical density of less than 2, in addition to the light-shielding layers with an optical density of not less than 2. By this configuration, in the pattern structure formed, recesses with depths according to the light-shielding performances of the light-shielding layers can be formed.

Such an imprint mold is given an excellent oxidation-resisting property by the protective film, so that a lowering in the function of the light-shielding layers is prevented even upon removal of adhering foreign matter and the like; by this, pattern structures having recesses differing in depths can be formed with high accuracy and repeatedly.

Here, referring to FIG. 34, an example of formation of a pattern structure by use of the imprint mold of the present invention will be described.

Figure 34:
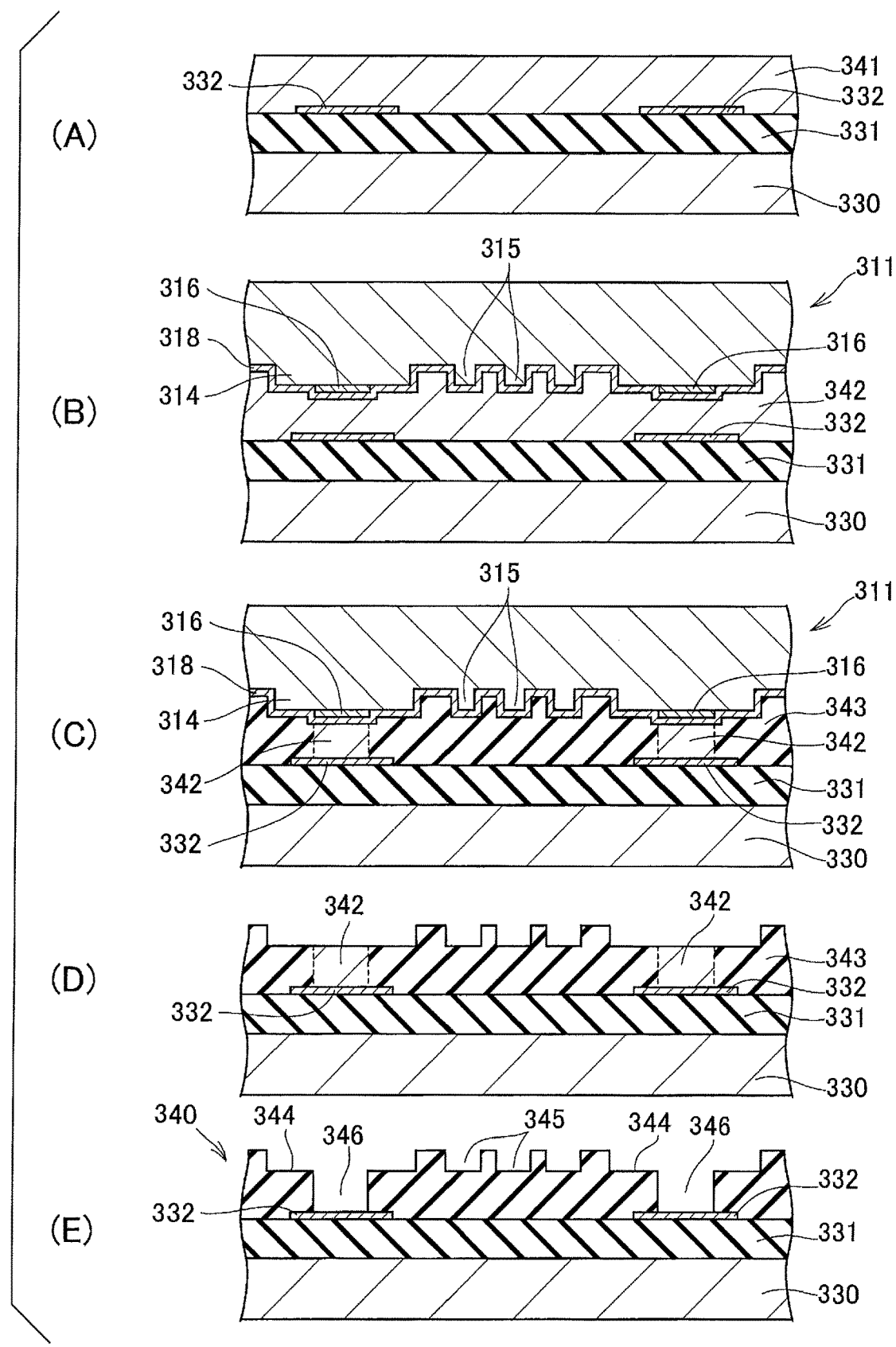
FIG. 34 is a process drawing for explaining a formation example of a pattern structure using the imprint mold according to the third embodiment of the present invention.

FIG. 34 is a process drawing for explaining an example of formation of a pattern structure by use of the imprint mold of the present invention, and shows an example in which the aforementioned imprint mold 311 is used.

In this example of formation of a pattern structure, the object of formation of the pattern structure is an insulating layer 331 which is located on a transfer base material 330 and which has conduction pad portions 332. A photo-curing insulating resist 341 as a to-be-molded resin material is supplied onto the insulating layer 331 (FIG. 34 (A)). While the insulating layer 331 has only the conduction pad portions 332 in the illustration, the insulating layer 331 may be one that has desired wiring.

Next, the aforementioned imprint mold 311 and the transfer base material 330 are brought close to each other, to spread the photo-curing insulating resist 341 between the mold 311 and the insulating layer 331, thereby forming a photo-curing insulating resist layer 342 (FIG. 34 (B)).

Next, irradiation with light from the mold 311 side is conducted to cure the photo-curing insulating resist layer 342, thereby forming an insulating material layer 343, while leaving uncured the photo-curing insulating resist layer 342 located between the light-shielding layers 316 of the mold 311 and the insulating layer 331 (FIG. 34 (C)). For preventing the generation of a problem in which the light used for irradiation from the mold 311 side comes around into a gap between the light-shielding layers 316 of the mold 311 and the insulating layer 331 to cause curing of the photo-curing insulating resist layer 342 located beneath the light-shielding layers 316, it is preferable to use parallel light as the irradiation light.

Thereafter, the mold 311 is released from the insulating material layer 343 and the remaining photo-curing insulating resist layer 342 (FIG. 34 (D)).

Subsequently, the insulating material layer 343 is developed, to remove the remaining photo-curing insulating resist layer 342 (FIG. 34 (E)). By this, a state is obtained in which an insulating pattern structure 340 having recesses 344 for forming pad portions, through-holes 346 for forming interlayer connection vias which are located in the recesses 344, and recesses 345 for forming wiring is located on the insulating layer 331.

Figure 35:
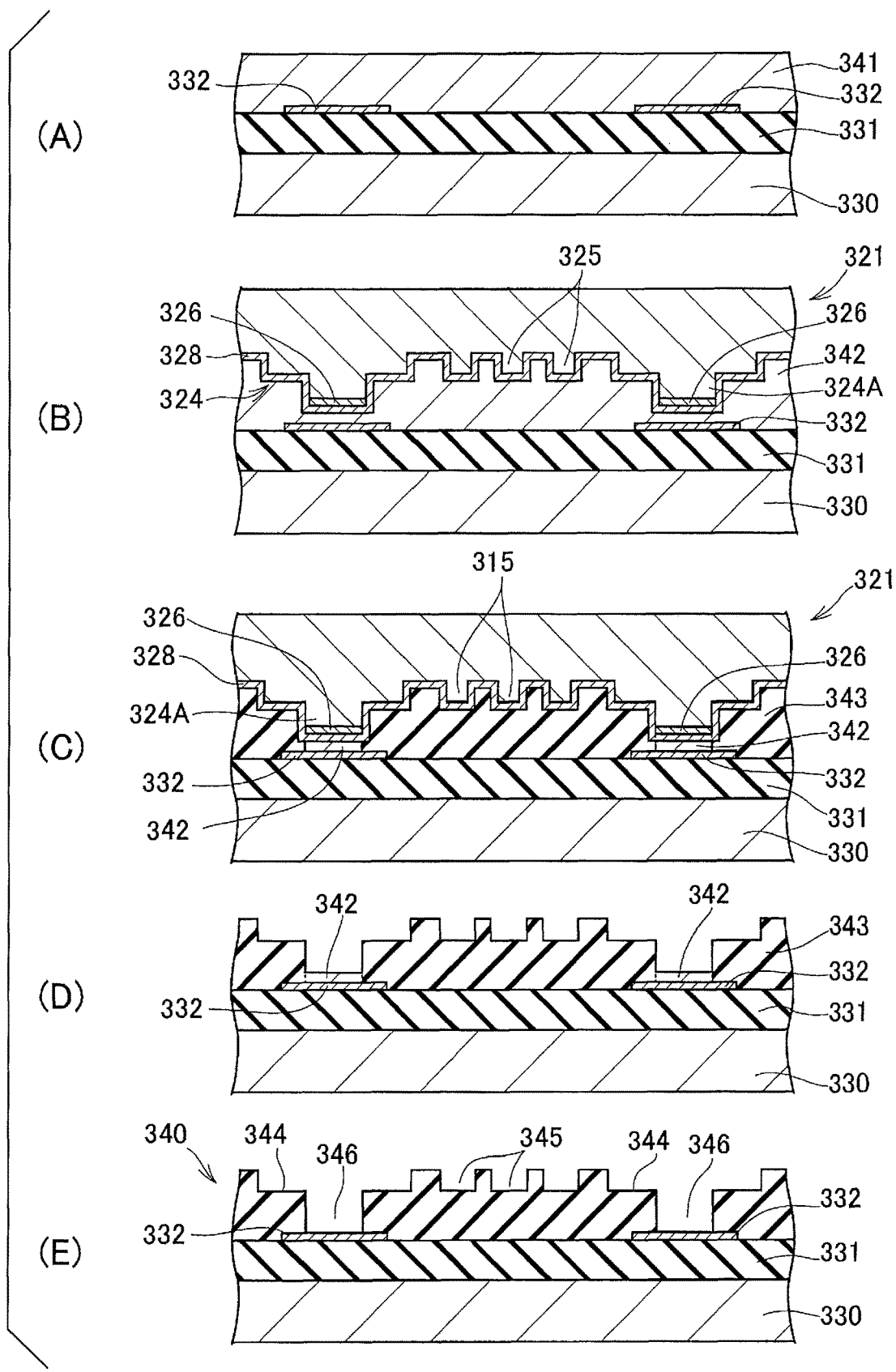
FIG. 35 is a process drawing for explaining another formation example of a pattern structure using the imprint mold according to the third embodiment of the present invention.

In addition, FIG. 35 is a process drawing for explaining another example of formation of a pattern structure by use of the imprint mold of the present invention, and shows an example in which the aforementioned imprint mold 321 is used.

In this example of formation of a pattern structure, also, a photo-curing insulating resist 341 as a to-be-molded resin material is supplied onto an insulating layer 331 (FIG. 35 (A)).

Next, the aforementioned imprint mold 321 and a transfer base material 330 are brought close to each other, to spread the photo-curing insulating resist 341 between the mold 321 and the insulating layer 331, thereby forming a photo-curing insulating resist layer 342 (FIG. 35 (B)).

Subsequently, irradiation with light from the mold 321 side is conducted, to cure the photo-curing insulating resist layer 342, thereby forming an insulating material layer 343, while leaving uncured the photo-curing insulating resist layer 342 located between the light-shielding layers 326 of the mold 321 and the insulating layer 331 (FIG. 35 (C)). This mold 321 has the light-shielding layers 326 provided on top portion flat surfaces 324a of top portions 324A of projected portions 324. As compared to the aforementioned mold 311, the mold 321 has the gap between the light-shielding layer 326 and the insulating layer 331 being narrower, so that the possibility that the light used for irradiation from the mold 311 side would come around into the gap between the light-shielding layer 326 of the mold 311 and the insulating layer 331 to cause curing of the photo-curing insulating resist layer 342 located beneath the light-shielding layer 326 is lower in the case of the mold 321. However, it is preferable, for further enhancing the accuracy of the pattern structure to be formed, to use parallel light as the irradiation light.

Next, the mold 321 is released from the insulating material layer 343 and the remaining photo-curing insulating resist layer 342 (FIG. 35 (D)).

Subsequently, the insulating material layer 343 is developed, to remove the remaining photo-curing insulating resist layer 342 (FIG. 35 (E)). By this, a state is obtained in which an insulating pattern structure 340 having recesses 344 for forming pad portions, through-holes 346 for forming interlayer connection vias which are located in the recesses 344, and recesses 345 for forming wiring is located on the insulating layer 331.

[Method of Manufacturing Imprint Mold]

A method of manufacturing an imprint mold of the present invention will be described below.

Figure 36:
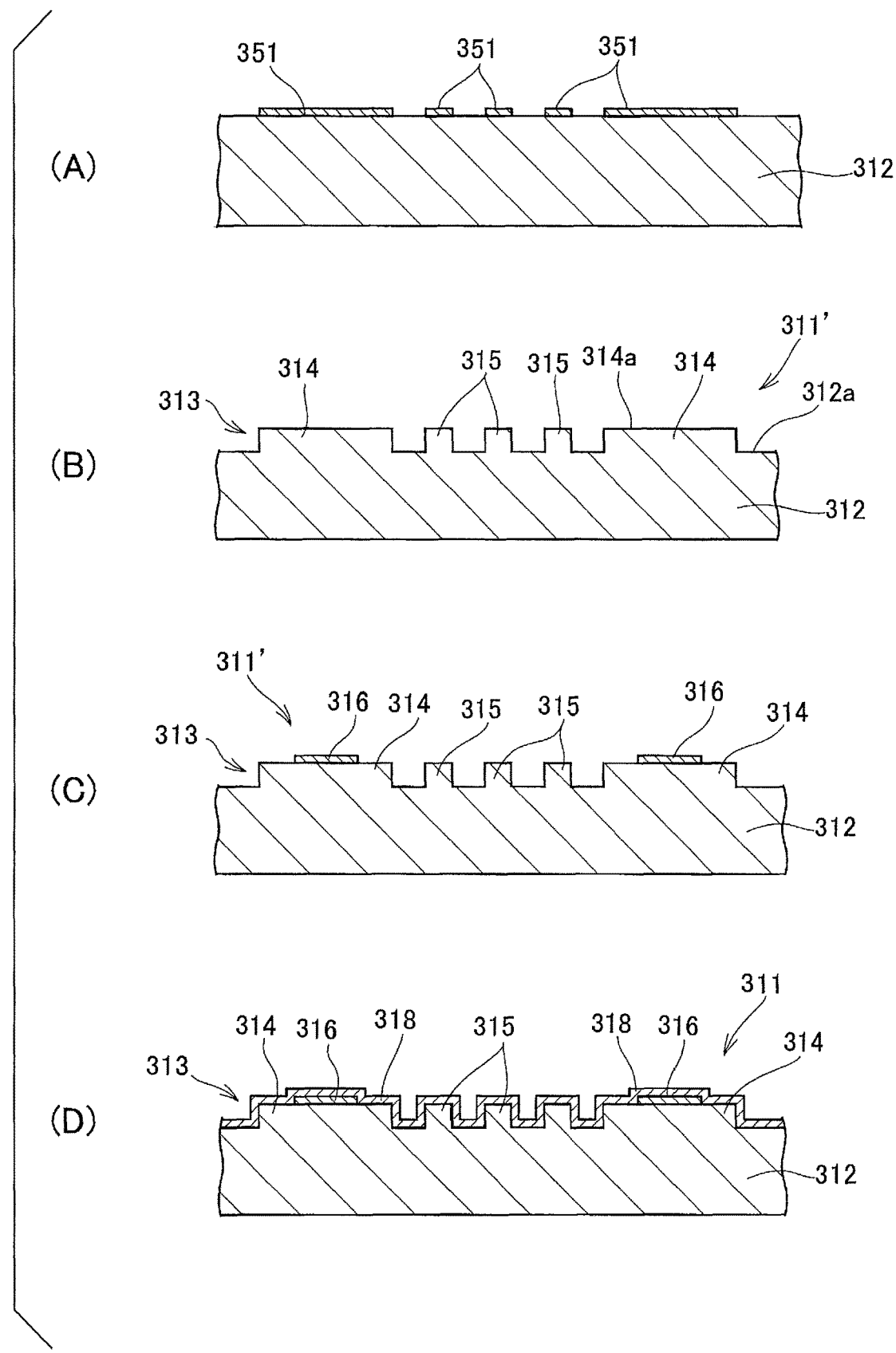
FIG. 36 is a process drawing for explaining a method of manufacturing an imprint mold according to the third embodiment of the present invention.

FIG. 36 is a process drawing for explaining a method of manufacturing an imprint mold according to the present embodiment, and shows as an example a case of manufacturing the mold 311 of the present invention shown in FIG. 30.

In the present embodiment, a hard mask 351 is formed in a desired pattern shape on a mold base material 312 (FIG. 36 (A)). Then, with the hard mask 351 as an etching mask, the mold base material 312 is etched, after which the hard mask 351 is removed. By this, the mold base material 312 is formed with projected portions 314 and 315 (FIG. 36 (B)). The formation of the hard mask 351 on the mold base material 312 can be carried out, for example, by forming a hard mask material layer on the mold base material 312, forming a resist pattern on the hard mask material layer by an imprint method or a photolithographic method, and etching the hard mask material layer through the resist pattern. The thickness of such a hard mask 351 can be about 10 to 20 nm, for example.

Next, light-shielding layers 316 are formed on desired parts of top portion flat surfaces 314a of the projected portions 314 formed as above-mentioned (FIG. 36 (C)). The light-shielding layers 316 can be formed by providing a resist pattern such as to expose desired parts of the top portion flat surfaces 314a of the projected portions 314, forming a light-shielding layer in a thickness of, for example, about 50 to 150 nm through the resist pattern by use of a known vacuum film forming method such as a sputtering method, and thereafter removing the resist pattern and lifting off the surplus of light-shielding layer. In addition, the light-shielding layers 316 can be formed on desired parts of the top portion flat surfaces 314a of the projected portions 314, by forming a light-shielding layer in a thickness of, for example, about 50 to 150 nm on a mold 311' in such a manner as to cover the projected portions 314 and 315, providing a resist pattern such as to cover the light-shielding layer located on desired parts of the top portion flat surfaces 314a of the projected portions 314, and thereafter etching the light-shielding layer through the resist pattern. Note that in the method of manufacturing the imprint mold 311 shown in FIG. 32, also, the light-shielding layers 316 can be similarly formed on the top portion flat surfaces 314a of the projected portions 314.

Note that in the case where the material of the above-mentioned hard mask 351 is suitable for the light-shielding layer 316, the thickness of the hard mask 351 formed in a desired pattern shape on the mold base material 312, illustrated in FIG. 36 (A), can be set to be about 50 to 150 nm. Then, with the hard mask 351 as an etching mask, the mold base material 312 is etched, and, while leaving the hard mask 351 as it is, a resist pattern provided in a desired shape such as to cover only the hard mask 351 located on the top portion flat surfaces 314a of the projected portions 314. Thereafter, the hard mask 351 is etched through this resist pattern, whereby the light-shielding layers 316 can be formed on desired parts of the top portion flat surfaces 314a of the projected portions 314 (FIG. 36 (C)).

By this, preparation of the mold 311' having the mold base material 312 and a rugged structure 313 located at a main surface 312a of the mold base material 312, in which the rugged structure 313 has a plurality of projected portions 314 and 315 located at the main surface 312a and the light-shielding layers 316 are provided on the top portion flat surfaces 314a of the projected portions 314, is completed.

Subsequently, a protective film 318 having an oxidation-resisting property is formed on the main surface 312a side in such a manner as to cover the light-shielding layers 316 (FIG. 36 (D)). By this, an imprint mold 311 is obtained. The formation of the protective film 318 can be carried out, for example, by forming a thin film of an inorganic silicon compound containing a silicon group, such as silicon oxide and silicon nitride, by use of a known vacuum film forming method such as a sputtering method. The thickness of the protective film 318 can be in the range of, for example, 40 to 120 nm, preferably 40 to 100 nm. If the thickness of the protective film 318 is less than 40 nm, protection of the light-shielding layers 316 in a treatment conducted using a chemical liquid containing a strong oxidizer may be impossible to perform sufficiently. On the other hand, if the thickness exceeds 120 nm, internal stress of the protective film 318 would be high, peeling would easily occur, and durability would be lowered, which is unfavorable.

Besides, in the case of manufacturing the imprint mold 311 shown in FIG. 31, the protective film 318 can be formed by providing a resist pattern on the above-mentioned mold 311' in such a manner as to expose the light-shielding layers 316, forming a thin film of an inorganic silicon compound through the resist pattern by a known vacuum film forming method such as a sputtering method, and removing the resist pattern and lifting off the surplus thin film of the inorganic silicon compound.

Figure 37:
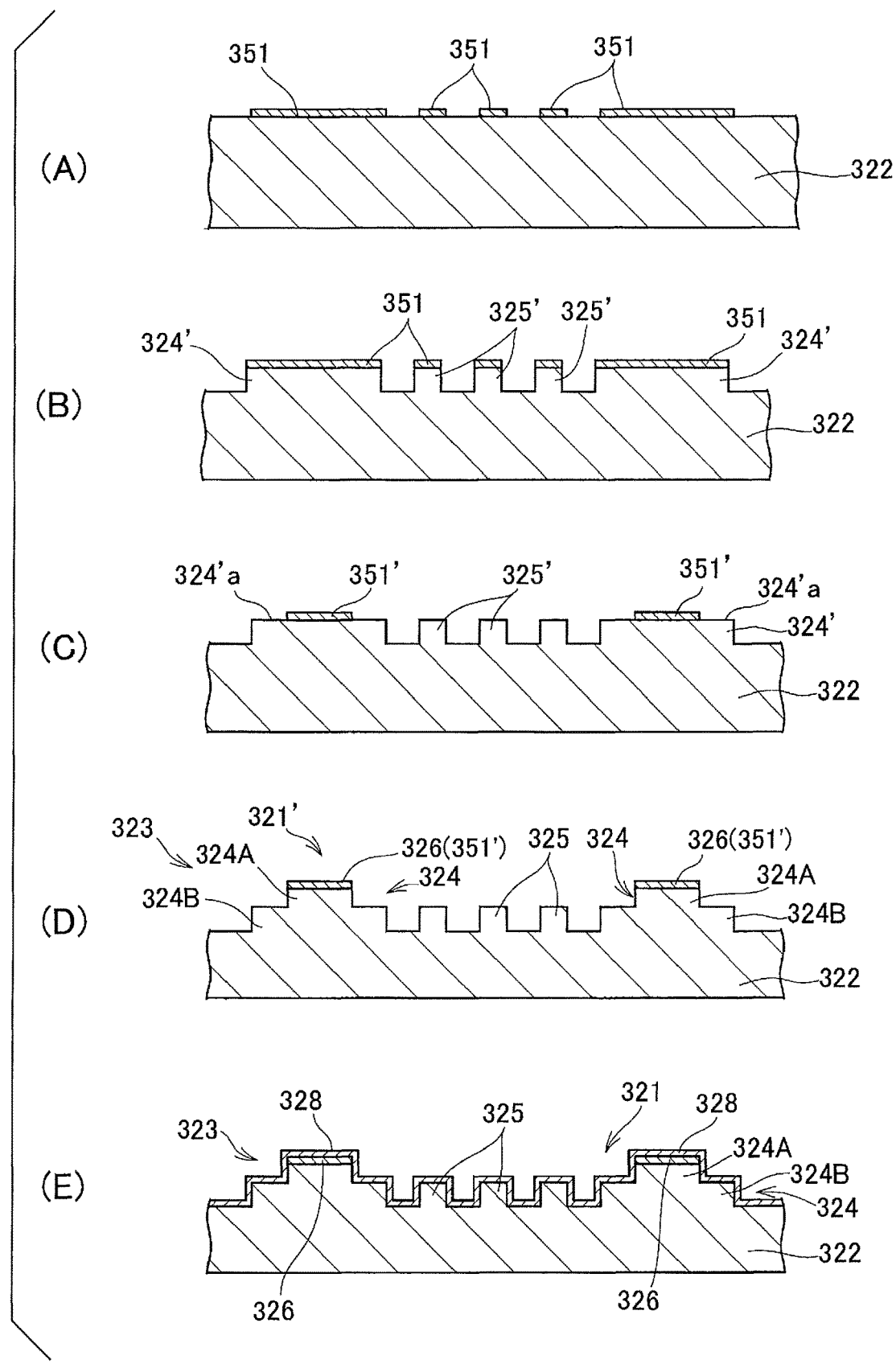
FIG. 37 is a process drawing for explaining the method of manufacturing the imprint mold according to the third embodiment of the present invention.

FIG. 37 is a process drawing for explaining a modification of the method of manufacturing the imprint mold according to the present embodiment, and shows as an example a case of manufacturing the aforementioned mold 321 of the present invention.

This modification is an example in which a hard mask is suitable for the light-shielding layers 326 constituting the mold 321 of the present invention, and the hard mask is used as the light-shielding layers. First, a hard mask 351 is formed in a desired pattern shape on a mold base material 322 (FIG. 37 (A)). The formation of the hard mask 351 on the mold base material 322 can be carried out, for example, by forming a hard mask material layer on the mold base material 322, forming a resist pattern on the hard mask material layer by an imprint method or a photolithographic method, and etching the hard mask material layer through this resist pattern. The thickness of such a hard mask 351 can be, for example, about 50 to 150 nm.

Next, with this hard mask 351 as an etching mask, the mold base material 322 is etched. By this, the mold base material 322 is formed with projected portions 324' and 325' for forming projected portions 324 and 325 (FIG. 37 (B)). On such projected portions 324' and 325', the hard mask 351 is present.

Subsequently, a resist pattern in a desired shape is formed such as to cover only the hard mask 351 located on top portion flat surfaces 324'a of the projected portions 324', and the hard mask 351 is etched through this resist pattern, whereby a state is obtained in which the hard mask 351' is present on desired parts of the top portion flat surfaces 314a of the projected portions 314 (FIG. 37 (C)). Then, with this hard mask 351' as an etching mask, the mold base material 322 is etched further (FIG. 37 (D)). By this, a mold 321' having the mold base material 322 and a rugged structure 323 located at a main surface 322a of the mold base material 322 is obtained. The rugged structure 323 of the mold 321' has projected portions 324 comparatively greater in height from the main surface 322a and projected portions 325 comparatively smaller in height from the main surface, in which the higher projected portions 324 have a two-step structure composed of a base portion 324B located on the base material 322 side and a column-shaped top portion 324A located substantially in the center on the base portion 324B. In addition, light-shielding layers 326 consisting of the hard mask 351' are located on the top portion flat surfaces 324a of the top portions 324A of the projected portions 324.

Note that in the case where the hard mask 351' is not suitable for the light-shielding layers 326 constituting the mold 321 of the present invention, the hard mask 351' may be removed and, thereafter, the light-shielding layers 326 may be formed on the top portion flat surfaces 324a of the top portions 324A of the projected portions 324. In this case, the light-shielding layers 326 can be formed by providing a resist pattern in such a manner as to expose the top portion flat surfaces 324a of the top portions 324A of the projected portions 324, forming a light-shielding layer in a thickness of, for example, about 50 to 150 nm through the resist pattern by use of a known vacuum film forming method such as a sputtering method, and thereafter removing the resist pattern and lifting off the surplus light-shielding layer. Besides, the light-shielding layers 326 can be formed on the top portion flat surfaces 324a of the top portions 324A of the projected portions 324, by forming a light-shielding layer in a thickness of, for example, about 50 to 150 nm on the mold 321' in such a manner as to cover the top portion flat surfaces 324a of the top portions 324A, thereafter providing a resist pattern in such a manner as to cover the light-shielding layer located on the top portion flat surfaces 324a of the top portions 324A, and etching the light-shielding layer through this resist pattern.

By this, preparation of the mold 321' having the mold base material 322 and a rugged structure 323 located at a main surface 322a of the mold base material 322, in which the rugged structure 323 has a plurality of projected portions 324 and 325 located at the main surface 322a and the light-shielding layers 326 are provided on the top portion flat surfaces 324a of the top portions 324A of the projected portions 324, is completed.

Next, a protective film 328 having an oxidation-resisting property is formed on the main surface 322a side in such a manner as to cover the light-shielding layers 326 (FIG. 37 (E)). By this, an imprint mold 321 is obtained. The formation of the protective film 328 can be performed in the same as manner as the formation of the aforementioned protective film 318.

According to such a method of manufacturing the imprint mold of the present invention, it is possible to easily manufacture a mold for forming, with high accuracy and repeatedly, a pattern structure which has recesses differing in depth.

The aforementioned embodiment is illustrative, and the method of manufacturing the imprint mold of the present invention is not to be limited to the embodiment. For example, while the mold 311' is obtained by etching the mold base material 312 using the hard mask 351 as an etching mask in the aforementioned embodiment, the mold 311' may be obtained by forming a desired resist pattern on the mold base material 312 and etching the mold base material 312 through the resist pattern. This applies also to the mold 321'.

EXAMPLES

Now, the present invention will be described in detail below by showing examples.

EXAMPLE

A quartz glass (65 mm square) having a thickness of 675 µm was prepared as a mold base material, and a chromium thin film (150 nm thick) was formed on a surface of the base material by a sputtering method. A surface of the chromium thin film was coated with a photosensitive resist, then exposure to light through a desired photomask was conducted, and development was conducted, to form a resist pattern. With the resist pattern as an etching mask, the exposed chromium thin film was removed by dry etching using a chlorine-based gas. Thereafter, with the remaining chromium thin film as an etching mask, the exposed quartz glass was cut by dry etching using a fluorine-based gas, to obtain a mold having a rugged structure.

The rugged structure of the mold was composed of two kinds of projected portions, namely, projected portions linear in plan-view shape and projected portions circular in plan-view shape, in which the chromium thin film was present in the projected portions. The linearly shaped projected portions had a line/space (5 µm/5 µm) shape. In addition, the circularly shaped projected portions had a diameter of 30 µm, and were present in a density of 225 pieces/mm$^2$ (65 µm pitch). The projected portions of the quartz glass had a height from a main surface of 2 µm.

Next, the rugged structure of the above-mentioned mold was coated with a photosensitive resist, exposure to light through a desired photomask was conducted, and development was performed. By this, there was formed a resist pattern coating, in a circular shape with a diameter of 20 µm, substantially central portions of the chromium thin film located at top portion flat surfaces of the projected portions circular in plan-view shape. Subsequently, with this resist pattern as an etching mask, the exposed chromium thin film was removed by dry etching using a chlorine-based gas, thereby to form light-shielding layers with a diameter of 20 µm on substantially central portions of the top portion flat surfaces of the projected portions circular in plan-view shape, as shown in FIG. 36 (C).

Next, a film was formed in such a manner as to cover the above-mentioned rugged structure and light-shielding layers by a spin coating method using AZ Lexp. S06-104 made by AZ Electronic Materials Manufacturing Co., Ltd., followed by heating on a hot plate at 100° C. for 3 minutes, to remove the solvent. Subsequently, the film surface was irradiated with light in an exposure dose of 2,000 mJ/cm$^2$ by using an i-line exposure apparatus, after which baking was conducted at 230° C. for 60 minutes, to form a protective film (50 nm thick) of an inorganic silicon compound having a glass skeleton, as shown in FIG. 36 (D). By this, an imprint mold was obtained.

The imprint mold produced in this way was subjected to the following surface modification treatment, swelling treatment, oxidative decomposition treatment, neutralization/reduction treatment, and cleaning. These treatments are an example of a treatment for depriving the mold of adherent matter, such as an insulating material and foreign matter, clogging or adhering in the recesses or on the surface of the mold.

(Surface Modification Treatment)

Irradiation with light using an excimer light source with a wavelength of 172 nm is conducted for 20 minutes, with the distance between a quartz window of a lamp house and the mold set to 3 mm, to treat the mold surface to such an extent that pure water spreads on and wets the mold surface.

(Swelling Treatment)

The mold is immersed in a swelling treatment liquid (Macudier 9204, made by Macdermid Performance Solutions Japan K.K.) at 35° C. for 10 minutes.

(Oxidative Decomposition Treatment)

The mold is immersed in a mixed liquid obtained by mixing an aqueous sodium permanganate solution, an aqueous sodium hydroxide solution and pure water in a volume ratio of 10:5:85, at 80° C. for 2 hours.

(Neutralization/Reduction Treatment)

The mold is immersed in a mixed liquid obtained by mixing hydroxylamine sulfate, an aqueous mixed sulfuric acid solution and pure water in a volume ratio of 10:2:88, at 43° C. for 5 minutes.

(Cleaning)

A mixed liquid, at 25° C., obtained by mixing isopropyl alcohol and pure water in a volume ratio of 1:1 is placed in a glass beaker, and, in a state in which the mold is immersed in the mixed solution, ultrasonic cleaning is conducted using an ultrasonic cleaning apparatus for 2 minutes, followed by drying by nitrogen blow.

The imprint mold having been subjected to the above-mentioned surface modification treatment, swelling treatment, oxidative decomposition treatment, neutralization/reduction treatment, and cleaning was observed, and no change in the light-shielding layers or the rugged structure was found.

COMPARATIVE EXAMPLE

An imprint mold was obtained in the same manner as in the above-described Example, except that a protective film was formed.

The imprint mold thus produced was subjected to the surface modification treatment, swelling treatment, oxidative decomposition treatment, neutralization/reduction treatment, and cleaning, in the same manner as in Example.

The imprint mold having been thus subjected to the surface modification treatment, swelling treatment, oxidative decomposition treatment, neutralization/reduction treatment, and cleaning was observed. Although no change was found in the rugged structure, the light-shielding layers disappeared in about 1 minute after the start of the oxidative decomposition treatment.

Industrial Applicability

The imprint mold of the present invention is applicable to manufacture of various pattern structures, fine processing of workpieces such as substrates, and the like in which an imprint method is used.

Fourth Embodiment

A fourth embodiment of the present invention will be described below, referring to the drawings.

Note that the drawings are schematic or conceptual, and the sizes of members, the size ratios between the members and the like are not necessarily the same as the practical ones, and even the same member or the like may be represented in the respective drawings in mutually different sizes or ratios.

[Imprint Mold]

Figure 38:
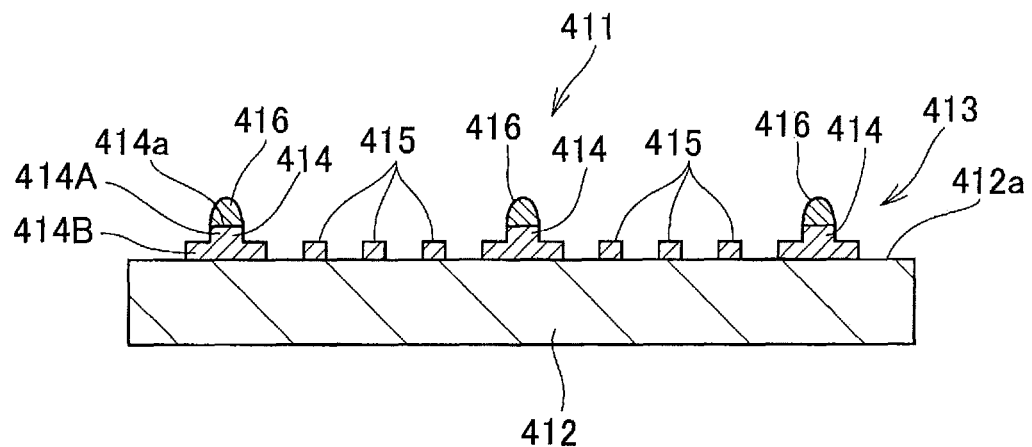
FIG. 38 is a sectional view for explaining an imprint mold according to a fourth embodiment of the present invention.

FIG. 38 is a sectional view for explaining an imprint mold according to the present embodiment. In FIG. 38, an imprint mold 411 is an example of a mold for forming an insulating layer of a multilayer wiring board, and has a base material 412 and a rugged structure 413 located at a main surface 412a of the base material 412. The rugged structure 413 possessed by the mold 411 has a plurality of projected portions located on the main surface 412a, and the projected portions are composed of two or more kinds of projected portions differing in height from the main surface 412a. In the example illustrated, the rugged structure 413 includes projected portions 414 comparatively greater in height from the main surface, and projected portions 415 comparatively smaller in height from the main surface. The higher projected portions 414 are projected portions for forming an insulating layer with through-holes for forming interlayer connection vias for connection between wiring layers located on upper and lower sides with the insulating layer therebetween, while the lower projected portions 415 are projected portions for forming the insulating layer with recesses for forming a wiring layer of an upper layer.

Figure 39:
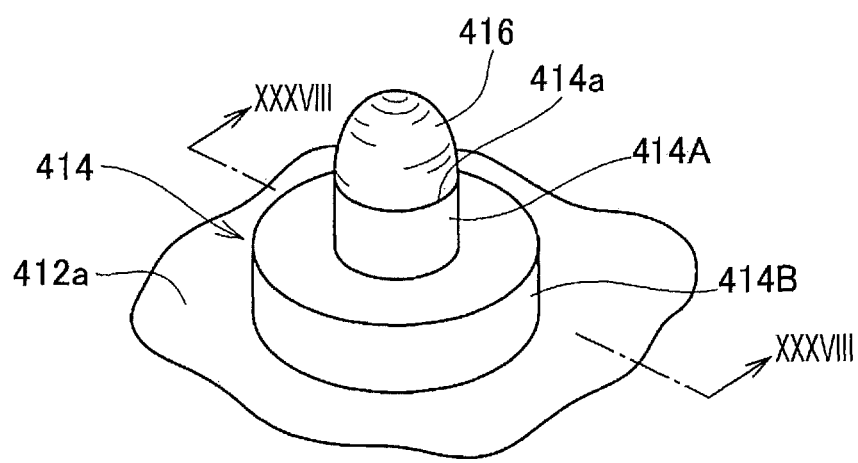
FIG. 39 is a partial enlarged perspective view of a projected portion of the imprint mold shown in FIG. 38.

FIG. 39 is a partial enlarged perspective view of the projected portion 414, and a section of the projected portion 414 shown in FIG. 38 corresponds to a vertical section along line XXXVIII-XXXVIII of FIG. 39. In the example illustrated, the projected portion 414 is of a two-step structure including a base portion 414B for forming a pad portion which is located on the base material 412 side, and a column-shaped top portion 414A for forming a via portion which is located substantially in the center on the base portion 414B. In the mold 411 of the present invention, a light-shielding portion 416 is provided on a top portion flat surface 414a of the top portion 414A of the projected portion 414 which is the greatest in height from the main surface 412a. Note that the projected portions 415 (not shown) for forming wiring patterns are provided juxtaposedly to the base portion 414B.

Figure 40:
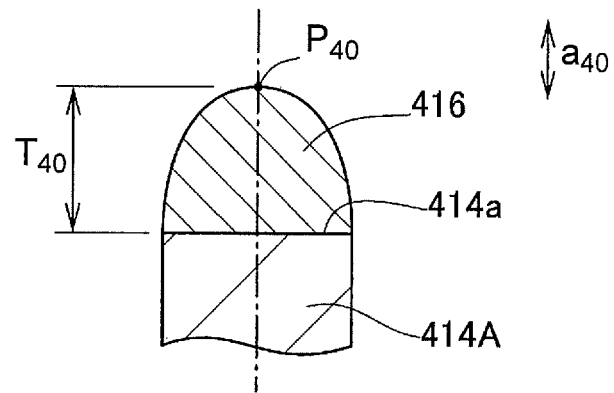
FIG. 40 is a partial enlarged sectional view for explaining a light-shielding portion located at a top portion flat surface of the imprint mold shown in FIG. 38.

In addition, FIG. 40 is a partial enlarged sectional view for explaining a light-shielding portion 416 located on the top portion flat surface 414a of the top portion 414A. As depicted in FIG. 40, the light-shielding portion 416 has a part differing in thickness. In the illustrated example, the light-shielding portion 416 has a thickest part $P_{40}$ at a central portion (the position indicated by an alternate dash and dot line in FIG. 40) of a plan-view shape as viewed in the thickness direction (the direction indicated by arrow $a_{40}$ in FIG. 40).

In such a light-shielding portion 416, the thickness $T_{40}$ at the thickest part $P_{40}$ is preferably in the range of 0.1 to 5 μm. If the thickness $T_{40}$ is less than 0.1 μm, the light-shielding property offered by the light-shielding portion 416 in transfer formation of a pattern structure by imprint described later would be insufficient, and an effect of reducing influences of warping and/or ruggedness of a substrate by deformation of the light-shielding portion 416 would be insufficient. On the other hand, if the thickness $T_{40}$ exceeds 5 μm, although a further damping performance offered by the light-shielding portion 416 can be obtained, the time required for forming the light-shielding portion 416 would be prolonged, leading to an increase in manufacturing cost of the mold 411.

In addition, it is preferable that the light-shielding portion 416 has a thinnest part at its peripheral edge. In the case where the thinnest part is present on the inner side of the peripheral edge, there arises a problem that when the mold 411 is pressed against a to-be-molded resin material in transfer formation of a pattern structure by imprint, the to-be-molded resin material collects at the thinnest part of the light-shielding portion 416, so that residue of the to-be-molded resin material is liable to be generated. In order to prevent the generation of residue, it is preferable for the thinnest part of the light-shielding portion 416 to be present at the peripheral edge of the light-shielding portion 416, and the thickness thereof is preferably not less than 0.1 μm, taking the light-shielding property offered by the light-shielding portion 416 into consideration. Besides, the difference in thickness between the thickest part of the light-shielding portion 416 and the thinnest part of the light-shielding portion 416 is preferably not less than 5 μm. If this difference in thickness of the light-shielding portion 416 is less than 5 μm, the effect of reducing influences of warping and/or ruggedness of the substrate by deformation of the light-shielding portion 416 may be insufficient.

Figure 41:
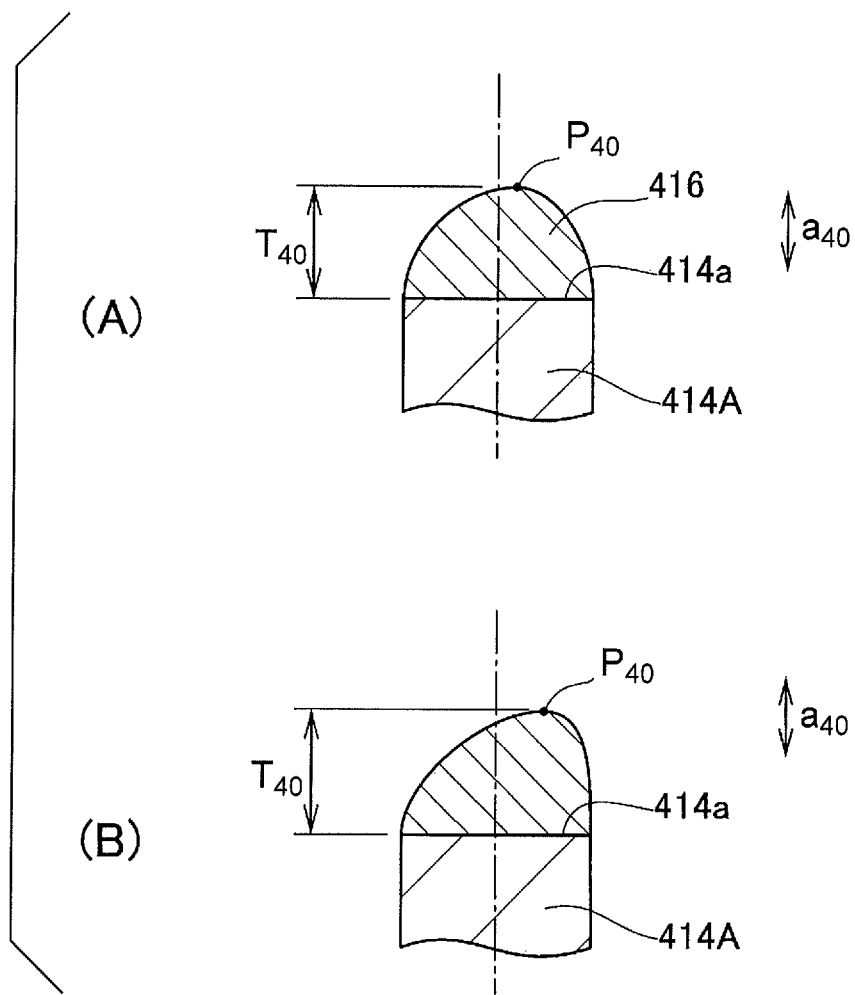
FIG. 41 is a partial enlarged sectional view, corresponding to FIG. 40, showing another shape example of the light-shielding portion of the imprint mold according to the fourth embodiment of the present invention.

The external shape in vertical section of the thickest part $P_{40}$ of such a light-shielding portion 416 may be a semicircular shape, a triangular shape, a trapezoidal shape or the like, other than the parabolic shape as in the illustrated example. In addition, the light-shielding portion 416 may have its thickest part $P_{40}$ deviated from a central portion (the position indicated by the alternate dash and dot line in FIG. 40) of plan-view shape as viewed in the thickness direction (the direction indicated by arrow $a_{40}$ in FIG. 40). FIG. 41 shows partial enlarged sectional views, corresponding to FIG. 40, for showing such examples of the light-shielding portion 416. In the example illustrated in FIG. 41 (A), a light-shielding portion 416' has its thickest part $P_{40}$ deviated to the peripheral edge side from the central portion (FIG. 41 (A)) of the plan-view shape in the thickness direction (the direction indicated by arrow $a_{40}$ in FIG. 41 (A)). Besides, in the example shown in FIG. 41 (B), a light-shielding portion 416" has its thickest part $P_{40}$ deviated further to the peripheral edge side from the central portion (the position indicated by an alternate dash and dot line in FIG. 41 (B)) of plan-view shape in the thickness direction (the direction indicated by arrow $a_{40}$ in FIG. 41 (B)). In such light-shielding portions 416', 416", the thickness $T_{40}$ at the thickest part $P_{40}$ is preferably in the range of 0.1 to 5 μm.

Where the light-shielding portion 416 thus has the part differing in thickness, it is thereby ensured that when the mold 411 is pressed against a to-be-molded resin material in transfer formation of a pattern structure by imprint, an effect of causing the to-be-molded resin material to flow toward an outer edge portion of the plan-view shape of the projected portion 414 is generated, and, as a result, residue of the to-be-molded resin material at a bottom portion of a recessed shape formed by the projected portion 414 can be restrained.

In addition, the light-shielding portion 416 preferably has an elastic modulus of not more than 100 GPa, preferably in the range of 1 MPa to 90 GPa. If the elastic modulus of the light-shielding portion 416 exceeds 100 GPa, the elasticity of the light-shielding portion 416 would be insufficient, and, in transfer formation of a pattern structure by imprint described later, an effect of reducing influences of warping and/or ruggedness of the substrate by deformation of the light-shielding portion 416 would be insufficient. To be more specific, in order that pattern breakage will not occur when a pattern possessed by a transfer substrate or a pattern possessed by a material layer formed on the transfer substrate and the light-shielding portion 416 of the mold 411 make contact with each other at the time of forming a pattern structure on the transfer substrate by imprint using the mold 411, it is preferable that the elastic modulus of the light-shielding portion 416 is lower than the elastic modulus of the pattern material. For example, in the case where a conduction pattern possessed by the insulating layer provided on the transfer substrate is formed of copper, if the elastic modulus of the light-shielding portion 416 is not more than 100 GPa, it is lower than the elastic modulus (117 GPa) of copper, which is preferable. On the other hand, chromium used as a material of a hard mask has an elastic modulus of 280 GPa; therefore, in the case where chromium is applied to the light-shielding portion 416, the elasticity of the light-shielding portion 416 is insufficient, and the effect of reducing influences of warping or ruggedness of the substrate by deformation of the light-shielding portion 416 is insufficient, resulting in that the effect of the present invention is not produced. Further, the elastic modulus of the light-shielding portion 416 formed of chromium is higher than the elastic modulus (117 GPa) of copper, so that the conduction pattern of copper may be broken, which is unfavorable.

In the case where a to-be-molded resin material used in imprint is photo-curing, a material permitting transmission therethrough of irradiation light for curing the resin material can be used as the material of the base material 412 of the mold 411; for example, there can be used not only glasses such as quartz glass, silicate glass, calcium fluoride, magnesium fluoride, acrylic glass, etc. but also sapphire, gallium nitride, and, further, resins such as polycarbonate, polystyrene, acrylics, polypropylene, etc. or arbitrary laminates of them. In the case where the to-be-molded resin material for use is not photo-curing, the mold 411 may not have a light-transmitting property, and, other than the above-mentioned materials, there can be used, for example, silicon, metals such as nickel, titanium, aluminum, etc. and their alloys, oxides, nitrides or arbitrary laminates of them.

The thickness of the base material 412 of the mold 411 can be set taking the strength, handleability and the like of the material into consideration; for example, the thickness can be appropriately set within the range of about 300 μm to about 10 mm. Note that the main surface 412a side of the base material 412 may be of a stepped structure with two or more steps; in this case, the uppermost step is the main surface 412a, and the rugged structure 413 is located thereon.

The material of the light-shielding portion 416 of the mold 411 may be one which contains not less than 90% by weight of a metal having a light-shielding property and having an elastic modulus of not more than 100 GPa, such as silver (elastic modulus: 83 GPa), for example. As a component constituting the light-shielding portion 416 together with such a metal, there can be mentioned resin materials such as epoxy resin. If the content of the above-mentioned metal contained in the light-shielding portion 416 is less than 90% by weight, the light-shielding property of the light-shielding portion 416 would be insufficient, and durability in the case of undergoing deformation due to repeated load may be impaired.

Note that in the present invention, the light-shielding property means that transmittance to light in a wavelength region of 0 to 365 nm is not more than 10%. In addition, in the present invention, measurement of elastic modulus is conducted using a test method based on the tensile test method for metallic materials specified in JIS-Z2241.

Such a light-shielding portion 416 may be one that is united with the top portion flat surface 414a of the top portion 414A of the projected portion 414 through siloxane linkage. In this case, the light-shielding portion 416 can be united with the top portion flat surface 414a through siloxane linkage by, for example, supplying an adhesion agent such as hexamethyldisilazane (HMDS) to the top portion flat surface 414a, and thereafter supplying the material for constituting the light-shielding portion 416 to the top portion flat surface 414a.

Figure 42:
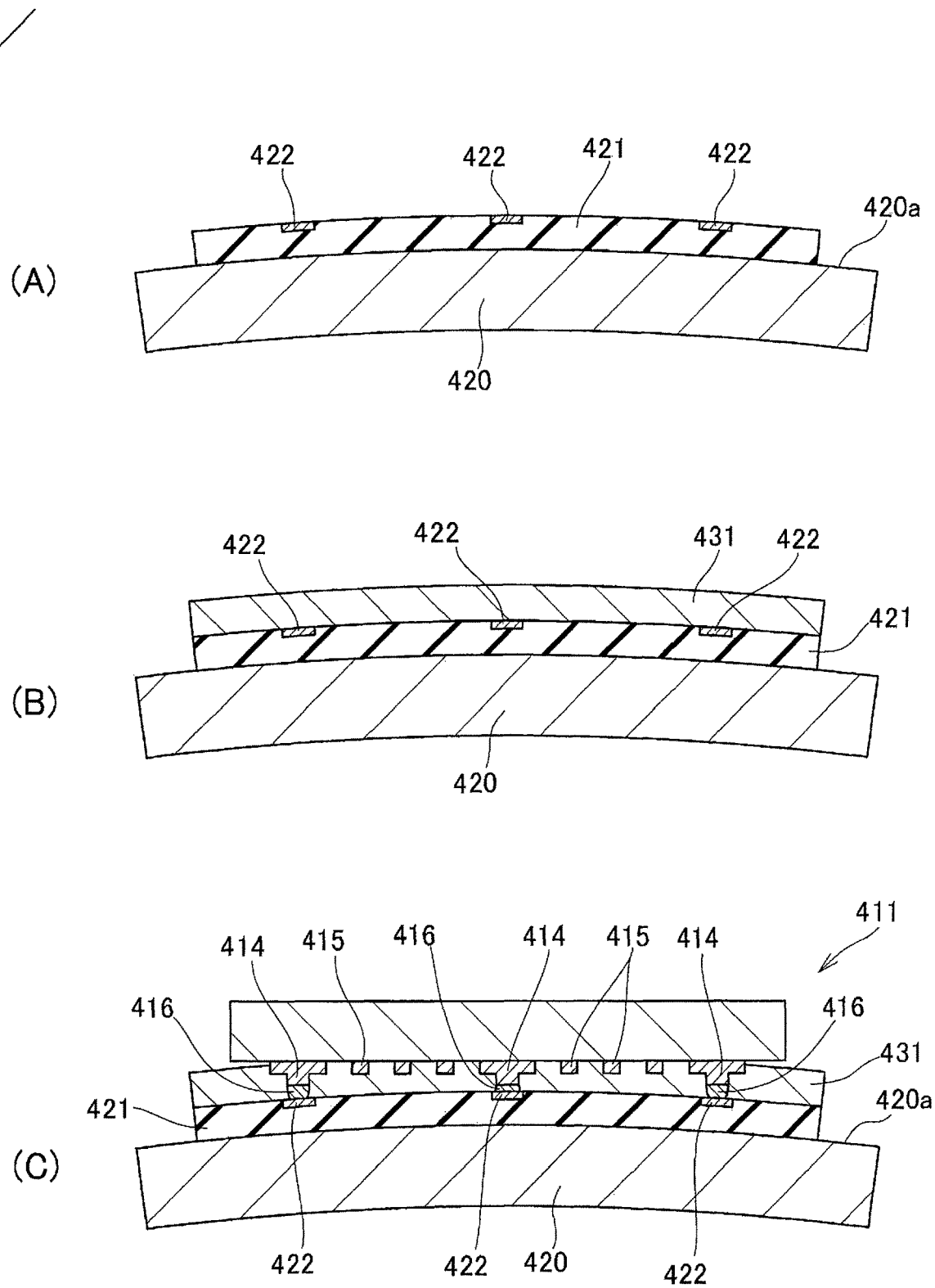
FIG. 42 is a process drawing for explaining an example of transfer formation of a pattern structure by imprint using the imprint mold according to the fourth embodiment of the present invention.

FIG. 42 is a process drawing for explaining an example in which transfer formation of a pattern structure on an insulating layer located on a transfer substrate is conducted by imprint using the aforementioned imprint mold 411. In this example, warping of a transfer substrate 420 has been generated, and a surface 421a of an insulating layer 421 formed on the transfer substrate 420 has also been influenced by the warping of the transfer substrate 420 (FIG. 42 (A)). Such an insulating layer 421 has patterns 422 at the surface 421a thereof, and a photo-curing to-be-molded resin material 431 is supplied to the surface 421a (FIG. 42 (B)).

Next, the patterns 422 possessed by the insulating layer 421 and the projected portions 414 of the rugged structure 413 of the mold 411 are aligned, and the mold 411 is pressed against the to-be-molded resin material 431. By this, the light-shielding portions 416 possessed by the projected portions 414 of the rugged structure 413 of the mold 411 and the patterns 422 possessed by the insulating layer 421 make contact with each other; in this case, loads acting on the light-shielding portions 416 differ according to the warped shape of the transfer substrate 420. Then, each of the light-shielding portions 416 is deformed according to the degree of the load, thereby to absorb the influence of the warping present in the transfer substrate 420, resulting in a state in which all the light-shielding portions 416 are in contact with the patterns 422 (FIG. 42 (C)). For example, in the case where the patterns 422 possessed by the insulating layer 421 are wiring patterns formed of copper, the elastic modulus of the light-shielding portions 416 of the mold 411 is not more than 100 GPa and is lower than the elastic modulus (117 GPa) of copper, and, therefore, breakage of the patterns 422 is prevented.

In addition, when the mold 411 is pressed against the to-be-molded resin material 431, the light-shielding portion 416 produces an effect of causing the to-be-molded resin material 431 to flow to an outer edge portion of the plan-view shape of the projected portion 414; therefore, the to-be-molded resin material 431 can be restrained from existing between the light-shielding portion 416 and the pattern 422.

Subsequently, in this state, irradiation with light from the mold 411 side is conducted to cure the to-be-molded resin material 431. In this instance, as above-mentioned, the to-be-molded resin material 431 is not present, or the to-be-molded resin material 431 is small in thickness even if it is present, between the light-shielding portions 416 possessed by the projected portions 414 and the patterns 422; therefore, progress of curing there under the influence of light diffraction at the time of exposure can be prevented securely. Accordingly, where the cured product of the to-be-molded resin material 431 and the mold 411 are separated from each other and thereafter development is conducted, it is thereby ensured that the unexposed to-be-molded resin material 431 is removed, and that no residual film exists at bottom portions of the recessed shapes formed by the projected portions 414 of the mold 411.

Thus, according to the imprint mold 411 of the present invention, influences of warping and/or ruggedness present in the transfer substrate can be absorbed by the light-shielding portions themselves, and a rugged structure with recesses differing in depth can be transfer formed on the transfer substrate with high accuracy.

The embodiment of the imprint mold as aforementioned is illustrative, and the present invention is not to be limited to the embodiment. For instance, in imprint using the mold of the present invention, a thermosetting to-be-molded resin material can be used. In this case, at the time of thermosetting the to-be-molded resin material in the state of FIG. 42 (C) mentioned above, also, it is preferable that the light-shielding portions 416 possessed by the mold 411 have an appropriate elastic modulus. Therefore, the light-shielding portions 416 possessed by the mold 411 preferably has an elastic modulus of, for example, not more than 100 GPa in a temperature range from normal temperature to 200° C.

In addition, the imprint mold of the present invention may be one that has a mold release layer at least on surfaces of the light-shielding portions 416. The mold release layer can be formed by use of a fluorine-based or silicone-based mold release agent.

Besides, while the imprint mold 411 in the above-described embodiment is an example of a mold for forming an insulating layer of a multilayer wiring board, this is not restrictive of the object to which to apply the present invention. Molds for use in various imprint methods for forming a transfer substrate with a rugged structure having recesses differing in depth can be an object to which to apply the present invention.

[Method of Manufacturing Imprint Mold]

A method of manufacturing an imprint mold of the present invention will be described below.

Figure 43:
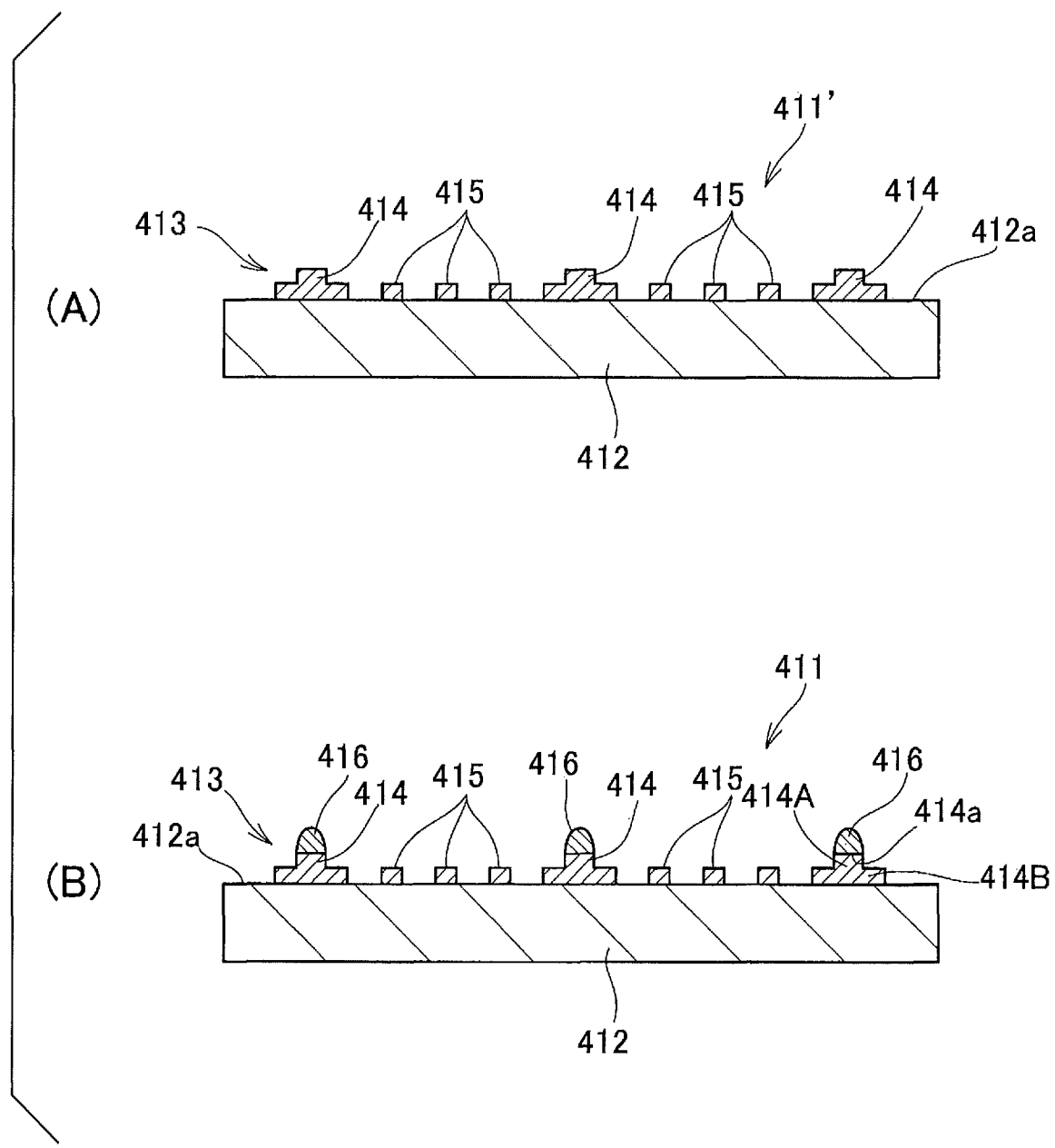
FIG. 43 is a drawing for explaining a method of manufacturing the imprint mold according to the fourth embodiment of the present invention.

FIG. 43 is a process drawing for explaining an embodiment of the method of manufacturing the imprint mold of the present invention, and shows as an example a case of manufacturing the aforementioned mold 411 of the present invention.

In the present invention, a mold is prepared which has a base material and a rugged structure located on a main surface of the base material, in which the rugged structure has a plurality of projected portions located on the main surface, and the projected portions include those differing in height from the main surface. FIG. 43 (A) is a sectional view showing an example of such a mold. In the example illustrated, a mold 411' has a base material 412, and a rugged structure 413 located at a main surface 412a of the base material 412. The rugged structure 413 has a plurality of projected portions located on the main surface 412a, and the projected portions include those differing in height from the main surface 412a. In the illustrated example, two kinds of projected portions, namely, projected portions 414 comparatively greater in height from the main surface and projected portions 415 comparatively smaller in height from the main surface constitute the rugged structure 413. In addition, the projected portions 414 are of a two-step structure composed of a base portion 414B located on the base material 412 side and a top portion 414A located substantially in the center on the base portion 414B.

In manufacturing such a mold 411', for example, the main surface 412a of the base material 412 is coated with an electron beam-sensitive resist, electron beam lithography is conducted, the resist is developed, and the main surface 412a of the base material 412 is etched through the resist. By this, the top portions 414A are first formed. Next, an electron beam-sensitive resist is applied to the whole region of the main surface 412a of the base material 412 in such a manner as to coat the top portions 414A, electron beam lithography is conducted, the resist is developed, and the main surface 412a of the base material 412 is etched through the resist. By this, the base portions 414B are formed beneath the top portions 414A, and the comparatively lower projected portions 415 are formed at desired positions, whereby the mold 411' can be obtained.

In addition, the mold 411' can be manufactured also by use of an imprint mold having a rugged structure which is reverse to the rugged structure 413. In this case, on a hard mask material layer of a base material 412 provided with the hard mask material layer on a main surface 412a thereof, a resist pattern is formed by imprint using a mold. Then, with the resist pattern as an etching mask, the hard mask material layer is dry etched to form a hard mask, and, further, with the hard mask as an etching mask, the base material 412 is etched by dry etching, whereby the mold 411' can be obtained.

Next, an adhesion agent such as hexamethyldisilazane (HMDS) is supplied to the main surface 412a side of the mold 411', to impart siloxane linkage groups to the main surface 412a side.

Subsequently, a light-shielding material is supplied to top portion flat surfaces 414a of the top portions 414A of the projected portions 414, to form light-shielding portions 416 (FIG. 43 (B)). By this, an imprint mold 411 of the present invention is obtained.

The formation of the light-shielding portions 416 can be carried out, for example, as follows. First, appropriate amounts of the light-shielding material is supplied from ink jet nozzles to the top portion flat surfaces 414a of the top portions 414A, and is cured by heating at a temperature of about 200° C., for example. Thereafter, appropriate amounts of the light-shielding material is supplied from the ink jet nozzles onto the cured light-shielding material, and is cured similarly. This operation is repeated multiple times with such a control as to gradually reduce the amounts of the light-shielding material supplied, whereby the light-shielding portions 416 having desired thickness and shape can be formed. The thus formed light-shielding portions 416 have parts differing in thickness of the projected portions 414. Note that curing of the light-shielding material supplied may not be conducted upon each run of supply, and may be conducted after the light-shielding material is formed to have desired height and shape.

As the light-shielding material to be used for forming the light-shielding portions 416 in this way, there can be used, for example, a light-shielding material which contains not less than 90% by weight of a metal such as silver as solid component, contains a resin material such as epoxy resin as another component, and contains a solvent such as to enable the light-shielding material to be supplied from ink jet nozzles.

As aforementioned, the prepared mold 411' already has the rugged structure 413, and it is difficult to form the light-shielding portions 416 with high accuracy by a photolithographic method which is a treatment applied ordinarily to a flat surface. On the other hand, in the case of forming the light-shielding portions 416 by supplying the light-shielding material from the ink jet nozzles, the light-shielding portions 416 can be assuredly formed on the top portion flat surfaces 414a of the projected portions 414 of the mold 411'

According to such a method of manufacturing the imprint mold of the present invention, a mold for transfer forming a transfer base material with a rugged structure having recesses differing in depth to a transfer substrate with high accuracy by an imprint method can be easily manufactured. In addition, in the case of forming the light-shielding portions by supplying the light-shielding material from the ink jet nozzles, the light-shielding portions can be locally formed. By this, even if part of a plurality of light-shielding portions is lost or broken, the lost or broken part of the light-shielding portions can be easily repaired.

The aforementioned embodiment of the imprint mold is illustrative, and the present invention is not to be limited to the embodiment. For example, after the light-shielding portions 416 are formed as aforementioned, a mold release layer may be formed on the surface of the rugged structure 413 including the light-shielding portions 416 of the mold 411. The formation of the mold release layer can be carried out, for example, by use of a fluorine-based or silicone-based mold release agent.

Figure 44:
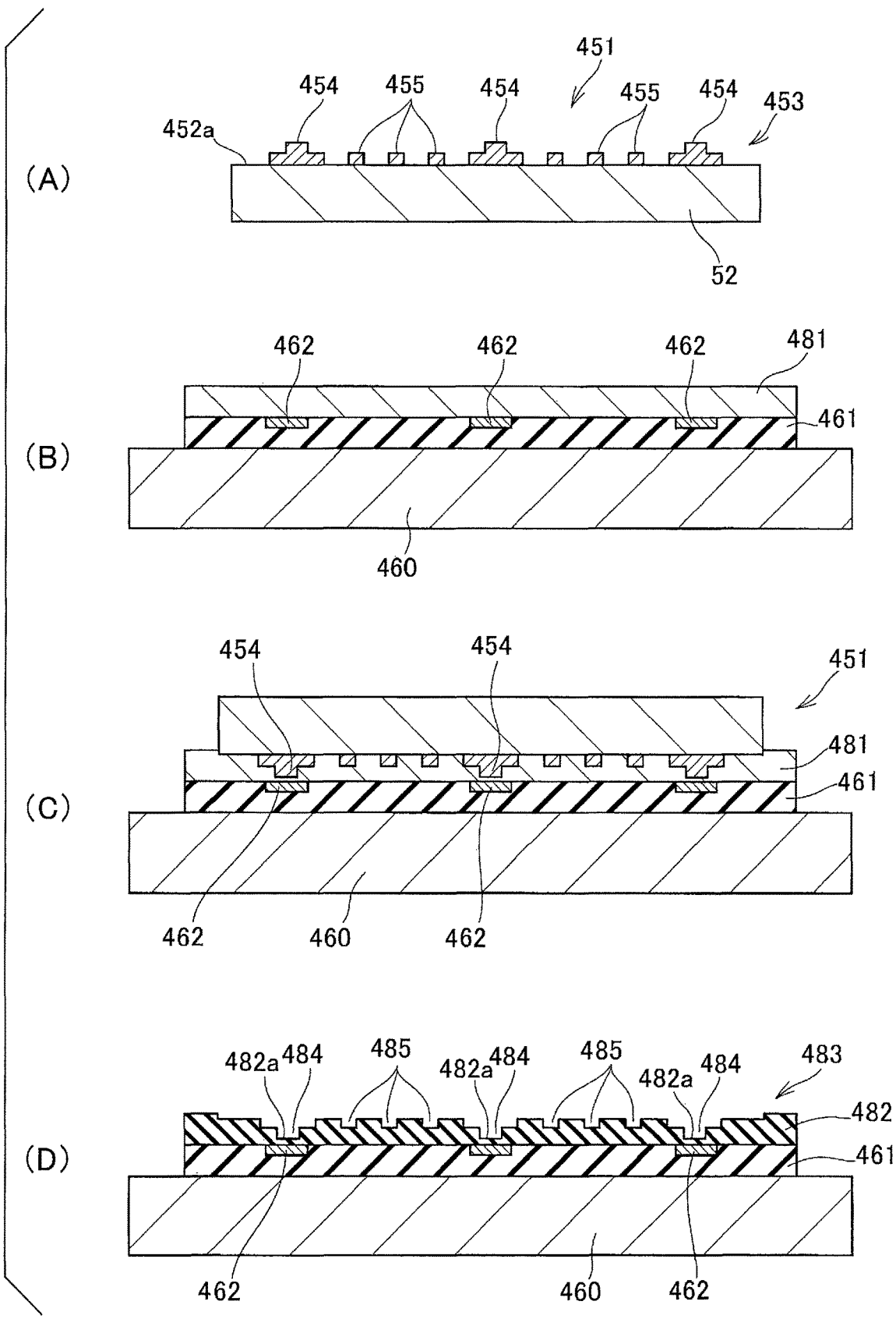
FIG. 44 is a process drawing for explaining a comparative example of forming a multilayer wiring structure by use of an imprint method.

Here, as a comparative example, a method of forming a multilayer wiring structure by use of a general imprint method will be described, referring to FIG. 44 as an example. Here, as an imprint mold, a mold 451 is prepared which has a rugged structure 453 including higher projected portions 454 for forming interlayer connection vias for connection between upper and lower wiring layers, and lower projected portions 455 for forming the wiring layer as an upper layer, on one surface 452a of a base material 452 (FIG. 44 (A)). On the other hand, an insulating layer 461 as a lower layer located on a substrate 460 is formed with wiring patterns 462 at its surface 461a, and a photo-curing resin composition 481 is supplied onto the insulating layer 461 (FIG. 44 (B)). Note that other insulating layer and/or wiring patterns may naturally be present between the substrate 460 and the insulating layer 461. The mold 451 and the insulating layer 461 are brought close to each other until a predetermined distance is left therebetween, to thereby fill the inside of the rugged structure 453 with the photo-curing resin composition 481 (FIG. 44 (C)). Irradiation with light from the mold 451 side is conducted in this state to cure the photo-curing resin composition 481, thereby forming a resin layer 482, after which the mold 451 is separated from the resin layer 482, whereby a pattern structure 483 is formed on the insulating layer 461 (FIG. 44 (D)). The thus formed pattern structure 483 has deeper recesses 484 formed through reversion of higher projected portions 454 possessed by the mold 451, and shallower recesses 485 formed through reversion of lower projected portions 455.

In such an imprint method, residual films 482a of the resin layer 482 are present between the deeper recesses 484 of the pattern structure 483 and the wiring patterns 462 as a lower layer formed in the insulating layer 461. The reason lies in that since the top portions of the higher projected portions 454 of the mold 451 are flat surfaces, the photo-curing resin composition 481 present between the projected portions 454 and the wiring patterns 462 as the lower layer cannot be pushed out, and residue of the photo-curing resin composition 481 is cured to form the residual films 482a. Therefore, even when a conductive material is disposed in the deeper recesses 484 of the pattern structure 483, connection thereof with the wiring patterns 462 as the lower layer is obstructed by the residual films 482a, so that the conductive material does not function as interlayer conduction vias. Accordingly, it becomes necessary to remove the residual films 482a present in the deeper recesses 484 of the pattern structure 483. However, in the case of removing only the residual films 482a present in the recesses 484 by a dry etching treatment or the like, for example, formation of an etching mask or the like is required, so that the process becomes complicated. In addition, in the case of removing the residual films 482a by dry etching the whole body of the pattern structure 483, a lowering in dimensional accuracy of the pattern structure 483 is generated.

Figure 45:
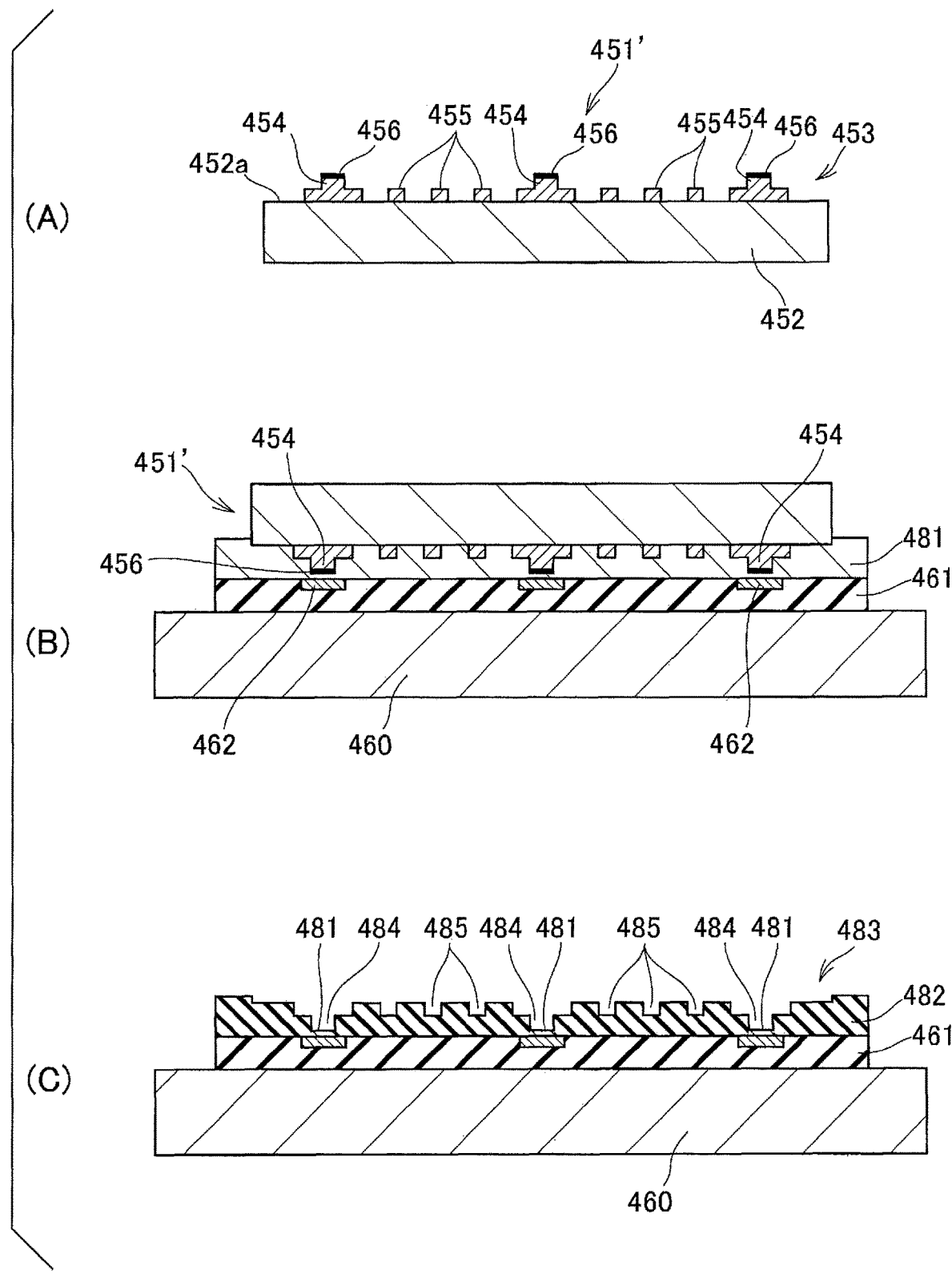
FIG. 45 is a process drawing for explaining a comparative example of forming the multilayer wiring structure by use of the imprint method.

In order to solve such a problem, it has been proposed to use a mold 451' in which at least top portions of higher projected portions 454 of a rugged structure 453 are formed of a light-shielding material to provide light-shielding layers 456, as shown in FIG. 45 (A) (for example, Japanese Patent No. 4951981). In the case where a photo-curing resin composition 481 is supplied to the insulating layer 461 on the substrate 460 using such a mold 451' and irradiation with light from the mold 451' side is conducted in a state in which the mold 451' is set close to the insulating layer 461, as shown in FIG. 45 (B), the photo-curing resin composition 481 located beneath the projected portions 454 remains uncured, since exposure thereof to light is obstructed by the light-shielding layers 456. Therefore, the residue present between the deeper recesses 484 of the pattern structure 483 comprised of the resin layer 482 and the wiring patterns 462 as a lower layer formed in the insulating layer 461 is residue of the photo-curing resin composition 481 in the uncured state (FIG. 45 (C)), and such residue can be easily removed by the subsequent development.

The mold 451' provided with the light-shielding layers 456 as aforementioned produces an effect that the uncured residue of the photo-curing resin composition 481 can be easily removed.

Figure 46:
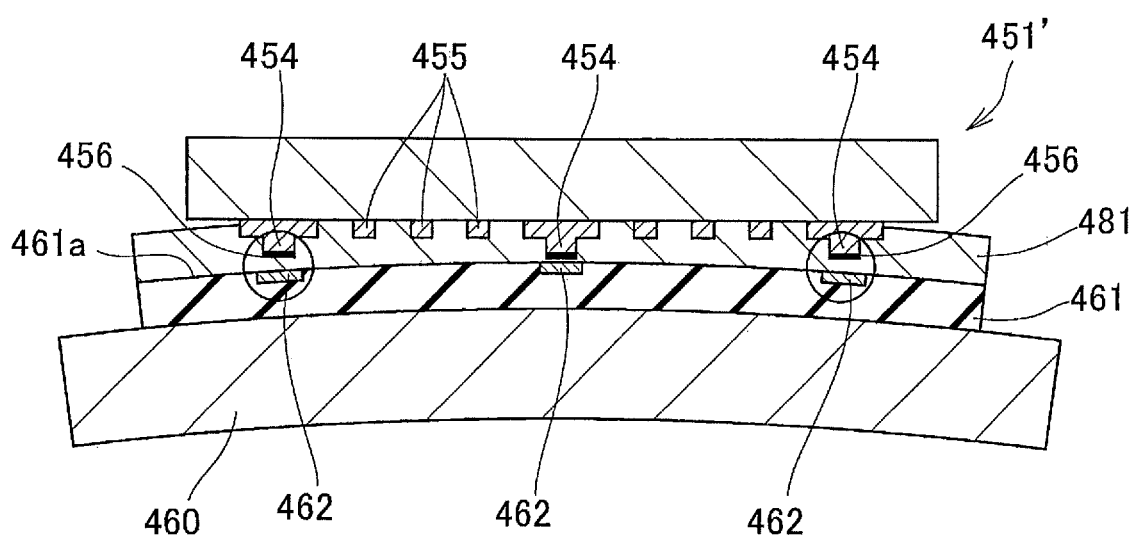
FIG. 46 is a drawing for explaining problems in forming a rugged structure by use of an imprint method.

However, for example, a silicon substrate 460 to be formed with a multilayer wiring structure has a problem in that it is difficult to make its surface perfectly flat and warping and/or ruggedness is present therein. When warping and/or ruggedness is present in the substrate 460, the surface 461a of the above-mentioned insulating layer 461 to be formed with the pattern structure by the imprint method is also a surface having undergone influences of the warping and/or ruggedness of the substrate 460. FIG. 46 illustrates a state in which a photo-curing resin composition 481 is supplied to an insulating layer 461 on a warped substrate 460, and a mold 451' is brought close to the insulating layer 461. In the case where warping and/or ruggedness is thus present in the substrate 460, it is difficult for a projected portion 454 of the mold 451' surrounded by a circle in FIG. 46 to be brought close to the insulating layer 461 (wiring pattern 462). At this part, therefore, the photo-curing resin composition 481 present between the light-shielding layer 456 located on the top portion of the projected portion 454 and the insulating layer 461 (wiring pattern 462) becomes thick, so that curing thereof may progress under the influence of light diffraction at the time of exposure to light for curing the photo-curing resin composition 481, or improper development may be caused in the subsequent development step. As a result, there is a problem that a factor of hindering connection with the wiring pattern 462 as the lower layer cannot be excluded.

On the other hand, according to the present embodiment, since the light-shielding portions 416 have parts differing in thickness, as aforementioned, influences of warping and/or ruggedness present in the transfer substrate 420 can be suppressed, and the transfer substrate 420 can be transfer formed with a rugged structure having recesses differing in depth, with high accuracy.

EXAMPLE

The present embodiment will be described more in detail below by showing an example.

<Production of Imprint Mold>

A quartz glass (65 mm square) having a thickness of 675 µm was prepared as a mold base material for an optical imprint. A chromium thin film (15 nm thick) was formed on a surface of the base material by a sputtering method, and thereafter a resist pattern was formed on the chromium thin film by imprint using a master mold. With the resist pattern as an etching mask, a chromium-made hard mask was formed by dry etching, and, further, with the hard mask as an etching mask, the base material was etched by dry etching, to obtain a mold having a rugged structure as shown in FIG. 43 (A).

The mold was one having a rugged structure composed of two kinds of projected portions, namely, projected portions comparatively greater in height from a main surface of the base material and projected portions comparatively smaller in height from the main surface. The projected portions comparatively greater in height from the main surface had a two-step structure composed of a base portion located on the base material side, and a top portion located substantially in the center on the base portion; the base portion had a cylindrical shape with a diameter of 25 µm and a height from the main surface of 2 µm, and the top portion had a cylindrical shape with a diameter of 10 µm and a height from the base portion of 2 µm. Such top portions were present in a density of 625 pieces/mm2. In addition, the projected portions comparatively smaller in height from the main surface had a line/space (2 µm/2 µm) shape, and the height of the line portions from the main surface was 2 µm.

Next, a light-shielding material having a composition set forth below was dropped by use of an ink jet device onto flat surfaces of top portions of the projected portions comparatively greater in height from the main surface of the mold described above, and was cured by heating at 150° C., and the dropping and curing were repeated three times, to form light-shielding portions. It is to be noted that the amount of the light-shielding material dropped was sequentially reduced; specifically, the dropping amount was 0.3 PL in the first run, 0.2 PL in the second run, and 0.1 PL in the third run.

| (Composition of Light-shielding Material) | |
|---|---|
| Silver | . . . 64 parts by weight |
| Tetradecane | . . . 26 parts by weight |
| Dispersant | . . . 10 parts by weight |

The light-shielding portions formed in this way had a sectional shape as shown in FIG. 40, in which the thickness of the thickest part was 4 µm, and the thickness of the thinnest part was 0.1 µm.

In the manner as described above, a mold (sample 1) was produced.

In addition, a mold (sample 2) was produced in the same manner as the above-mentioned mold (sample 1), except that the dropping of the light-shielding material in forming the light-shielding portions was conducted only once (liquid amount: 0.1 PL) to thereby form flat light-shielding portions having a thickness of 0.1 µm.

<Evaluation of Imprint Mold>

A silicon substrate intentionally formed in its surface with wavy ruggedness having a maximum roughness of 3 µm was prepared, and a copper thin film (0.1 µm thick) was formed on the surface of the silicon substrate by a sputtering method, to obtain a transfer substrate for evaluation.

A commercialized UV-curing type resist solution was supplied onto the transfer substrate, and then the above-mentioned mold (sample 1, sample 2) was pressed thereagainst. Irradiation with UV rays from the mold side was conducted in this state, to cure the resist, thereafter the mold was separated, and development was conducted, to form a resist pattern on the transfer substrate.

The resist pattern formed using the mold (sample 1) had a configuration in which the copper thin film possessed by the transfer substrate was exposed and no residual resist film was present, in recesses corresponding to the plurality of projected portions of the two-step structure of the mold.

On the other hand, the resist pattern formed using the mold (sample 2) had a configuration in which the copper thin film possessed by the transfer substrate was covered with a residual resist film, in some of recesses corresponding to the plurality of projected portions of the two-step structure of the mold.

Industrial Applicability

The imprint mold of the present invention is applicable to manufacture of various pattern structures, fine processing of workpieces such as substrates, and the like in which an imprint method is used.

Fifth Embodiment

Figure 47:
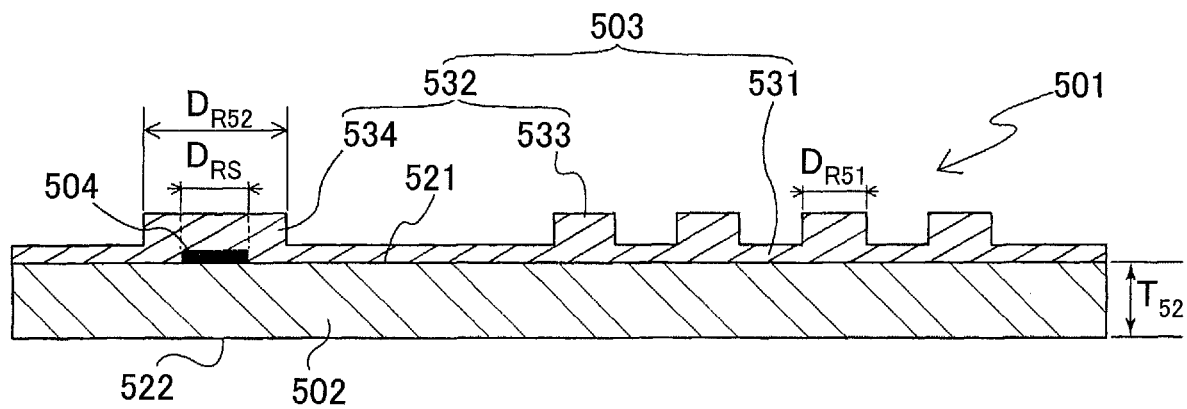
FIG. 47 is a sectional end view showing a general configuration of an imprint mold according to a fifth embodiment of the present invention.
Figure 48:
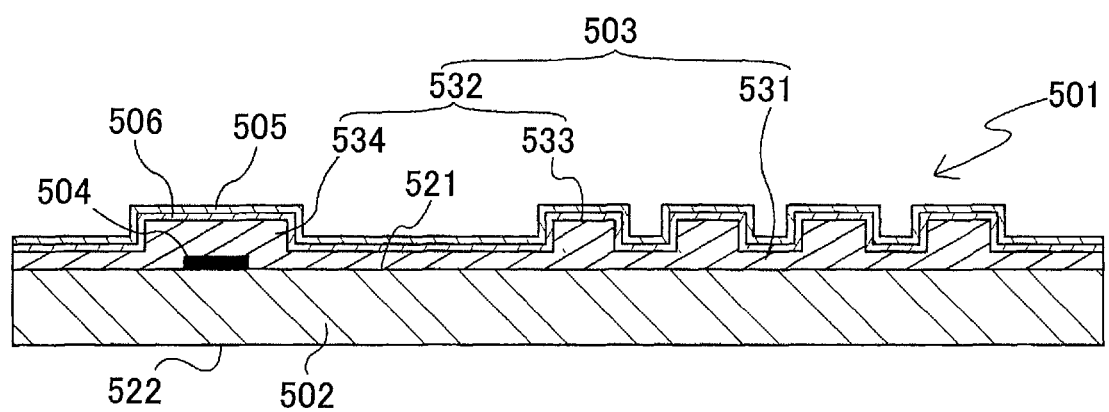
FIG. 48 is a sectional end view showing a general configuration of another mode of the imprint mold according to the fifth embodiment of the present invention.

A fifth embodiment of the present invention will be described below, referring to the drawings. FIG. 47 is a sectional end view showing a general configuration of an imprint mold according to the fifth embodiment, and FIG. 48 is a sectional end view showing a general configuration of another mode of the imprint mold according to the fifth embodiment.

[Imprint Mold]

As shown in FIG. 47, an imprint mold 501 according to the present embodiment includes a transparent base material 502 having a first surface 521 and a second surface 522 opposite to the first surface 521, and a transparent rugged pattern layer 503 and a light-shielding layer 504 which are provided on the first surface 521 of the transparent base material 502.

As the transparent base material 502, there can be used those which are generally used as imprint mold base material, for example, transparent substrates such as glass substrates such as quartz glass substrate, soda glass substrate, fluorite substrate, calcium fluoride substrate, magnesium fluoride substrate, barium borosilicate glass, aminoborosilicate glass, aluminosilicate glass and the like no alkali glass substrates, resin substrates such as polycarbonate substrate, polypropylene substrate, polyethylene substrate, polymethyl methacrylate substrate, polyethylene terephthalate substrate, and laminate substrates obtained by laminating two or more substrates arbitrarily selected from these substrates. The transparent rugged pattern layer 503 in the present embodiment is comprised of a transparent resin material, as described later, and, therefore, the transparent base material 502 preferably has a refractive index comparable to that of the transparent resin material constituting the transparent rugged pattern layer 503. For this reason, in the case where a glass substrate is used as the transparent base material 502, it is preferable to use a no alkali glass substrate, and in the case where a resin substrate is used, it is preferable to use a resin substrate comprised of the same resin material as the transparent resin material constituting the transparent rugged pattern layer 503. Note that in the present embodiment, "transparent" means that transmittance to rays of wavelengths of 300 to 450 nm is not less than 70%, preferably not less than 90%.

The plan-view shape of the transparent base material 502 is not particularly limited, and examples thereof include a substantially rectangular shape and a substantially circular shape. In the case where the transparent base material 502 is composed of a quartz glass substrate generally used for optical imprint, the plan-view shape of the transparent base material 502 is normally a substantially rectangular shape.

The size of the transparent base material 502 is also not particularly limited; in the case where the transparent base material 502 is composed of the quartz glass substrate, the size of the transparent base material 502 is about 152 mm×152 mm, for example. In addition, the thickness $T_{52}$ of the transparent base material 502 can be appropriately set within the range of about 0.3 to 10 mm, for example, taking strength and handleability and the like into consideration.

The transparent rugged pattern layer 503 includes a base layer 531 covering the whole area of the first surface 521, and projected pattern portions 532 projected from the base layer 531. The projected pattern portions 532 include first projected pattern portions 533 corresponding to wiring patterns 573 (see FIGS. 51 (C) and (D)) in the multilayer wiring board 510 produced using the imprint mold 501 according to the present embodiment, and a second projected pattern portion 534 corresponding to a land 575 (see FIGS. 51 (C) and (D)).

The shape of the first projected pattern portions 533 is a shape corresponding to the wiring patterns 573 in the multilayer wiring board 510, and is a line shape, for example. In addition, the shape of the second projected pattern portions 534 is a shape corresponding to the land 575 in the multilayer wiring board 510, and is, for example, a substantially circular shape in plan view.

The size (line width) $D_{R51}$ of the first projected pattern portions 533 is appropriately set according to the size of the wiring patterns 573 in the multilayer wiring board 510, to be about 0.5 to 10 µm, for example. The size (diameter) $D_{R52}$ of the second projected pattern portions 534 is appropriately set according to the size of the lands 575 in the multilayer wiring board 510, to be about 5 to 30 µm, for example. The height of the first projected pattern portions 533 and the second projected pattern portions 534 (transparent rugged pattern layer 503) is appropriately set to be about 0.5 to 10 µm, for example.

The thickness of the base layer 531 is not particularly limited, and is appropriately set to be about 50 nm to about 3 µm, for example.

The transparent rugged pattern layer 503 is comprised of a transparent resin material, and is preferably comprised of a transparent resin material which has a refractive index comparable to the refractive index of the transparent base material 502. Examples of such a transparent resin material include: thermoplastic resins such as polycarbonate (PC), polymethyl methacrylate (PMMA), cycloolefin polymer (COP), polyethylene terephthalate (PET), etc.; and photo-curing resins which contain a photopolymerization initiator and are UV-curing.

Figure 50:
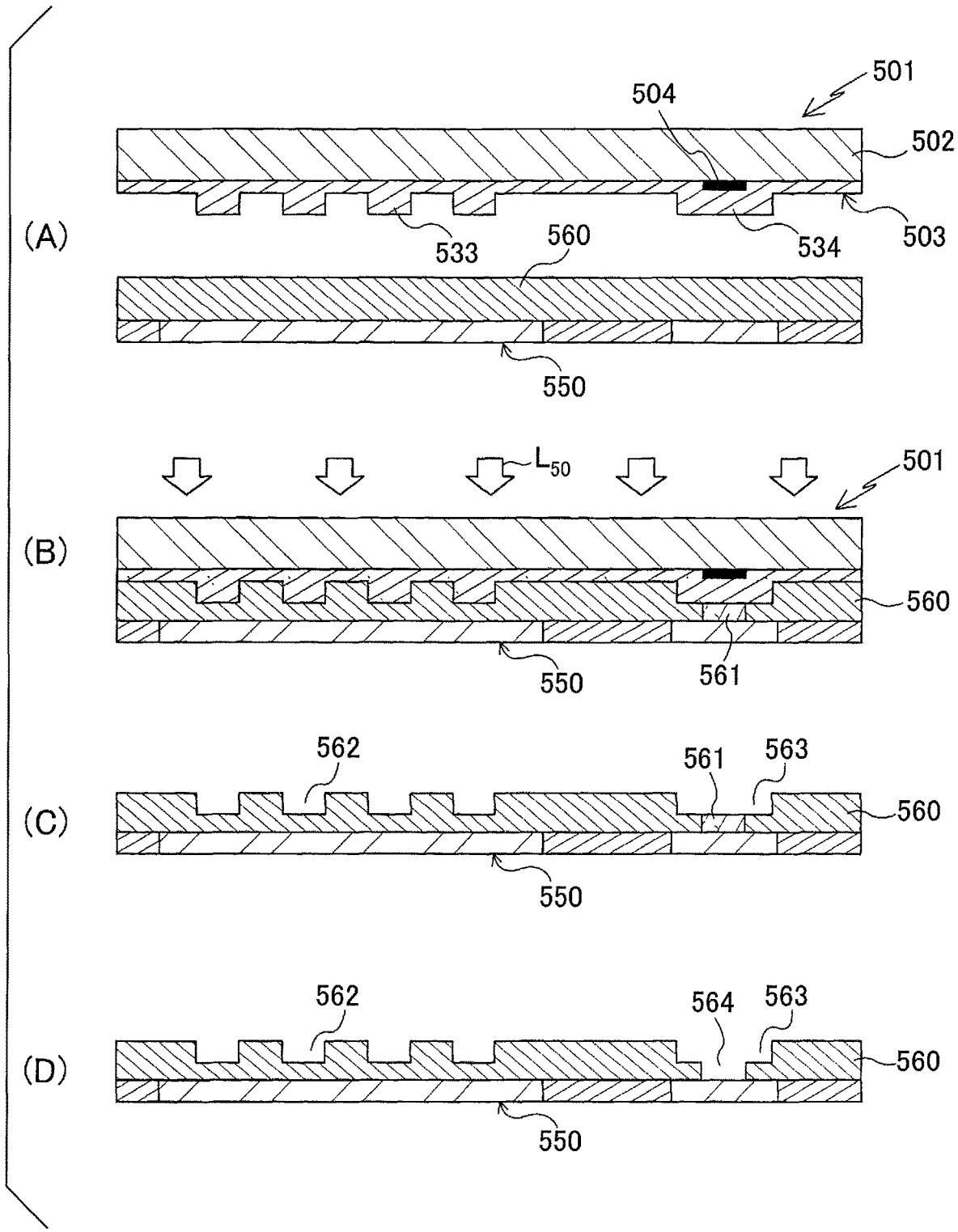
FIG. 50 is a process flow drawing (No. 1) showing, in end sections, steps of a method of manufacturing a multilayer wiring board using the imprint mold according to the fifth embodiment of the present invention.
Figure 51:
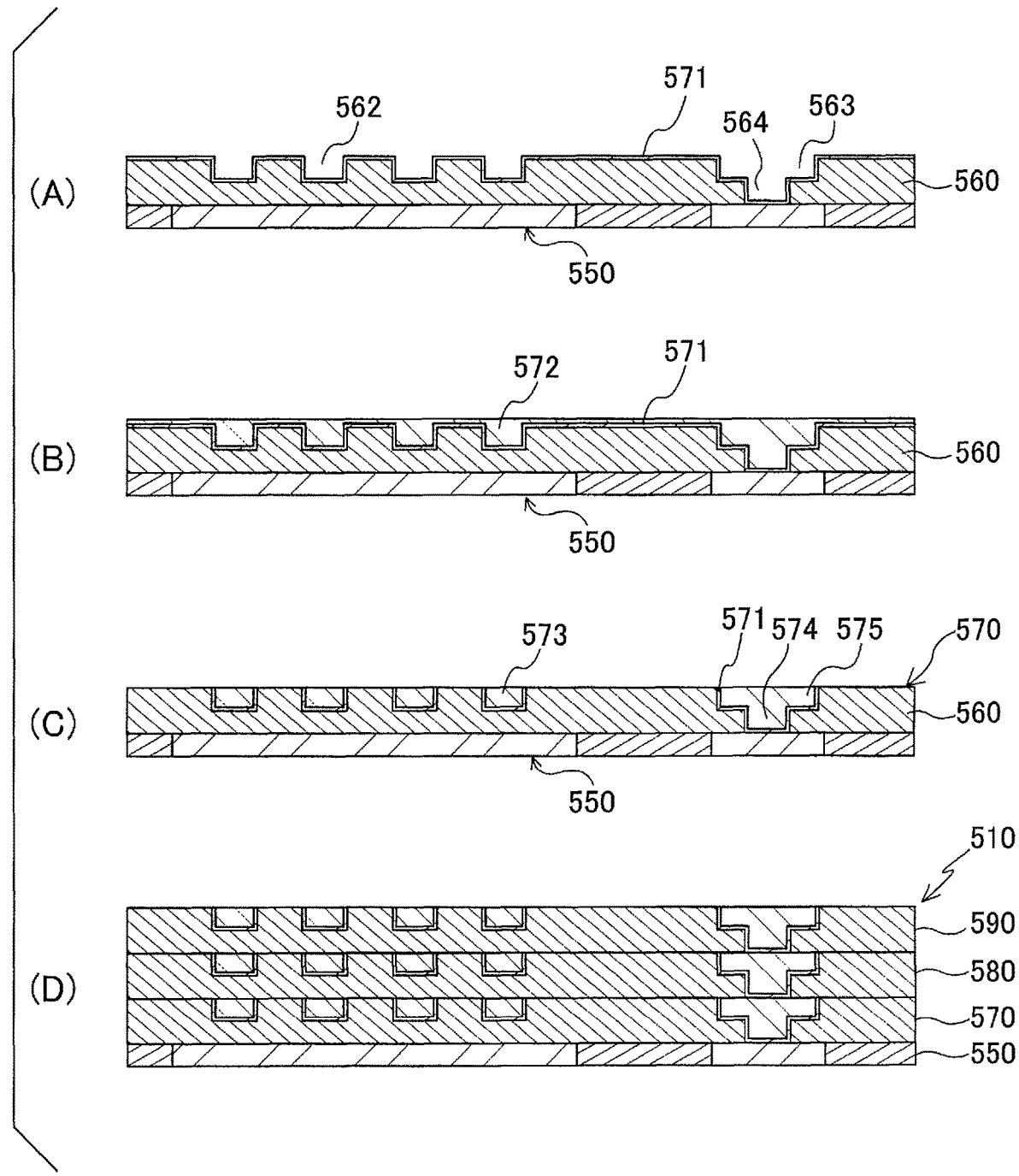
FIG. 51 is a process flow drawing (No. 2) showing, in end sections, the steps of the method of manufacturing the multilayer wiring board using the imprint mold according to the fifth embodiment of the present invention.

The light-shielding layers 504 correspond to vias 574 (see FIGS. 51 (C) and (D)) in the multilayer wiring board 510 produced using the imprint mold 501 according to the present embodiment. As will be described later, the light-shielding layer 504 is for ensuring that at the time of manufacturing the multilayer wiring board 510 using the imprint mold 501 according to the present embodiment, a predetermined position of an insulating film 560 is prevented from being irradiated with rays, whereby a through-hole 564 corresponding to the via 574 is formed through a developing treatment, without curing the insulating film 560 at the part not irradiated with the rays (see FIGS. 50 (C) and (D)). Therefore, the light-shielding layer 504 preferably has an optical characteristic of being capable of shielding light to such an extent that the insulating film 560 is not cured; for example, the light-shielding layer 504 preferably has an OD value of not less than 2.

Examples of the material constituting the light-shielding layer 504 include: chromium-based materials such as chromium, chromium nitride, chromium oxide, chromium oxynitride, etc.; tantalum-based materials such as tantalum, tantalum nitride, tantalum oxide, tantalum oxynitride, tantalum oxide boride, tantalum oxynitride boride, etc.; metallic materials such as titanium, aluminum, silver, molybdenum, etc. and alloy materials containing at least one of them; nickel-based materials and the like, which can be used either singly or in combination of arbitrarily selected two or more of them.

The shape (plan-view shape) of the light-shielding layer 504 is not particularly limited, and is a shape corresponding to the shape of the via 574 in the multilayer wiring board 510, for example, a substantially circular shape in plan view.

The size (diameter) $D_{RS}$ of the light-shielding layer 504 is preferably not more than the size $D_{R52}$ of the second projected pattern portion 534 covering the light-shielding layer 504. If the size $D_{RS}$ of the light-shielding layer 504 is greater than the size $D_{R52}$ of the second projected pattern portion 534, it may be impossible to form the land 575 (see FIGS. 51 (C) and (D)) corresponding to the second projected pattern portion 534. The size $D_{RS}$ of the light-shielding layer 504 can be appropriately set within the range of 5 to 30 µm, for example.

The thickness of the light-shielding layer 504 is not particularly limited, so long as a desired optical characteristic can be exhibited. For example, in the case where the material constituting the light-shielding layer 504 is chromium, the thickness of the light-shielding layer 504 is preferably not less than 50 nm, and is more preferably 50 to 150 nm.

In plan view as viewed from the side of the first surface 521 of the imprint mold 501 according to the present embodiment, it is preferable that the light-shielding layer 504 is provided on the first surface 521 in such a manner as to be physically included in the second projected pattern portion 534 covering the light-shielding layer 504, and it is particularly preferable that the center of the light-shielding layer 504 and the center of the second projected pattern portion 534 substantially coincide with each other. With the light-shielding layer 504 physically included in the second projected pattern portion 534, the light-shielding layer 504 is not exposed to the outside, and the light-shielding layer 504 can be prevented from being damaged. In addition, with the center of the light-shielding layer 504 and the center of the second projected pattern portion 534 substantially coinciding with each other, the via 574 in the multilayer wiring board 510 can be formed substantially in the center of the land 575.

In the present embodiment, it is preferable that a mold release layer 505 covering the transparent rugged pattern layer 503 is provided on the transparent rugged pattern layer 503 (see FIG. 48). With the mold release layer 505 provided, a mold release property of the imprint mold 501 according to the present embodiment can be enhanced, at the time of an imprint treatment using the imprint mold 501. Furthermore, it is preferable that a close contact layer 506 is provided between the transparent rugged pattern layer 503 and the mold release layer 505.

[Method of Manufacturing Imprint Mold]

Figure 49:
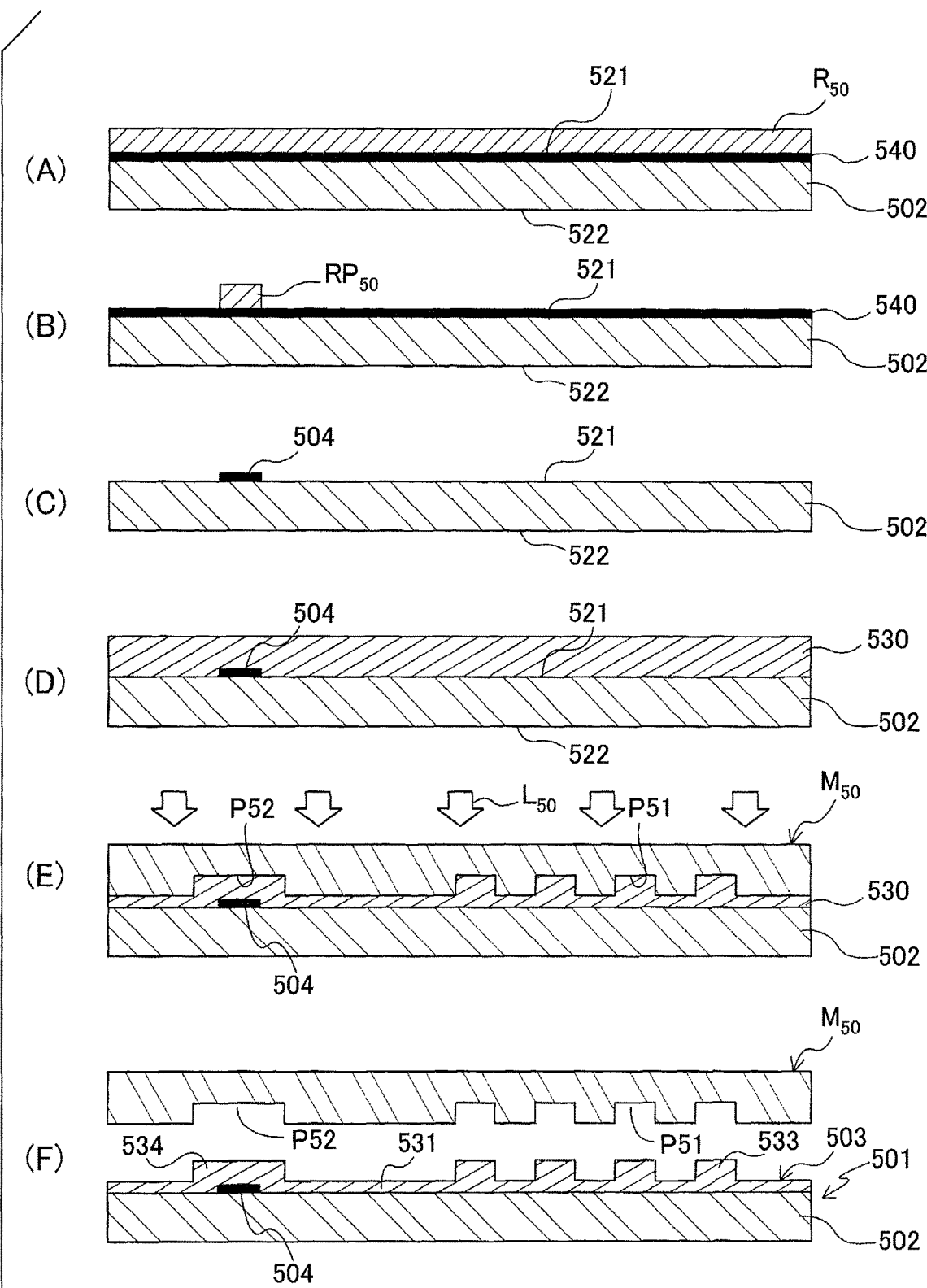
FIG. 49 is a process flow drawing showing, in end sections, steps of a method of manufacturing the imprint mold according to the fifth embodiment of the present invention.

A method of manufacturing the imprint mold 501 having the above-mentioned configuration will be described below. FIG. 49 is a process flow drawing which shows, in end sections, steps in the method of manufacturing the imprint mold according to the present embodiment.

[Light-Shielding Layer Forming Step]

First, a transparent base material 502 having a first surface 521 and a second surface 522 opposite thereto is prepared, a light-shielding material layer 540 is formed on the first surface 521 of the transparent base material 502, and a resist film $R_{50}$ is formed thereon (see FIG. 49 (A)).

The light-shielding material layer 540 can be formed by a known film forming method such as sputtering, PVD, and CVD, while using either one or arbitrarily selected two or more of materials including: chromium-based materials such as chromium, chromium nitride, chromium oxide, chromium oxynitride, etc.; tantalum-based materials such as tantalum, tantalum nitride, tantalum oxide, tantalum oxynitride, tantalum oxide boride, tantalum oxynitride boride, etc.; metallic materials such as titanium, aluminum, silver, molybdenum, etc. and alloy materials containing at least two of them; nickel-based materials, and the like.

The thickness of the light-shielding material layer 540 is not limited so long as a desired light-shielding characteristic can be exhibited according to the OD value of the material constituting the light-shielding material layer 540. For example, in the case where the light-shielding material layer 540 is comprised of metallic chromium, the thickness of the light-shielding material layer 540 is not less than 50 nm, and is preferably 50 to 150 nm.

The resin material (resist material) constituting the resist film $R_{50}$ is not particularly limited, and examples thereof include negative-type or positive-type electron beam reactive resist materials, UV reactive resist materials and the like generally used in an electron beam lithographic treatment, a photolithographic treatment or the like.

The thickness of the resist film $R_{50}$ is not particularly limited. A resist pattern $RP_{50}$ obtained by patterning the resist film $R_{50}$ in a step described later (see FIGS. 49 (B) and (C)) is used as a mask at the time of etching the light-shielding material layer 540. Therefore, the thickness of the resist film $R_{50}$ is appropriately set, taking the material constituting the light-shielding material layer 540, the thickness of the light-shielding material layer 540, and the like in such a manner that the resist pattern $RP_{50}$ remains after the etching treatment of the light-shielding material layer 540; specifically, the thickness of the resist film $R_{50}$ is about 0.3 to 1 μm.

The method for forming the resist film $R_{50}$ on the light-shielding material layer 540 is not particularly limited, and examples thereof include conventionally known methods, such as a method in which a resist material is applied onto the light-shielding material layer 540 by a coating apparatus such as a spin coater or a spray coater, or in which a dry film resist containing the above-mentioned resin component is laminated on the light-shielding material layer 540, optionally followed by heating (prebake) at a predetermined temperature.

Next, a resist pattern $RP_{50}$ is formed at a desired position on the light-shielding material layer 540, as shown in FIG. 49 (B). The resist pattern $RP_{50}$ can be formed, for example, by electron beam lithography in which an electron beam lithography device is used, photolithography in which a photomask having predetermined openings and light-shielding portions is used, or the like.

The shape of the resist pattern $RP_{50}$ is appropriately set according to the shape of the light-shielding layer 504 of the imprint mold 501 according to the present embodiment, namely, the shape of the via 574 in the multilayer wiring board 510 manufactured using the imprint mold 501 (see FIGS. 51 (C) and (D)), and is not particularly limited; in general, the shape is a substantially circular shape in plan view.

Like the shape, the size of the resist pattern $RP_{50}$ is appropriately set according to the size $D_{RS}$ (see FIG. 47) of the light-shielding layer 504 of the imprint mold 501 produced in the present embodiment, namely, the size of the via 574 (see FIGS. 51 (C) and (D)) in the multilayer wiring board 510 manufactured using the imprint mold 501, and is not particularly limited; for example, the size of the resist pattern $RP_{50}$ is about 5 to 30 μm. Note that in the case where the shape of the resist pattern $RP_{50}$ is a substantially circular shape in plan view, the size of the resist pattern $RP_{50}$ means the diameter of the resist pattern $RP_{50}$.

Using the resist pattern $RP_{50}$ formed as above-mentioned as a mask, the light-shielding material layer 540 is etched, after which the resist pattern $RP_{50}$ is removed, whereby the light-shielding layer 504 is formed at a desired position on the first surface 521 of the transparent base material 502 (see FIG. 49 (C)).

[Production of Transparent Rugged Pattern Layer]

Next, as shown in FIG. 49 (D), a transparent resin material film 530 covering the light-shielding layer 504 is formed over the whole area of the first surface 521 of the transparent base material 502. As the transparent resin material constituting the transparent resin material film 530, there can be used, for example: thermoplastic resins such as polycarbonate (PC), polymethyl methacrylate (PMMA), cycloolefin polymer (COP), polyethylene terephthalate (PET), etc.; and photo-curing resins which contain a photopolymerization initiator and are UV-curing.

Examples of the method for forming the transparent resin material film 530 include a spin coating method, an ink jet method, a spray coating method, and a die coating method. The film thickness of the transparent resin material film 530 is not particularly limited, and is about 1 to 20 μm, for example.

Subsequently, a mold $M_{50}$ having first recessed pattern portions P51 and a second recessed pattern portion P52 corresponding to first projected pattern portions 533 and a second projected pattern portion 534 of the transparent rugged pattern layer 503 is prepared, and, in the case where the transparent resin material constituting the transparent resin material layer 530 is the above-mentioned photo-curing resin, the surface formed with the first recessed pattern portions P51 and the second recessed pattern portion P52 of the mold $M_{50}$ is pressed against the transparent resin material film 530, and, in that state, irradiation with UV rays $L_{50}$ or the like is conducted, to cure the transparent resin material film 530 (see FIG. 49 (E)). Note that in the case where the transparent resin material constituting the transparent resin material film 530 is the above-mentioned thermoplastic resin, it is sufficient that a substrate formed with the transparent resin material film 530 is heated to or above a glass transition temperature, and the transparent resin material film 530 is pressed by the mold $M_{50}$, followed by cooling, to cure the transparent resin material film 530.

Like the transparent base material 502 of the imprint mold 501 according to the present embodiment, the mold $M_{50}$ can be comprised of a transparent substrate such as glass substrates such as quartz glass substrate, soda glass substrate, fluorite substrate, calcium fluoride substrate, magnesium fluoride substrate, acrylic glass, etc., resin substrates such as polycarbonate substrate, polypropylene substrate, polyethylene substrate, polyethylene terephthalate substrate, etc., and laminate substrates obtained by laminating arbitrary selected two or more of these substrates.

The shape, size and the like of the first recessed pattern portions P51 and the second recessed pattern portion P52 of the mold $M_{50}$ are not particularly limited, and can be set according to the shape, size and the like of the first projected pattern portions 533 and the second projected pattern portion 534 required in the imprint mold 501 manufactured in the present embodiment; for example, the shape can be set to be a space shape, a hole shape or the like, and the size can be set to be about 0.5 to 30 μm. Note that on the side of the surface formed with the first and second recessed pattern portions P51 and P52 of the mold $M_{50}$, a mold release layer may be provided for the purpose of facilitating mold release from the transparent resin material film 530.

Then, the mold $M_{50}$ is released from the cured transparent resin material film 530 (see FIG. 49 (F)). By this, the transparent rugged pattern layer 503 is formed on the first surface 521 of the transparent base material 502, and the imprint mold 501 according to the present embodiment is manufactured. Note that a close contact layer 506 and a mold release layer 505 may optionally be formed over the transparent rugged pattern layer 503 of the imprint mold 501 by conventionally known methods.

[Method of Manufacturing Multilayer Wiring Board]

A method of manufacturing a multilayer wiring board using the imprint mold 501 having the aforementioned configuration will be described. FIG. 50 is a process flow drawing (No. 1) which shows, in end sections, steps of the method of manufacturing the multilayer wiring board using the imprint mold according to the present embodiment, and FIG. 51 is a process flow drawing (No. 2) which shows, in end sections, steps of the method of manufacturing the multilayer wiring board using the imprint mold according to the present embodiment.

First, a first wiring layer 550 and the imprint mold 501 according to the present embodiment are prepared, and an insulating film 560 is formed on the first wiring layer 550 (see FIG. 50 (A)). As the material constituting the insulating film 560, there can be used an electrically insulating material, examples of which include epoxy resin materials, phenolic resin materials, polyimide resin materials, polysulfone resin materials, polyester resin materials, and polycarbonate resin materials; it is preferable to use a UV-curing resin which is cured when irradiated with UV rays. The thickness of the insulating film 560 is preferably about 3 to 30 μm.

While the imprint mold 501 is being pressed against the insulating film 560 on the first wiring layer 550, the insulating film 560 is cured (see FIG. 50 (B)). It is sufficient to appropriately select the method for curing the insulating film 560, according to curing characteristics of the resin material constituting the insulating film 560. For example, in the case where the insulating film 560 is comprised of a UV-curing resin, the insulating film 560 can be cured by irradiating with UV rays $L_{50}$ in a state in which the imprint mold 501 is pressed against the insulating film 560. Since the imprint mold 501 according to the present embodiment has the light-shielding layer 504, that portion 561 of the insulating film 560 which is not irradiated with the UV rays $L_{50}$ due to the light-shielding layer 504 is not cured. The uncured portion 561 is removed in a later step, to correspond to a through-hole 564 for forming a via 574. The light-shielding layer 504 is completely covered by a transparent rugged pattern layer 503 (second projected pattern portion 534), whereby it is ensured that the light-shielding layer 504 does not contact the insulating film 560 at the time of imprint using the imprint mold 501. Therefore, even when the imprint treatment is conducted repeatedly, damaging such as peeling of the light-shielding layer 504 can be restrained from occurring.

The cured insulating film 560 is peeled from the imprint mold 501 (see FIG. 50 (C)). By this, there is formed the insulating film 560 which has recesses 562 and 563 corresponding to the transparent rugged pattern layer 503 (the first projected pattern portions 533 and the second projected pattern portion 534) of the imprint mold 501 and an uncured portion 561 corresponding to the light-shielding layer 504. Thereafter, by a developing treatment using a developing liquid, the uncured portion 561 is removed, to form the through-hole 564 (see FIG. 50 (D)). By this, the insulating film 560 having the recesses 562 and 563 and the through-hole 564 is produced on the first wiring layer 550.

Subsequently, a metal seed layer 571 is formed on the insulating film 560 (see FIG. 51 (A)). Examples of the material constituting the metal seed layer 571 include Ti, Mo, W, In, Nb, Co, Cr, Cu, and Ni. The thickness of the metal seed layer 571 is not particularly limited, and can be set to be about 10 to 500 nm. The method for forming the metal seed layer 571 is not specifically restricted, and examples of the method include sputtering, and electroless plating.

A metal plating layer 572 such as a copper plating layer which fills the recesses 562 and 563 and the through-hole 564 of the insulating film 560 is formed on the metal seed layer 571 by an electroplating method (see FIG. 51 (B)). Then, the metal plating layer 572 is subjected to a polishing treatment to such an extent that the insulating film 560 can be exposed, whereby there is formed a second wiring layer 570 which has a wiring pattern 573 and has a via 574 and a land 575 for electrical connection with the first wiring layer 550 (see FIG. 51 (C)).

The aforementioned steps shown in FIG. 50 (A) to FIG. 51 (C) are conducted repeatedly, to form an Nth wiring layer (N is an integer of not less than 2) on an (N−1)th layer, whereby a multilayer wiring board 510 can be manufactured (see FIG. 51 (D)). Note that in FIG. 51 (D) is illustrated the multilayer wiring board 510 in which the first wiring layer 550, the second wiring layer 570, a third wiring layer 580 and a fourth wiring layer 590 are stacked in this order.

As aforementioned, according to the imprint mold 501 according to the present embodiment, the second light-shielding layer 504 is completely covered by the transparent rugged pattern layer 503 (the second projected pattern portion 534), whereby it is ensured that the light-shielding layer 504 does not contact the insulating film 560 at the time of an imprint treatment using the imprint mold 501. For this reason, even when the imprint treatment is conducted repeatedly, damaging such as peeling of the light-shielding layer 504 can be restrained from occurring, and the imprint mold 501 can be stably used for a period of time.

[Modification]

Figure 52:
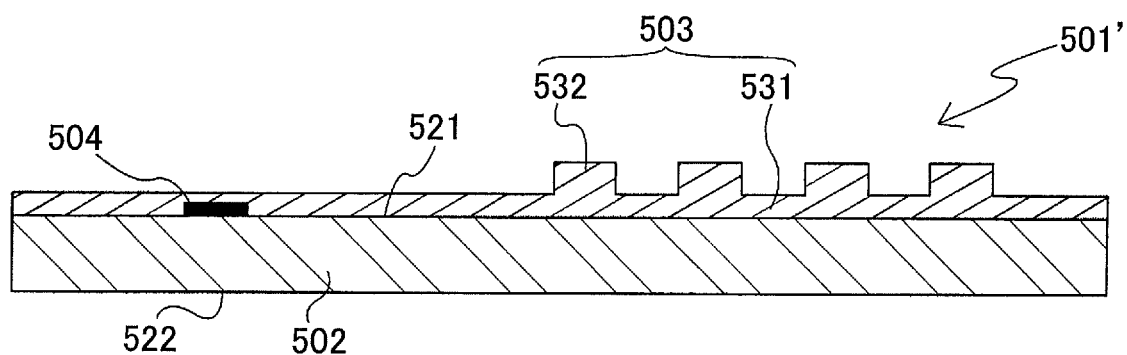
FIG. 52 is a sectional end view showing a general configuration of an imprint mold according to a modification of the fifth embodiment of the present invention.
Figure 53:
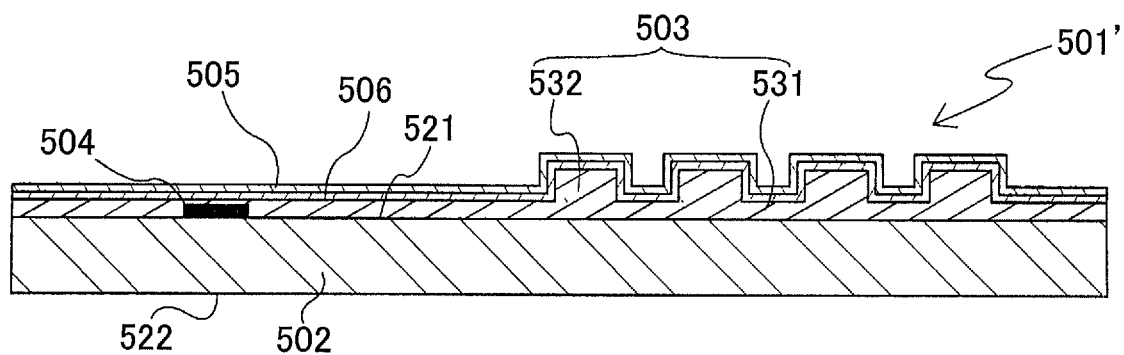
FIG. 53 is a sectional end view showing a general configuration of another mode of the imprint mold according to a modification of the fifth embodiment of the present invention.

A modification of the fifth embodiment will be described below, referring to the drawings. FIG. 52 is a sectional end view showing a general configuration of an imprint mold according to a modification of the fifth embodiment, and FIG. 53 is a sectional end view showing a general configuration of another mode of the imprint mold according to the modification of the fifth embodiment. Note that in the present modification, the same configurations as those in the embodiment shown in FIGS. 47 to 51 are denoted by the same reference symbols as used above, and detailed description thereof will be omitted.

[Imprint Mold]

As shown in FIGS. 52 and 53, an imprint mold 501' according to the present modification has the same configuration as that of the imprint mold 501 according to the embodiment shown in FIGS. 47 to 51, except that a transparent rugged pattern layer 503 has only projected pattern portions 532 (does not have a second projected pattern portion 534 covering a light-shielding layer 504) and that the light-shielding layer 504 is covered with a base layer 531 of the transparent rugged pattern layer 503. Therefore, in the imprint mold 501' according to the present modification, in regard of the same configurations as those of the imprint mold 501 according to the embodiment shown in FIGS. 47 to 51, detailed descriptions will be omitted.

In the present modification, the thickness of the base layer 531 is preferably greater than the thickness of the light-shielding layer 504 such that the light-shielding layer 504 can be completely covered, and the thickness of the base layer 531 can be appropriately set to be about 50 nm to about 3 μm, for example.

The size $D_{RS}$ of the light-shielding layer 504 can be appropriately set according to the size of the via 574 in the multilayer wiring board 510, in the range of 5 to 30 μm, for example. In addition, the thickness of the light-shielding layer 504 is not particularly limited, so long as a desired optical characteristic can be exhibited. For example, in the case where the material constituting the light-shielding layer 504 is chromium, the thickness of the light-shielding layer 504 is preferably not less than 50 nm, and is more preferably 50 to 150 nm.

[Method of Manufacturing Imprint Mold]

Figure 54:
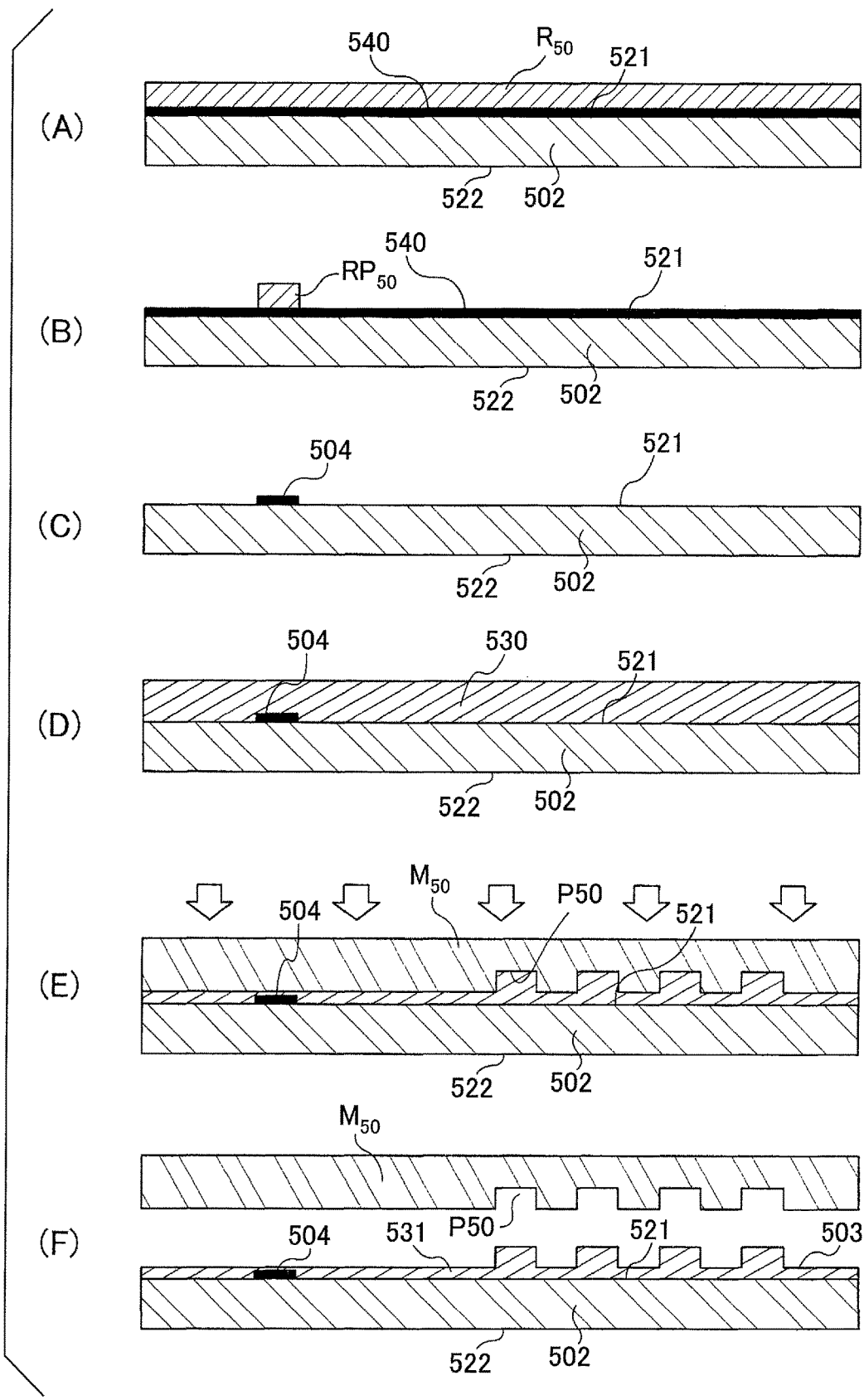
FIG. 54 is a process flow drawing showing, in end sections, steps of a method of manufacturing an imprint mold according to a modification of the fifth embodiment of the present invention.

The imprint mold 501' according to the present modification as aforementioned can be manufactured in the following manner. FIG. 54 is a process flow drawing which shows, in end sections, a method of manufacturing the imprint mold 501' according to the present modification.

In the present modification, like in the embodiment shown in FIGS. 47 to 51, a transparent base material 502 having a first surface 521 and a second surface 522 opposite thereto is prepared, a light-shielding material layer 540 is formed on the first surface 521 of the transparent base material 502, and a resist film $R_{50}$ is formed thereon (see FIG. 54 (A)).

Next, as shown in FIG. 54 (B), a resist pattern $RP_{50}$ is formed at a desired position on the light-shielding material layer 540. Then, the light-shielding material layer 540 is etched using the resist pattern $RP_{50}$ as a mask, and thereafter the resist pattern $RP_{50}$ is removed, whereby a light-shielding layer 504 is formed at a desired position on the first surface 521 of the transparent base material 502 (see FIG. 54 (C)). Next, a transparent resin material film 530 covering the light-shielding layer 504 is formed over the whole area of the first surface 521 of the transparent base material 502 (see FIG. 54 (D)).

A mold $M_{50}$ having recessed pattern portions P50 corresponding to projected pattern portions 532 of a transparent rugged pattern layer 503 is prepared, the surface formed with the recessed pattern portions P50 of the mold $M_{50}$ is pressed against the transparent resin material film 530, and, in that state, irradiation with UV rays $L_{50}$ or the like is conducted, to cure the transparent resin material film 530 (see FIG. 54 (E)). Then, the mold M50 is released from the cured transparent resin material film 530 (see FIG. 54 (F)). By this, the imprint mold 501' according to the present modification is manufactured. Note that a close contact layer 506 and a mold release layer 505 may optionally be formed on the transparent rugged pattern layer 503 of the imprint mold 501' by conventionally known methods.

[Method of Manufacturing Multilayer Wiring Board]

Figure 55:
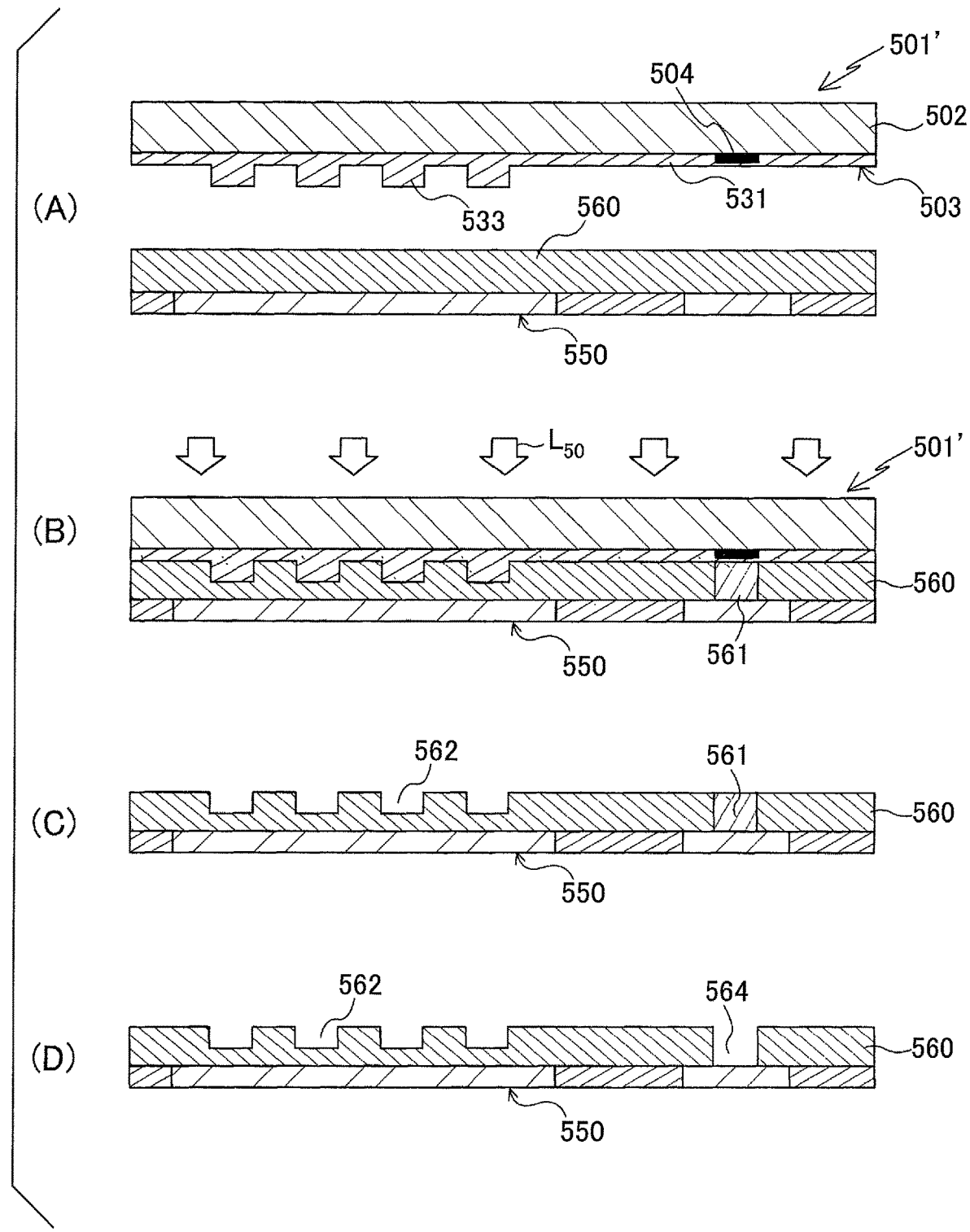
FIG. 55 is a process flow drawing (No. 1) showing, in end sections, steps of a method of manufacturing a multilayer wiring board using an imprint mold according to a modification of the fifth embodiment of the present invention.
Figure 56:
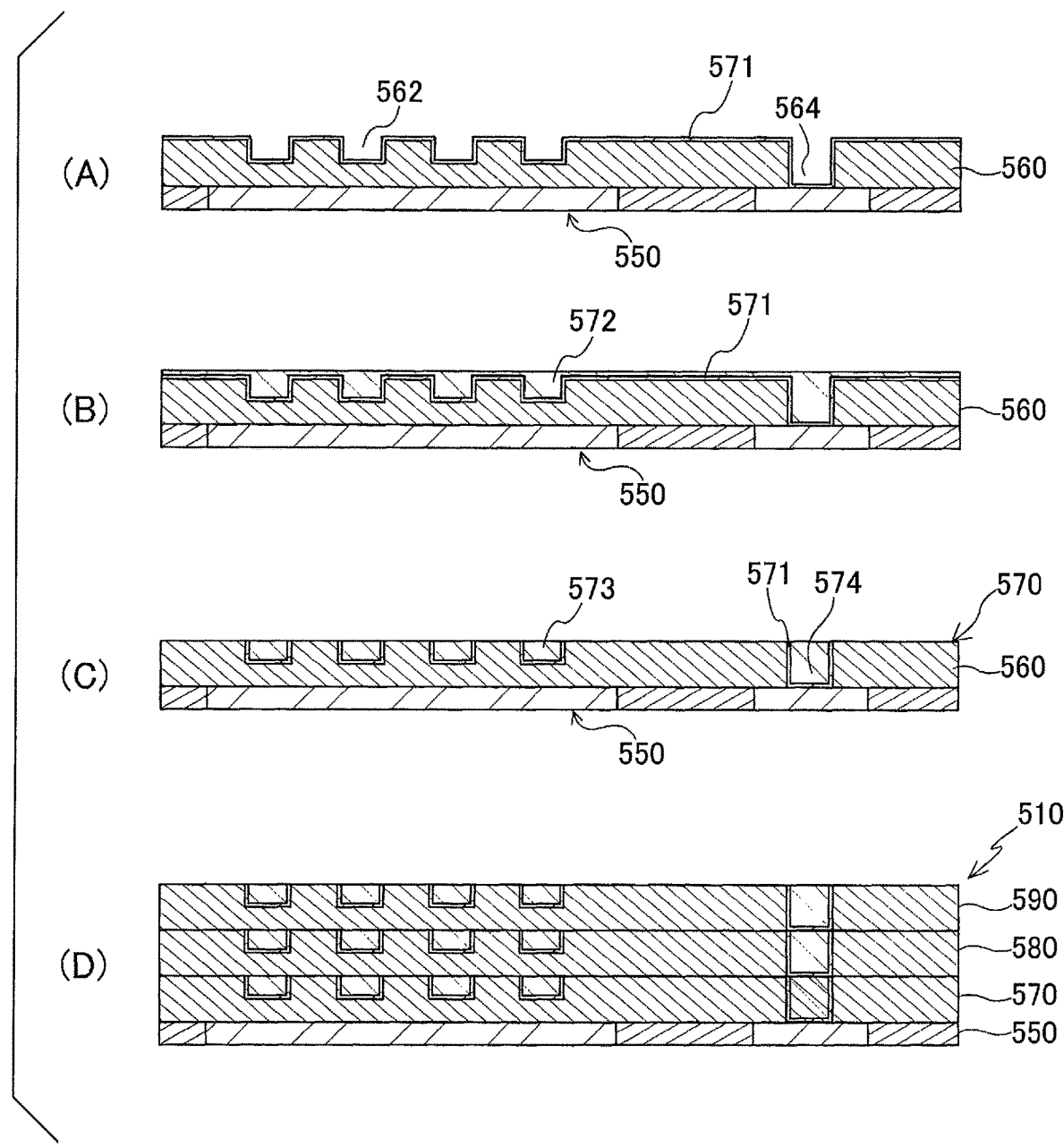
FIG. 56 is a process flow drawing (No. 2) showing, in end sections, steps of the method of manufacturing the multilayer wiring board using the imprint mold according to the modification of the fifth embodiment of the present invention.

FIG. 55 is a process flow drawing (No. 1) which shows, in end sections, steps of a method of manufacturing a multilayer wiring board using the imprint mold according to the present modification, and FIG. 56 is a process flow drawing which shows, in end sections, steps of the method of manufacturing the multilayer wiring board using the imprint mold according to the present embodiment.

First, a first wiring layer 550 and the imprint mold 501' according to the present modification are prepared, and an insulating film 560 is formed on the first wiring layer 550 (see FIG. 55 (A)). Next, while the imprint mold 501' is being pressed against the insulating film 560 on the first wiring layer 550, irradiation with UV rays L50 or the like is conducted, to cure the insulating film 560 (see FIG. 55 (B)). Then, the imprint mold 501' is released from the cured insulating film 560 (see FIG. 55 (C)). By this, there is formed the insulating film 560 which has recesses 562 corresponding to the transparent rugged pattern layer 503 (the projected pattern portions 532) of the imprint mold 501' and an uncured portion 561 corresponding to the light-shielding layer 504. Thereafter, by a developing treatment using a developing liquid, the uncured portion 561 is removed, to form a through-hole 564 (see FIG. 55 (D)). By this, the insulating film 560 having recesses 562 and the through-hole 564 is produced on the first wiring layer 550.

Subsequently, a metal seed layer 571 is formed on the insulating film 560 (see FIG. 56 (A)). Next, a metal plating layer 572 such as a copper plating layer that fills the recesses 562 and the through-hole 564 of the insulating film 560 is formed on the metal seed layer 571 by an electroplating method (see FIG. 56 (B)). Then, the metal plating layer 572 is subjected to a polishing treatment to such an extent that the insulating film 560 can be exposed, whereby there is formed a second wiring layer 570 which has a wiring pattern 573 and has a via (landless via) 574 for electrical connection with the first wiring layer 550 (see FIG. 56 (C)). Note that the through-hole 564 can be formed in a normal tapered shape by suitably setting the material constituting the insulating film 560, process conditions of the imprint treatment using the imprint mold 501', and the like. Where the metal plating layer 572 thus filling the through-hole 564 is formed and a predetermined polishing treatment is conducted to form the via 574, it is thereby ensured that the via 574 can have not only the original function as a via but also a function as a land.

The aforementioned steps shown in FIG. 55 (A) to FIG. 56 (C) are conducted repeatedly to form an Nth wiring layer (N is an integer of not less than 2) on an (N−1)th wiring layer, whereby a multilayer wiring board 510 can be manufactured (see FIG. 56 (D)). Note that in FIG. 56 (D) is illustrated the multilayer wiring board 510 in which the first wiring layer 550, a second wiring layer 570, a third wiring layer 580 and a fourth wiring layer 590 are stacked in this order.

As aforementioned, according to the imprint mold 501' according to the present modification, the second light-shielding layer 504 is completely covered by the transparent rugged pattern layer 503 (the base layer 531), whereby it is ensured that the light-shielding layer 504 does not contact the insulating film 560 at the time of an imprint treatment using the imprint mold 501'. For this reason, even when the imprint treatment is conducted repeatedly, damaging such as peeling of the light-shielding layer 504 can be restrained from occurring, and the imprint mold 501' can be stably used over a long period of time.

In addition, according to the imprint mold 501' according to the present modification, the via (landless via) 574 not having a land portion can be easily formed, and, therefore, a multiplicity of wiring patterns 573 can be formed in the vicinity of the via 574, and a high-density multilayer wiring board 510 can be manufactured.

The embodiment and modification described above have been described for facilitating understanding of the present invention, and have not been described for limiting the present invention. Therefore, each of the elements disclosed in the above embodiment and modification is intended to include all design modifications and equivalents that fall within the technical scope of the present invention.

Each of the wiring layers 550, 570, 580 and 590 (see FIG. 51 (D)) of the multilayer wiring board 510 in the embodiment shown in FIGS. 47 to 51 has the via 574 and the land 575, whereas each of the wiring layers 550, 570, 580 and 590 (see FIG. 56 (D)) of the multilayer wiring board 510 in the modification shown in FIGS. 52 to 56 has the via (landless via) 574, but the present invention is not to be limited to these modes. For example, at least one of the wiring layers 550, 570, 580 and 590 of the multilayer wiring board 510 in the embodiment shown in FIGS. 47 to 51 may have a via (landless via) 574 and may not have a land 575. Besides, at least one of the wiring layers 550, 570, 580 and 590 of the multilayer wiring board 510 in the modification shown in FIGS. 52 to 56 may have a via 574 and a land 575.

Figure 57:
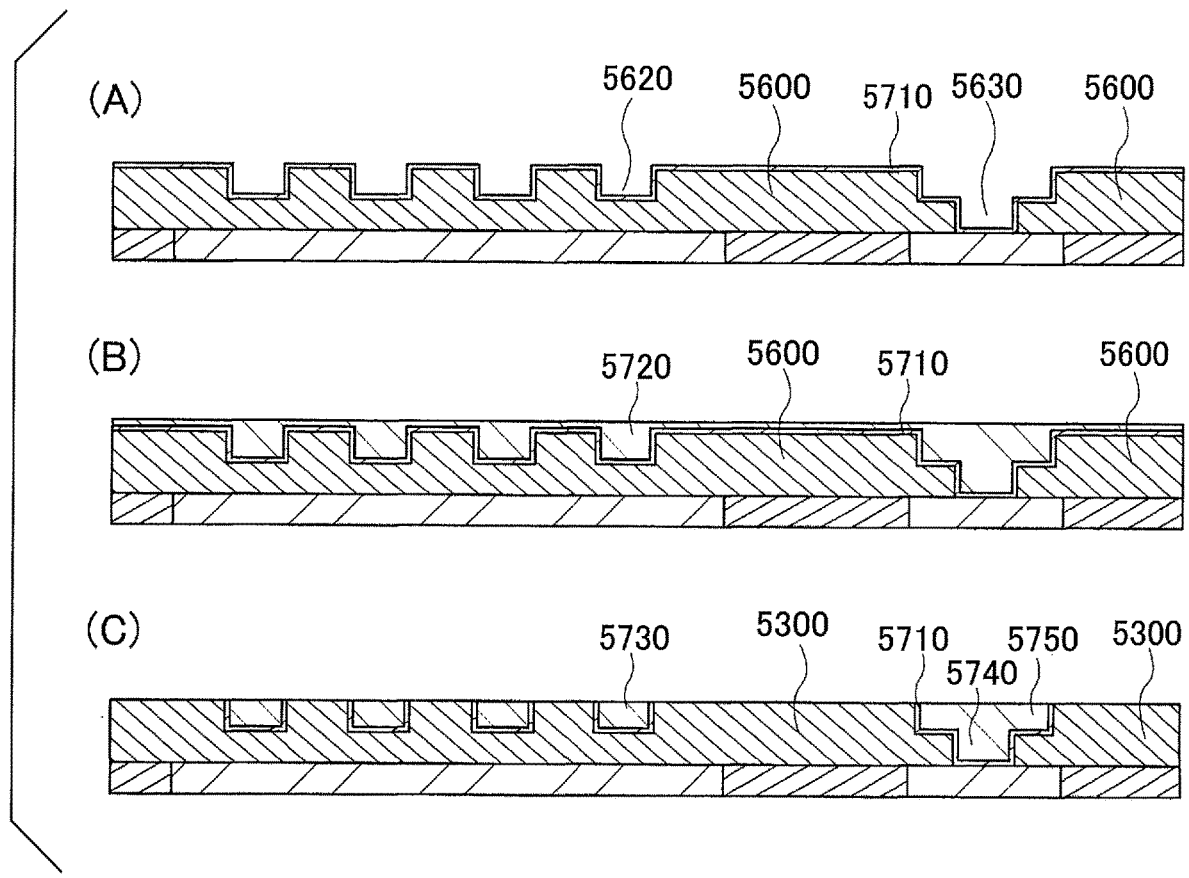
FIG. 57 is a process flow drawing showing, in end sections, steps of a method of manufacturing a wiring board according to a comparative example.
Figure 58:
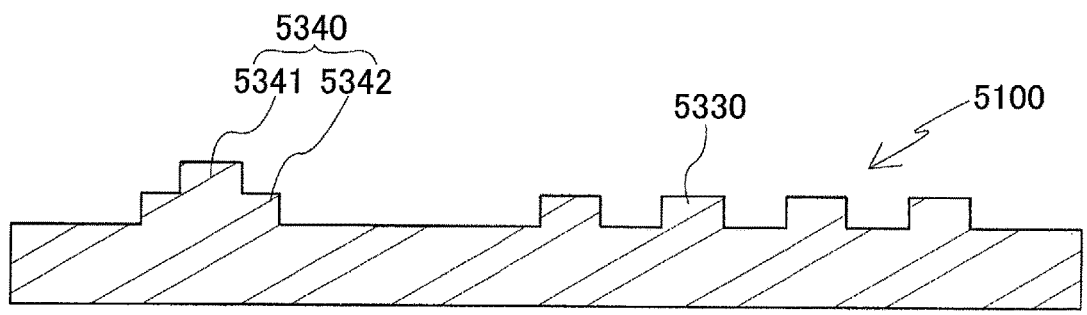
FIG. 58 is a sectional end view showing a general configuration of an imprint mold (No. 1) used in the process of manufacturing the wiring board according to the comparative example.

Here, as a comparative example, a general method of manufacturing a multilayer wiring board will be described, using FIGS. 57 to 59. As shown in FIG. 57, a metal layer 5710 is formed by sputtering, electroless plating or the like on an insulating film (resin film) 5600 formed with recesses 5620 for forming wiring patterns 5730 and with stepped through-holes 5630 for forming a via 5740 and a land 5750 (see FIG. 57 (A)), copper 5720 as a conductor is embedded in the recesses 5620 and the through-hole 5630 by a copper electroplating treatment (see FIG. 57 (B)), and a polishing treatment is conducted (see FIG. 57 (C)), whereby a multilayer wiring board having the wiring patterns 5730, the via 5740 and the land 5750 is manufactured.

The insulating film (resin film) 5600 having the recesses 5620 and the through-hole 5630 can be produced, for example, by an imprint lithographic method using an imprint mold 5100 (see FIG. 58) which has first projected pattern portions 5330 corresponding to the recesses 5620 for forming the wiring patterns 5730 and has a second projected pattern portion 5340 corresponding to the through-hole 5630 for forming the via 5740 and the land 5750.

In the imprint mold 5100 to be used for producing such an insulating film (resin film) 5600, the second projected pattern portion 5340 corresponding to the through-hole 5630 for forming the via 5740 and the land 5750 includes a first projected portion 5341 corresponding to the via 5740 and a second projected portion 5342 corresponding to the land 5750.

In the imprint treatment using the imprint mold 5100, the through-hole 5630 formed correspondingly to the second projected pattern portion 5340 (the first projected portion 5341) is for forming the via 5740 for electrical connection with the wiring pattern or the like in the lower layer; therefore, the through-hole 5630 must penetrate the insulating film (resin film) 5600 in the thickness direction and expose the wiring pattern or the like in the lower layer. However, in the imprint treatment using the imprint mold 5100, residue (residual film) of the imprint resin is usually present at a bottom portion of the first projected portion 5341 after the release of the imprint mold 5100. In general, therefore, the residue (residual film) is removed by ashing or the like after the imprint treatment, whereby the through-hole 5630 penetrating the insulating film (resin film) 5600 in the thickness direction is formed.

With the residue (residual film) removed by ashing or the like, side walls of the recesses 5620 and the through-hole 5630 and the like are somewhat damaged. As a result, there arises a problem that the surfaces of the conductor (copper) of the wiring patterns 5730, the via 5740 and the land 5750 formed by embedding the conductor (copper) in the recesses 5620 and the through-hole 5630 would be roughened, and electrical characteristics would be lowered.

Figure 59:
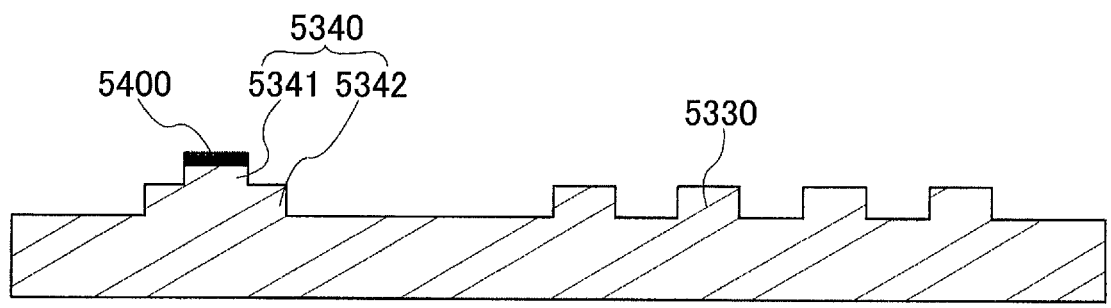
FIG. 59 is a sectional end view showing the general configuration of the imprint mold (No. 2) used in the process of manufacturing the wiring board according to the comparative example.

In view of this, there have been proposed a method as shown in FIG. 59, in which by providing a light-shielding layer 5400 on a top portion of the first projected portion 5341, the imprint resin (the part corresponding to the residual film) beneath the light-shielding layer 5400 is not cured but is removed by a developing treatment or the like after the imprint treatment, to thereby form a through-hole 5630 penetrating the insulating film (resin film) 5600 in the thickness direction, and an imprint mold for use in the method (see U.S. Pat. No. 7,168,936).

However, in the imprint mold described in the above-mentioned U.S. Pat. No. 7,168,936, since the light-shielding layer 5400 is provided on the top portion of the first projected portion 5341, the light-shielding layer 5400 makes direct contact with the imprint resin. As a result, when the imprint treatment is repeated using the imprint mold, there arises a problem that damaging such as peeling of the light-shielding layer 5400 would be generated.

When the light-shielding layer 5400 is damaged (peeled) in the imprint mold, it is extremely difficult to regenerate the light-shielding layer 5400 and, therefore, the imprint mold cannot be used continuedly over a long period of time.

On the other hand, according to the present embodiment, the transparent rugged pattern layer 503 is provided on the first surface 521 of the transparent base material 502 in such a manner as to cover the light-shielding layer 504, whereby damaging such as peeling of the light-shielding layer 504 can be restrained from occurring, and it is possible to provide an imprint mold 501 that can be stably used over a long period of time.

Sixth Embodiment

Figure 60:
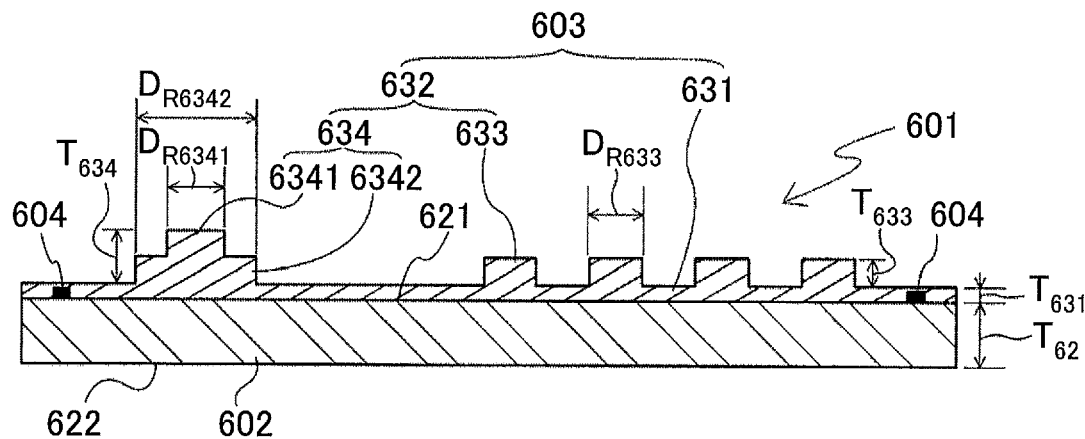
FIG. 60 is a sectional end view showing a general configuration of an imprint mold according to a sixth embodiment of the present invention.
Figure 61:
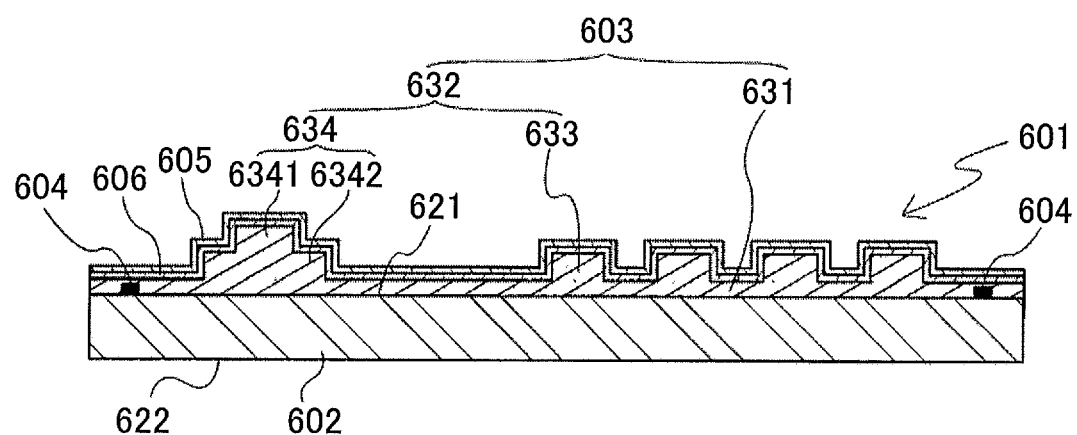
FIG. 61 is a sectional end view showing a general configuration of another mode of the imprint mold according to the sixth embodiment of the present invention.
Figure 62:
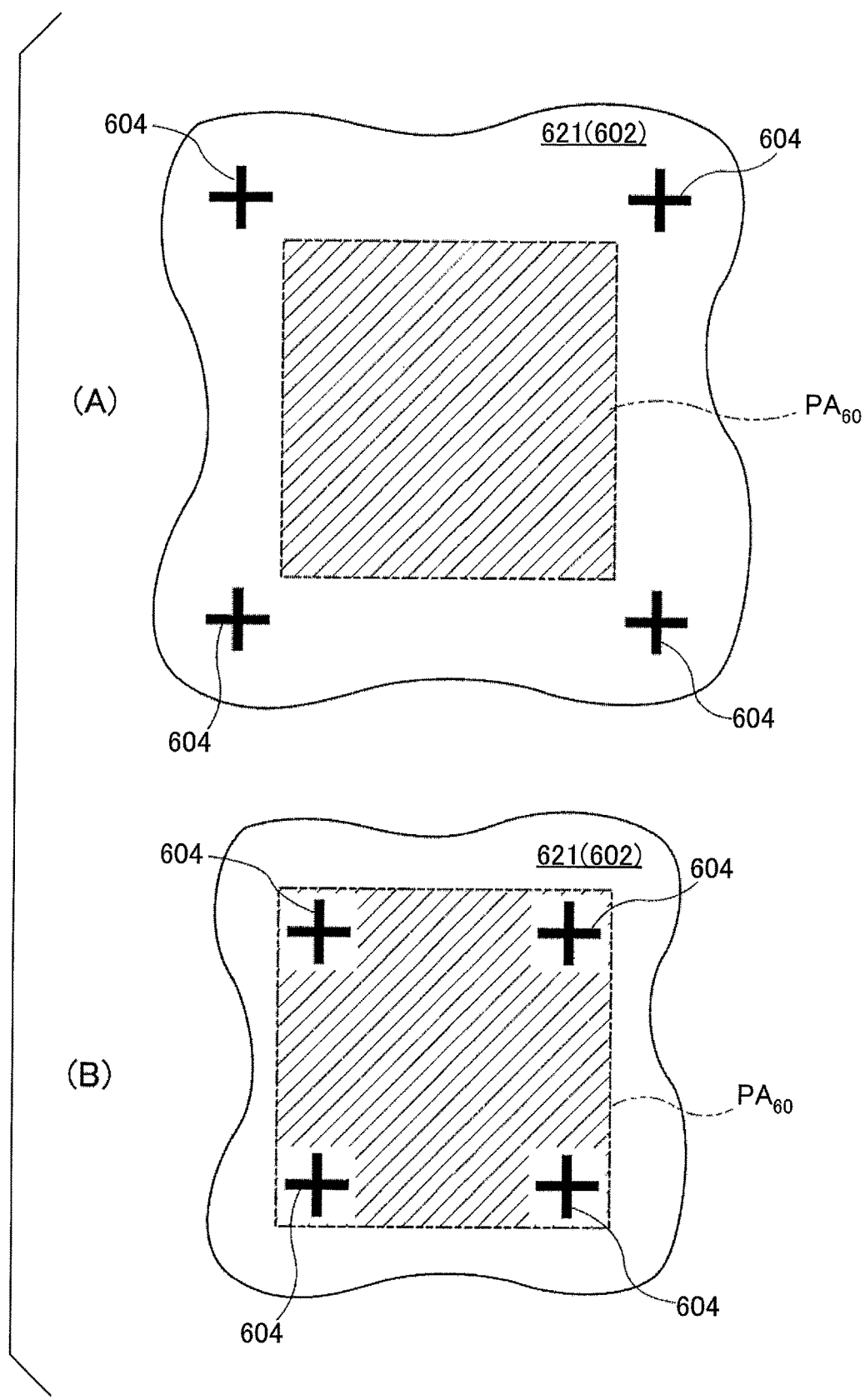
FIGS. 62 (A) and (B) are plan views showing a general configuration of an alignment mark in the sixth embodiment of the present invention.
Figure 63:
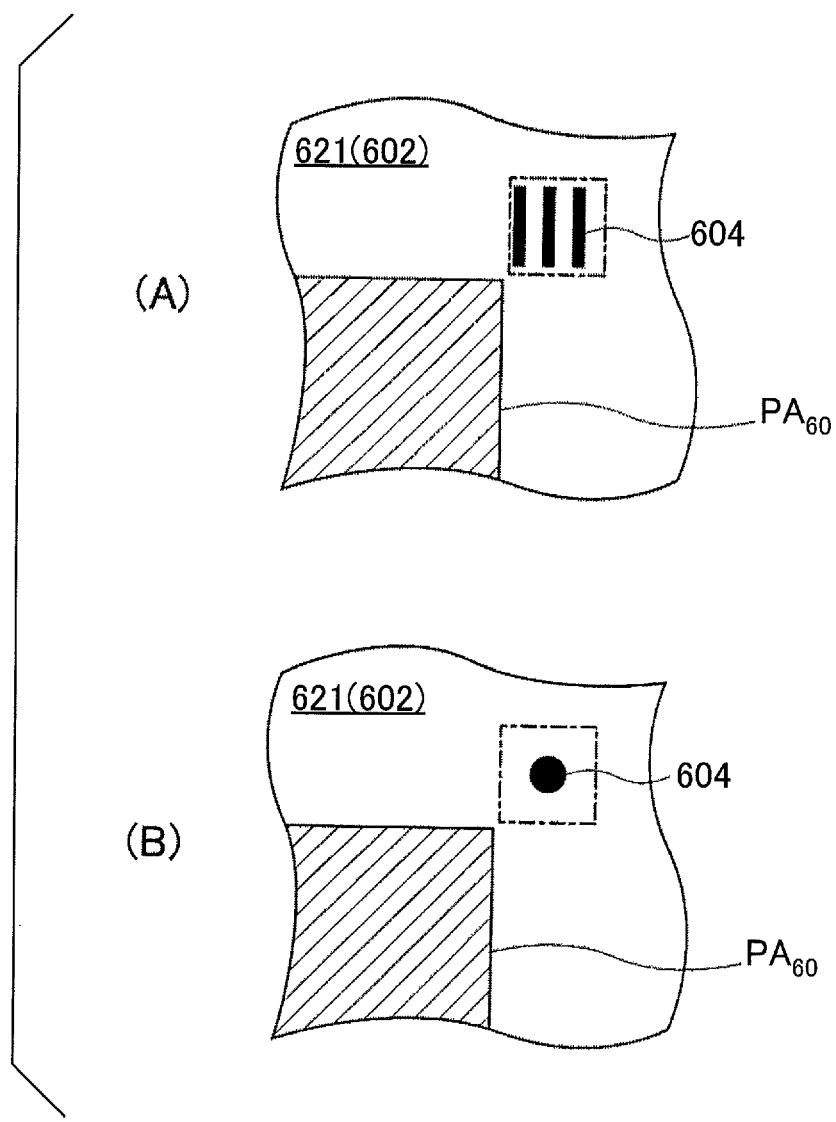
FIGS. 63 (A) and (B) are plan views showing a general configuration of another mode of the alignment mark in the sixth embodiment of the present invention.

A sixth embodiment of the present invention will be described below, referring to the drawings. FIG. 60 is a sectional end view showing a general configuration of an imprint mold according to the present embodiment, FIG. 61 is a sectional end view showing a general configuration of another mode of the imprint mold according to the present embodiment, FIG. 62 shows plan views showing a general configuration of alignment marks in the present embodiment, and FIG. 63 shows plan views showing a general configuration of another mode of the alignment mark in the present embodiment.

[Imprint Mold]

As shown in FIG. 60, an imprint mold 601 according to the present embodiment has a transparent base material 602 having a first surface 621 and a second surface 622 opposite to the first surface 621, and a transparent rugged pattern layer 603 and alignment marks 604 which are provided on the first surface 621 of the transparent base material 602.

As the transparent base material 602, there can be used those which are generally used as imprint mold base material, for example, transparent substrates such as glass substrates such as quartz glass substrate, soda glass substrate, fluoride substrate, calcium fluoride substrate, magnesium fluoride substrate, barium borosilicate glass, aminoborosilicate glass, aluminosilicate glass and the like no alkali glass substrates, resin substrates such as polycarbonate substrate, polypropylene substrate, polyethylene substrate, polymethyl methacrylate substrate, polyethylene terephthalate substrate, and laminate substrates obtained by laminating two or more substrates arbitrarily selected from these substrates. The transparent rugged pattern layer 603 in the present embodiment is comprised of a transparent resin material, as described later, and, therefore, the transparent base material 602 preferably has a refractive index comparable to that of the transparent resin material constituting the transparent rugged pattern layer 603. For this reason, in the case where a glass substrate is used as the transparent base material 602, it is preferable to use a no alkali glass substrate, and in the case where a resin substrate is used, it is preferable to use a resin substrate comprised of the same resin material as the transparent resin material constituting the transparent rugged pattern layer 603. Note that in the present embodiment, "transparent" means that transmittance to rays of wavelengths of 300 to 450 nm is not less than 70%, preferably not less than 90%.

The plan-view shape of the transparent base material 602 is not particularly limited, and examples thereof include a substantially rectangular shape and a substantially circular shape. In the case where the transparent base material 602 is composed of a quartz glass substrate generally used for optical imprint, the plan-view shape of the transparent base material 602 is normally a substantially rectangular shape.

The size of the transparent base material 602 is also not particularly limited; in the case where the transparent base material 602 is composed of the quartz glass substrate, the size of the transparent base material 602 is about 152 mm×152 mm, for example. In addition, the thickness $T_{62}$ of the transparent base material 602 can be appropriately set within the range of about 0.3 to 10 mm, for example, taking strength and handleability and the like into consideration.

The transparent rugged pattern layer 603 includes a base layer 631 covering the whole area of the first surface 621, and projected pattern portions 632 projected from the base layer 631 and located in a pattern area $PA_{60}$ (see FIG. 62) set on the first surface 621. The projected pattern portions 632 include first projected pattern portions 633 corresponding to wiring patterns 674 (see FIG. 69 (C)) in a multilayer wiring board 610 produced using the imprint mold 601 according to the present embodiment, and a second projected pattern portion 634 corresponding to a via 675 and a land 676 (see FIG. 69 (C)).

The shape of the first projected pattern portions 633 is a shape corresponding to the wiring patterns 674 in the multilayer wiring board 610, and is a line shape, for example. In addition, the shape of the second projected pattern portion 634 is a substantially stepped shape of two steps in side view which includes a first step 6341 corresponding to the via 675 in the multilayer wiring board 610 and a second step 6342 corresponding to the land 676, in which the plan-view shape of the first step 6341 and the second step 6342 is a substantially circular shape, for example.

The size (line width) $D_{R633}$ of the first projected pattern portions 633 is appropriately set according to the size of the wiring patterns 674 in the multilayer wiring board 610, to be about 0.5 to 10 μm, for example. The size (diameter) $D_{R6341}$ of the first step 6341 of the second projected pattern portion 634 is appropriately set according to the size of the via 675 in the multilayer wiring board 610, to be about 5 to 30 μm, for example. In addition, the size (diameter) $D_{R6342}$ of the second step 6342 is greater than the size $D_{R633}$ of the first projected pattern portions 633 and is appropriately set according to the size of the land 676 in the multilayer wiring board 610, to be about 5 to 30 μm, for example. The height $T_{633}$ of the first projected pattern portions 633 is appropriately set to be about 0.5 to 10 μm, for example, and the height $T_{634}$ of the second projected pattern portion 634 is appropriately set to be about 0.5 to 10 μm, for example.

The thickness T631 of the base layer 631 need only be such a thickness as to be able to sufficiently cover the alignment marks 604 which will be described later, and the thickness can be appropriately set to be about 50 nm to about 3 μm, for example.

The transparent rugged pattern layer 603 is comprised of a transparent resin material, and is preferably comprised of a transparent resin material which has a refractive index comparable to the refractive index of the transparent base material 602. Examples of such a transparent resin material include: thermoplastic resins such as polycarbonate (PC), polymethyl methacrylate (PMMA), cycloolefin polymer (COP), polyethylene terephthalate (PET), etc.; and photo-curing resins which contain a photopolymerization initiator and are UC-curing.

In the present embodiment, the alignment marks 604 are comprised of a light-shielding material. With the alignment marks 604 comprised of a light-shielding material, a high contrast can be obtained at the time of an alignment treatment of the imprint mold 601 according to the present embodiment, and the imprint mold 601 can be easily aligned with high accuracy. Particularly, in the case of aligning the imprint mold 601 in a state in which an imprint resin is interposed between a lower layer (for example, an already formed wiring layer, a substrate serving as a base, or the like) and the alignment marks 604, a sufficiently high contrast can be obtained.

The light-shielding material constituting the alignment marks 604 need only have an optical characteristic such that a sufficient contrast can be obtained at the time of the alignment treatment; for example, the light-shielding material preferably has an OD value of not less than 2.

Examples of the light-shielding material constituting the alignment marks 604 include: chromium-based materials such as chromium, chromium nitride, chromium oxide, chromium oxynitride, etc.; tantalum-based materials such as tantalum, tantalum nitride, tantalum oxide, tantalum oxynitride, tantalum oxide boride, tantalum oxynitride boride, etc.; metallic materials such as titanium, aluminum, silver, molybdenum, etc. and alloy materials containing at least one of them; nickel-based materials and the like, which is used either singly or in combination of arbitrarily selected two or more of them.

As the shape (plan-view shape) of the alignment marks 604 in the present embodiment, a substantially cross shape is mentioned as an example (see FIG. 62), but this mode is not restrictive; for example, the shape may be a line shape (see FIG. 63 (A)), a substantially circular shape (see FIG. 63 (B)) or the like.

The alignment marks 604 may be provided outside the pattern area $PA_{60}$ on the first surface 621 of the transparent base material 602 of the imprint mold 601 (see FIG. 62 (A)), or may be provided in the pattern area $PA_{60}$ (see FIG. 62 (B)). Note that the alignment marks 604 are provided at four corners with respect to the pattern area $PA_{60}$ in the examples shown in FIG. 62, but such a mode is not restrictive; for example, the alignment marks 604 may be provided at two diagonal parts of the pattern area $PA_{60}$.

The size of the alignment marks 604 is not particularly limited, and the alignment marks 604 need only have such a size as to be visually confirmable at the time of an imprint treatment of the imprint mold 601. For example, the size of the alignment marks 604 can be set to be about 20 to 1,000 μm.

Note that in the present embodiment, it is preferable that a mold release layer 605 covering the transparent rugged pattern layer 603 is provided on the transparent rugged pattern layer 603 (see FIG. 61). With the mold release layer 605 provided, it is possible to enhance a mold release property of the imprint mold 601 at the time of an imprint treatment using the imprint mold 601 according to the present embodiment. Furthermore, a close contact layer 606 is preferably provided between the transparent rugged pattern layer 603 and the mold release layer 605.

[Method of Manufacturing Imprint Mold]

Figure 64:
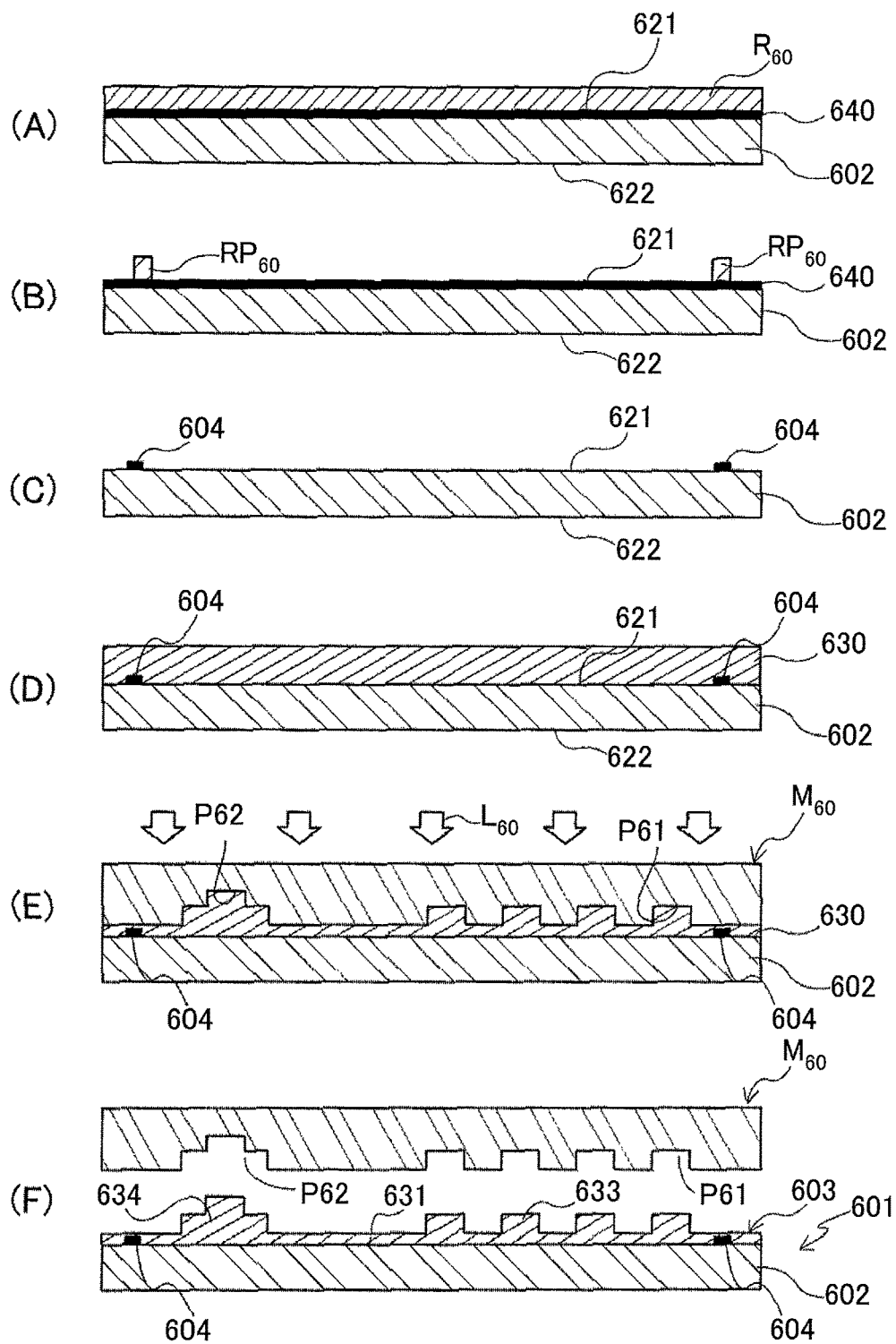
FIG. 64 is a process flow drawing showing, in end sections, steps of a method of manufacturing an imprint mold according to the sixth embodiment of the present invention.

A method of manufacturing the imprint mold 601 having the above-mentioned configuration will be described below. FIG. 64 is a process flow drawing which shows, in end sections, steps of the method of manufacturing the imprint mold according to the present embodiment.

[Alignment Mark Forming Step]

First, a transparent base material 602 having a first surface 621 and a second surface 622 opposite thereto is prepared, a light-shielding material layer 640 is formed on the first surface 621 of the transparent base material 602, and a resist film $R_{60}$ is formed thereon (see FIG. 64 (A)).

The light-shielding material layer 640 can be formed by a known film forming method such as sputtering, PVD, and CVD, while using either one or arbitrarily selected two or more of materials including: chromium-based materials such as chromium, chromium nitride, chromium oxide, chromium oxynitride, etc.; tantalum-based materials such as tantalum, tantalum nitride, tantalum oxide, tantalum oxynitride, tantalum oxide boride, tantalum oxynitride boride, etc.; metallic materials such as titanium, aluminum, silver, molybdenum, etc. and alloy materials containing at least two of them; nickel-based materials, and the like.

The thickness of the light-shielding material layer 640 is not particularly limited. For example, in the case where the light-shielding material layer 640 is comprised of metallic chromium, the thickness of the light-shielding material layer 640 is not less than 50 nm, and is preferably 50 to 150 nm.

The resin material (resist material) constituting the resist film $R_{60}$ is not particularly limited, and examples thereof include negative-type or positive-type electron beam reactive resist materials, UV reactive resist materials and the like generally used in an electron beam lithographic treatment, a photolithographic treatment or the like.

The thickness of the resist film $R_{60}$ is not particularly limited. A resist pattern $RP_{60}$ obtained by patterning the resist film $R_{60}$ in a step described later (see FIGS. 64 (B) and (C)) is used as a mask at the time of etching the light-shielding material layer 640. Therefore, the thickness of the resist film $R_{60}$ is appropriately set, taking the material constituting the light-shielding material layer 640, the thickness of the light-shielding material layer 640, and the like in such a manner that the resist pattern $RP_{60}$ remains after the etching treatment of the light-shielding material layer 640; specifically, the thickness of the resist film $R_{60}$ is about 0.3 to 1 μm.

The method for forming the resist film $R_{60}$ on the light-shielding material layer 640 is not particularly limited, and examples thereof include conventionally known methods, such as a method in which a resist material is applied onto the light-shielding material layer 640 by a coating apparatus such as a spin coater or a spray coater, or in which a dry film resist containing the above-mentioned resin component is laminated on the light-shielding material layer 640, optionally followed by heating (prebake) at a predetermined temperature.

Next, a resist pattern $RP_{60}$ is formed at a desired position on the light-shielding material layer 640, as shown in FIG. 64 (B). The resist pattern $RP_{60}$ can be formed, for example, by electron beam lithography in which an electron beam lithography device is used, photolithography in which a photomask having predetermined openings and light-shielding portions is used, or the like.

The shape of the resist pattern $RP_{60}$ is appropriately set according to the shape of the alignment marks 604 of the imprint mold 601 according to the present embodiment, and is not particularly limited; for example, the shape is a substantially cross shape, a line shape, a substantially circular shape, or the like in plan view.

Like the shape, the size of the resist pattern $RP_{60}$ is appropriately set according to the size of the alignment marks 604 of the imprint mold 601 manufactured in the present embodiment, and is not particularly limited; for example, the size of the resist pattern $RP_{60}$ is about 20 to 1,000 μm.

Using the resist pattern $RP_{60}$ formed as above-mentioned as a mask, the light-shielding material layer 640 is etched, after which the resist pattern $RP_{60}$ is removed, whereby the alignment marks 604 are formed at a desired position on the first surface 621 of the transparent base material 602 (see FIG. 64 (C)).

[Production of Transparent Rugged Pattern Layer]

Next, as shown in FIG. 64 (D), a transparent resin material film 630 covering the alignment marks 604 is formed over the whole area of the first surface 621 of the transparent base material 602. As the transparent resin material constituting the transparent resin material film 630, there can be used, for example: thermoplastic resins such as polycarbonate (PC), polymethyl methacrylate (PMMA), cycloolefin polymer (COP), polyethylene terephthalate (PET), etc.; and photo-curing resins which contain a photopolymerization initiator and are UV-curing.

Examples of the method for forming the transparent resin material film 630 include a spin coating method, an ink jet method, a spray coating method, and a die coating method.

The film thickness of the transparent resin material film 630 is not particularly limited, and is about 1 to 20 μm, for example.

Subsequently, a mold $M_{60}$ having first recessed pattern portions P61 and a second recessed pattern portion P62 corresponding to first projected pattern portions 633 and a second projected pattern portion 634 of the transparent rugged pattern layer 603 is prepared, and, in the case where the transparent resin material constituting the transparent resin material layer 630 is the above-mentioned photo-curing resin, the surface formed with the first recessed pattern portions P61 and the second recessed pattern portion P62 of the mold $M_{60}$ is pressed against the transparent resin material film 630, and, in that state, irradiation with UV rays $L_{60}$ or the like is conducted, to cure the transparent resin material film 630 (see FIG. 64 (E)). The mold $M_{60}$ has alignment marks comprised of rugged shapes or alignment marks having a light-shielding property which correspond to the alignment marks 604 of the imprint mold 601, and the alignment marks of the mold $M_{60}$ are formed in such a manner that they can be aligned with the alignment marks 604 of the imprint mold 601. Note that in the case where the transparent resin material constituting the transparent resin material film 630 is the above-mentioned thermoplastic resin, it is sufficient that a substrate formed with the transparent resin material film 630 is heated to or above a glass transition temperature, and the transparent resin material film 630 is pressed by the mold $M_{60}$, followed by cooling, to cure the transparent resin material film 630.

Like the transparent base material 602 of the imprint mold 601 according to the present embodiment, the mold $M_{60}$ is comprised of, for example, a transparent substrate such as, for example, glass substrates such as quartz glass substrate, soda glass substrate, fluorite substrate, calcium fluoride substrate, magnesium fluoride substrate, barium borosilicate glass, aminoborosilicate glass, aluminosilicate glass and the like no alkali glass substrates, resin substrates such as polycarbonate substrate, polypropylene substrate, polyethylene substrate, polymethyl methacrylate substrate, polyethylene terephthalate substrate, and laminate substrates obtained by laminating two or more substrates arbitrarily selected from these substrates.

The shape, size and the like of the first recessed pattern portions P61 and the second recessed pattern portion P62 of the mold $M_{60}$ are not particularly limited, and can be set according to the shape, size and the like of the first projected pattern portions 633 and the second projected pattern portion 634 (the first step 6341 and the second step 6342) required in the imprint mold 601 manufactured in the present embodiment; for example, the shape can be set to be a space shape, a hole shape or the like, and the size can be set to be about 0.5 to 30 μm. Note that on the side of the surface formed with the first and second recessed pattern portions P61 and P62 of the mold $M_{60}$, a mold release layer may be provided for the purpose of facilitating mold release from the transparent resin material film 630.

Then, the mold $M_{60}$ is released from the cured transparent resin material film 630 (see FIG. 64 (F)). By this, the transparent rugged pattern layer 603 is formed on the first surface 621 of the transparent base material 602, and the imprint mold 601 according to the present embodiment is manufactured. Note that a close contact layer 606 and a mold release layer 605 may optionally be formed over the transparent rugged pattern layer 603 of the imprint mold 601 by conventionally known methods.

[Method of Manufacturing Multilayer Wiring Board]

Figure 65:
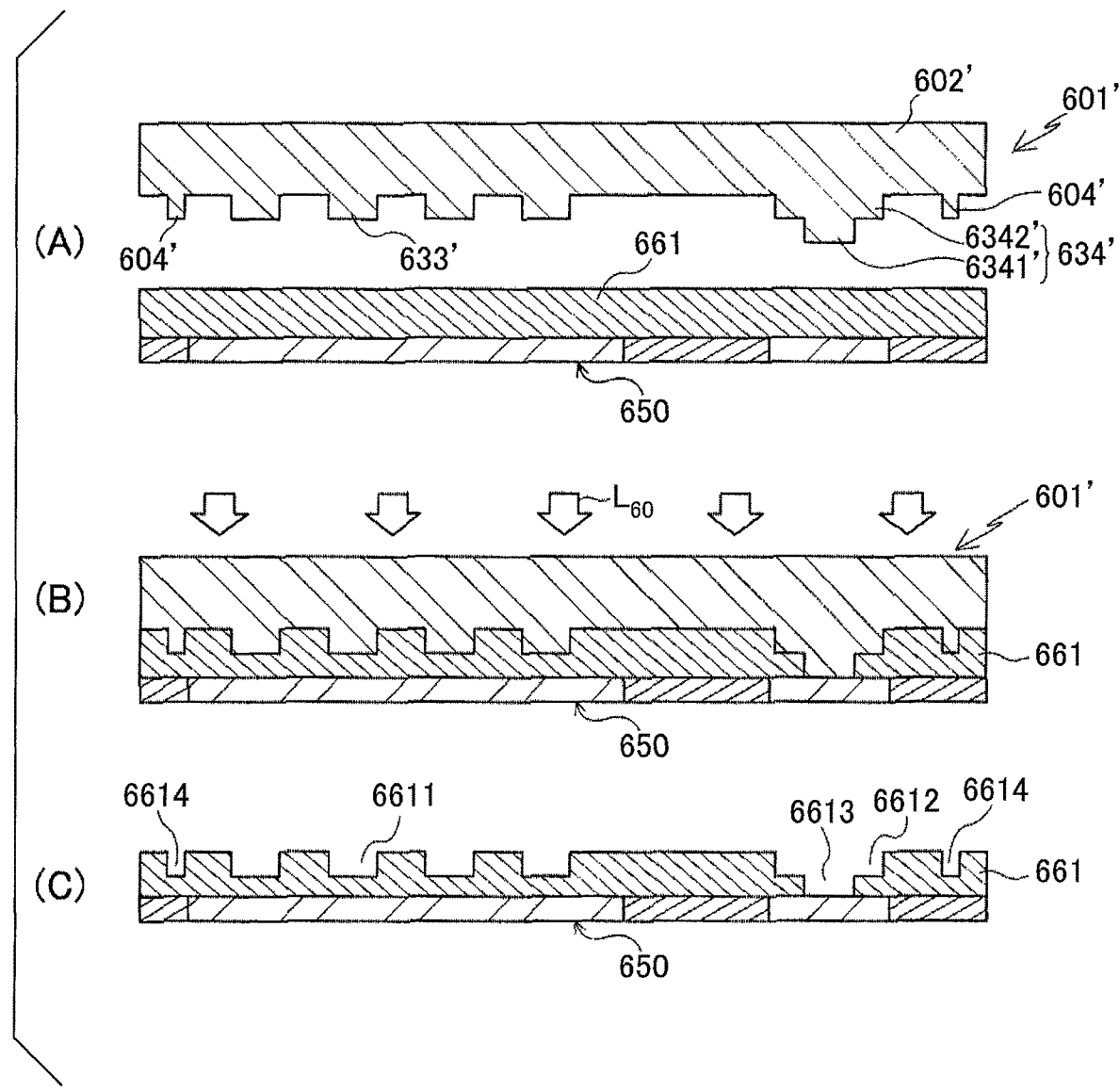
FIG. 65 is a process flow drawing (No. 1) showing, in end sections, steps of a method of manufacturing a multilayer wiring board using an imprint mold set including the imprint mold according to the sixth embodiment of the present invention.
Figure 66:
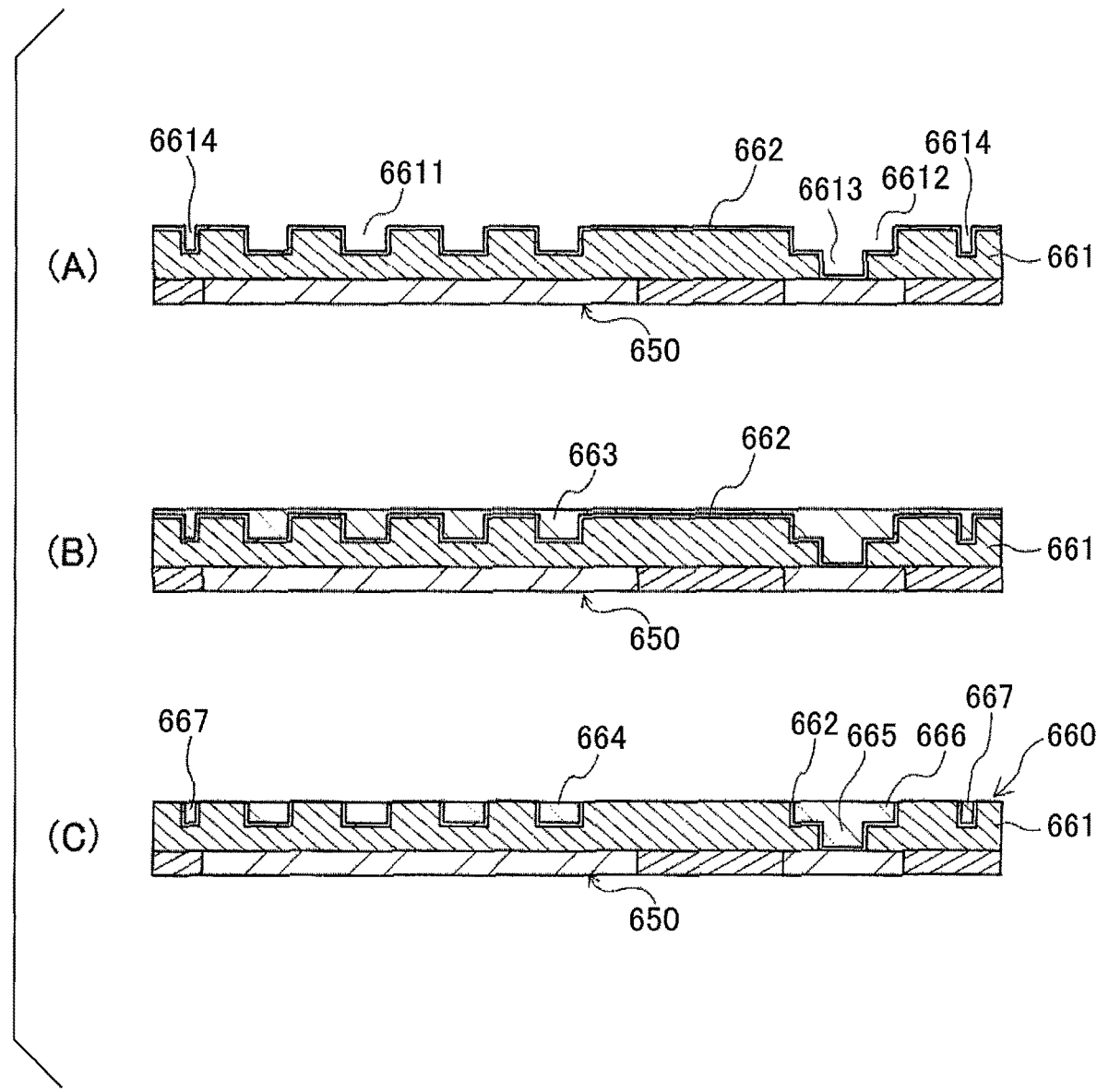
FIG. 66 is a process flow drawing (No. 2) showing, in end sections, the steps of the method of manufacturing the multilayer wiring board using the imprint mold set including the imprint mold according to the sixth embodiment of the present invention.
Figure 67:
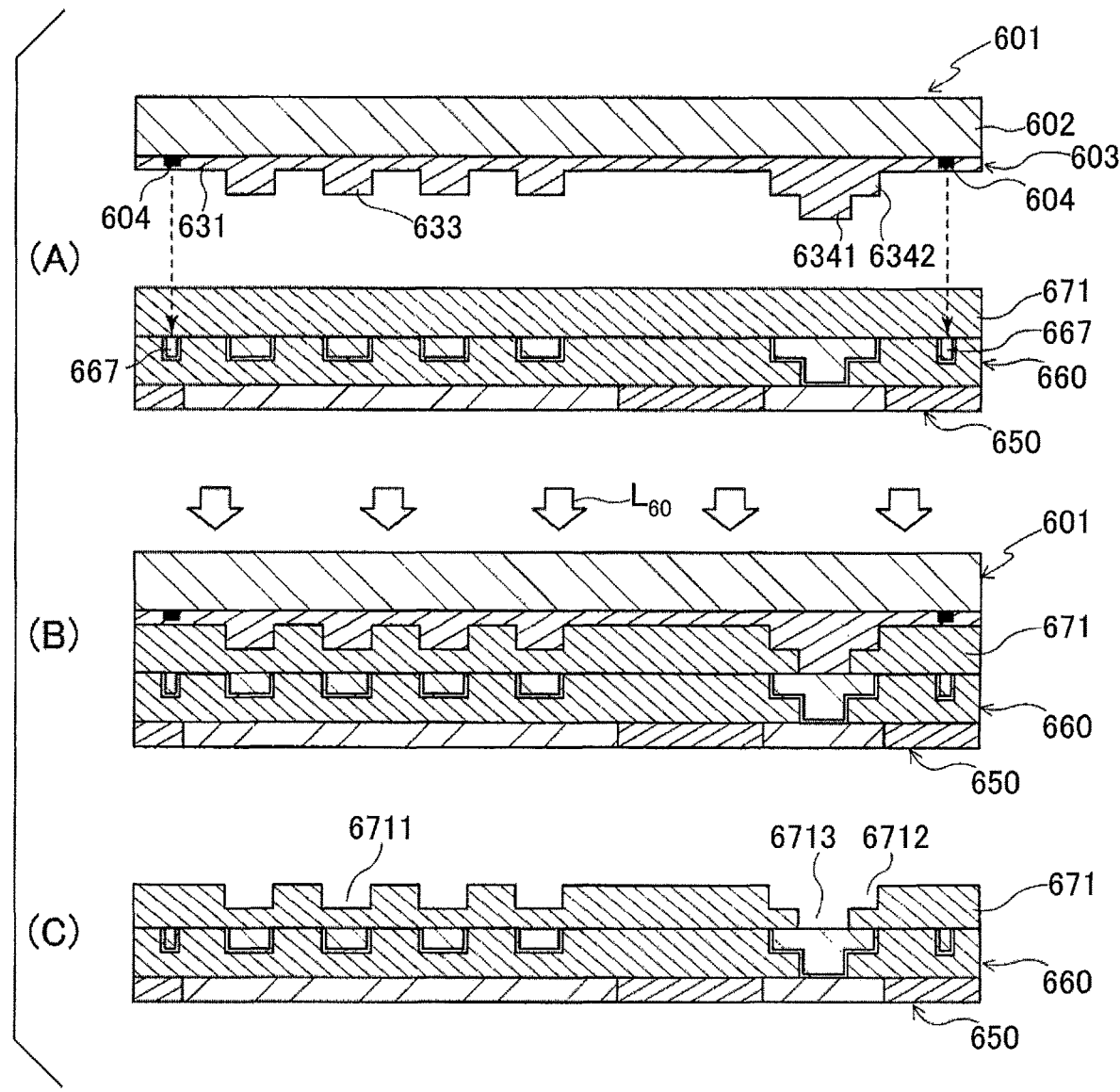
FIG. 67 is a process flow drawing (No. 3) showing, in end sections, the steps of the method of manufacturing the multilayer wiring board using the imprint mold set including the imprint mold according to the sixth embodiment of the present invention.

A method of manufacturing a multilayer wiring board using the imprint mold 601 having the aforementioned configuration will be described. FIG. 65 is a process flow drawing (No. 1) which shows, in end sections, steps of a method of manufacturing the multilayer wiring board using an imprint mold set including the imprint mold according to the present embodiment, FIG. 66 is a process flow drawing (No. 2) which shows, in end sections, steps of the method of manufacturing the multilayer wiring board using the imprint mold set including the imprint mold according to the present embodiment, and FIG. 67 is a process flow drawing (No. 3) which shows, in end sections, steps of the method of manufacturing the multilayer wiring board using the imprint mold set including the imprint mold according to the present embodiment.

First, an imprint mold set in the present embodiment will be described. The imprint mold set in the present embodiment includes a first imprint mold 601' (see FIG. 65 (A)), and the imprint mold 601 according to the present embodiment as a second imprint mold. Like the second imprint mold 601, the first imprint mold 601' is provided with first projected pattern portions 633' on a first surface of a transparent base material 602', and a second projected pattern portion 634', which includes a first step 6341' and a second step 6342', and alignment mark forming projected portions 604'. Note that the alignment mark forming projected portions 604' of the first imprint mold 601' are configured as projected patterns for forming an insulating film 661 of a multilayer wiring board with alignment mark forming recesses 6614. Using these two imprint molds 601 and 601', the multilayer wiring board is manufactured.

A base wiring layer 650 and the first imprint mold 601' are prepared, and the insulating film 661 is formed on the base wiring layer 650 (see FIG. 65 (A)). As the material constituting the insulating film 661, there can be used an electrically insulating material, examples of which include epoxy resin materials, phenolic resin materials, polyimide resin materials, polysulfone resin materials, polyester resin materials, and polycarbonate resin materials, and it is preferable to use a UV-curing resin which is cured when irradiated with UV rays. The thickness of the insulating film 661 is preferably about 3 to 30 μm.

While the first imprint mold 601' is being pressed against the insulating film 661 on the base wiring layer 650, the insulating film 661 is cured (see FIG. 65 (B)). The method for curing the insulating film 661 may be appropriately selected according to curing characteristics of the resin material constituting the insulating film 661; for example, in the case where the insulating film 661 is comprised of a UV-curing resin, the insulating film 661 can be cured by irradiating with UV rays $L_{60}$ in a state in which the first imprint mold 601' is pressed against the insulating film 661. Since the first imprint mold 601' in the present embodiment has the alignment mark forming projected portions 604', the insulating film 661 is formed with the alignment mark forming recesses 6614 corresponding to the alignment mark forming projected portions 604' upon curing. The alignment mark forming recesses 6614 are used for an alignment treatment of the second imprint mold 601 at the time of the imprint treatment conducted using the second imprint mold 601 in a later step.

The first imprint mold 601' is released from the cured insulating film 661, and a residual film of the insulating film 661 present between the base wiring layer 650 and a recess 6613 is removed by dry etching (see FIG. 65 (C)). By this, there are formed recesses 6611 corresponding to the first projected pattern portions 633' of the first imprint mold 601', a recess 6612 and a through-hole 6613 corresponding to the second projected pattern portion 634', and the alignment mark forming recesses 6614 corresponding to the alignment mark forming projected portions 604'. In this way, the insulating film 661 having the recesses 6611 and 6612, the through-hole 6613 and the alignment mark forming recesses 6614 is produced on the base wiring layer 650.

Subsequently, a metal seed layer 662 is formed on the insulating film 661 (see FIG. 66 (A)). Examples of the material (metallic material) constituting the metal seed layer 662 include Ti, Mo, W, In, Nb, Co, Cr, Cu, and Ni. The thickness of the metal seed layer 662 is not particularly limited, and can be set to be about 10 to 500 nm. The method for forming the metal seed layer 662 is not specifically restricted, and examples thereof include sputtering and electroless plating.

A metal plating layer 663 such as a copper plating layer that fills the recesses 6611, 6612, the through-hole 6613 and the alignment mark forming recesses 6614 of the insulating film 661 is formed on the metal seed layer 662 by an electroplating method (see FIG. 66 (B)). Then, the metal plating layer 663 is subjected to a polishing treatment to such an extent that the insulating film 661 can be exposed, whereby a first wiring layer 660 which has wiring patterns 664, a via 665 and a land 666 for electrical connection with the base wiring layer 650, and alignment marks 667 is formed (see FIG. 66 (C)).

Subsequently, an insulating film 671 is formed on the first wiring layer 660 (see FIG. 67 (A)), and alignment of the second imprint mold 601 is conducted using the alignment marks 604 of the second imprint mold 601 and the alignment marks 667 of the first wiring layer 660. In this instance, in a state in which the second imprint mold 601 is pressed against the insulating film 671, the alignment of the second imprint mold 601 is conducted while observing from the side of a second surface 622 of the second imprint mold 601. Note that in the case where, for example, the transparent base material 602 constituting the second imprint mold 601 is in a non-rigid film form and it is difficult to perform alignment in a state in which the second imprint mold 601 is pressed against the insulating film 671, the alignment of the second imprint mold 601 is carried out in such a manner as to form a gap between the insulating film 671 and the second imprint mold 601. In this case, if the alignment marks 604 of the second imprint mold 601 are comprised of rugged structures formed in the transparent base material 602, contrast of the alignment marks is low, mis-recognition may occur, and the accuracy of alignment of the second imprint mold 601 may be lowered. In the present embodiment, however, the alignment marks 604 of the second imprint mold 601 are comprised of the light-shielding material, so that even in a state in which a gap is formed between the insulating film 671 and the second imprint mold 601, a sufficiently high contrast can be obtained, and, therefore, alignment of the second imprint mold 601 can be performed with high accuracy.

Figure 68:
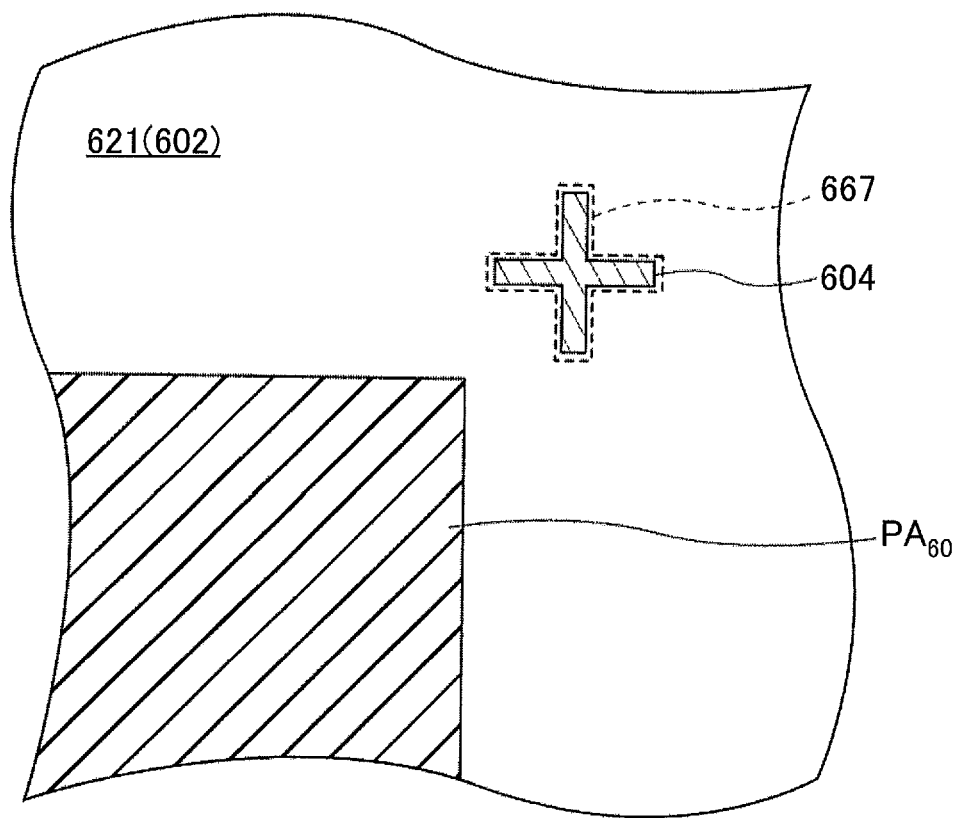
FIG. 68 is a plan view schematically showing a method of aligning a second imprint mold in the sixth embodiment of the present invention.

As shown in FIG. 68, in the present embodiment, the alignment marks 604 of the second imprint mold 601 are in a substantially cross shape in plan view, and the alignment marks 667 of the first wiring layer 660 formed by the first imprint mold 601' are in a substantially cross shape in plan view which is slightly larger than the alignment marks 604 of the second imprint mold 601.

Therefore, in the present embodiment, alignment of the second imprint mold 601 is conducted in such a manner that when viewed from above in the stacking direction of the multilayer wiring board 610, the alignment marks 604 of the second imprint mold 601 are physically included in the alignment marks 667 of the first wiring layer 660. In this instance, since the alignment marks 604 of the second imprint mold 601 are comprised of the light-shielding material, a sufficiently high contrast can be obtained even in a state in which the second imprint mold 601 is pressed against the insulating film 671, and, therefore, alignment of the second imprint mold 601 can be carried out with high accuracy.

Then, while the aligned second imprint mold 601 is being pressed against the insulating film 671, the insulating film 671 is cured (see FIG. 67 (B)), the imprint mold 601 is released from the cured insulating film 671, and a residual film of the insulating film 661 present between the base wiring layer 650 and the recess 6613 is removed by dry etching (see FIG. 67 (C)). By this, recesses 6711 and 6712 and a through-hole 6713 corresponding to the transparent rugged pattern layer 603 (the first projected pattern portions 633 and the second projected pattern portion 634) of the second imprint mold 601 are formed. In this manner, the insulating film 671 having the recesses 6711 and 6712 and the through-hole 6713 is produced on the first wiring layer 660. Note that in the present embodiment, with the alignment marks 604 comprised of the light-shielding material, the second imprint mold 601 can be aligned with high accuracy, and, as a result, the recesses 6711 and 6712 and the through-hole 6713 can be formed with high accuracy.

Subsequently, a metal seed layer 672 is formed on the insulating film 671 (see FIG. 69 (A)), and a metal plating layer 673 such as a copper plating layer that fills the recesses 6711 and 6712 and the through-hole 6713 of the insulating film 671 is formed on the metal seed layer 672 by an electroplating method (see FIG. 69 (B)). Then, the metal plating layer 673 is subjected to a polishing treatment to such an extent that the insulating film 671 can be exposed, whereby a second wiring layer 670 which has wiring patterns 674 and has a via 675 and a land 676 for electrical connection with the first wiring layer 660 is formed (see FIG. 69 (C)).

Figure 69:
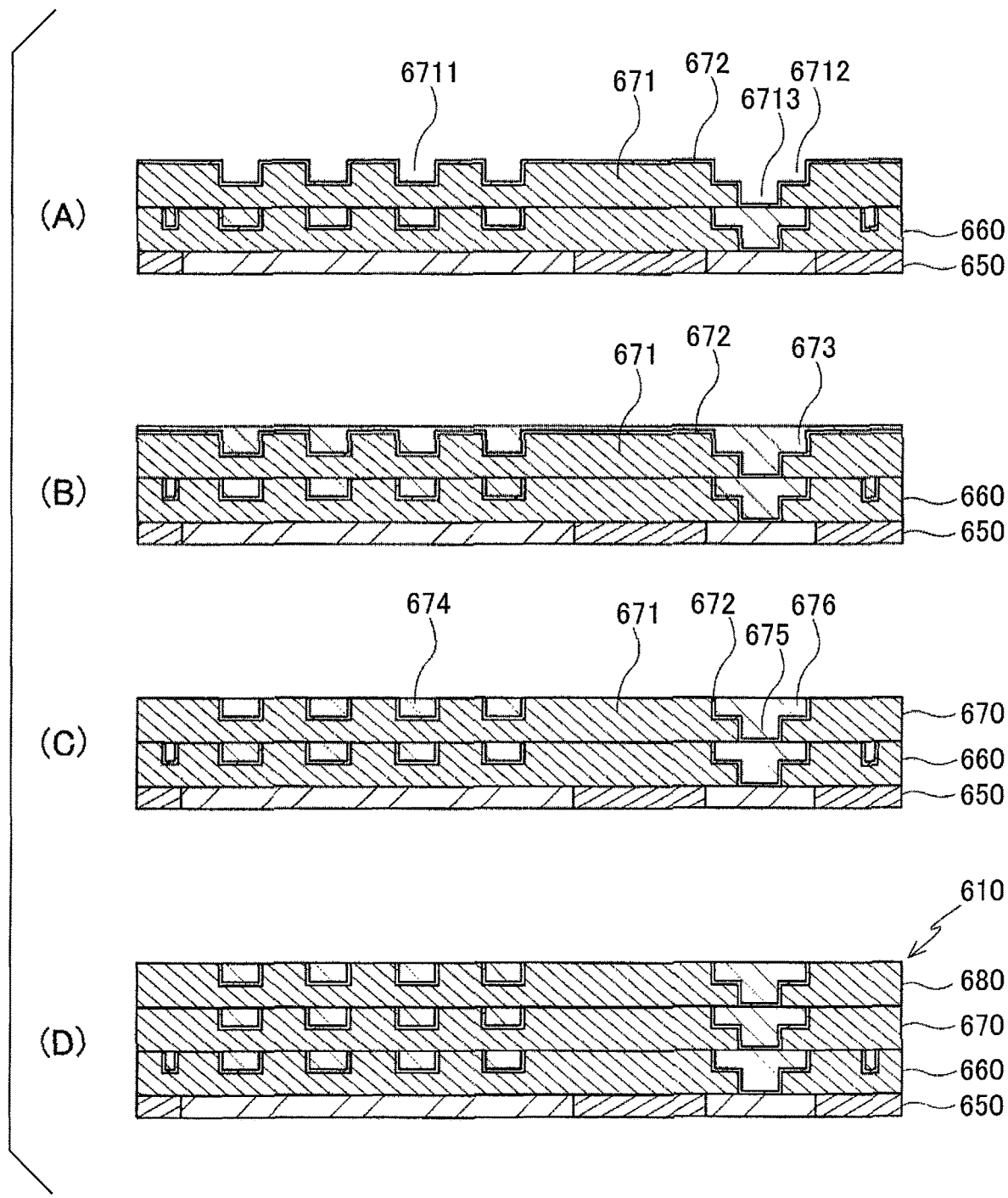
FIG. 69 is a process flow drawing (No. 4) showing, in end sections, steps of the method of manufacturing the multilayer wiring board using the imprint mold set including the imprint mold according to the sixth embodiment of the present invention.

The aforementioned steps are conducted repeatedly, to form an Nth wiring layer (N is an integer of not less than 2) on an (N−1)th wiring layer, whereby a multilayer wiring board 610 can be manufactured (see FIG. 69 (D)). Note that in FIG. 69 (D) is illustrated the multilayer wiring board 610 in which a base wiring layer 650, the first wiring layer 660, the second wiring layer 670 and a third wiring layer 680 are stacked in this order.

As aforementioned, according to the imprint mold 601 according to the present embodiment, the alignment marks 604 are completely covered by the transparent rugged pattern layer 603 (the base layer 631), whereby it is ensured that the alignment marks 604 do not make direct contact with the insulating films 661, 671 at the times of an alignment treatment and an imprint treatment conducted using the imprint mold 601. For this reason, even if the imprint treatment is conducted repeatedly, damaging such as peeling of the alignment marks 604 can be restrained from occurring, and, therefore, the imprint mold 601 can be stably used over a long period of time.

The embodiment as aforementioned has been described for facilitating understanding of the present invention, and has not been described for limiting the present invention. Therefore, each of the elements disclosed in the above embodiment is intended to include all design modifications and equivalents that fall within the technical scope of the present invention.

While each of the wiring layers 660 to 680 (see FIG. 69 (D)) of the multilayer wiring board 610 in the present embodiment has a via and a land, the present invention is not to be limited to such a mode. For example, at least one of the wiring layers 660 to 680 of the multilayer wiring board 610 may have a via (landless via) and may not have a land.

While a mode in which the first wiring layer 660 is formed using the first imprint mold 601' and thereafter the second wiring layer 670 and the latter-formed ones are formed using the second imprint mold 601 has been shown in the description of the present embodiment, the present invention is not to be restricted to such a mode. For example, after the first wiring layer 660 is formed using the first imprint mold 601' and the second wiring layer 670 is formed using the second imprint mold 601, the third wiring layer 680 may be formed using the first imprint mold 601'. In other words, the multilayer wiring board 610 may be manufactured while using the first imprint mold 601' and the second imprint mold 601 alternately.

While an imprint mold set including two imprint molds consisting of the first imprint mold 601' and the second imprint mold 601 has been shown as an example in the description of the present embodiment, the present invention is not to be limited to such a mode, and such an imprint mold set may include three or more imprint molds.

Figure 70:
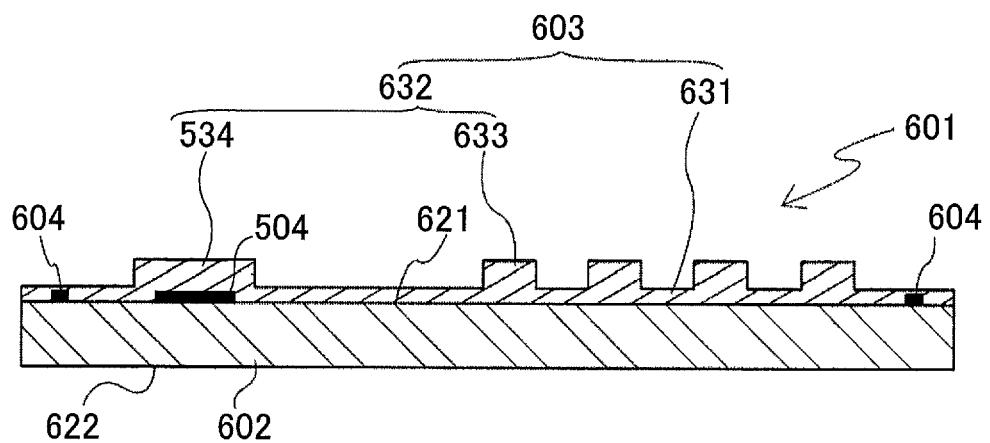
FIG. 70 is a sectional end view showing a general configuration of an imprint mold according to a modification of the sixth embodiment of the present invention.

Furthermore, the present embodiment and the fifth embodiment may be combined with each other. Specifically, as illustrated in FIG. 70, a light-shielding layer 504 may be provided on a first surface 621 of a transparent base material 602. The light-shielding layer 504 is covered by a transparent rugged pattern layer 603, specifically by a second projected pattern portion 534. Note that, in FIG. 70, while the second projected pattern portion 534 is comprised of a one-step projected portion in the same manner as in the fifth embodiment (FIG. 47), this is not restrictive, and the second projected pattern portion may be a second projected pattern portion 634 in a stepped shape having two or more steps (see FIG. 60). In addition, the transparent rugged pattern layer 603 may have only the first projected pattern portions 633 (not having a second projected pattern portion 634 that covers the light-shielding layer 504), and the light-shielding layer 504 may be covered by the base layer 631 of the transparent rugged pattern layer 603 (see FIG. 52).

In FIG. 70, the light-shielding layer 504 is formed simultaneously with the alignment marks 604 at the time of producing the imprint mold 601 provided with the alignment marks 604 (see FIG. 64). The light-shielding layer 504 may be formed from the same light-shielding material as the alignment marks 604. In this case, the light-shielding layer 504 and the alignment marks 604 can be produced simultaneously, and, therefore, the positional accuracy of the light-shielding layer 504 and the alignment marks 604 can be made to be favorable. In addition, at the time of conducting alignment of the second imprint mold 601 and the first wiring layer 660 by the alignment marks 604 of the second imprint mold 601 and the alignment marks 667 of the first wiring layer 660 (see FIG. 67 (A)), alignment of the light-shielding layer 504 of the second imprint mold 601 and the first wiring layer 660 can be performed with good accuracy. Note that use of an opaque light-shielding layer 504 as an alignment mark may be contemplated, but the position and size of the light-shielding layer 504 often differ among the wiring layers. Therefore, the position of an alignment camera for recognizing the alignment marks 604 and image treatment settings should be modified, which may be troublesome. In FIG. 70, on the other hand, the alignment marks 604 are provided separately from the light-shielding layer 504, whereby positioning of the imprint mold 601 can be accurately performed, irrespectively of the position and size of the light-shielding layer 504.

In FIG. 70, the same parts as those in the mode shown in FIGS. 60 to 69 are denoted by the same reference symbols as used above. In addition, the configuration of the light-shielding layer 504 and the second projected pattern portion 534 are the same as in the case of the fifth embodiment, and, therefore, detailed descriptions thereof are omitted here.

Figure 71:
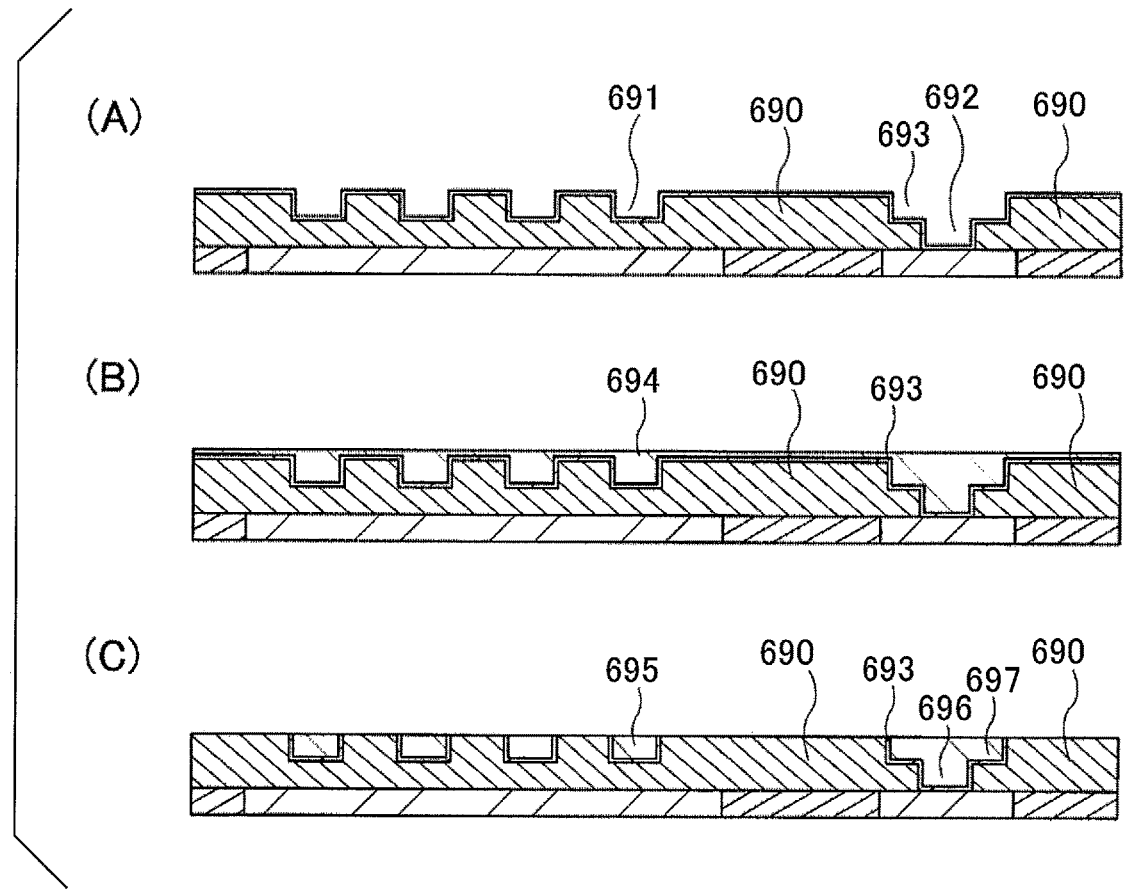
FIG. 71 is a process flow drawing showing, in end sections, steps of a method of manufacturing a wiring board according to a comparative example.
Figure 72:
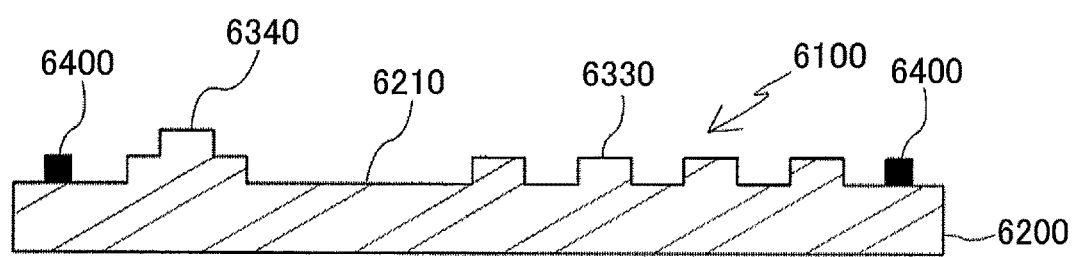
FIG. 72 is a sectional end view showing a general configuration of an imprint mold used in the process of manufacturing the wiring board according to the comparative example.

Here, as a comparative example, a general method of manufacturing a multilayer wiring board will be described referring to FIGS. 71 to 72. As shown in FIG. 71, on an insulating film (resin film) 690 formed with recesses 691 for forming wiring patterns 695 and with a stepped through-hole 692 for forming a via 696 and a land 697, a metal layer 693 is formed by sputtering, electro less plating or the like (see FIG. 71 (A)), copper 694 as a conductor is embedded in the recesses 691 and the through-hole 692 by a copper electroplating treatment (see FIG. 71 (B)), a polishing treatment is conducted to produce a wiring layer having the wiring patterns 695, the via 696 and the land 697 (see FIG. 71 (C)), and this series of steps are conducted repeatedly, to manufacture a multilayer wiring board.

The insulating film (resin film) 690 having the recesses 691 and the through-hole 692 for producing each wiring layer can be produced by an imprint lithographic method using an imprint mold 6100 (see FIG. 72) in which first projected pattern portions 6330 corresponding to the recesses 691 for forming the wiring patterns 695 and a second projected pattern portion 6340 corresponding to the through-hole 692 for forming the via 696 and the land 697 are provided on a first surface 6210 of a mold base material 6200.

In a multilayer wiring board on which semiconductor chips such as LSIs can be mounted in high density, the positional accuracy of the recesses 691 and the through-hole 692 formed in the insulating film (resin film) 690 using the above-mentioned imprint mold 6100 is extremely important, for securing a high electrical connection property between the wiring layers.

In the conventional imprint mold 6100, alignment marks 6400 to be used for alignment in the stacking direction are provided on the first surface 6210 of the mold base material 6200, together with the first projected pattern portions 6330 and the second projected pattern portion 6340. Besides, alignment of the imprint mold 6100 is conducted using such alignment marks 6400 and alignment marks provided in a lower layer (for example, an already-formed wiring layer, a substrate as a base, or the like), whereby the recesses 691 and the through-hole 692 are formed with high positional accuracy (see Japanese Patent No. 4448191).

In the imprint mold described in the above-mentioned Japanese Patent No. 4448191, the alignment marks 6400 are provided on the first surface 6210 of the mold base material 6200, and the alignment marks 6400 are comprised of a light-shielding material such as chromium, whereby aligning can be carried out with high accuracy. However, since the alignment marks 6400 are exposed on the first surface 6210, an imprint resin (an insulating film 690) and the alignment marks 6400 make direct contact with each other at the time of an imprint treatment. As a result, there is a problem that when the imprint treatment is repeated multiple times by use of the imprint mold, damaging such as peeling of the alignment marks 6400 would be generated.

When the alignment marks 6400 is damaged (peeled) in the imprint mold, it is extremely difficult to regenerate the alignment marks 6400, and, therefore, it becomes impossible to use the imprint mold continuedly over a long period of time.

On the other hand, according to the present embodiment, the alignment marks 604 are covered by the base layer 631 of the transparent rugged pattern layer 603. By this, damaging such as peeling of the alignment marks 604 comprised of the light-shielding material can be restrained from occurring, and the imprint mold 601 can be stably used over a long period of time.

The plurality of constituent elements disclosed in each of the above embodiments can be appropriately combined with one another, as required. Alternatively, some constituent elements may be eliminated from all the constituent elements shown in each of the above embodiments.

The invention claimed is:

1. A wiring structure formed on a transfer base material, the wiring structure comprising:
    an insulating pattern structure; and
    a wiring layer embedded in the pattern structure, wherein:
    the wiring layer has a pad portion and an interlayer connection via connected to the pad portion,
    the interlayer connection via has a stepped shape including:
        a first projected step on a side of the pad portion, and
        a second projected step on a side of the transfer base material, and in a plan view:
        the pad portion is larger than the first projected step, and
        the first projected step is larger than the second projected step.

2. The wiring structure according to claim 1, wherein in a sectional view, a side surface of the second projected step is perpendicular to a surface of the transfer base material.

3. The wiring structure according to claim 1, wherein in a sectional view, a side surface of the second projected step is inclined relative to a surface of the transfer base material.

4. The wiring structure according to claim 1, wherein in a sectional view, a side surface of the second projected step is curved toward inside of the interlayer connection via.

5. The wiring structure according to claim 1, wherein in a sectional view, a side surface of the second projected step is curved toward outside of the interlayer connection via.

6. A semiconductor device comprising:
    the wiring structure according to claim 1;
    a semiconductor element fixed to the wiring structure; and
    a sealing resin that seals the semiconductor element.

* * * * *